United States Patent
Kimura et al.

(10) Patent No.: US 10,460,690 B2
(45) Date of Patent: Oct. 29, 2019

(54) LIQUID CRYSTAL DISPLAY DEVICE AND ELECTRONIC DEVICE INCLUDING THE SAME

(71) Applicant: Semiconductor Energy Laboratory Co., Ltd., Atsugi-shi, Kanagawa-ken (JP)

(72) Inventors: Hajime Kimura, Kanagawa (JP); Atsushi Umezaki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/434,142

(22) Filed: Feb. 16, 2017

(65) Prior Publication Data

US 2017/0162161 A1    Jun. 8, 2017

Related U.S. Application Data

(63) Continuation of application No. 15/040,134, filed on Feb. 10, 2016, now Pat. No. 9,576,983, which is a
(Continued)

(30) Foreign Application Priority Data

Mar. 26, 2009    (JP) ................................. 2009-077201

(51) Int. Cl.
*G09G 3/36*    (2006.01)
*G09G 3/20*    (2006.01)
(Continued)

(52) U.S. Cl.
CPC ......... *G09G 3/3677* (2013.01); *G02F 1/1368* (2013.01); *G02F 1/13624* (2013.01);
(Continued)

(58) Field of Classification Search
CPC ...... G09G 3/3677; G09G 3/20; G09G 3/3688; G09G 3/3696; G09G 3/3674;
(Continued)

(56) References Cited

U.S. PATENT DOCUMENTS

| | | |
|---|---|---|
| 5,410,583 A | 4/1995 | Weisbrod et al. |
| 6,064,713 A | 5/2000 | Lebrun et al. |

(Continued)

FOREIGN PATENT DOCUMENTS

| | | |
|---|---|---|
| EP | 1895545 A | 3/2008 |
| EP | 1906414 A | 4/2008 |

(Continued)

OTHER PUBLICATIONS

Jang.Y et al., "Integrated Gate Driver Circuit Using a-Si TFT with Dual Pull-down Structure.", IDW'04 : Proceedings of the 11th International Display Workshops, Dec. 8, 2004, pp. 333-336.

*Primary Examiner* — Adam J Snyder
(74) *Attorney, Agent, or Firm* — Fish & Richardson P.C.

(57) ABSTRACT

A driver circuit includes a circuit 200, a transistor 101_1, and a transistor 101_2. A signal is selectively input from the circuit 200 to a gate of the transistor 101_1 and the transistor 101_2, so that the transistor 101_1 and the transistor 101_2 are controlled to be on or off. The transistor 101_1 and the transistor 101_2 are turned on or off; thus, the wiring 112 and the wiring 111 become conducting or non-conducting.

10 Claims, 49 Drawing Sheets

Related U.S. Application Data continuation of application No. 14/522,792, filed on Oct. 24, 2014, now Pat. No. 9,268,185, which is a continuation of application No. 12/730,952, filed on Mar. 24, 2010, now Pat. No. 8,872,751.

(51) Int. Cl.
  *G02F 1/1362* (2006.01)
  *G02F 1/1368* (2006.01)
  *H01L 27/12* (2006.01)
  *H01L 29/24* (2006.01)
  *H01L 29/786* (2006.01)

(52) U.S. Cl.
  CPC ............ *G09G 3/20* (2013.01); *G09G 3/3688* (2013.01); *G09G 3/3696* (2013.01); *H01L 27/124* (2013.01); *H01L 27/1225* (2013.01); *H01L 29/24* (2013.01); *H01L 29/7869* (2013.01); *G02F 2202/10* (2013.01); *G09G 3/3674* (2013.01); *G09G 2300/0426* (2013.01); *G09G 2300/0809* (2013.01); *G09G 2300/0842* (2013.01); *G09G 2310/0267* (2013.01); *G09G 2310/0275* (2013.01); *G09G 2310/0286* (2013.01); *G09G 2310/0291* (2013.01); *G09G 2330/021* (2013.01)

(58) Field of Classification Search
  CPC ............... G02F 1/13624; G02F 1/1368; H01L 27/1225; H01L 27/124; H01L 29/24; H01L 29/7869
  USPC ............................................. 345/100; 377/64
  See application file for complete search history.

(56) References Cited

U.S. PATENT DOCUMENTS

| | | |
|---|---|---|
| 6,295,046 B1 | 9/2001 | Hebiguchi |
| 6,300,928 B1 | 10/2001 | Kim |
| 6,310,668 B1 | 10/2001 | Ukita |
| 6,426,743 B1 | 7/2002 | Yeo et al. |
| 6,556,646 B1 | 4/2003 | Yeo et al. |
| 6,690,347 B2 | 2/2004 | Jeon et al. |
| 6,845,140 B2 | 1/2005 | Moon et al. |
| 6,876,353 B2 | 4/2005 | Morosawa et al. |
| 7,202,863 B2 | 4/2007 | Kimura et al. |
| 7,268,756 B2 | 9/2007 | Koyama et al. |
| 7,336,254 B2 | 2/2008 | Iwasaki et al. |
| 7,443,944 B2 | 10/2008 | Tobita et al. |
| 7,486,269 B2 | 2/2009 | Moon |
| 7,529,333 B2 | 5/2009 | Kim et al. |
| 7,633,477 B2 | 12/2009 | Jang et al. |
| 7,786,985 B2 | 8/2010 | Kimura et al. |
| 7,800,576 B2 | 9/2010 | Jinta |
| 7,843,421 B2 | 11/2010 | Chang et al. |
| 7,859,510 B2 | 12/2010 | Umezaki |
| 7,936,331 B2 | 5/2011 | Uh et al. |
| 7,978,274 B2 | 7/2011 | Umezaki et al. |
| 8,008,950 B2 | 8/2011 | Jinta |
| 8,031,160 B2 | 10/2011 | Chen et al. |
| 8,044,906 B2 | 10/2011 | Kimura et al. |
| 8,054,279 B2 | 11/2011 | Umezaki et al. |
| 8,059,078 B2 | 11/2011 | Kimura et al. |
| 8,319,528 B2 | 11/2012 | Kimura et al. |
| 8,330,492 B2 | 12/2012 | Umezaki |
| 8,456,396 B2 | 6/2013 | Umezaki |
| 8,456,402 B2 | 6/2013 | Kimura et al. |
| 8,462,100 B2 | 6/2013 | Umezaki |
| 8,520,159 B2 | 8/2013 | Umezaki et al. |
| 8,643,586 B2 | 2/2014 | Umezaki |
| 8,742,811 B2 | 6/2014 | Umezaki |
| 8,786,793 B2 | 7/2014 | Yamazaki |
| 8,908,115 B2 | 12/2014 | Umezaki et al. |
| 9,070,593 B2 | 6/2015 | Umezaki |
| 9,184,183 B2 | 11/2015 | Umezaki |
| 9,214,473 B2 | 12/2015 | Umezaki |
| 9,263,468 B2 | 2/2016 | Umezaki et al. |
| 9,335,599 B2 | 5/2016 | Umezaki |
| 9,461,071 B2 | 10/2016 | Umezaki |
| 9,606,408 B2 | 3/2017 | Umezaki et al. |
| 9,684,215 B2 | 6/2017 | Umezaki |
| 9,741,309 B2 | 8/2017 | Kimura et al. |
| 2002/0158666 A1 | 10/2002 | Azami et al. |
| 2003/0002615 A1 | 1/2003 | Morosawa et al. |
| 2003/0187903 A1 | 10/2003 | Comer et al. |
| 2004/0125069 A1 | 7/2004 | Park et al. |
| 2004/0207590 A1 | 10/2004 | Lu et al. |
| 2004/0217935 A1 | 11/2004 | Jeon et al. |
| 2004/0253781 A1 | 12/2004 | Kimura et al. |
| 2005/0001805 A1 | 1/2005 | Jeon et al. |
| 2005/0212746 A1* | 9/2005 | Iwasaki ................ G09G 3/3677 345/100 |
| 2005/0220262 A1 | 10/2005 | Moon |
| 2006/0001637 A1 | 1/2006 | Pak et al. |
| 2006/0139292 A1 | 6/2006 | Yoon et al. |
| 2006/0145999 A1 | 7/2006 | Cho et al. |
| 2006/0202940 A1 | 9/2006 | Azami et al. |
| 2006/0220587 A1 | 10/2006 | Tobita et al. |
| 2006/0238482 A1 | 10/2006 | Jang et al. |
| 2006/0267912 A1 | 11/2006 | Lee et al. |
| 2006/0291610 A1 | 12/2006 | Lo et al. |
| 2007/0057899 A1 | 3/2007 | Yamashita |
| 2007/0086558 A1 | 4/2007 | Wei et al. |
| 2007/0104307 A1* | 5/2007 | Kim ...................... G11C 19/28 377/64 |
| 2007/0132686 A1 | 6/2007 | Kimura et al. |
| 2007/0195053 A1 | 8/2007 | Tobita et al. |
| 2007/0217564 A1 | 9/2007 | Tobita |
| 2007/0247932 A1* | 10/2007 | Tobita ................. G09G 3/3677 365/189.12 |
| 2007/0274433 A1 | 11/2007 | Tobita |
| 2007/0296660 A1 | 12/2007 | Kimura et al. |
| 2007/0296662 A1* | 12/2007 | Lee ...................... G09G 3/3677 345/87 |
| 2008/0002805 A1 | 1/2008 | Tobita et al. |
| 2008/0007296 A1 | 1/2008 | Umezaki |
| 2008/0048964 A1 | 2/2008 | Chang et al. |
| 2008/0056431 A1 | 3/2008 | Chien et al. |
| 2008/0062112 A1* | 3/2008 | Umezaki .............. G09G 3/3674 345/100 |
| 2008/0079001 A1 | 4/2008 | Umezaki et al. |
| 2008/0080661 A1 | 4/2008 | Tobita |
| 2008/0100560 A1 | 5/2008 | Na et al. |
| 2008/0165095 A1 | 7/2008 | Jeon et al. |
| 2008/0174580 A1 | 7/2008 | Chang et al. |
| 2008/0219401 A1 | 9/2008 | Tobita |
| 2008/0224985 A1 | 9/2008 | Jang |
| 2008/0278214 A1 | 11/2008 | Yoon et al. |
| 2009/0026453 A1 | 1/2009 | Yamazaki |
| 2010/0026619 A1 | 2/2010 | Umezaki |
| 2010/0182306 A1 | 7/2010 | Kimura et al. |
| 2010/0245335 A1 | 9/2010 | Kimura et al. |
| 2010/0246750 A1 | 9/2010 | Kimura et al. |
| 2011/0187694 A1 | 8/2011 | Umezaki |
| 2012/0049184 A1 | 3/2012 | Umezaki et al. |
| 2012/0056860 A1 | 3/2012 | Umezaki et al. |
| 2012/0068173 A1 | 3/2012 | Umezaki |
| 2013/0043911 A1 | 2/2013 | Kimura et al. |
| 2013/0264574 A1 | 10/2013 | Kimura et al. |
| 2013/0314139 A1 | 11/2013 | Umezaki |
| 2017/0018576 A1 | 1/2017 | Umezaki |
| 2017/0176794 A1 | 6/2017 | Umezaki et al. |
| 2017/0249918 A1 | 8/2017 | Kimura et al. |
| 2017/0263169 A1 | 9/2017 | Kimura et al. |
| 2017/0285431 A1 | 10/2017 | Umezaki |

FOREIGN PATENT DOCUMENTS

| | | |
|---|---|---|
| JP | 02-061620 A | 3/1990 |
| JP | 05-090427 A | 4/1993 |
| JP | 11-086586 A | 3/1999 |
| JP | 11-352517 A | 12/1999 |

(56) References Cited

FOREIGN PATENT DOCUMENTS

| | | | | |
|---|---|---|---|---|
| JP | 2002-197885 A | 7/2002 | | |
| JP | 2003-241201 A | 8/2003 | | |
| JP | 2005-050502 A | 2/2005 | | |
| JP | 2005-285168 A | 10/2005 | | |
| JP | 2006-024350 A | 1/2006 | | |
| JP | 2006-351171 A | 12/2006 | | |
| JP | 2007-317288 A | 12/2007 | | |
| JP | 2008-009393 A | 1/2008 | | |
| JP | 2008-083692 A | 4/2008 | | |
| JP | 2008-089915 A | 4/2008 | | |
| JP | 2008-107807 A | 5/2008 | | |
| JP | 2009-017608 A | 1/2009 | | |
| JP | 2009-055011 A | 3/2009 | | |
| JP | 2010-193434 A | 9/2010 | | |
| KR | 2008-0001856 A | 1/2008 | | |
| KR | 10-2008-0091996 | * 10/2008 | ............... | G09G 3/36 |
| WO | WO-2007/080813 | 7/2007 | | |

\* cited by examiner

Period A1

Period B1

Period C1

Period D1、Period E1

Period A2

Period B2

Period C2

Period D2、Period E2

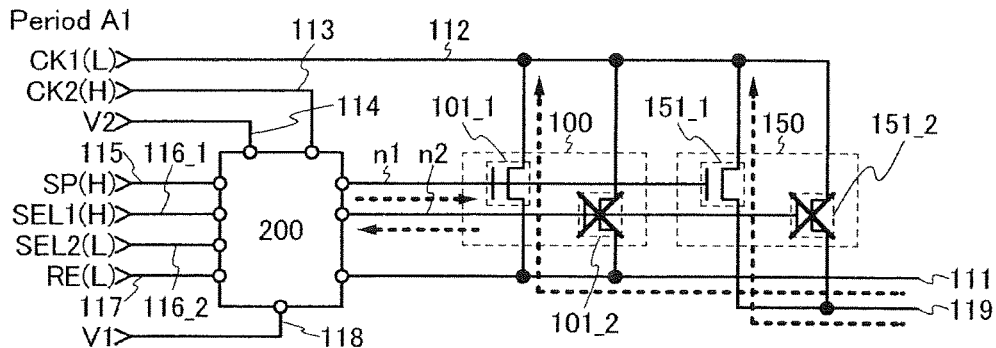
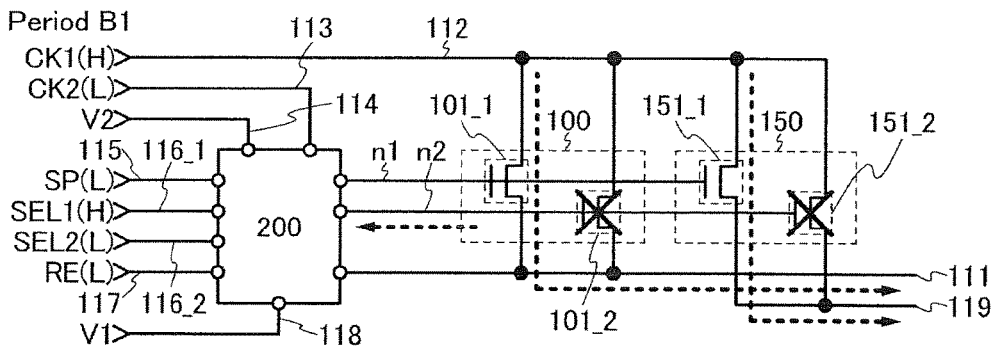
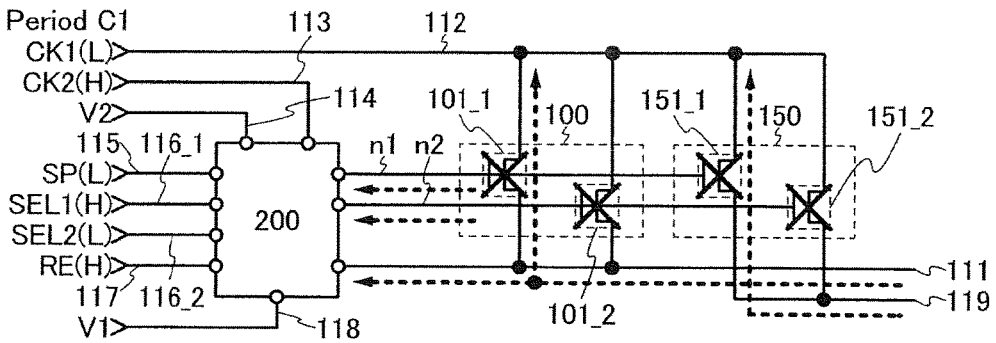
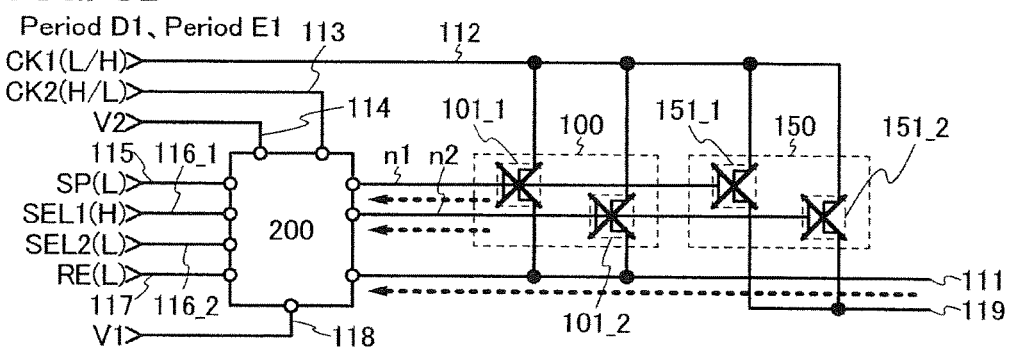

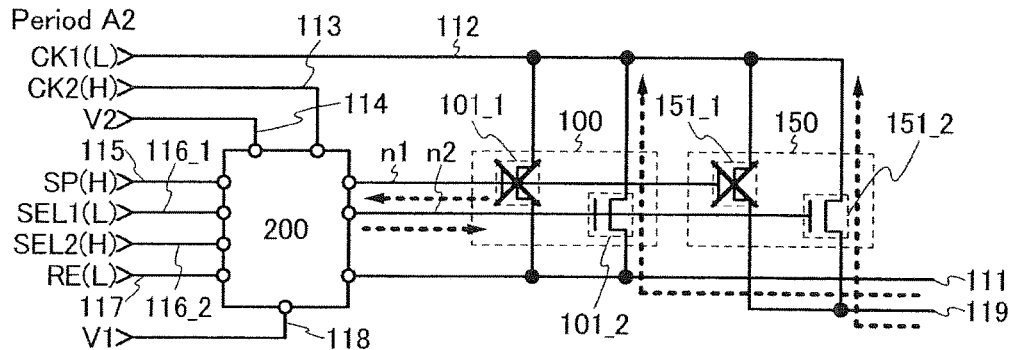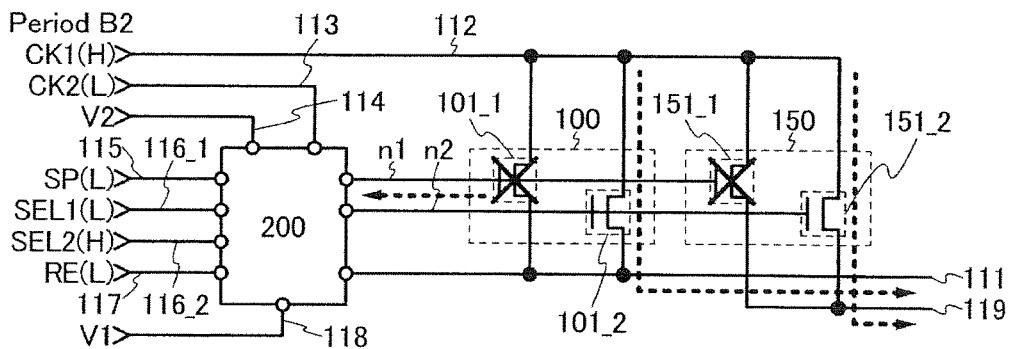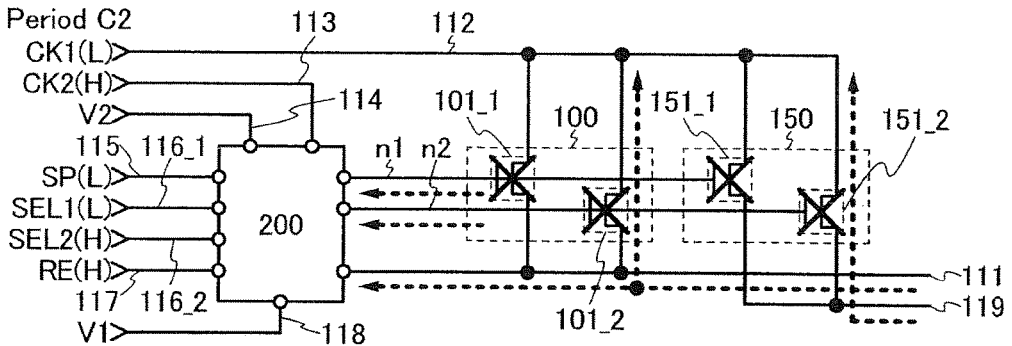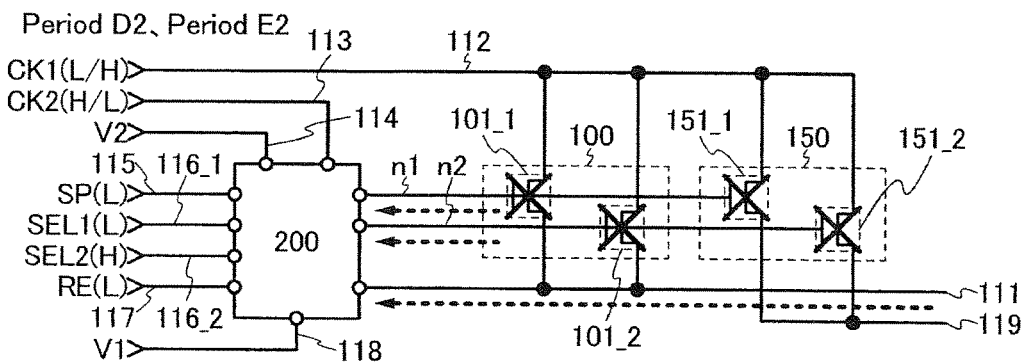

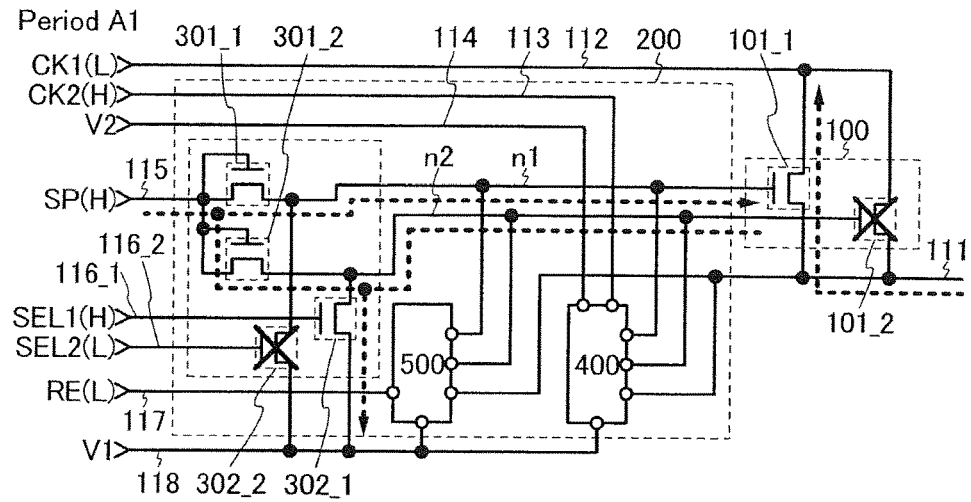
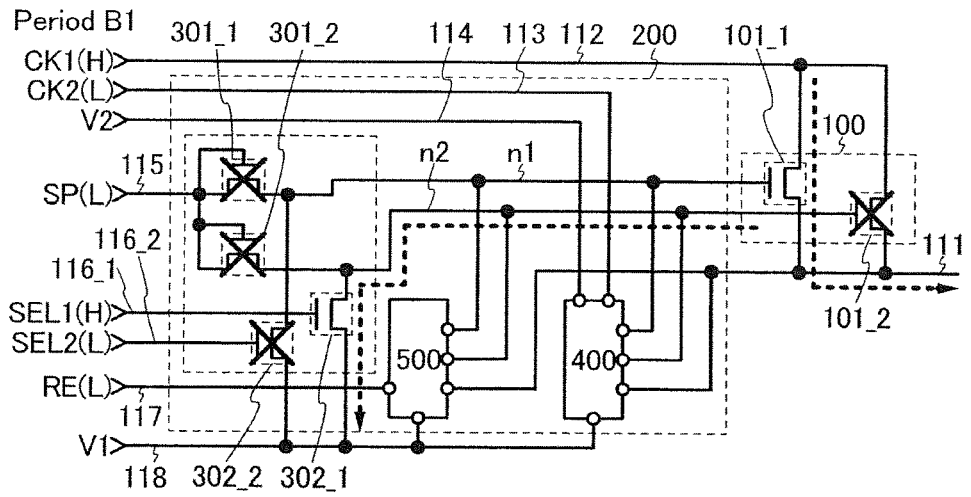
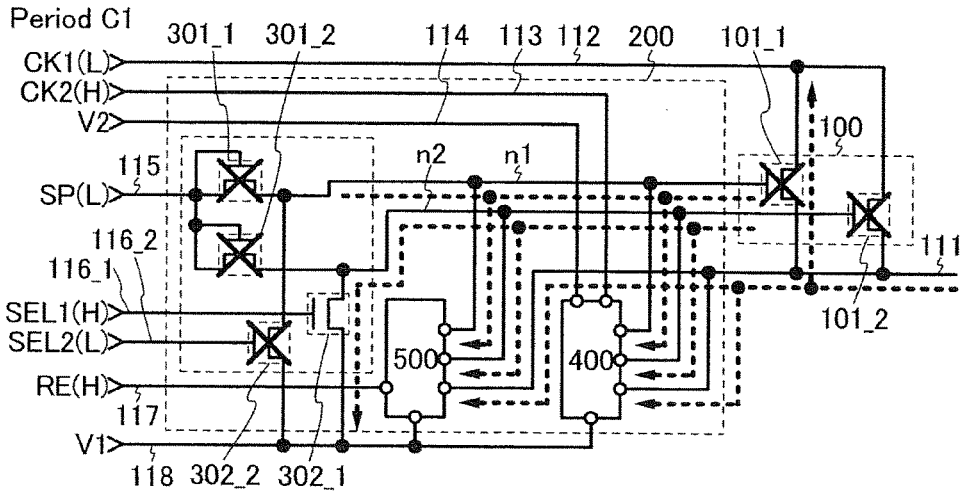

Period A1

Period B1

Period C1

Period D1、Period E1

Period A2

Period B2

Period C2

Period D2, Period E2

Period C2

Period D2、Period E2

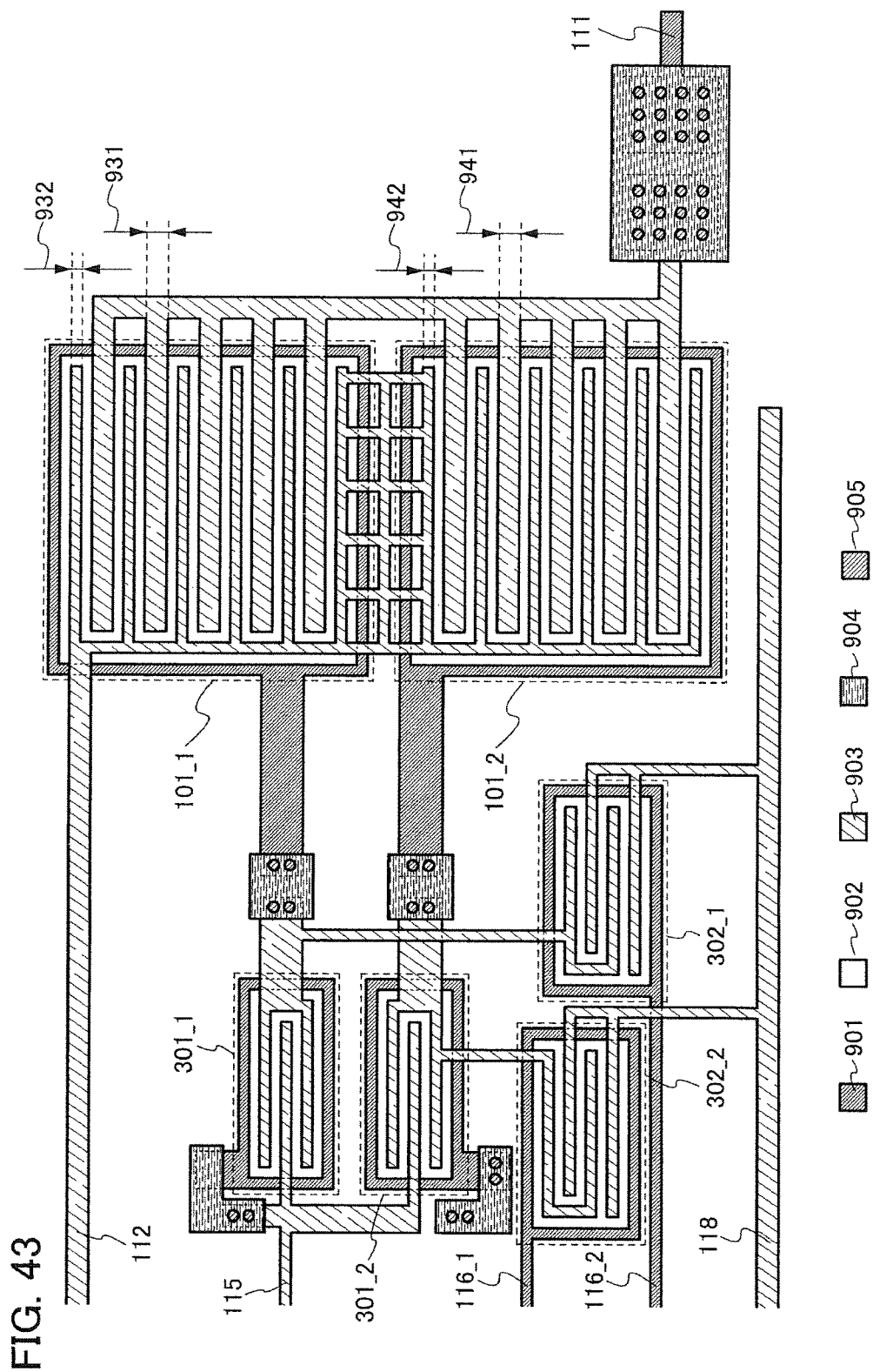

LIQUID CRYSTAL DISPLAY DEVICE AND ELECTRONIC DEVICE INCLUDING THE SAME

CROSS-REFERENCE TO RELATED APPLICATIONS

This application is a continuation of U.S. application Ser. No. 15/040,134, filed Feb. 10, 2016, now allowed, which is a continuation of U.S. application Ser. No. 14/522,792, filed Oct. 24, 2014, now U.S. Pat. No. 9,268,185, which is a continuation of U.S. application Ser. No. 12/730,952, filed Mar. 24, 2010, now U.S. Pat. No. 8,872,751, which claims the benefit of a foreign priority application filed in Japan as Serial No. 2009-077201 on Mar. 26, 2009, all of which are incorporated by reference.

BACKGROUND OF THE INVENTION

1. Field of the Invention

The present invention relates to a semiconductor device, a display device, a liquid crystal display device, a light-emitting device, a method for driving these devices, and a method for manufacturing these devices. The present invention particularly relates to a semiconductor device, a display device, a liquid crystal display device, a light-emitting device which include driver circuits formed over the same substrates as pixel portions, and a method for driving these devices. Alternatively, the present invention relates to an electronic device including the semiconductor device, the display device, the liquid crystal display device, or the light-emitting device.

2. Description of the Related Art

In recent years, with the increase of large display devices such as liquid crystal televisions, display devices have been actively developed. In particular, a technique for forming a driver circuit such as a gate driver over the substrate, over which a pixel portion is provided, by using transistors including a non-single-crystal semiconductor has been actively developed because the technique greatly contributes to reduction in cost and improvement in reliability.

In a transistor including a non-single-crystal semiconductor, degradation such as variation in threshold voltage or reduction in mobility occurs. As such degradation of a transistor progresses, it becomes difficult to operate a driver circuit and incapable of displaying images. Patent Documents 1 and 2, and Non-patent Document 1 each disclose a shift register in which degradation of transistors that have a function of maintaining an output signal from a flip-flop at a low level or making an output signal from a flip-flop the low-level (hereinafter such a transistor is also referred to as a pull-down transistor) can be suppressed. In these documents, two pull-down transistors are connected between an output terminal of a flip-flop and a wiring to which VSS (also referred to as negative power supply) is supplied. Moreover, one pull-down transistor and the other pull-down transistor are alternately turned on (i.e., it can also be said that one pull-down transistor and the other pull-down transistor alternately go into an on state). Accordingly, the time during which each of the pull-down transistors is on is reduced, so that degradation of characteristics of the pull-down transistors can be suppressed.

REFERENCE

Patent Document

[Patent Document 1] Japanese Published Patent Application No. 2005-050502

[Patent Document 2] Japanese Published Patent Application No. 2006-024350

Non-Patent Document

[Non Patent Document 1] Yong Ho Jang et al., "Integrated Gate Driver Circuit Using a-Si TFT with Dual Pull-down Structure", Proceedings of The 11th International Display Workshops 2004, pp. 333-336

SUMMARY OF THE INVENTION

In a structure of conventional techniques, the voltage of a gate of a transistor for controlling an output signal to set its level to high (hereinafter also referred to as a pull-up transistor) is higher than a positive power supply voltage or the voltage of a clock signal at a high level in some cases. Therefore, high voltage is applied to the pull-up transistor in some cases. Alternatively, high voltage is applied to a transistor that is connected to the gate of the pull-up transistor in some cases. Alternatively, the channel width of a transistor is large in some cases so that the shift register operates even when the transistor deteriorates. Alternatively, when the channel width of a transistor is large, a gate and a source or a drain of the transistor are likely to be short-circuited in some cases. Alternatively, when the channel width of a transistor is large, parasitic capacitance of transistors included in the shift register is increased in some cases.

According to one embodiment of the present invention, it is an object to suppress degradation of the transistor characteristics. Alternatively, according to one embodiment of the present invention, it is an object to reduce the channel width of a transistor. Particularly, it is an object to suppress degradation of characteristics of a pull-up transistor or to reduce the channel width of the pull-up transistor. Alternatively, according to one embodiment of the present invention, it is an object to increase the amplitude of an output signal. Alternatively, according to one embodiment of the present invention, it is an object to increase the time during which a transistor included in a pixel is on. Alternatively, according to one embodiment of the present invention, it is an object to improve insufficient write of a signal to a pixel. Alternatively, according to one embodiment of the present invention, it is an object to shorten the fall time of an output signal. Alternatively, according to one embodiment of the present invention, it is an object to shorten the rise time of an output signal. Alternatively, according to one embodiment of the present invention, it is an object to prevent a video signal from being written to a pixel in a raw, when the video signal is intended to be written to a pixel in another raw. Alternatively, according to one embodiment of the present invention, it is an object to reduce variations in the fall time of an output signal from a driver circuit. Alternatively, according to one embodiment of the present invention, it is an object to make influence of feedthrough for pixels uniform. Alternatively, according to one embodiment of the present invention, it is an object to reduce crosstalk. Alternatively, according to one embodiment of the present invention, it is an object to reduce the layout area. Alternatively, it is an object to reduce the size of a frame of a display device. Alternatively, according to one embodiment of the present invention, it is an object to realize higher definition of a display device. Alternatively, according to one embodiment of the present invention, it is an object to increase an yield. Alternatively, according to one embodiment of the present invention, it is an object to reduce manufacturing costs. Alternatively, according to one embodiment of the present invention, it is an object to reduce distortion of an output signal. Alternatively, according to one embodiment of the present invention, it is an object to reduce delay of an output signal. Alternatively, according to one embodiment of the present invention, it is an object to reduce power consumption. Alternatively, according to one embodiment of the present invention, it is an object to decrease the current supply capability of an external circuit. Alternatively, according to one embodiment of the present invention, it is an object to reduce the size of an external circuit or the size of a display device including the external circuit. Note that the description of these objects does not preclude the existence of other objects. Further, one embodiment of the present invention does not necessarily achieve all the above objects.

One embodiment of the present invention is a liquid crystal device including a driver circuit to which a first signal is input and from which a second signal is output; and a pixel including a liquid crystal element, for which a voltage applied to the liquid crystal element is set in accordance with the second signal. The driver circuit includes first to sixth transistors each having a gate, a source, and a drain. The first signal is input to the gate and one of the source and the drain of the first transistor. The first signal is input to the gate and one of the source and the drain of the second transistor. The gate of the third transistor is electrically connected to the other one of the source and the drain of the first transistor and the third transistor controls whether or not a voltage state of the second signal is set by being on or off. The gate of the fourth transistor is electrically connected to the other one of the source and the drain of the second transistor and the fourth transistor controls whether or not the voltage state of the second signal is set by being on or off. One of the source and the drain of the fifth transistor is electrically connected to the gate of the fourth transistor and the fifth transistor controls whether or not the fourth transistor is turned off by being on or off. One of the source and the drain of the sixth transistor is electrically connected to the gate of the third transistor and the sixth transistor controls whether or not the third transistor is turned off by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to sixth transistors each having a gate, a source, and a drain. The first input signal is input to the gate and one of the source and the drain of the first transistor. The first input signal is input to the gate and one of the source and the drain of the second transistor. The gate of the third transistor is electrically connected to the other one of the source and the drain of the first transistor. The third transistor controls whether or not a voltage state of the output signal is set by being on or off. The gate of the fourth transistor is electrically connected to the other one of the source and the drain of the second transistor. The fourth transistor controls whether or not the voltage state of the output signal is set by being on or off. The second input signal is input to the gate of the fifth transistor. One of the source and the drain of the fifth transistor is electrically connected to the gate of the fourth transistor. A first voltage is supplied to the other one of the source and the drain of the fifth transistor. The fifth transistor controls whether or not the fourth transistor is turned off by being on or off. The third input signal is input to the gate of the sixth transistor. One of the source and the drain of the sixth transistor is electrically connected to the gate of the third transistor. A second voltage is supplied to the other one of the source and the drain of the sixth transistor. The sixth transistor controls whether or not the third transistor is turned off by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to sixth transistors each having a gate, a source, and a drain. The first input signal is input to the gate and one of the source and the drain of the first transistor. The first input signal is input to the gate and one of the source and the drain of the second transistor. The gate of the third transistor is electrically connected to the other one of the source and the drain of the first transistor. The third transistor controls whether or not a voltage state of the output signal is set by being on or off. The gate of the fourth transistor is electrically connected to the other one of the source and the drain of the second transistor. The fourth transistor controls whether or not the voltage state of the output signal is set by being on or off. The second input signal is input to the gate of the fifth transistor. One of the source and the drain of the fifth transistor is electrically connected to the gate of the fourth transistor. The third input signal is input to the other one of the source and the drain of the fifth transistor. The fifth transistor controls whether or not the fourth transistor is turned off by being on or off. The third input signal is input to the gate of the sixth transistor. One of the source and the drain of the sixth transistor is electrically connected to the gate of the third transistor. The second input signal is input to the other one of the source and the drain of the sixth transistor. The sixth transistor controls whether or not the third transistor is turned off by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to sixth transistors each having a gate, a source, and a drain. The first input signal is input to the gate and one of the source and the drain of the first transistor. The first input signal is input to the gate and one of the source and the drain of the second transistor. The gate of the third transistor is electrically connected to the other one of the source and the drain of the first transistor. The third transistor controls whether or not a voltage state of the output signal is set by being on or off. The gate of the fourth transistor is electrically connected to the other one of the source and the drain of the second transistor. The fourth transistor controls whether or not the voltage state of the output signal is set by being on or off. The gate of the fifth transistor is electrically connected to the other one of the source and the drain of the second transistor. One of the source and the drain of the fifth transistor is electrically connected to the gate of the fourth transistor. The third input signal is input to the other one of the source and the drain of the fifth transistor. The fifth transistor controls whether or not the fourth transistor is turned off by being on or off. The gate of the sixth transistor is electrically connected to the other one of the source and the drain of the first transistor. One of the source and the drain of the sixth transistor is electrically connected to the gate of the third transistor. The second input signal is input to the other one of the source and the drain of the sixth transistor. The sixth transistor controls whether or not the third transistor is turned off by being on or off.

According to one embodiment of the present invention, the channel width of the third transistor can be equal to the channel width of the fourth transistor.

According to one embodiment of the present invention, the channel width of the first transistor can be smaller than the channel width of the third transistor, and the channel width of the second transistor can be smaller than the channel width of the fourth transistor.

One embodiment of the present invention is a liquid crystal device including a driver circuit to which a first signal is input and from which a second signal is output; and a pixel including a liquid crystal element, for which a voltage applied to the liquid crystal element is set in accordance with the second signal. The driver circuit includes first to fourth transistors each having a gate, a source, and a drain, and first and second diodes each having an anode and a cathode. The first signal is input to the gate and one of the source and the drain of the first transistor. The first signal is input to the gate and one of the source and the drain of the second transistor. The gate of the third transistor is electrically connected to the other one of the source and the drain of the first transistor. The third transistor controls whether or not a voltage state of the second signal is set by being on or off. The gate of the fourth transistor is electrically connected to the other one of the source and the drain of the second transistor. The fourth transistor controls whether or not the voltage state of the second signal is set by being on or off. One of the anode and the cathode of the first diode is electrically connected to the gate of the fourth transistor. The first diode controls whether or not the fourth transistor is turned off by being conducting or non-conducting. One of the anode and the cathode of the second diode is electrically connected to the gate of the third transistor. The second diode controls whether or not the third transistor is turned off by being conducting or non-conducting.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to fourth transistors each having a gate, a source, and a drain, and first and second diodes each having an anode and a cathode. The first input signal is input to the gate and one of the source and the drain of the first transistor. The first input signal is input to the gate and one of the source and the drain of the second transistor. The gate of the third transistor is electrically connected to the other one of the source and the drain of the first transistor. The third transistor controls whether or not a voltage state of the output signal is set by being on or off. The gate of the fourth transistor is electrically connected to the other one of the source and the drain of the second transistor. The fourth transistor controls whether or not the voltage state of the output signal is set by being on or off. One of the anode and the cathode of the first diode is electrically connected to the gate of the fourth transistor. The second input signal is input to the other one of the anode and the cathode of the first diode. The first diode controls whether or not the fourth transistor is turned off by being conducting or non-conducting. One of the anode and the cathode of the second diode is electrically connected to the gate of the third transistor. The third input signal is input to the other one of the anode and the cathode of the second diode. The second diode controls whether or not the third transistor is turned off by being conducting or non-conducting.

One embodiment of the present invention is a liquid crystal device including a driver circuit to which a first signal is input and from which a second signal is output; and a pixel including a liquid crystal element, for which a voltage applied to the liquid crystal element is set in accordance with the second signal. The driver circuit includes first to fourth transistors each having a gate, a source, and a drain, and first and second diodes each having an anode and a cathode. The first signal is input to the gate and one of the source and the drain of the first transistor. The first signal is input to the gate and one of the source and the drain of the second transistor. One of the anode and the cathode of the first diode is electrically connected to the other one of the source and the drain of the first transistor. The first diode controls whether or not the voltage state of the second signal is set by being conducting or non-conducting. One of the anode and the cathode of the second diode is electrically connected to the other one of the source and the drain of the second transistor. The second diode controls whether or not the voltage state of the second signal is set by being conducting or non-conducting. One of the source and the drain of the third transistor is electrically connected to one of the anode and the cathode of the second diode. The third transistor controls whether or not the second diode is made non-conducting by being on or off. One of the source and the drain of the fourth transistor is electrically connected to one of the anode and the cathode of the first diode. The fourth transistor controls whether or not the first diode is made non-conducting by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to fourth transistors each having a gate, a source, and a drain, and first and second diodes each having an anode and a cathode. The first input signal is input to the gate and one of the source and the drain of the first transistor. The first input signal is input to the gate and one of the source and the drain of the second transistor. One of the anode and the cathode of the first diode is electrically connected to the other one of the source and the drain of the first transistor. The first diode controls whether or not the voltage state of the output signal is set by being conducting or non-conducting. One of the anode and the cathode of the second diode is electrically connected to the other one of the source and the drain of the second transistor. The second diode controls whether or not the voltage state of the output signal is set by being conducting or non-conducting. The second input signal is input to the gate of the third transistor. One of the source and the drain of the third transistor is electrically connected to one of the anode and the cathode of the second diode. The first voltage is supplied to the other one of the source and the drain of the third transistor. The third transistor controls whether or not the second diode is made non-conducting by being on or off. The third input signal is input to the gate of the fourth transistor and one of the source and the drain of the fourth transistor is electrically connected to one of the anode and the cathode of the first diode. The second voltage is supplied to the other one of the source and the drain of the fourth transistor. The fourth transistor controls whether or not the first diode is made non-conducting by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to fourth transistors each having a gate, a source, and a drain, and first and second diodes each having an anode and a cathode. The first input signal is input to the gate and one of the source and the drain of the first transistor. The first input signal is input to the gate and one of the source and the drain of the second transistor. One of the anode and the cathode of the first diode is electrically connected to the other one of the source and the drain of the first transistor. The first diode controls whether or not the voltage state of the output signal is set by being conducting or non-conducting. One of the anode and the cathode of the second diode is electrically connected to the other one of the source and the drain of the second transistor. The second diode controls whether or not the voltage state of the output signal is set by being conducting or non-conducting. The second input signal is input to the gate of the third transistor. One of the source and the drain of the third transistor is electrically connected to one of the anode and the cathode of the second diode. The third input signal is input to the other one of the source and the drain of the third transistor. The third transistor controls whether or not the second diode is made non-conducting by being on or off. The third input signal is input to the gate of the fourth transistor. One of the source and the drain of the fourth transistor is electrically connected to one of the anode and the cathode of the first diode. The second input signal is input to the other one of the source and the drain of the fourth transistor. The fourth transistor controls whether or not the first diode is made non-conducting by being on or off.

One embodiment of the present invention is a liquid crystal device including a driver circuit to which a first input signal, a second input signal, and a third input signal are input and from which an output signal is output; and a pixel including a liquid crystal element, for which a voltage applied to the liquid crystal element is set in accordance with the output signal. The driver circuit includes first to fourth transistors each having a gate, a source, and a drain, and first and second diodes each having an anode and a cathode. The first input signal is input to the gate and one of the source and the drain of the first transistor. The first input signal is input to the gate and one of the source and the drain of the second transistor. One of the anode and the cathode of the first diode is electrically connected to the other one of the source and the drain of the first transistor. The first diode controls whether or not the voltage state of the output signal is set by being conducting or non-conducting. One of the anode and the cathode of the second diode is electrically connected to the other one of the source and the drain of the second transistor. The second diode controls whether or not the voltage state of the output signal is set by being conducting or non-conducting. The gate of the third transistor is electrically connected to the other one of the source and the drain of the second transistor. One of the source and the drain of the third transistor is electrically connected to one of the anode and the cathode of the second diode. The third input signal is input to the other one of the source and the drain of the third transistor. The third transistor controls whether or not the second diode is made non-conducting by being on or off. The gate of the fourth transistor is electrically connected to the other one of the source and the drain of the first transistor. One of the source and the drain of the fourth transistor is electrically connected to one of the anode and the cathode of the first diode. The second input signal is input to the other one of the source and the drain of the fourth transistor. The fourth transistor controls whether or not the first diode is made non-conducting by being on or off.

One embodiment of the present invention is a liquid crystal device including a driver circuit to which a first signal is input and from which a second signal is output; and a pixel including a liquid crystal element, for which a voltage applied to the liquid crystal element is set in accordance with the second signal. The driver circuit includes first and second transistors each having a gate, a source, and a drain, and first to fourth diodes each having an anode and a cathode. The first signal is input to the gate and one of the source and the drain of the first transistor. The first signal is input to the gate and one of the source and the drain of the second transistor. One of the anode and the cathode of the first diode is electrically connected to the other one of the source and the drain of the first transistor. The first diode controls whether or not the voltage state of the second signal is set by being conducting or non-conducting. One of the anode and the cathode of the second diode is electrically connected to the other one of the source and the drain of the second transistor. The second diode controls whether or not the voltage state of the second signal is set by being conducting or non-conducting. One of the anode and the cathode of the third diode is electrically connected to one of the anode and the cathode of the second diode. The third diode controls whether or not the second diode is made non-conducting by being conducting or non-conducting. One of the anode and the cathode of the fourth diode is electrically connected to one of the anode and the cathode of the first diode. The fourth diode controls whether or not the first diode is made non-conducting by being conducting or non-conducting.

One embodiment of the present invention is a liquid crystal device including a driver circuit to which a first input signal, a second input signal, a third input signal are input and from which an output signal is output; and a pixel including a liquid crystal element, for which a voltage applied to the liquid crystal element is set in accordance with the output signal. The driver circuit includes first and second transistors each having a gate, a source, and a drain, and first to fourth diodes each having an anode and a cathode. The first input signal is input to the gate and one of the source and the drain of the first transistor. The first input signal is input to the gate and one of the source and the drain of the second transistor. One of the anode and the cathode of the first diode is electrically connected to the other one of the source and the drain of the first transistor. The first diode controls whether or not the voltage state of the output signal is set by being conducting or non-conducting. One of the anode and the cathode of the second diode is electrically connected to the other one of the source and the drain of the second transistor. The second diode controls whether or not the voltage state of the output signal is set by being conducting or non-conducting. One of the anode and the cathode of the third diode is electrically connected to one of the anode and the cathode of the second diode. The second input signal is input to the other one of the anode and the cathode of the third diode. The third diode controls whether or not the second diode is made non-conducting by being conducting or non-conducting. One of the anode and the cathode of the fourth diode is electrically connected to one of the anode and the cathode of the first diode. The third input signal is input to the other one of the anode and the cathode of the fourth diode. The fourth diode controls whether or not the first diode is made non-conducting by being conducting or non-conducting.

One embodiment of the present invention is an electronic device including at least the liquid crystal display device according to any of the above and an operation switch for controlling operation of the liquid crystal display device.

Note that a variety of switches can be used as a switch. Examples of a switch are an electrical switch, a mechanical switch, and the like. That is, there is no particular limitation on the kind of switch as long as it can control the flow of current.

Examples of switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit combining such elements. As examples of mechanical switches, there is a switch formed by a micro electro mechanical system (MEMS) technology, such as a digital micromirror device (DMD). Such a switch includes an electrode which can be moved mechanically, and operates to control electrical connection or non-electrical-connection with the movement of the electrode.

Note that a CMOS switch may be employed as a switch by using both n-channel and p-channel transistors.

Note that a display element, a display device which is a device having a display element, a light-emitting element, and a light-emitting device which is a device having a light-emitting element can use various types and can include various elements. For example, a display element, a display device, a light-emitting element, and a light-emitting device can include a display medium in which contrast, luminance, reflectivity, transmittance, or the like is changed by an electromagnetic action, such as an EL (electroluminescent) element (e.g., an EL element including organic and inorganic materials, an organic EL element, or an inorganic EL element), an LED (e.g., a white LED, a red LED, a green LED, or a blue LED), a transistor (e.g., a transistor that emits light corresponding to a current), an electron emitter, a liquid crystal element, electronic ink, an electrophoresis element, a grating light valve (GLV), a digital micromirror device (DMD), or a carbon nanotube can be used. Alternatively, examples of display devices include a plasma display or a piezoelectric ceramic display. Note that example of display devices having EL elements include an EL display and the like. Examples of display devices having electron emitters include a field emission display (FED), an SED-type flat panel display (SED: surface-conduction electron-emitter display), and the like. Examples of display devices having liquid crystal elements include a liquid crystal display (e.g., a light-transmissive liquid crystal display, a transflective liquid crystal display, a reflective liquid crystal display, a direct-view liquid crystal display, or a projection liquid crystal display) and the like. Examples of display devices having electronic ink or electrophoretic elements include electronic paper.

An example of liquid crystal elements is an element which controls transmission and non-transmission of light by optical modulation action of liquid crystals. Such an element can be formed using a pair of electrodes and a liquid crystal layer. Note that the optical modulation action of liquid crystals is controlled by an electric field applied to the liquid crystal (including a lateral electric field, a vertical electric field and a diagonal electric field). Specifically, examples of a liquid crystal element include a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a PDLC (polymer dispersed liquid crystal), a ferroelectric liquid crystal, an anti-ferroelectric liquid crystal, a main chain type liquid crystal, a side chain type polymer liquid crystal, a plasma addressed liquid crystal (PALC), a banana-shaped liquid crystal. In addition, examples of a method for driving liquid crystal include a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue-phase mode. Note that the present invention is not limited to this, that is, various kinds of liquid crystal elements and methods for driving liquid crystal can be used.

Note that transistors with various structures can be used. Therefore, there is no limitation to the kinds of transistors to be used. For example, a thin film transistor (TFT) including a non-single crystal semiconductor film typified by amorphous silicon, polycrystalline silicon, microcrystalline (also referred to as microcrystal, nanocrystal, or semi-amorphous) silicon, or the like can be used.

Note that as an example of a transistor, a transistor including a compound semiconductor or an oxide semiconductor, such as ZnO, a-InGaZnO, SiGe, GaAs, IZO (indium zinc oxide), ITO (indium tin oxide), SnO, TiO, or AlZnSnO (AZTO), a thin film transistor obtained by thinning such a compound semiconductor or an oxide semiconductor, or the like can be given.

Note that as an example of a transistor, a transistor formed by using an inkjet method, a printing method, or the like can be given.

Note that as an example of a transistor, a transistor or the like including an organic semiconductor or a carbon nanotube can be given.

Note that transistors with various structures can be used. For example, a MOS transistor, a junction transistor, a bipolar transistor, or the like can be used as a transistor.

Note that as an example of a transistor, a multi-gate structure having two or more gate electrodes can be used.

Note that as another example of a transistor, a transistor with a structure where gate electrodes are formed above and below a channel can be used.

Note that as an example of a transistor, a transistor with a structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be given.

Note that as an example of a transistor, a transistor with a structure where a source electrode or a drain electrode may overlap with a channel region (or part of it) can be given.

Note that as an example of a transistor, a transistor with a structure where an LDD region is provided may be applied.

Note that a transistor can be formed using a variety of kinds of substrate. There is no particular limitation on the kind of substrate for forming a transistor. As an example of the substrate, a semiconductor substrate, a single crystal substrate (e.g., a silicon substrate), an SOI substrate, a glass substrate, a quartz substrate, a plastic substrate, a metal substrate, a stainless steel substrate, a substrate including a stainless steel foil, a tungsten substrate, a substrate including a tungsten foil, a flexible substrate, an attachment film, paper including a fibrous material, a base material film, or the like can be given. As an example of a glass substrate, a barium borosilicate glass substrate, an aluminoborosilicate glass substrate, soda lime glass substrate, or the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film include an attachment film formed using polypropylene, polyester, vinyl, polyvinyl fluoride, polyvinyl chloride, and the like. Examples of a base film include a base film formed using polyester, polyamide, polyimide, inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Note that the transistor may be formed using one substrate, and then, the transistor may be transferred to another substrate. Example of a substrate to which a transistor is transferred include, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. The use of such a substrate allows a transistor with good characteristics, a transistor with low power consumption, a device that cannot break easily, a device with heat resistance, a device with reduced weight, or a device with reduced thickness.

Note that all the circuits that are necessary to realize a desired function can be formed using one substrate (e.g., a glass substrate, a plastic substrate, a single crystal substrate, or an SOI substrate). In this manner, cost can be reduced by reduction in the number of component parts or reliability can be improved by reduction in the number of connection to circuit components.

Note that not all the circuits that are necessary to realize the predetermined function are needed to be formed using one substrate. That is, part of the circuits that are necessary to realize the predetermined function may be formed using one substrate and another part of the circuits that are necessary to realize the predetermined function may be formed using another substrate. For example, part of the circuits that is necessary to realize the predetermined function may be formed over a glass substrate and another part of the circuits that is necessary to realize the predetermined function may be formed using a single crystal substrate. Then, the single crystal substrate provided with the another part of the circuits (such a substrate is also referred to as an IC chip) that is necessary to realize the predetermined function may be connected to a glass substrate by COG (chip on glass), so that the glass can be provided with the IC chip. Alternatively, the IC chip can be connected to the glass substrate by using TAB (tape automated bonding), COF (chip on film), SMT (surface mount technology), a printed substrate, or the like. When part of the circuits are formed over a substrate where a pixel portion is formed in this manner, cost can be reduced by reduction in the number of component parts or reliability can be improved by reduction in the number of connections between circuit components. Specifically, a circuit in a portion where a driving voltage is high, a circuit in a portion where a driving frequency is high, or the like consumes much power in many cases. In order to deal with it, such a circuit is formed over a substrate (e.g., a single crystal substrate) which is different from a substrate over which the pixel portion is formed, so that an IC chip is formed. By the use of this IC chip, increase in power consumption can be prevented.

Note that as a transistor, for example, an element having at least three terminals of a gate, a drain, and a source can be used. The element has a channel region between a drain region and a source region. Current can flow through the drain region, the channel region, and the source region. Here, since a source and a drain may change depending on a structure, operating conditions, and the like of the transistor, it is difficult to define which is the source or the drain. Therefore, a region functioning as the source or the drain is not called the source or the drain in some cases. In that case, for example, one of the source and the drain is referred to as a first terminal, a first electrode, or a first region, and the other of the source and the drain is referred to as a second terminal, a second electrode, or a second region in some cases. In addition, a gate is referred to as a third terminal or a third electrode in some cases.

Note that a transistor may be an element including at least three terminals of a base, an emitter and a collector. In that case too, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

Note that when it is explicitly described that A and B are connected, the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be provided in the connections shown in the drawings and texts, without being limited to a predetermined connection, for example, the connection shown in the drawings and texts.

For example, when A and B are electrically connected, one or more elements that enable electrical connection between A and B (e.g., a switch, a transistor, a capacitor, an inductor, a resistor, or a diode) may be connected between A and B.

For example, when A and B are functionally connected, one or more circuits that enable functional connection between A and B (e.g., a logic circuit such as an inverter, a NAND circuit, or a NOR circuit; a signal converter circuit such as a DA converter circuit, an AD converter circuit, or a gamma correction circuit; a voltage level converter circuit such as a power supply circuit (e.g., a dc-dc converter, a step-up dc-dc converter, or a step-down dc-dc converter) or a level shifter circuit for changing a voltage level of a signal; a voltage source; a current source; a switching circuit; or an amplifier circuit such as a circuit that can increase signal amplitude, the amount of current, or the like (e.g., an operational amplifier, a differential amplifier circuit, a source follower circuit, or a buffer circuit), a signal generating circuit, a memory circuit, or a control circuit) may be connected between A and B. Note that for example, when a signal outputted from A is transmitted to B, it can be said that A and B are functionally connected even if another circuit is provided between A and B.

Note that when it is explicitly described that A and B are electrically connected, the case where A and B are electrically connected (i.e., the case where A and B are connected with another element or another circuit provided therebetween), the case where A and B are functionally connected (i.e., the case where A and B are functionally connected with another circuit provided therebetween), and the case where A and B are directly connected (i.e., the case where A and B are connected without another element or another circuit provided therebetween) are included therein. That is, when it is explicitly described that A and B are electrically connected, the description is the same as the case where it is explicitly only described that A and B are connected.

When it is explicitly described that B is formed on or over A, it does not necessarily mean that B is formed in direct contact with A. The description includes the case where A and B are not in direct contact with each other, that is, the case where another object is interposed between A and B. Here, each of A and B is an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or D. Note that another layer (e.g., the layer C or the layer D) may be single-layer or multilayer.

Similarly, when it is explicitly described that B is formed above A, it does not necessarily mean that B is formed in direct contact with A, and another object may be interposed between A and B. Accordingly, the case where a layer B is formed above a layer A includes the case where the layer B is formed in direct contact with the layer A and the case where another layer (such as a layer C and a layer D) is formed in direct contact with the layer A and the layer B is formed in direct contact with the layer C or the D. Note that another layer (e.g., a layer C or a layer D) may be single-layer or multilayer.

Note that when it is explicitly described that B is formed over, on, or above A, B may be formed diagonally above A.

Note that the same can be said when it is explicitly described that B is formed below or under A.

Note that explicit singular forms preferably mean singular forms. However, without being limited thereto, such singular forms can include plural forms. Similarly, explicit plural forms preferably mean plural forms. However, without being limited thereto, such plural forms can include singular forms.

Note that the size, the thickness of layers, or regions in diagrams are sometimes exaggerated for simplicity. Therefore, embodiments of the present invention are not limited to such scales.

Note that a diagram schematically shows an ideal example, and embodiments of the present invention are not limited to the shape or the value shown in the diagram. For example, the following can be included: variation in shape due to a manufacturing technique or dimensional deviation; or variation in signal, voltage, or current due to noise or difference in timing.

Note that technical terms are used in order to describe a specific embodiment, example, or the like in many cases. However, one embodiment of the present invention should not be construed as being limited by the technical terms.

Note that terms which are not defined (including terms used for science and technology, such as technical terms and academic parlance) can be used as the terms which have a meaning equivalent to a general meaning that an ordinary person skilled in the art understands. It is preferable that the term defined by dictionaries or the like be construed as a consistent meaning with the background of related art.

The terms such as first, second, and third are used for distinguishing various elements, members, regions, layers, and areas from others. Therefore, the terms such as first, second, and third do not limit the number of elements, members, regions, layers, areas, or the like. Further, for example, "first" can be replaced with "second", "third", or the like.

Terms for describing spatial arrangement, such as "over", "above", "under", "below", "laterally", "right", "left", "obliquely", "back", "front", "inside", "outside", and "in" are often used for briefly showing, with reference to a diagram, a relation between an element and another element or between some characteristics and other characteristics. Note that embodiments of the present invention are not limited thereto, and such terms for describing spatial arrangement can indicate not only the direction shown in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", "front", "inside", "outside", and "in" in addition to the directions described by "over" and "under" because a device in a diagram can be rotated in a variety of directions. That is, the terms for describing spatial arrangement can be construed adequately depending on the situation.

One embodiment of the present invention is that, to which a first input signal is input and from which a second signal is output, including first to sixth transistors each having a gate, a source, and a drain. The first signal is input to the gate and one of the source and the drain of the first transistor. The first signal is input to the gate and one of the source and the drain of the second transistor. The gate of the third transistor is electrically connected to the other one of the source and the drain of the first transistor. The third transistor controls whether or not a voltage state of the second signal is set by being on or off. The gate of the fourth transistor is electrically connected to the other one of the source and the drain of the second transistor. The fourth transistor controls whether or not the voltage state of the second signal is set by being on or off. One of the source and the drain of the fifth transistor is electrically connected to the gate of the fourth transistor. The fifth transistor controls whether or not the fourth transistor is turned off by being on or off. One of the source and the drain of the sixth transistor is electrically connected to the gate of the third transistor. The sixth transistor controls whether or not the third transistor is turned off by being on or off.

According to one embodiment of the present invention, it is possible to suppress degradation of the transistor characteristics. Alternatively, according to one embodiment of the present invention, it is possible to reduce the channel width of a transistor. Particularly, suppression of degradation of the characteristics of a pull-up transistor or reduction in channel width of the pull-up transistor can be achieved. Alternatively, according to one embodiment of the present invention, it is possible to increase the amplitude of a signal. Alternatively, according to one embodiment of the present invention, it is possible to increase the length of the time during which a transistor included in a pixel is on. Alternatively, according to one embodiment of the present invention, it is possible to improve insufficient write of a signal to a pixel. Alternatively, according to one embodiment of the present invention, it is possible to shorten the fall time of a signal. Alternatively, according to one embodiment of the present invention, it is possible to shorten the rise time of a signal. Alternatively, according to one embodiment of the present invention, it is possible to prevent a video signal from being written to a pixel in a raw, when the video signal is intended to be written to a pixel in another raw. Alternatively, according to one embodiment of the present invention, it is possible to reduce variations in the fall time of a signal. Alternatively, according to one embodiment of the present invention, it is possible to make influence of feedthrough for pixels uniform. Alternatively, according to one embodiment of the present invention, it is possible to reduce crosstalk. Alternatively, according to one embodiment of the present invention, it is possible to reduce the layout area. Alternatively, it is possible to reduce the frame of a display device. Alternatively, according to one embodiment of the present invention, it is possible to realize higher definition of a display device. Alternatively, according to one embodiment of the present invention, it is possible to increase an yield. Alternatively, according to one embodiment of the present invention, it is possible to reduce costs. Alternatively, according to one embodiment of the present invention, it is possible to reduce distortion of a signal. Alternatively, according to one embodiment of the present invention, it is possible to reduce delay of a signal. Alternatively, according to one embodiment of the present invention, it is possible to reduce power consumption. Alternatively, according to one embodiment of the present invention, it is possible to decrease the current supply capability of an external circuit. Alternatively, according to one embodiment of the present invention, it is possible to reduce the size of an external circuit or the size of a display device including the external circuit.

BRIEF DESCRIPTION OF THE DRAWINGS

FIGS. 8A to 8D are examples of a schematic view for showing operation of the semiconductor device in Embodiment 1.

FIGS. 9A to 9D are examples of a schematic view for showing operation of the semiconductor device in Embodiment 1.

FIGS. 15A to 15C are examples of a schematic view for showing operation of the semiconductor device in Embodiment 2.

FIG. 43 is an example of a top view of a semiconductor device in Embodiment 11.

DETAILED DESCRIPTION OF THE INVENTION

Figure 1A:
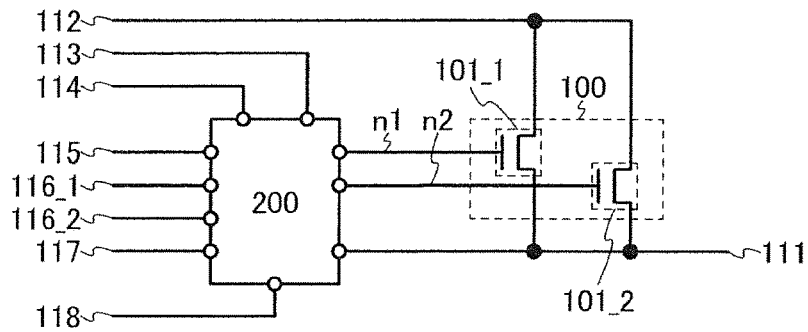
FIGS. 1A to 1F are examples of a circuit diagram of a semiconductor device in Embodiment 1.

Hereinafter, embodiments will be described with reference to drawings. However, the embodiments can be implemented with various modes. It will be readily appreciated by those skilled in the art that modes and details can be changed in various ways without departing from the spirit and scope of the present invention. Therefore, this invention is not interpreted as being limited to the description of the embodiments below. Note that in structures of the invention described below, the same portions or portions having similar functions are denoted by the same reference numerals, and description thereof is not repeated.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a paragraph disclosed in this specification.

Note that by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, part of the diagram or the text is taken out, and one embodiment of the invention can be constituted. For example, M pieces of circuit elements (e.g., transistors, capacitors, or the like) (M is an integer, and M<P) are taken out from a circuit diagram in which P pieces of circuit elements (e.g., transistors, capacitors, or the like) (P is an integer) are provided, and one embodiment of the invention can be constituted. As another example, M pieces of layers are taken out from a cross-sectional view in which P pieces of layers are provided, and one embodiment of the invention can be constituted. As another example, it is possible to take out M pieces of elements from a flow chart in which P pieces of elements are provided and constitute one embodiment of the invention.

(Embodiment 1)

An example of this embodiment includes a first transistor, a second transistor, and a first circuit. A first terminal of the first transistor is electrically connected to a first wiring and a second terminal of the first transistor is electrically connected to a second wiring. A first terminal of the second transistor is electrically connected to the first wiring and a second terminal of the second transistor is electrically connected to the second wiring. The first circuit is electrically connected to a gate of the first transistor and a gate of the second transistor. The first circuit has the function of raising the gate voltage of the first transistor when a first signal is in a second voltage state and a second signal is in a first voltage state and the function of raising the gate voltage of the second transistor when the first signal is in the second voltage state and a third signal is in the first voltage state.

An example of a semiconductor device in this embodiment will be described. The semiconductor device in this embodiment can be used for, for example, various driver circuits such as a shift register, a gate driver, or a source driver. Note that the semiconductor device in this embodiment can be referred to as a driver circuit or a circuit.

First, a circuit structure of the semiconductor device in this embodiment will be described with reference to FIG. 1A. A semiconductor device shown in FIG. 1A includes a circuit 100 and a circuit 200. The circuit 100 includes a plurality of transistors, that is, transistors 101_1 and 101_2.

Note that the transistors 101_1 and 101_2 are n-channel transistors. N-channel transistors are turned on when a potential difference (Vgs) between a gate and a source exceeds a threshold voltage (Vth). Note that this embodiment is not limited to this, that is, the transistor 101_1 and/or the transistor 101_2 can be p-channel transistors. P-channel transistors are turned on when a potential difference (Vgs) between a gate and a source falls below a threshold voltage (Vth).

Next, a connection relation of the semiconductor device in FIG. 1A will be described. A first terminal of the transistor 101_1 is connected to a wiring 112, and a second terminal of the transistor 101_1 is connected to a wiring 111. A first terminal of the transistor 101_2 is connected to the wiring 112, and a second terminal of the transistor 101_2 is connected to the wiring ill. A circuit 200 is connected to a wiring 113, a wiring 114, a wiring 115, wirings 116_1 and 116_2, a wiring 117, a wiring 118, a gate of the transistor 101_1, a gate of the transistor 101_2, and the wiring 111. However, this embodiment is not limited to this. For example, the circuit 200 can be connected to various other wirings or nodes depending on its structure. Alternatively, the circuit 200 is not necessarily connected to all of the wirings described above, that is, it is possible that the circuit 200 is connected to some of the wirings described above.

Note that a junction of the gate of the transistor 101_1 and the circuit 200 is shown as a node n1 and a junction of the gate of the transistor 101_2 and the circuit 200 is shown as a node n2.

Note that the wiring 111 is drawn and provided in a pixel portion in many cases. Alternatively, the wiring 111 is connected to a gate of a transistor (e.g., a selection transistor or a switching transistor) included in a pixel, in many cases. However, this embodiment is not limited to this. For example, suppose that a plurality of semiconductor devices is cascaded. In this case, the wiring 111 can be connected to the wiring 115 of the semiconductor device in another stage (e.g., the next stage). Alternatively, the wiring 111 can be connected to the wiring 117 of the semiconductor device in another stage (e.g., the previous stage).

Next, a signal, a voltage, or the like that is input to or output from each wiring is described.

A signal OUT is output from the wiring 111, for example. The signal OUT can be a signal in the first voltage stage or in the second voltage state. For example, the signal OUT can be, in many cases, a digital signal which is at a high level or at a low level and can function as an output signal of the semiconductor device. Therefore, the wiring 111 can function as a signal line or an output signal line. Particularly, when the wiring 111 is drawn and provided in the pixel portion, the signal OUT can function as a gate signal, a scan signal, or a selection signal. Therefore, the wiring 111 can function as a gate signal line (hereinafter also referred to as a gate line) or a scan line. For example, in the case of a liquid crystal display device, it is possible to connect the wiring 111 to a pixel including a liquid crystal element and set a voltage which is applied to the liquid crystal element in accordance with the voltage of the wiring 111. However, this embodiment is not limited to this. For example, suppose that a plurality of semiconductor devices is cascaded. In this case, if the wiring 111 is connected to the wiring 115 of the semiconductor device in another stage (e.g., the next stage), the signal OUT can function as a transfer signal, or a start signal. Alternatively, if the wiring 111 is connected to the wiring 117 of the semiconductor device in another stage (e.g., the previous stage), the signal OUT can function as a reset signal.

Suppose that a signal CK1, for example, is input to the wiring 112. The signal CK1 can be a signal in the first voltage state or in the second voltage state. For example, the signal CK1 can be a digital signal which repeatedly switches between two states of high level and low level in many cases and can function as a clock signal. Therefore, the wiring 112 can function as a signal line, a clock line, a clock signal line, or a clock supply line. However, this embodiment is not limited to this. For example, a voltage such as a voltage V1 or a voltage V2 can be supplied to the wiring 112. Thus, the wiring 112 can function as a power supply line.

Suppose that a signal CK2, for example, is input to the wiring 113. The signal CK2 can be a signal in the first voltage state or in the second voltage state. For example, the signal CK2 is a digital signal which repeatedly switches between two states of high level and low level in many cases and can function as an inverted clock signal. Note that the signal CK2 can be an inverted signal of the signal CK1 or a signal approximately 180° out of phase with the signal CK1. Therefore, the wiring 113 can function as a signal line, an inverted clock line, an inverted clock signal line, or an inverted clock supply line. However, this embodiment is not limited to this. For example, a voltage such as the voltage V1 or the voltage V2 can be supplied to the wiring 113. Thus, the wiring 113 can function as a power supply line.

Suppose the voltage V2, for example, is supplied to the wiring 114. The voltage V2 has a value which is substantially equal to that of a high-level signal, in many cases, and can function as a power supply voltage, a reference voltage, or a positive power supply voltage. Thus, the wiring 114 can function as a power supply line. However, this embodiment is not limited to this. For example, a signal such as the signal CK1 or the signal CK2 can be input to the wiring 114. Thus, the wiring 114 can function as a signal line.

Suppose that a signal SP, for example, is input to the wiring 115. The signal SP can be a signal in the first voltage state or in the second voltage state, for example. For example, the signal SP is a digital signal in many cases and can function as a start signal. Therefore, the wiring 115 can function as a signal line. However, this embodiment is not limited to this. For example, suppose that a plurality of semiconductor devices is cascaded. In this case, if the wiring 115 is connected to the wiring 111 of the semiconductor device in another stage (e.g., the previous stage), the signal SP can function as a transfer signal, a gate signal, or a scan signal. Thus, the wiring 115 can function as an output signal line, a gate signal line, or a scan line.

Suppose that a signal SEL1, for example, is input to the wiring 116_1. The signal SEL1 can be a signal in the first voltage state or in the second voltage state. For example, the signal SEL1 is a digital signal which repeatedly switches between two states of high level and low level in many cases and can function as a control signal, a clock signal, or a clock control signal. Therefore, the wiring 116_1 can function as a signal line, a control line, or a clock line. However, this embodiment is not limited to this. For example, the signal SEL1 can repeatedly switch between two states of high level and low level, every other plural frames, every time power is applied, or at random.

Suppose that a signal SEL2, for example, is input to the wiring 116_2. The signal SEL2 can be a signal in the first voltage state or in the second voltage state. For example, the signal SEL2 is a digital signal which repeatedly switches between two states of high level and low level every certain period (e.g., every frame period), in many cases. Note that the signal SEL2 is an inverted signal of the signal SEL1 or a signal approximately 180° out of phase with the signal SEL1 in many cases, and the signal SEL2 thus can function as a control signal, an inverted clock line, or an inverted clock control signal. Therefore, the wiring 116_2 can function as a signal line, a control line, or an inverted clock line. For example, if the signal SEL1 is at one of high level and low level, the signal SEL2 can be set at the other one of high level and low level. However, this embodiment is not limited to this. For example, the signal SEL2 can repeatedly switch between the states of high level and low level every other plural frames, every time power is applied, or at random.

Suppose that a signal RE, for example, is input to the wiring 117. The signal RE can be a signal in the first voltage state or in the second voltage state. For example, the signal RE is a digital signal in many cases and can function as a reset signal. Therefore, the wiring 117 can function as a signal line. However, this embodiment is not limited to this. For example, suppose that a plurality of semiconductor devices is cascaded. In this case, if the wiring 117 is connected to the wiring 111 of the semiconductor device in another stage (e.g., the next stage), the signal RE can function as a transfer signal, a gate signal, or a scan signal. Therefore, the wiring 117 can function as an output signal line, a gate signal line, or a scan line.

Suppose that the voltage V1, for example, is supplied to the wiring 118. The voltage V1 has a value which is substantially equal to that of a low-level signal, in many cases, and can function as a power supply voltage, a reference voltage, a ground voltage, or a negative power supply voltage. Therefore, the wiring 118 can function as a power supply line or a ground. However, this embodiment is not limited to this. For example, the signal CK1, the signal CK2, the signal SEL1, the signal SEL2, or the like can be input to the wiring 118. Therefore, the wiring 118 can function as a signal line.

In that case, a transistor can be reverse-biased, therefore, deterioration of a transistor can be suppressed.

Note that these wirings can have various other functions and need not have all of the functions above.

Note that the term "substantially" means that a value includes a variety of errors such as an error due to noise, an error due to variations in a process, an error due to variations in steps of manufacturing an element, and/or a measurement error.

Note that although in general, a voltage in some cases refers to a difference between potentials of two points, and a potential in some cases refers to electrostatic energy (electric potential energy) that a unit charge at a point in an electrostatic field has, in this specification, a voltage at a point refers to a potential difference between a potential at the point and a reference potential, unless otherwise specifically stated. This is because a difference between a potential at a point and a reference potential (e.g., a ground potential) is shown as a voltage at the point in many cases in an electronic circuit.

Note that the voltage of the first state, that is, a low-level signal is V1, and the voltage of the second state, that is, a high-level signal is V2, for example. In addition, the voltage V2 is higher than the voltage V1. Accordingly, the voltage V1 refers to a value which is substantially equal to the voltage of a low-level signal. Meanwhile, the voltage V2 refers to a value which is substantially equal to that of a high-level signal. However, this embodiment is not limited to this. For example, the voltage of a low-level signal can be lower than V1 or higher than V1. Alternatively, the voltage of a high-level signal can be lower than V2 or higher than V2. For example, a voltage which is referred to as a high-level signal or a high-level voltage can be lower than V2 or higher than V2, depending on the circuit structure. Alternatively, a voltage can be lower than V1 or higher than V1 even when it is referred to as a low-level signal or a low-level voltage, depending on the circuit structure.

Note that the signal CK1 and/or the signal CK2 can be balanced signals or unbalanced signals. A balanced signal has, in one cycle, a period in which the signal is at a high level and a period in which the signal is at a low level, which have substantially the same duration. An unbalanced signal has, in one cycle, the period in which the signal is at a high level and the period in which the signal is at a low level, which have different durations. Note that in this case, the range expressed by the word "different" refers to the range out of the range expressed by the word "substantially the same".

Note that when the signal CK1 and the signal CK2 are unbalanced signals, the signal CK2 is not an inverted signal of the CK1 in some cases. In this case, a period in which the signal CK1 is at a high level and a period in which the signal CK2 is at a high level can have substantially the same duration. However, this embodiment is not limited to this.

Next, the function of each circuit or each transistor will be described.

The circuit 100 has the function of controlling electrical continuity between the wiring 112 and the wiring 111 in accordance with the voltage of the node n1 and/or the voltage of the node n2, for example. Alternatively, the circuit 100 has the function of controlling the timing of when the voltage of the wiring 112 is supplied to the wiring 111. For example, in the case where a signal or a voltage (e.g., the voltage V2 or the signal CK1) is supplied to the wiring 112, the circuit 100 has the function of controlling the timing of when the signal or the voltage supplied to the wiring 112 is supplied to the wiring 111. Alternatively, the circuit 100 has the function of controlling the timing of when a high-level signal (e.g., the signal CK1) is supplied to the wiring 111. Alternatively, the circuit 100 has the function of controlling the timing of when the voltage of the wiring 111 is increased. Alternatively, the circuit 100 has the function of controlling the timing of when a low-level signal (e.g., the signal CK1) is supplied to the wiring 111. Alternatively, the circuit 100 has the function of controlling the timing of when the voltage of the wiring 111 is decreased or maintained. Alternatively, the circuit 100 has the function of controlling the timing of when the voltage of the node n1 and/or the voltage of the node n2 is increased with the bootstrap operation. As described above, the circuit 100 can function as a control circuit, a buffer circuit, a switch, or the like. However, this embodiment is not limited to this. Note that the circuit 100 need not have all of the functions above.

The circuit 200 has the function of controlling the voltage of the node n1, the voltage of the node n2, and/or the voltage of the wiring 111 in accordance with a signal or a voltage input (the signal CK2, the signal SP, the signal RE, the voltage of the node n1, the voltage of the node n2, and/or the signal OUT, etc.), for example. Alternatively, the circuit 200 has the function of controlling the timing of when a high-level signal or the voltage V2 is supplied to the node n1 and/or the node n2. Alternatively, the circuit 200 has the function of controlling the timing of when the voltage of the node n1 and/or the voltage of the node n2 is increased. Alternatively, the circuit 200 has the function of controlling the timing of when a low-level signal or the voltage V1 is supplied to the node n1 and/or the node n2. Alternatively, the circuit 200 has the function of controlling the timing of when the voltage of the node n1 and/or the voltage of the node n2 is decreased or maintained. Alternatively, the circuit 200 has the function of controlling the timing of when the supply of a signal or a voltage to the node n1 and/or the node n2 is stopped. Alternatively, the circuit 200 has the function of controlling the timing of when the node n1 and/or the node n2 is brought into a floating state. Alternatively, the circuit 200 has the function of controlling the timing of when a low-level signal or the voltage V1 is supplied to the wiring 111. Alternatively, the circuit 200 has the function of controlling the timing of when the voltage of the wiring 111 is decreased or maintained. As described above, the circuit 200 can function as a control circuit. However, this embodiment is not limited to this. Note that the circuit 200 need not have all of the functions above.

The transistor 101_1 has the function of controlling electrical continuity between the wiring 112 and the wiring 111 in accordance with the voltage of the node n1, for example. Alternatively, the transistor 101_1 has the function of controlling the timing of when the voltage of the wiring 112 is supplied to the wiring 111. For example, when a signal or a voltage (e.g., the voltage V2 or the signal CK1) is supplied to the wiring 112, the transistor 101_1 has the function of controlling the timing of when the signal or the voltage supplied to the wiring 112 is supplied to the wiring 111. Alternatively, the transistor 101_1 has the function of controlling the timing of when a high-level signal (e.g., the signal CK1) is supplied to the wiring 111. Alternatively, the transistor 101_1 has the function of controlling the timing of when the voltage of the wiring 111 is increased. Alternatively, the transistor 101_1 has the function of controlling the timing of when a low-level signal (e.g., the signal CK1) is supplied to the wiring 111. Alternatively, the transistor 101_1 has the function of controlling the timing of when the voltage of the wiring 111 is decreased or maintained. Alternatively, the transistor 101_1 has the function of performing the bootstrap operation. Alternatively, the transistor 101_1 has the function of increasing the voltage of the node n1 with the bootstrap operation. Alternatively, the transistor 101_1 has the function of controlling whether or not the voltage state of the signal OUT is set by being on or off. As described above, the transistor 101_1 can function as a buffer, a switch, or the like. However, this embodiment is not limited to this. Note that the transistor 101_1 need not have all of the functions above.

The transistor 101_2 has the function of controlling electrical continuity between the wiring 112 and the wiring 111 in accordance with the voltage of the node n2, for example. Alternatively, the transistor 101_2 has the function of controlling the timing of when the voltage of the wiring 112 is supplied to the wiring ill. For example, when a signal or a voltage (e.g., the voltage V2 or the signal CK1) is supplied to the wiring 112, the transistor 101_2 has the function of controlling the timing of when the signal or the voltage supplied to the wiring 112 is supplied to the wiring 111. Alternatively, the transistor 101_2 has the function of controlling the timing of when a high-level signal (e.g., the signal CK1) is supplied to the wiring 111. Alternatively, the transistor 101_2 has the function of controlling the timing of when the voltage of the wiring 111 is increased. Alternatively, the transistor 101_2 has the function of controlling the timing of when a low-level signal (e.g., the signal CK1) is supplied to the wiring 111. Alternatively, the transistor 101_2 has the function of controlling the timing of when the voltage of the wiring 111 is decreased or maintained. Alternatively, the transistor 101_2 has the function of performing the bootstrap operation. Alternatively, the transistor 101_2 has the function of increasing the voltage of the node n2 with the bootstrap operation. Alternatively, the transistor 101_2 has the function of controlling whether or not the voltage state of the signal OUT is set by being on or off. As described above, the transistor 101_2 can function as a buffer, a switch, or the like. However, this embodiment is not limited to this. Note that the transistor 101_2 need not have all of the functions above.

Figure 2:
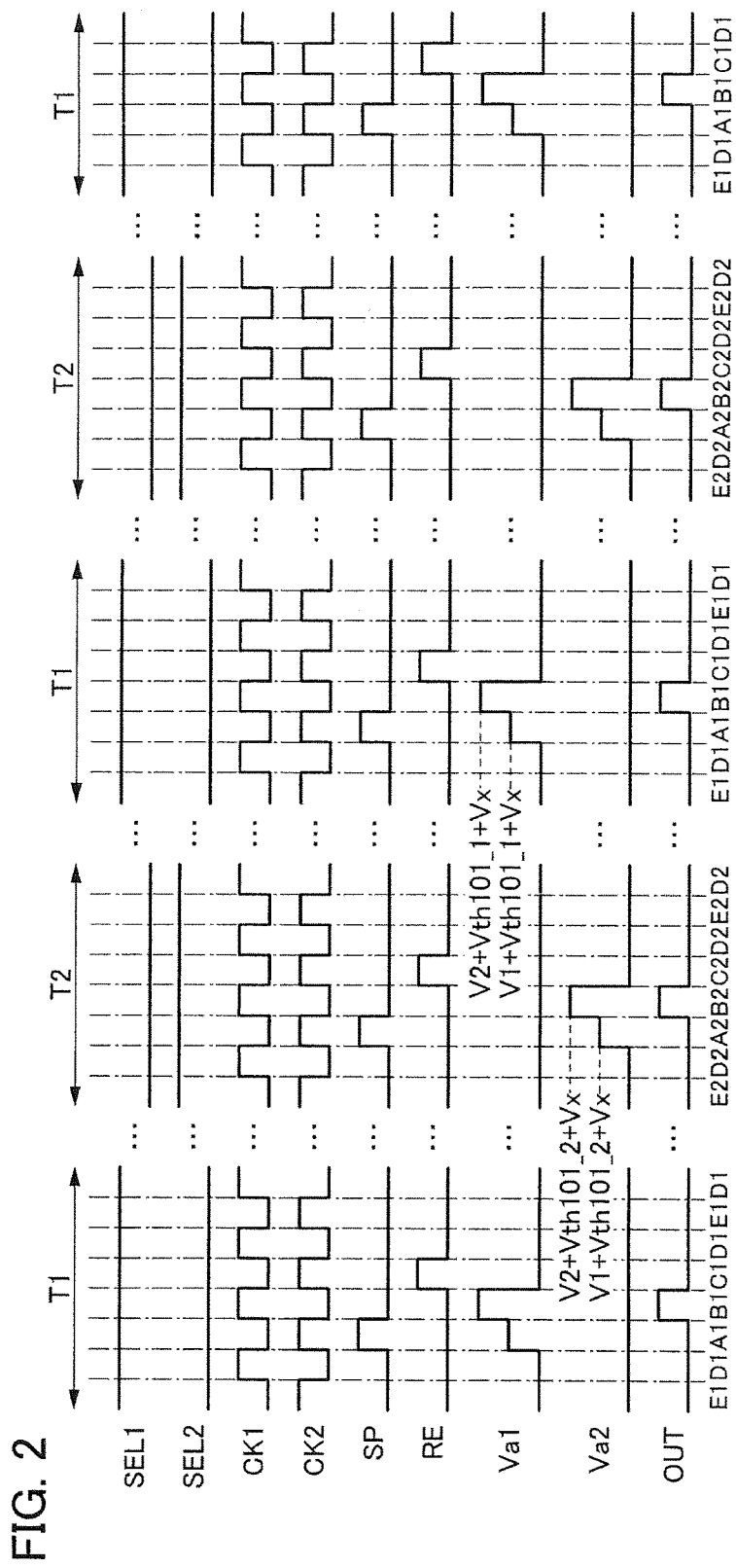
FIG. 2 is an example of a timing chart for showing operation of the semiconductor device in Embodiment 1.

Next, an example of the operation of the semiconductor device in FIG. 1A will be described with reference to a timing chart in FIG. 2. The timing chart in FIG. 2 shows the signal SEL1, the signal SEL2, the signal CK1, the signal CK2, the signal SP, the signal RE, the voltage of the node n1 (Va1), the voltage of the node n2 (Va2), and the signal OUT. Note that the operation of the semiconductor device in FIG. 1A is not limited to that shown in the timing chart in FIG. 2 and can be controlled at different timings.

Note that the timing chart in FIG. 2 includes a plurality of periods (hereinafter also referred to as frame periods). Each of the periods includes a plurality of sub-periods (hereinafter also referred to as one gate selection periods). For example, the timing chart in FIG. 2 includes a plurality of periods, that is, a period T1 and a period T2. The period T1 includes a plurality of sub-periods, that is, a period A1, a period B1, a period C1, a period D1, and a period E1. The period T2 includes a plurality of sub-periods, that is, a period A2, a period B2, a period C2, a period D2, and a period E2. However, this embodiment is not limited to this. For example, in the timing chart in FIG. 2, a period different from the period T1 and the period T2 can be included and/or one of the period T1 and the period 12 can be omitted. Alternatively, during the period T1, various periods other than the periods A1 to E1 can be included or any of the periods A1 to E1 can be omitted. Alternatively, during the period T2, various periods other than the periods A2 to E2 can be included or any of the periods A2 to E2 can be omitted.

Note that the period T1 and the period T2 alternate, for example. However, this embodiment is not limited to this, that is, the period T1 and the period T2 can be in various orders.

Note that the period A1, the period B1, and the period C1 are set in the order presented during the period T1, for example. After that, the period D1 and the period E1 alternate until the end of the period T1 (or the beginning of the period T2). However, this embodiment is not limited to this. For example, the period D1 and/or the period E1 can be set between the beginning of the period T1 and the beginning of the period A1.

Note that the period A2, the period B2, and the period C2 are set in the order presented during the period T2, for example. After that, the period D2 and the period E2 alternate until the end of the period T2 (or the beginning of the period T1). However, this embodiment is not limited to this. For example, the period D2 and/or the period E2 can be set between the beginning of the period T2 and the beginning of the period A2.

First, operation during the period T1 is described. During the period T1, the signal SEL1 is at a high level and the signal SEL2 is at a low level.

Figure 3A:
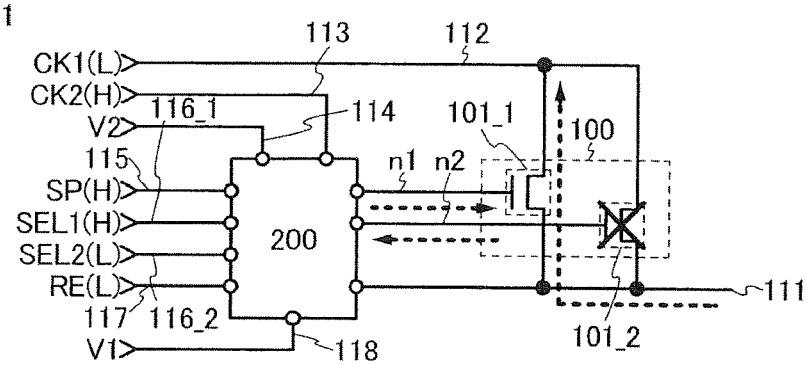
FIGS. 3A to 3D are examples of a schematic view for showing operation of the semiconductor device in Embodiment 1.

During the period A1, as shown in FIG. 3A, the signal SP is at a high level. Accordingly, the circuit 200 supplies a high-level signal or the voltage V2 to the node n1. Therefore, the voltage of the node n1 starts to be increased. Meanwhile, the circuit 200 supplies a low-level signal or the voltage V1 to the node n2. Thus, the voltage of the node n2 is decreased to substantially equal to V1. Alternatively, the voltage of the node n2 is maintained at substantially equal to V1. As a result, the transistor 101_2 is turned off. After that, the voltage of the node n1 keeps increasing and then reaches V1+Vth101_1+Vx (Vth101_1: the threshold voltage of the transistor 101_1). Here, a value of Vx is larger than 0. Accordingly, the transistor 101_1 is turned on, so that electrical continuity is established between the wiring 112 and the wiring 111 through the transistor 101_1. Therefore, the signal CK1 at a low level is supplied from the wiring 112 to the wiring 111 through the transistor 101_1. As a result, the signal OUT goes to a low level. After that, the voltage of the node n1 further is increased. The circuit 200 then stops supplying a signal or a voltage to the node n1; thus, electrical continuity is broken between the circuit 200 and the node n1. As a result, the node n1 is brought into a floating state and the voltage of the node n1 is maintained at the value of V1+Vth101_1+Vx. However, this embodiment is not limited to this. For example, the circuit 200 can keep supplying the voltage of V1+Vth101_1+Vx to the node n1 during the period A1.

Note that during the period A1, the circuit 200 can supply a low-level signal or the voltage V1 to the wiring 111 or supply no signal or voltage to the wiring 111.

Figure 3B:
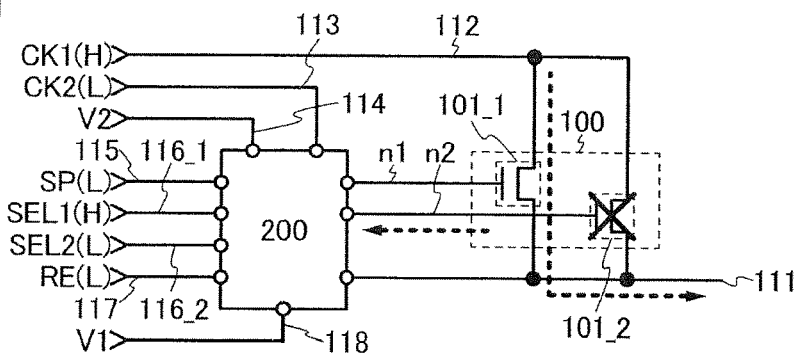

During the period B1, as shown in FIG. 3B, the signal SP is at a low level. Accordingly, the circuit 200 keeps supplying no signal or voltage to the node n1. Therefore, the node n1 remains in a floating state, so that the voltage of the node n1 remains the value of V1+Vth101_1+Vx. That is, the transistor 101_1 remains on, so that electrical continuity remains between the wiring 112 and the wiring 111 through the transistor 101_1. Meanwhile, the circuit 200 supplies a low-level signal or the voltage V1 to the node n2. Therefore, the voltage of the node n2 remains substantially equal to V1. As a result, the transistor 101_2 remains off. Here, the signal CK1 at a low level goes to a high level. Thus, the signal CK1 at a high level is supplied from the wiring 112 to the wiring 111 through the transistor 101_1, so that the voltage of the wiring 111 starts to be increased. Accordingly, the node n1 remains in a floating state; thus, the voltage of the node n1 is increased to the value of V2+Vth101_1+Vx because of a parasitic capacitance between the gate and the second terminal of the transistor 101_1. This is the so-called bootstrap operation. The voltage of the wiring 111 can be increased to V2 in such a manner. Thus, the signal OUT goes to a high level.

Note that during the period B1, the circuit 200 supplies no signal or voltage to the wiring 111 in many cases. However, this embodiment is not limited to this, that is, the circuit 200 can supply a high-level signal or the voltage V2 to the wiring 111.

Figure 3C:
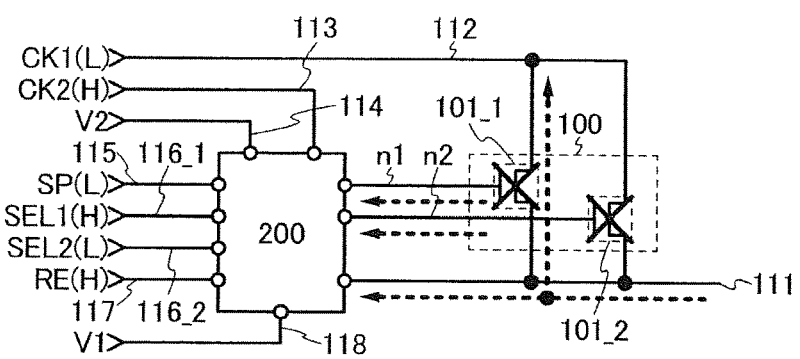

Next, during the period C1, as shown in FIG. 3C, the signal RE is at a high level. Accordingly, the circuit 200 supplies a low-level signal or the voltage V1 to the node n1, the node n2, and/or the wiring 111. Therefore, the voltage of the node n1, the voltage of the node n2 and/or the voltage of the wiring 111 becomes substantially equal to V1. As a result, the transistor 101_1 and the transistor 101_2 are turned off; thus, electrical continuity is broken between the wiring 112 and the wiring 111. Accordingly, the signal OUT goes to a low level.

Note that during the period C1, the timing of when the signal CK1 goes to a low level is earlier than the timing of when the voltage of the node n1 is decreased in some cases. That is, the signal CK1 goes to a low level before the transistor 101_1 is turned off in some cases. Therefore, the signal CK1 at a low level is supplied from the wiring 112 to the wiring 111 through the transistor 101_1 in some cases. In this case, when another transistor is also included, the channel width of the transistor 101_1 is larger than that of the transistor in many cases; therefore, the fall time of the signal OUT can be shortened. Accordingly, during the period C1, there are the case where a low-level signal or the voltage V1 is supplied to the wiring 111 from the circuit 200, the case where a low-level signal is supplied to the wiring 111 from the wiring 112 through the transistor 101_1, and the case where a low-level signal or the voltage V1 is supplied to the wiring 111 from the circuit 200 and a low-level signal is supplied to the wiring 111 from the wiring 112 through the transistor 101_1.

Figure 3D:
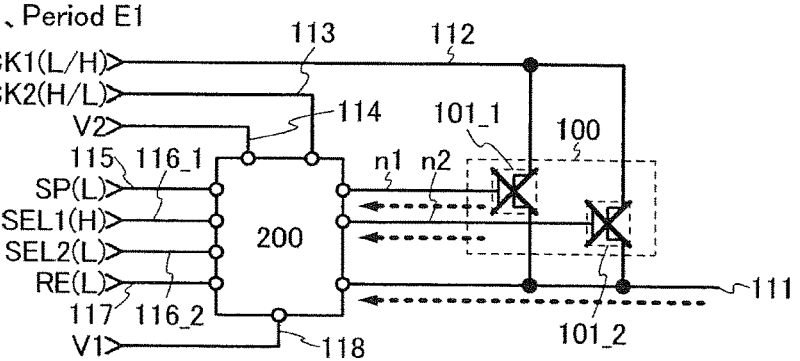

Next, during the period D1 and the period E1, as shown in FIG. 3D, the circuit 200 supplies a low-level signal or the voltage V1 to the node n1, the node n2, and/or the wiring 111. Accordingly, the voltage of the node n1, the voltage of the node n2 and/or the voltage of the wiring 111 remains substantially equal to V1. Therefore, the transistor 101_1 and the transistor 101_2 remain off; thus, there is still no electrical continuity between the wiring 112 and the wiring 111. Thus, the signal OUT remains at a low level.

Note that during one of the period D1 and the period E1, it is possible that the circuit 200 supplies a low-level signal or the voltage V1 to the node n1, the node n2, and/or the wiring 111, and during the other period, it is possible that the circuit 200 supplies no signal or voltage to the node n1, the node n2, and/or the wiring 111.

Next, operation during the period T2 will be described. During the period T2, the signal SEL1 is at a low level and the signal SEL2 is at a high level.

Figure 4A:
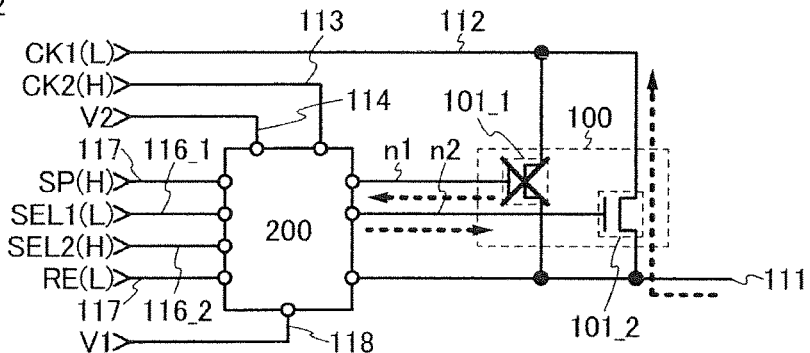
FIGS. 4A to 4D are examples of a schematic view for showing operation of the semiconductor device in Embodiment 1.

During the period A2, as shown in FIG. 4A, the signal SP is at a high level. Accordingly, the circuit 200 supplies a low-level signal or the voltage V1 to the node n1. Therefore, the voltage of the node n1 is decreased to substantially equal to V1. Alternatively, the voltage of the node n1 is maintained at substantially equal to V1. As a result, the transistor 101_1 is turned off. Meanwhile, the circuit 200 supplies a high-level signal or the voltage V2 to the node n2. Therefore, the voltage of the node n2 starts to be increased. After that, the voltage of the node n2 keeps increasing and then reaches V1+Vth101_2+Vx (Vth101_2: the threshold voltage of the transistor 101_2). Accordingly, the transistor 101_2 is turned on, so that electrical continuity is established between the wiring 112 and the wiring 111 through the transistor 101_2. Therefore, the signal CK1 at a low level is supplied from the wiring 112 to the wiring 111 through the transistor 101_2. As a result, the signal OUT goes to a low level. After that, the voltage of the node n2 further is increased. The circuit 200 then stops supplying a signal or a voltage to the node n2; thus, electrical continuity is broken between the circuit 200 and the node n2. As a result, the node n2 is brought into a floating state and the voltage of the node n2 is maintained at the value of V1+Vth101_2+Vx. However, this embodiment is not limited to this. For example, the circuit 200 can keep supplying the voltage of V1+Vth101_2+Vx to the node n2.

Note that during the period A2, the circuit 200 can supply a low-level signal or the voltage V1 to the wiring 111 or supply no signal or voltage to the wiring 111.

Figure 4B:
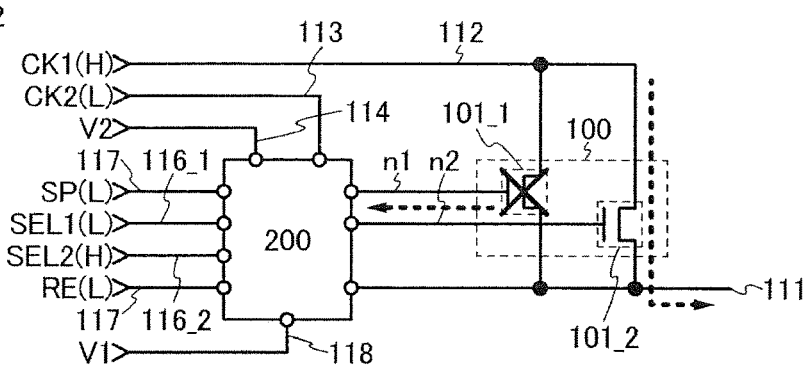

During the period B2, as shown in FIG. 4B, the signal SP is at a low level. Accordingly, the circuit 200 supplies a low-level signal or the voltage V1 to the node n1. Therefore, the voltage of the node n1 remains substantially equal to V1. As a result, the transistor 101_1 remains off. Meanwhile, the circuit 200 keeps supplying no signal or voltage to the node n2. Therefore, the node n2 remains in a floating state, so that the voltage of the node n2 remains the value of V1+Vth101_2+Vx. That is, the transistor 101_2 remains on, so that electrical continuity remains between the wiring 112 and the wiring 111 through the transistor 101_2. Here, the signal CK1 at a low level goes to a high level. Thus, the signal CK1 at a high level is supplied from the wiring 112 to the wiring 111 through the transistor 101_2, so that the voltage of the wiring 111 starts to be increased. Accordingly, the node n2 remains in a floating state; thus, the voltage of the node n2 is increased to the value of V2+Vth101_2+Vx because of a parasitic capacitance between the gate and the second terminal of the transistor 101_2. This is the so-called bootstrap operation. The voltage of the wiring 111 can be increased to V2 in such a manner. Thus, the signal OUT goes to a high level.

Note that during the period B2, the circuit 200 supplies no signal or voltage to the wiring 111 in many cases. However, this embodiment is not limited to this, that is, the circuit 200 can supply a high-level signal or the voltage V2 to the wiring 111.

Figure 4C:
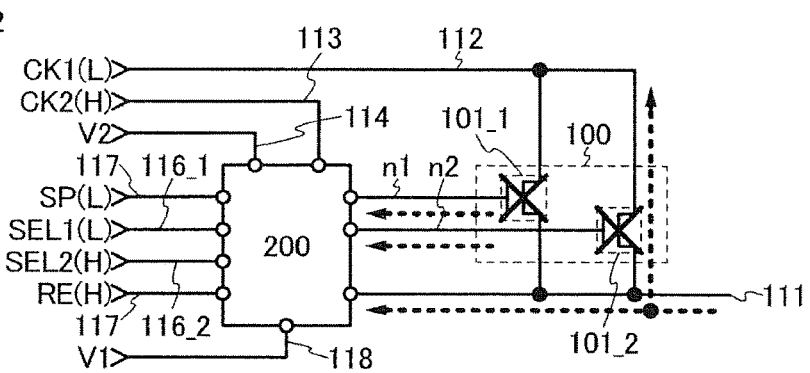

Next, during the period C2, as shown in FIG. 4C, the signal RE is at a high level. Accordingly, the circuit 200 supplies a low-level signal or the voltage V1 to the node n1, the node n2 and/or the wiring 111. Therefore, the voltage of the node n1, the voltage of the node n2 and/or the voltage of the wiring 111 becomes V1. As a result, the transistor 101_1 and the transistor 101_2 are turned off; thus, electrical continuity is broken between the wiring 112 and the wiring 111. Accordingly, the signal OUT goes to a low level.

Note that during the period C2, the timing of when the signal CK1 goes to a low level is earlier than the timing of when the voltage of the node n1 is decreased in some cases. That is, the signal CK1 goes to a low level before the transistor 101_2 is turned off in some cases. Therefore, the signal CK1 at a low level is supplied from the wiring 112 to the wiring 111 through the transistor 101_1 in some cases. In this case, when another transistor is also included, the channel width of the transistor 101_1 is larger than that of another transistor in many cases; therefore, the fall time of the signal OUT can be shortened. Accordingly, during the period C2, there are the case where a low-level signal or the voltage V1 is supplied to the wiring 111 from the circuit 200, the case where a low-level signal is supplied to the wiring 111 from the wiring 112 through the transistor 101_1, and the case where a low-level signal or the voltage V1 is supplied to the wiring 111 from the circuit 200 and a low-level signal is supplied to the wiring 111 from the wiring 112 through the transistor 101_1.

Figure 4D:
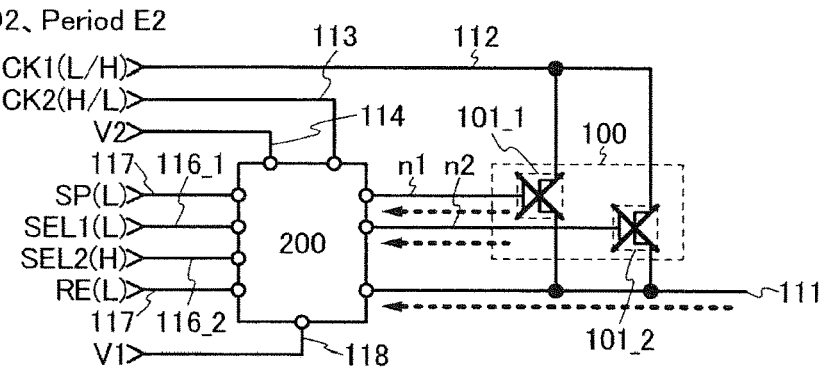

Next, during the period D2 and the period E2, as shown in FIG. 4D, the circuit 200 supplies a low-level signal or the voltage V1 to the node n1, the node n2, and/or the wiring 111. Accordingly, the voltage of the node n1, the voltage of the node n2 and/or the voltage of the wiring 111 remain/ remains substantially equal to V1. Therefore, the transistor 101_1 and the transistor 101_2 remain off; thus, there is still no electrical continuity between the wiring 112 and the wiring 111. Thus, the signal OUT remains at a low level.

Note that it is possible that during one of the period D2 and the period E2, the circuit 200 supplies a low-level signal or the voltage V1 to the node n1, the node n2, and/or the wiring 111, and during the other period, the circuit 200 supplies no signal or voltage to the node n1, the node n2, and/or the wiring 111.

As described above, during the period T1, the transistor 101_2 can turn off, and during the period T2, the transistor 101_1 can turn off. Therefore, the number of times the transistor 101_1 is turned on and the number of times the transistor 101_2 is turned on can be decreased, the number of times a large Vgs is applied to the transistor 101_1 and the number of times a large Vgs is applied to transistor 101_2 can be decreased, and/or a period of time over which the transistor 101_1 is on and a period of time over which the transistor 101_2 is on, can be achieved, and deterioration of characteristics of the transistor 101_1 and the transistor 101_2 can be suppressed.

Alternatively, the suppression of degradation of the transistor characteristics produces various merits. For example, when the wiring 111 is connected to a pixel, a video signal held in the pixel can be influenced by a waveform of the signal OUT. For example, when the voltage of the signal OUT at a high level is not increased to V2, the time over which a transistor included in the pixel (e.g., a selection transistor or a switching transistor) is on is shortened. As a result, a video signal is insufficiently written to the pixel and a visual quality is thus reduced. Alternatively, when the fall time or the rise time of the signal OUT is long, a video signal can be written to a pixel in a selected raw, although the video signal is intended to be written to a pixel in another raw. As a result, the visual quality is reduced. Alternatively, when the fall time of the signal OUT varies, the influence of feed through to a video signal held in a pixel can vary. This results in uneven images caused by cross-talk, etc.

However, the semiconductor device in this embodiment, degradation of the transistor characteristics can be suppressed. Accordingly, the voltage of the signal OUT at a high level can be increased to V2; thus, the time over which the transistor included in a pixel can be longer. As a result, a video signal can be written to the pixel with enough time; thus, visual quality can be improved. Alternatively, since the fall time or the rise time of the signal OUT can be shortened, a video signal can be prevented from being written to a pixel in a selected raw, when the video signal is intended to be written to a pixel in another raw. As a result, the visual quality can be improved. Alternatively, variations in the fall time of the signal OUT can be suppressed; thus, variations in the influence of feed through to a video signal held in a pixel can be suppressed. Accordingly, uneven images can be suppressed.

In the semiconductor device in this embodiment, all of the transistors can be n-channel transistors or all of the transistors can be p-channel transistors. Accordingly, with a circuit in this embodiment, a reduction in the number of steps, improvement in yield, improvement in reliability, or a reduction in cost can be realized more efficiently than with a CMOS circuit. In particular, when all the transistors including those in a pixel portion and the like are n-channel transistors, a non-single-crystal semiconductor, an amorphous semiconductor, a microcrystalline semiconductor, an organic semiconductor, an oxide semiconductor, or the like can be used for a semiconductor layer of the transistor. A transistor using any of these semiconductors easily deteriorates in many cases. However, with the semiconductor device in this embodiment, deterioration of a transistor can be suppressed.

Alternatively, since deterioration of a transistor can be suppressed, it is not necessary to make the channel width of a transistor large by taking into consideration of the case where a transistor deteriorates. Accordingly, the channel width of a transistor can be made small.

Note that during the period T1, a period in which the transistor 101_1 is on (the period A1 and the period B1 ) can be called a first period or a first sub-period, and a period in which the transistor 101_1 is off (the period C1, the period D1, and the period E1) can be called a second period or a second sub-period. In a similar manner, during the period T2, a period in which the transistor 101_2 is on (the period A2 and the period B2) can be called a third period or a third sub-period, and a period in which the transistor 101_2 is off (the period C2, the period D2, and the period E2) can be called a fourth period or a fourth sub-period.

Note that the period in which the transistor 101_1 is on (the period A1 and the period B1 ) is shorter than the period in which the transistor 101_1 is off (the period C1, the period D1, and the period E1) in many cases. Alternatively, the period in which the transistor 101_2 is on (the period A2 and the period B2) is shorter than the period in which the transistor 101_2 is off (the period C2 to the period E2) in many cases. Alternatively, the period in which the transistor 101_1 is on and the period in which the transistor 101_2 is on have substantially the same duration in many cases. However, this embodiment is not limited to this.

Note that during the period T1, the period B1 can serve as a selection period, and the period A1, the period C1, the period D1, and the period E1 can serve as non-selection periods. In a similar manner, during the period T2, the period B2 can serve as a selection period, and the period A2, the period C2, the period D2, and the period E2 can serve as non-selection periods.

Note that the period A1 and the period A2 can serve as set periods or start periods. The period B1 and the period B2 can serve as selection periods. Alternatively, the period C1 and the period C2 can serve as reset periods.

Note that the period T1 and the period T2 can serve as frame periods. Note that the frame frequency is preferably set at approximately 60 Hz (or 50 Hz). However, this embodiment is not limited to this. For example, setting the frame frequency higher than 60 Hz can reduce motion blur or image blur. However, excessively-high frame frequency leads to high drive frequency, so that power consumption is increased. Therefore, in order to suppress the increase in power consumption, the frame frequency is preferably set at 60 Hz (or 50 Hz) to 360 Hz, more preferably 60 Hz (or 50 Hz) to 240 Hz, and much more preferably 60 Hz (or 50 Hz) to 120 Hz (or 100 Hz). Meanwhile, setting the frame frequency lower than 60 Hz can simplify the configuration of an external circuit or reduce power consumption. Accordingly, the semiconductor device, which is one embodiment of the present invention, can be applied to a mobile device such as a mobile phone. However, excessively-low frame frequency leads to a large storage capacitance of the pixel, so that aperture ratio of the pixel is decreased. Therefore, in order to suppress the decrease in aperture ratio, the frame frequency is preferably set at 15 Hz to 60 Hz (or 50 Hz) and more preferably 30 Hz to 60 Hz (or 50 Hz).

Note that each of the periods A1 to E1 and each of the periods A2 to E2 can serve as a sub-period or one gate selection period.

Note that the period or the sub-period can also be called a step, a processing, or an operation. For example, the first period can also be called a first step, a first processing, or a first operation.

Note that it is preferable that the duration between the beginning of the period T1 and the beginning of the period A1 be substantially equal to that between the beginning of the period T2 and the beginning of the period A2. However, this embodiment is not limited to this.

Figure 5A:
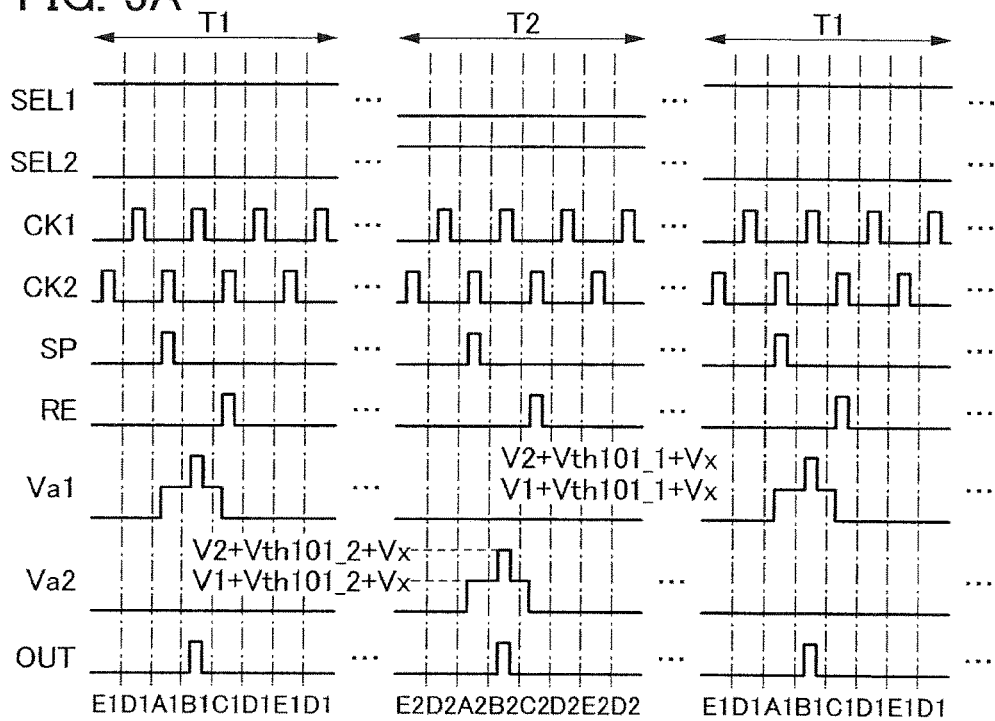
FIGS. 5A and 5B are examples of a timing chart for showing operation of the semiconductor device in Embodiment 1.

Note that the signal CK1 and the signal CK2 can be unbalanced signals. A timing chart in the case where, in one cycle, a period in which a signal is at a high level is shorter than a period in which a signal is at a low level is shown in FIG. 5A as an example. Setting the period in which the signal is at a high level shorter than the period in which the signal is at a low level allows the signal CK1 at a low level to be supplied to the wiring 111 during the period C1 or the period C2 ; thus, the fall time of the signal OUT can be shortened. Particularly in the case where the wiring 111 is drawn and provided in the pixel portion, a video signal can be prevented from being falsely written to the pixel. However, this embodiment is not limited to this. For example, in one cycle, the period in which the signal is at a high level can be longer than the period in which the signal is at a low level.

Figure 5B:
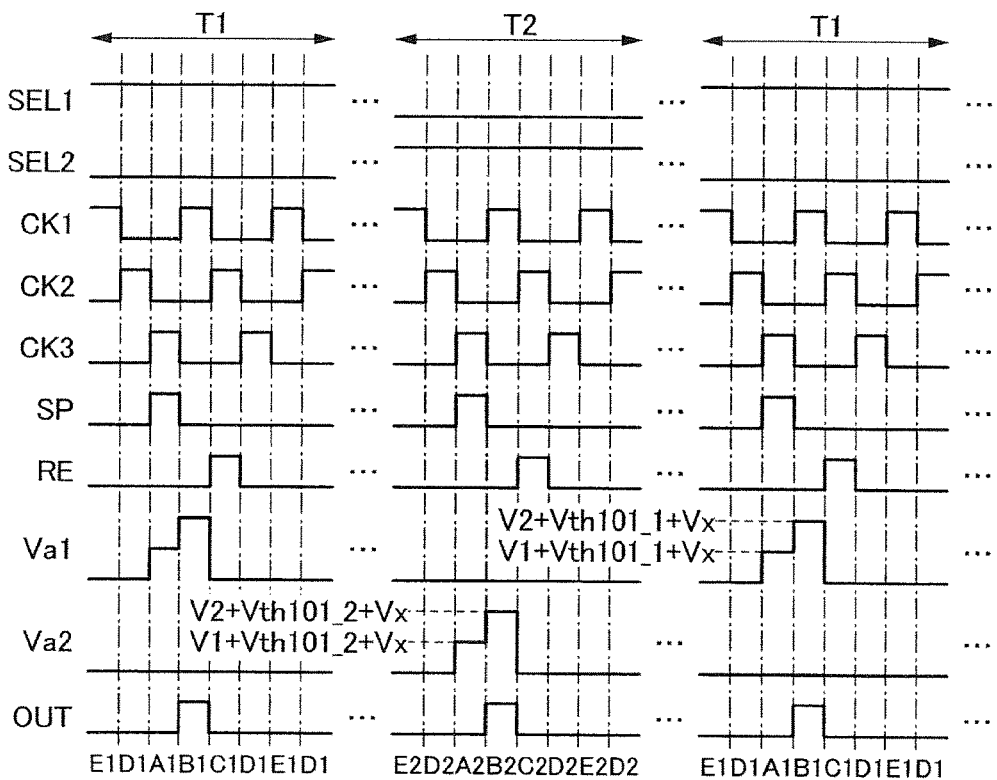

Note that a multi-phase clock signal can be used for the semiconductor device. For example, an n-phase (n is a natural number) clock signal can be used for the semiconductor device. The n-phase clock signal refers to n clock signals which are out of phase with each other by 1/n cycle. FIG. 5B shows, as an example, a timing chart in the case where a three-phase clock signal is used for the semiconductor device. However, this embodiment is not limited to this.

Note that the larger n is, the lower the clock frequency, so that a reduction in power consumption can be achieved. However, if n is excessively large, the number of signals is increased; thus, a layout area can be large or a scale of the external circuit can be large. Therefore, it is preferable that n<8. It is more preferable that n<6. It is further more preferable that n=4 or n=3. However, this embodiment is not limited to this.

Note that the transistor 101_1 and the transistor 101_2 can be turned on at the same time. In this case, for example, the circuit 200 can supply a high-level signal or the voltage V2 to the node n1 and the node n2.

It is preferable that the channel width of the transistor 101_1 be substantially equal to that of the transistor 101_2. By making the transistors have substantially the same size, the transistors can have substantially the same current supply capability. Alternatively, the degree of degradation of the transistors can be substantially equal. Accordingly, even when a different transistor is selected, the waveform of the signal OUT can be substantially uniform. Note that for a similar reason, it is preferable that the channel length of the transistor 101_1 be substantially equal to the channel length of the transistor 101_2. However, this embodiment is not limited to this.

Note that the channel width of a transistor can also refer to a W/L ratio of a transistor (W represents the channel width and L represents the channel length).

Since the transistor 101_1 and the transistor 101_2 drive a heavy load such as a gate signal line, the channel width of the transistor 101_1 and the channel width of the transistor 101_2 are preferably large. For example, each of the channel width of the transistor 101_1 and the channel width of the transistor 101_2 is preferably 1000 μm to 30000 μm, more preferably 2000 μm to 20000 μm, much more preferably 3000 μm to 8000 μm or 10000 μm to 18000 μm. However, this embodiment is not limited to this.

Figure 1B:
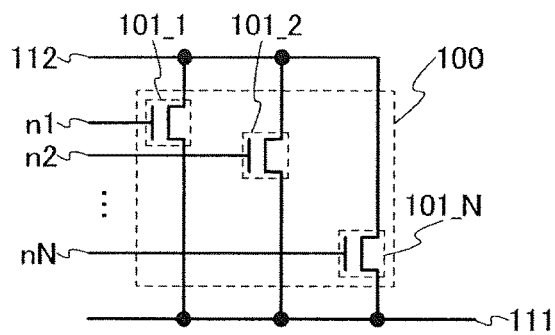

Note that in the structure described with reference to FIG. 1A, as shown in FIG. 1B, the circuit 100 can include a plurality of transistors, that is, the transistors 101_1 to 101_N (N is a natural number more than 2). First terminals of the transistors 101_1 to 101_N are connected to the wiring 112. Second terminals of the transistors 101_1 to 101_N are connected to the wiring 111. Gates of the transistors 101_1 to 101_N are connected to the circuit 200. Note that junctions of the gates of the transistors 101_1 to 101_N and the circuit 200 are denoted as nodes n1 to nN, respectively. However, this embodiment is not limited to this.

Note that when N is large, the number of times a transistor is turned on can be reduced or the time over which a transistor is on can be shortened. Accordingly, the larger N is, the more effectively deterioration of a transistor is suppressed. However, if N is excessively large, the number of transistors excessively is increased; thus, the circuit scale becomes large. Therefore, it is preferable that N is 6 or less. It is more preferable that N is 4 or less. It is further more preferable that N=2 or N=3.

Figure 1C:
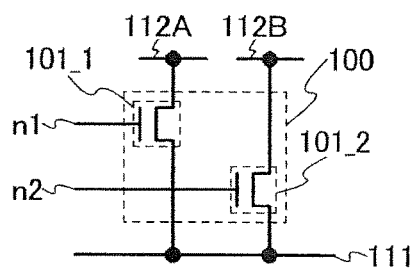

Note that in the structure described with reference to FIGS. 1A and 1B, as shown in FIG. 1C, the first terminal of the transistor 101_1 and the first terminal of the transistor 101_2 can be connected to different wirings. In an example of FIG. 1C, the wiring 112 is divided into a plurality of wirings, that is, wirings 112A and 112B. Then, the first terminal of the transistor 101_1 is connected to the wiring 112A, and the first terminal of the transistor 101_2 is connected to the wiring 112B. Note that the wirings 112A and 112B can function in a manner similar to the wiring 112. Accordingly, a signal such as the signal CK1 can be input to the wirings 112A and 112B. However, this embodiment is not limited to this. For example, different voltages or different signals can be supplied to the wiring 112A and the wiring 112B.

Figure 1D:
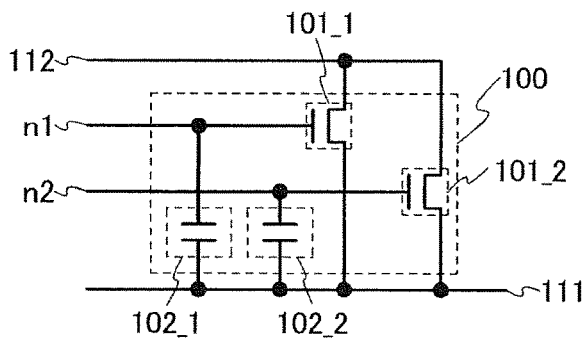

Note that in the structure described with reference to FIGS. 1A to 1C, as shown in FIG. 1D, a capacitor 102_1 can be connected between the gate and the second terminal of the transistor 101_1, and a capacitor 102_2 can be connected between the gate and the second terminal of the transistor 101_2. In such a manner, the voltage of the node n1 or the voltage of the node n2 is easily increased when the bootstrap operation is performed. Therefore, Vgs of the transistor 101_1 and Vgs of the transistor 101_2 can be increased, so that the channel width of these transistors can be small. Alternatively, the fall time or the rise time of the signal OUT can be shortened. However, this embodiment is not limited to this. For example, an MIS capacitor can be used as the capacitor.

Note that one electrode of each of the capacitors 102_1 and 102_2 is preferably formed using a material similar to a material of the gates of the transistors 101_1 and 101_2. The other electrode of each of the capacitors 102_1 and 102_2 is preferably formed using a material similar to a material of the sources or drains of the transistors 101_1 and 101_2. In such a manner, the layout area can be small or a capacitance can be large. However, this embodiment is not limited to this.

Note that, it is preferable that the capacitance of the capacitor 102_1 and the capacitance of the capacitor 102_2 be substantially equal. Alternatively, it is preferable that the area where one electrode of the capacitor 102_1 overlaps with the other electrode thereof be substantially equal to the area where one electrode of the capacitor 102_2 overlaps with the other electrode thereof. In such a manner, Vgs of the transistor 101_1 and Vgs of the transistor 101_2 can be substantially equal even when the transistor 101_1 and the transistor 101_2 are alternately used. Therefore, the waveform of the signal OUT can be made substantially uniform. However, this embodiment is not limited to this.

Figure 1E:
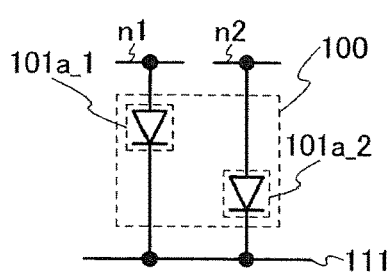
Figure 1F:
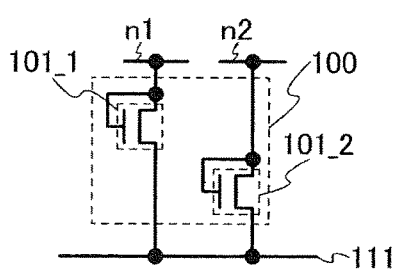

Note that in the structure described with reference to FIGS. 1A to 1D, as shown in FIG. 1E, the transistor 101_1 can be replaced with a diode 101a_1 and the transistor 101_2 can be replaced with a diode 101a_2. One terminal (hereinafter also referred to as an anode) of the diode 101a_1 is connected to the node n1 and the other terminal (hereinafter also referred to as a cathode) is connected to the wiring 111. One terminal of the diode 101a_2 is connected to the node n2 and the other terminal is connected to the wiring 111. However, this embodiment is not limited to this. For example, in the structure described with reference to FIGS. 1A to 1D, as shown in FIG. 1F, connecting the first terminal of the transistor 101_1 to the node n1 allows the transistor 101_1 to be diode-connected. In a similar manner, connecting the first terminal of the transistor 101_2 to the node n2 allows the transistor 101_2 to be diode-connected.

Figure 6A:
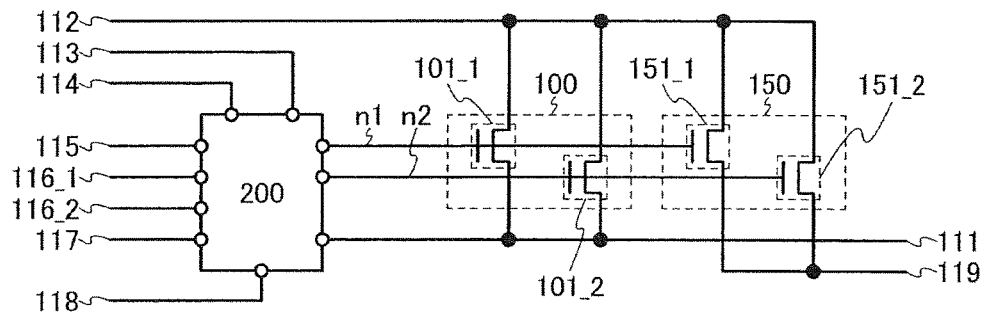
FIGS. 6A to 6G are examples of a circuit diagram of the semiconductor device in Embodiment 1.

Note that in the structure described with reference to FIGS. 1A to 1F, as shown in FIG. 6A, it is possible to generate a signal to be transmitted in addition to generate the signal OUT. For example, suppose that a plurality of semiconductor devices is cascaded. In this case, the signal to be transmitted is not input to the gate signal line but to a semiconductor device in the next stage as a start signal in many cases. Therefore, a delay of the signal to be transmitted is shorter and a distortion of the signal to be transmitted is smaller than those of the signal OUT in many cases. Therefore, the semiconductor devices can be driven by using a signal with a short delay and a small distortion; thus, a delay of output signals of the semiconductor devices can be shortened. Alternatively, the timing of when the node n1 or the node n2 is charged can be set earlier, so that a wide operating range can be realized. However, this embodiment is not limited to this.

Accordingly, as shown in FIG. 6A, the semiconductor device in this embodiment can include a circuit 150. The circuit 150 includes a plurality of transistors, that is, transistors 151_1 and 151_2. The transistors 151_1 and 151_2 preferably have the same polarity as the transistors 101_1 and 101_2, which are n-channel transistors. However, this embodiment is not limited to this, that is, the transistors 151_1 and 151_2 can be p-channel transistors.

A first terminal of the transistor 151_1 is connected to the wiring 112. A second terminal of the transistor 151_1 is connected to the wiring 119. A gate of the transistor 151_1 is connected to the node n1. A first terminal of the transistor 151_2 is connected to the wiring 112. A second terminal of the transistor 151_2 is connected to the wiring 119. A gate of the transistor 151_2 is connected to the node n2.

If a plurality of semiconductor devices are cascaded, for example, the wiring 119 is connected to the wiring 115 of the semiconductor device in another stage (e.g., the next stage) in many cases. In this case, the wiring 111 can be drawn and provided in the pixel portion. Alternatively, the wiring 111 can be connected to a gate of a transistor included in the pixel (e.g., a switching transistor or a selection transistor). However, this embodiment is not limited to this. For example, the wiring 119 can be drawn and provided in the pixel portion. Alternatively, the wiring 119 can be connected to a gate of a transistor included in the pixel. Alternatively, the wiring 119 can be connected to the wiring 117 of the semiconductor device in another stage (e.g., the previous stage).

Suppose that a signal SOUT, for example, is output from the wiring 119. For example, the signal SOUT is a digital signal which is at a high level or at a low level, in many cases and can function as an output signal of the semiconductor device. Therefore, the wiring 119 can function as a signal line or an output signal line. For example, suppose that a plurality of semiconductor devices is cascaded. In this case, the wiring 119 is connected to the wiring 115 of the semiconductor device in another stage (e.g., the next stage) in many cases, so that the signal SOUT can function as a transfer signal, or a start signal. However, this embodiment is not limited to this. For example, if the wiring 119 is drawn and provided in the pixel portion, or if the wiring 119 is connected to a gate of a transistor in a pixel, the signal SOUT can function as a gate signal, a scan signal, or a selection signal. Therefore, the wiring 119 can function as a gate signal line or a scan line. Alternatively, if the wiring 119 is connected to the wiring 117 of the semiconductor device in another stage (e.g., the previous stage), the signal SOUT can function as a reset signal.

The circuit 150 has the function of controlling electrical continuity between the wiring 112 and the wiring 119 in accordance with the voltage of the node n1 and/or the voltage of the node n2, for example. Alternately, the circuit 150 has the function of controlling the timing of when the voltage of the wiring 112 is supplied to the wiring 119. For example, when a signal or a voltage (e.g., the voltage V2 or the signal CK1) is supplied to the wiring 112, the circuit 150 has the function of controlling the timing of when the signal or the voltage supplied to the wiring 112 is supplied to the wiring 119. Alternatively, the circuit 150 has the function of controlling the timing of when a high-level signal (e.g., the signal CK1) is supplied to the wiring 119. Alternatively, the circuit 150 has the function of controlling the timing of when the voltage of the wiring 119 is increased. Alternatively, the circuit 150 has the function of controlling the timing of when a low-level signal (e.g., the signal CK1) is supplied to the wiring 119. Alternatively, the circuit 150 has the function of controlling the timing of when the voltage of the wiring 119 is decreased or maintained. Alternatively, the circuit 150 has the function of controlling the timing of when the voltage of the node n1 and/or the voltage of the node n2 is increased with the bootstrap operation. As described above, the circuit 150 can function as a control circuit, a buffer circuit, a switch, or the like. However, this embodiment is not limited to this. Note that the circuit 150 need not have all of the functions above.

The transistor 151_1 has the function of controlling electrical continuity between the wiring 112 and the wiring 119 in accordance with the voltage of the node n1, for example. Alternatively, the transistor 151_1 has the function of controlling the timing of when the voltage of the wiring 112 is supplied to the wiring 119. For example, when a signal or a voltage (e.g., the voltage V2 or the signal CK1) is supplied to the wiring 112, the transistor 151_1 has the function of controlling the timing of when the signal or the voltage supplied to the wiring 112 is supplied to the wiring 119. Alternatively, the transistor 151_1 has the function of controlling the timing of when a high-level signal (e.g., the signal CK1) is supplied to the wiring 119. Alternatively, the transistor 151_1 has the function of controlling the timing of when the voltage of the wiring 119 is increased. Alternatively, the transistor 151_1 has the function of controlling the timing of when a low-level signal (e.g., the signal CK1) is supplied to the wiring 119. Alternatively, the transistor 151_1 has the function of controlling the timing of when the voltage of the wiring 119 is decreased or maintained. Alternatively, the transistor 151_1 has the function of performing the bootstrap operation. Alternatively, the transistor 151_1 has the function of increasing the voltage of the node n1 with the bootstrap operation. As described above, the transistor 151_1 can function as a buffer, a switch, or the like. However, this embodiment is not limited to this. Note that the transistor 151_1 need not have all of the functions above.

The transistor 151_2 has the function of controlling electrical continuity between the wiring 112 and the wiring 119 in accordance with the voltage of the node n2, for example. Alternatively, the transistor 151_2 has the function of controlling the timing of when the voltage of the wiring 112 is supplied to the wiring 119. For example, when a signal or a voltage (e.g., the voltage V2 or the signal CK1) is supplied to the wiring 112, the transistor 151_2 has the function of controlling the timing of when the signal or the voltage supplied to the wiring 112 is supplied to the wiring 119. Alternatively, the transistor 151_2 has the function of controlling the timing of when a high-level signal (e.g., the signal CK1) is supplied to the wiring 119. Alternatively, the transistor 151_2 has the function of controlling the timing of when the voltage of the wiring 119 is increased. Alternatively, the transistor 151_2 has the function of controlling the timing of when a low-level signal (e.g., the signal CK1) is supplied to the wiring 119. Alternatively, the transistor 151_2 has the function of controlling the timing of when the voltage of the wiring 119 is decreased or maintained. Alternatively, the transistor 151_2 has the function of performing the bootstrap operation. Alternatively, the transistor 151_2 has the function of increasing the voltage of the node n2 with the bootstrap operation. As described above, the transistor 151_2 can function as a buffer, a switch, or the like. However, this embodiment is not limited to this. Note that the transistor 151_2 need not have all of the functions above.

Figure 7:
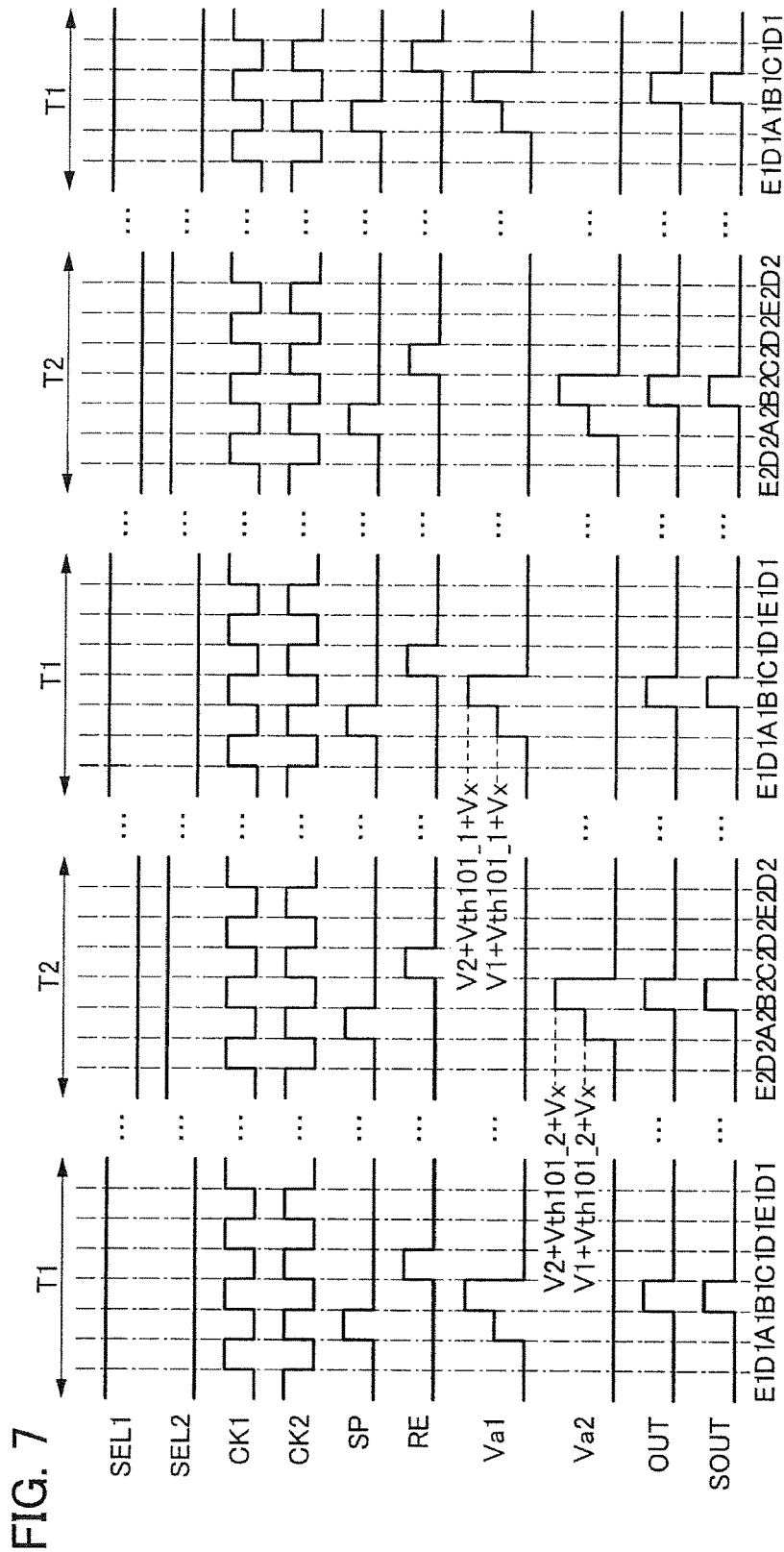
FIG. 7 is an example of a timing chart for showing operation of the semiconductor device in Embodiment 1.

As shown in a timing chart in FIG. 7, schematic views of the semiconductor device in FIGS. 8A to 8D, and schematic views of the semiconductor device in FIGS. 9A to 9D, the transistors 151_1 and 151_2 operate with substantially the same timing as the transistors 101_1 and 101_2. For example, during the periods A1 and B1, when the transistor 101_1 is turned on, the transistor 151_1 also is turned on. After that, during the periods C1 to E1, when the transistor 101_1 is turned off, the transistor 151_1 also is turned off. Then, during the periods A2 and B2, when the transistor 101_2 is turned on, the transistor 151_2 also is turned on. After that, during the periods C2 to E2, when the transistor 101_2 is turned off, the transistor 151_2 also is turned off. Therefore, the signal SOUT changes between a high level and a low level with substantially the same timing as the signal OUT. However, this embodiment is not limited to this.

It is preferable that the channel width of the transistor 151_1 be substantially equal to that of the transistor 151_2. By making the transistors have substantially the same size, the transistors can have substantially the same current supply capability. Alternatively, the degree of degradation of the transistors can be substantially equal. Accordingly, even when a different transistor is selected, the waveform of the signal SOUT can be substantially uniform. Note that for a similar reason, it is preferable that the channel length of the transistor 151_1 be substantially equal to the channel length of the transistor 151_2. However, this embodiment is not limited to this.

Note that when the signal SOUT is used as a signal to be transferred and the signal OUT is used as a gate signal, a scan, signal, or a selection signal, a load on the wiring 119 is lighter than that on the wiring 111 in many cases. Therefore, the channel width of the transistor 151_1 is preferably smaller than that of the transistor 101_1. Similarly, the channel width of the transistor 151_2 is preferably smaller than that of the transistor 101_2. However, this embodiment is not limited to this.

Note that the channel length of the transistor 151_1 is preferably substantially equal to that of the transistor 101_1. Alternatively, the channel length of the transistor 151_2 is preferably substantially equal to that of the transistor 101_2. However, this embodiment is not limited to this.

Note that each of the channel width of the transistor 151_1 and the channel width of the transistor 151_2 is preferably 100 μm to 5000 μm, more preferably 300 μm to 2000 μm, much more preferably 500 µm to 1000 µm. However, this embodiment is not limited to this.

Figure 6B:
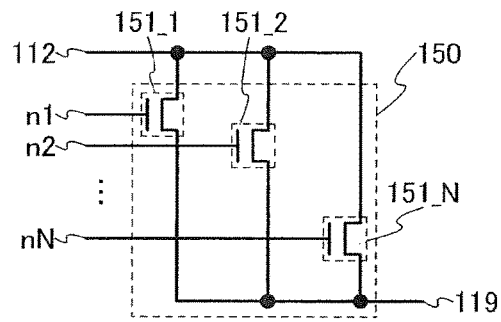

Note that in the structure described with reference to FIG. 6A, as shown in FIG. 6B and in a manner similar to that described with reference to FIG. 1B, the circuit 150 can include a plurality of transistors, that is, the transistors 151_1 to 151_N (N is a natural number more than 2). First terminals of the transistors 151_1 to 151_N are connected to the wiring 112. Second terminals of the transistors 151_1 to 151_N are connected to the wiring 119. Gates of the transistors 151_1 to 151_N are connected to any of the nodes n1 to nN. However, this embodiment is not limited to this.

Figure 6C:
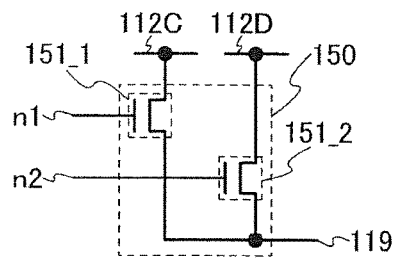

Note that in the structure described with reference to FIGS. 6A and 6B, as shown in FIG. 6C and in a manner similar to that described with reference to FIG. 1C, the first terminal of the transistor 151_1 and the first terminal of the transistor 151_2 can be connected to different wirings. In an example of FIG. 6C, the wiring 112 is divided into a plurality of wirings, that is, wirings 112C and 112D. The first terminal of the transistor 151_1 is connected to the wiring 112C, and the first terminal of the transistor 151_2 is connected to the wiring 112D. However, this embodiment is not limited to this.

Figure 6D:
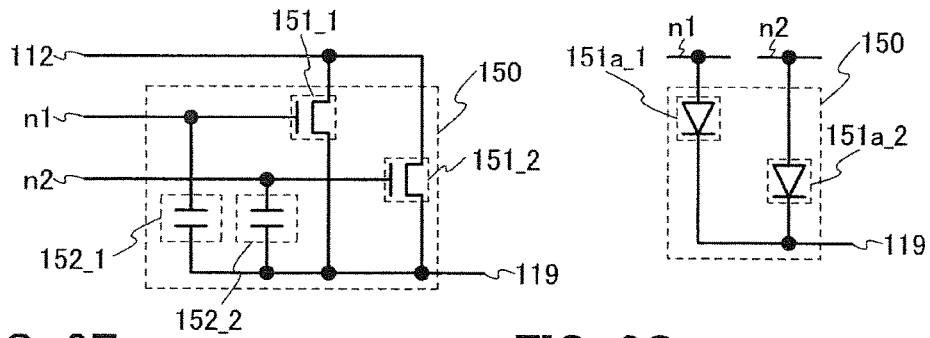

Note that in the structure described with reference to FIGS. 6A to 6C, as shown in FIG. 6D and in a manner similar to that described with reference to FIG. 1D, a capacitor 152_1 can be connected between the gate and the second terminal of the transistor 151_1, and a capacitor 152_2 can be connected between the gate and the second terminal of the transistor 151_2. However, this embodiment is not limited to this.

Note that, it is preferable that the capacitance of the capacitor 152_1 and the capacitance of the capacitor 152_2 be substantially equal. Alternatively, it is preferable that the area where one electrode of the capacitor 152_1 overlaps with the other electrode thereof be substantially equal to the area where one electrode of the capacitor 152_2 overlaps with the other electrode thereof. In such a manner, Vgs of the transistor 151_1 and Vgs of the transistor 151_2 can be substantially equal even when the transistor 151_1 and the transistor 151_2 are alternately used. Therefore, the waveform of the signal SOUT can be made substantially uniform. However, this embodiment is not limited to this.

Figure 6E:
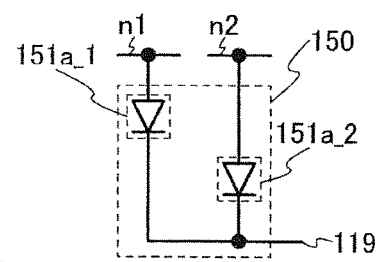
Figure 6F:
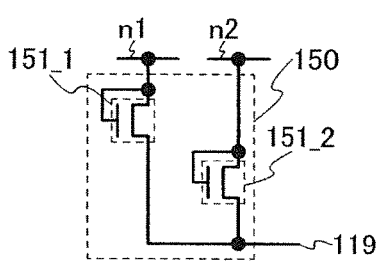

Note that in the structure described with reference to FIGS. 6A to 6D, as shown in FIG. 6E and in a manner similar to that described with reference to FIG. 1E, the transistor 151_1 can be replaced with a diode 151a_1. One terminal of the diode 151a_1 is connected to the node n1 and the other terminal is connected to the wiring 119. In a similar manner, the transistor 151_2 can be replaced with a diode 151a_2. One terminal of the diode 151a_2 is connected to the node n2 and the other terminal is connected to the wiring 119. However, this embodiment is not limited to this. For example, in the structure described with reference to FIGS. 6A to 6D, as shown in FIG. 6F and in a manner similar to that described with reference to FIG. 1F, connecting the first terminal of the transistor 151_1 to the node n1 allows the transistor 151_1 to be diode-connected. In a similar manner, connecting the first terminal of the transistor 151_2 to the node n2 allows the transistor 151_2 to be diode-connected.

Figure 6G:
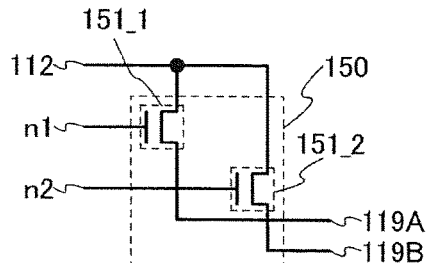

Note that in the structure described with reference to FIGS. 6A to 6F, as shown in FIG. 6C; the second terminal of the transistor 151_1 and the second terminal of the transistor 151_2 can be connected to different wirings. In an example of FIG. 6G, the wiring 119 is divided into a plurality of wirings, that is, wirings 119A and 119B. Then, the second terminal of the transistor 151_1 is connected to the wiring 119A, and the second terminal of the transistor 151_2 is connected to the wiring 119B. However, this embodiment is not limited to this.

(Embodiment 2)

An example of this embodiment includes a first transistor, a second transistor, a first circuit, a second circuit, and a third circuit. A first terminal of the first transistor is electrically connected to a first wiring and a second terminal of the first transistor is electrically connected to a second wiring. A first terminal of the second transistor is electrically connected to the first wiring and a second terminal of the second transistor is electrically connected to the second wiring. The first circuit is electrically connected to a gate of the first transistor and a gate of the second transistor. The second circuit is electrically connected to the gate of the first transistor, the gate of the second transistor, and the second wiring. The third circuit is electrically connected to the gate of the first transistor, the gate of the second transistor, and the second wiring. The first circuit has the function of raising the gate voltage of the first transistor when a first signal is in the first voltage state and a second signal is in the second voltage state and the function of raising the gate voltage of the second transistor when the first signal is in the first voltage state and a third signal is in the second voltage state. The second circuit has the function of outputting a signal or voltage in the first voltage state to any of the gate of the first transistor, the gate of the second transistor, and the second wiring when any of the gate of the first transistor, the gate of the second transistor, and the second wiring is in the first voltage state. The third circuit has the function of outputting a signal or voltage in the first voltage state to any of the gate of the first transistor, the gate of the second transistor, and the second wiring when a fourth signal is in the second voltage state.

An example of this embodiment includes a first transistor, a second transistor, a third transistor, a fourth transistor, a fifth transistor, and a sixth transistor. A first terminal of the first transistor is electrically connected to a first wiring and a second terminal of the first transistor is electrically connected to a second wiring. a first terminal of the second transistor is electrically connected to the first wiring and a second terminal of the second transistor is electrically connected to the second wiring. A first terminal of the third transistor is electrically connected to a third wiring, a second terminal of the third transistor is electrically connected to the gate of the first transistor, and a gate of the third transistor is electrically connected to the third wiring. A first terminal of the fourth transistor is electrically connected to the third wiring, a second terminal of the fourth transistor is electrically connected to the gate of the second transistor, and a gate of the fourth transistor is electrically connected to the third wiring. A first terminal of the fifth transistor is electrically connected to a fourth wiring, a second terminal of the fifth transistor is electrically connected to the gate of the second transistor, and a gate of the fifth transistor is electrically connected to a fifth wiring. A first terminal of the sixth transistor is electrically connected to the fourth wiring, a second terminal of the sixth transistor is electrically connected to the gate of the first transistor, and a gate of the sixth transistor is electrically connected to a sixth wiring.

An example of a semiconductor device in this embodiment will be described. The semiconductor device in this embodiment can be used for the circuit 200 described in Embodiment 1. Note that description of the content in Embodiment 1 is omitted. Note that the content described in this embodiment can be combined with the content described in Embodiment 1, as appropriate.

Figure 10:
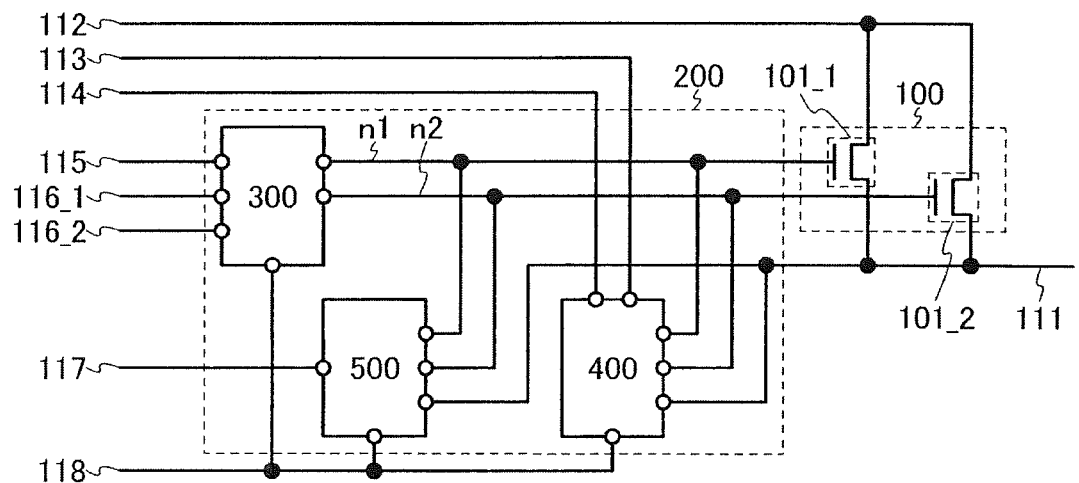
FIG. 10 is an example of a circuit diagram of a semiconductor device in Embodiment 2.

First, an example of the circuit 200 will be described with reference to FIG. 10. In an example of FIG. 10, the circuit 200 includes a circuit 300, a circuit 400, and a circuit 500. The circuit 300 represents a part of the circuit 200. The circuit 400 represents a part of the circuit 200. The circuit 500 represents a part of the circuit 200. A part or all of the circuit 300, the circuit 400, and the circuit 500 can be shared with one another.

The circuit 300 is connected to the wiring 115, the wiring 116_1, the wiring 116_2, the wiring 118, the node n1, and the node n2, for example. The circuit 400 is connected to the wiring 111, the wiring 113, the wiring 114, the wiring 118, the node n1, and the node n2, for example. The circuit 500 is connected to the wiring 111, the wiring 117, the wiring 118, the node n1, and the node n2, for example. However, this embodiment is not limited to this. For example, the circuit 300, the circuit 400, and the circuit 500 can be connected to various other wirings or nodes, in accordance with its structure.

Note that the circuit 300, the circuit 400, and the circuit 500 are not necessarily connected to all of the wirings above and can be disconnected from any of the wirings above. For example, the circuit 300 can be connected to the wiring 113 and/or the wiring 114. Alternatively, the circuit 300 can be disconnected from the wiring 118. Alternatively, the circuit 400 can be disconnected from one of the wiring 113 and the wiring 114. Alternatively, the circuit 500 can be disconnected from the wiring 111. However, this embodiment is not limited to this.

The circuit 300 has the function of controlling the voltage of the node n1 and/or the voltage of the node n2 in accordance with a signal input (e.g., the signal SP, the signal SEL1, and/or the signal SEL2 ), for example. Alternatively, the circuit 300 has the function of controlling the timing of when a high-level signal, the voltage V2, or the like is supplied to the node n1 and/or the node n2. Alternatively, the circuit 300 has the function of controlling the timing of when the voltage of the node n1 and/or the voltage of the node n2 is increased. Alternatively, the circuit 300 has the function of controlling the timing of when a low-level signal, the voltage V1, or the like is supplied to the node n1 and/or the node n2. Alternatively, the circuit 300 has the function of controlling the timing of when the voltage of the node n1 and/or the voltage of the node n2 is decreased or maintained. Alternatively, the circuit 300 has the function of controlling the timing of when the supply of a signal or a voltage to the node n1 and/or the node n2 is stopped. Alternatively, the circuit 300 has the function of controlling the timing of when the node n1 and/or the node n2 is brought into a floating state. As described above, the circuit 300 can function as a control circuit. However, this embodiment is not limited to this. Note that the circuit 300 need not have all of the functions above.

The circuit 400 has the function of controlling the voltage of the node n1, the voltage of the node n2, and/or the voltage of the wiring 111 in accordance with a signal input or a voltage supplied (e.g., the signal CK2, the wiring 114, the wiring 118, the signal OUT, the voltage of the node n1, the voltage of the node n2 and/or the voltage of the wiring 111), for example. Alternatively, the circuit 400 has the function of controlling the timing of when a low-level signal or the voltage V1 is supplied to the node n1, the node n2, and/or the wiring 111. Alternatively, the circuit 400 has the function of controlling the timing of when the voltage of the node n1, the voltage of the node n2, and/or the voltage of the wiring 111 is decreased or maintained. Alternatively, the circuit 400 has the function of controlling the timing of when the supply of a signal or a voltage to the node n1 and/or the node n2 is stopped. Alternatively, the circuit 400 has the function of controlling the timing of when the node n1 and/or the node n2 is brought into a floating state. As described above, the circuit 400 can function as a control circuit. However, this embodiment is not limited to this. Note that the circuit 400 need not have all of the functions above.

The circuit 500 has the function of controlling electrical continuity between the wiring 118 and the node n1, the wiring 118 and the node n2, and/or the wiring 118 and the wiring 111 in accordance with a signal input (e.g., the signal RE), for example. Alternatively, the circuit 500 has the function of controlling the timing of when the voltage of the wiring 118 is supplied to the node n1, the node n2, and/or the wiring ill. For example, when a signal, a voltage, or the like (e.g., the signal CK2 or the voltage V1) is supplied to the wiring 118, the circuit 500 has the function of controlling the timing of when the signal or the voltage supplied to the wiring 118 is supplied to the node n1, the node n2, and/or the wiring 111. Alternatively, the circuit 500 has the function of controlling the timing of when a low-level signal or the voltage V1 is supplied to the node n1, the node n2, and/or the wiring 111. Alternatively, the circuit 500 has the function of controlling the timing of when the voltage of the node n1, the voltage of the node n2, and/or the voltage of the wiring 111 is decreased or maintained. As described above, the circuit 500 can function as a control circuit, a switch, or the like. However, this embodiment is not limited to this. Note that the circuit 500 need not have all of the functions above.

Note that since the circuit 300, the circuit 400, and the circuit 500 represent a part of the circuit 200 in many cases, the circuit 200 can have a combination of a part or all of the functions of the circuit 300, the circuit 400, and the circuit 500. Alternatively, the circuit 300, the circuit 400, and the circuit 500 each can have a part or all of the functions of the circuit 200. However, this embodiment is not limited to this.

Next, an example of the operation of the semiconductor device in FIG. 10 will be described. Note that since the semiconductor device in FIG. 10 operates in a manner similar to the semiconductor device in FIGS. 1A to 1F, the operation of the semiconductor device in FIG. 10 will be described with reference to the timing chart in FIG. 2. Note that the operation of the semiconductor device in FIG. 10 is not limited to that shown in the timing chart in FIG. 2 and can be controlled at different timings.

First, an operation during the period T1 will be described. During the period T1, the signal SEL1 is at a high level and the signal SEL2 is at a low level.

Figure 11A:
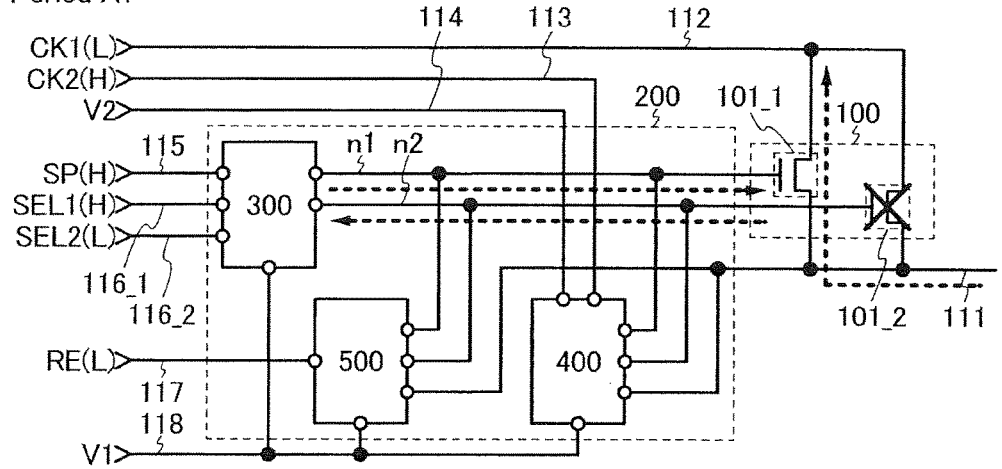
FIGS. 11A to 11C are examples of a schematic view for showing operation of the semiconductor device in Embodiment 2.

During the period A1, as shown in FIG. 11A, the signal SP is at a high level. Then, the circuit 300 supplies the voltage V2 or a high-level signal to the node n1. Meanwhile, the circuit 300 supplies a low-level signal or the voltage V1 to the node n2. After that, as described in Embodiment 1, the circuit 300 stops supplying the signal or the voltage to the node n1 at the time that the voltage of the node n1 reaches V1+Vth101_1 or more. Thus, electrical continuity is broken between the circuit 300 and the node n1. However, this embodiment is not limited to this. For example, the circuit 300 can keep supplying the voltage of V1+Vth101_1 or more to the node n1.

Note that during the period A1, the circuit 400 supplies no signal or voltage to the node n1 in many cases. Note that the circuit 400 may or may not supply a low-level signal or the voltage V1 to the node n2 and/or the wiring 111.

Note that during the period A1, the circuit 500 supplies no signal or voltage to the node n1, the node n2, and/or the wiring 111 in many cases.

Figure 11B:
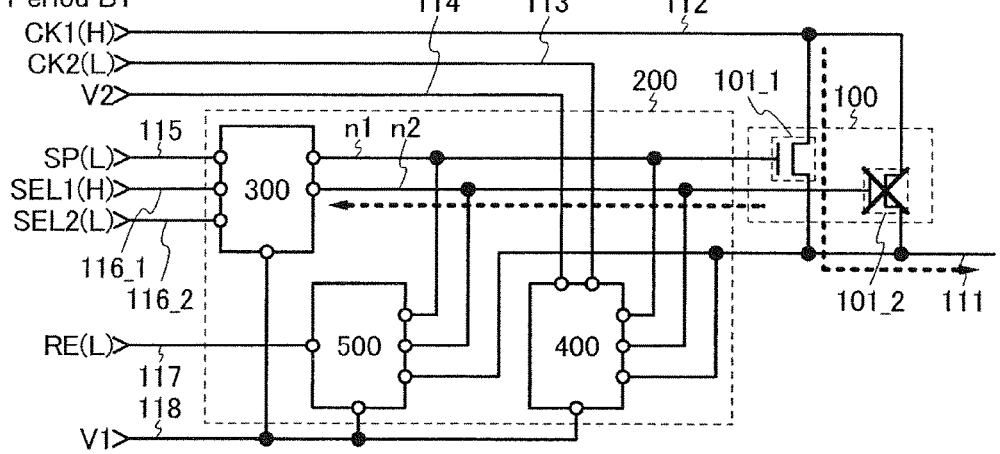

Next, during the period B1, as shown in FIG. 11B, the circuit 300 keeps supplying no signal or voltage to the node n1. Accordingly, there is still no electrical continuity between the circuit 300 and the node n1. Meanwhile, the circuit 300 supplies a low-level signal or the voltage V1 to the node n2.

Note that during the period B1, the circuit 400 supplies no signal or voltage to the node n1 and the wiring 111 in many cases. Note that the circuit 400 may or may not supply a low-level signal or the voltage V1 to the node n2.

Note that during the period B1, the circuit 500 supplies no signal or voltage to the node n1, the node n2, and/or the wiring 111 in many cases.

Figure 11C:
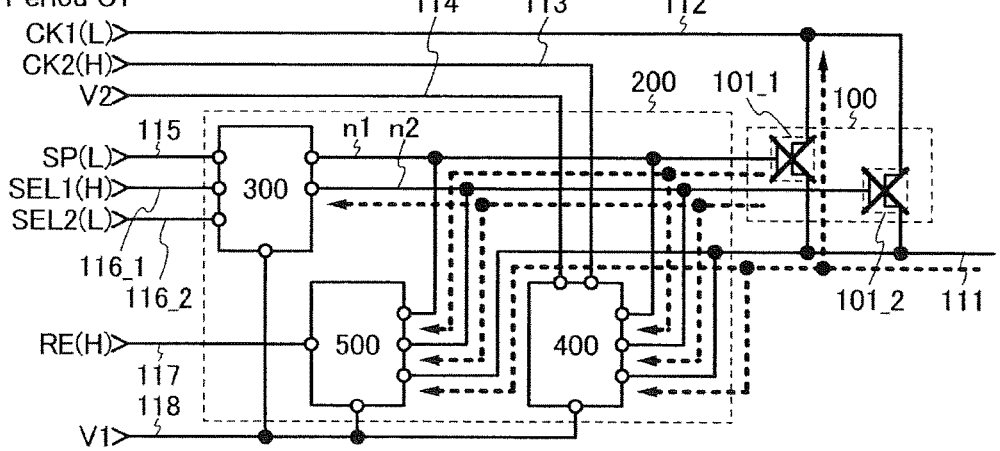

Next, during the period C1, as shown in FIG. 11C, the signal RE is at a high level. Accordingly, the circuit 500 supplies a low-level signal or the voltage V1 to the node n1, the node n2, and/or the wiring 111.

Note that during the period C1, the circuit 300 may or may not supply a low-level signal or the voltage V1 to the node n2.

Note that during the period C1, the circuit 400 may or may not supply a low-level signal or the voltage V1 to the node n1, the node n2 and/or the wiring 111.

Figure 12A:
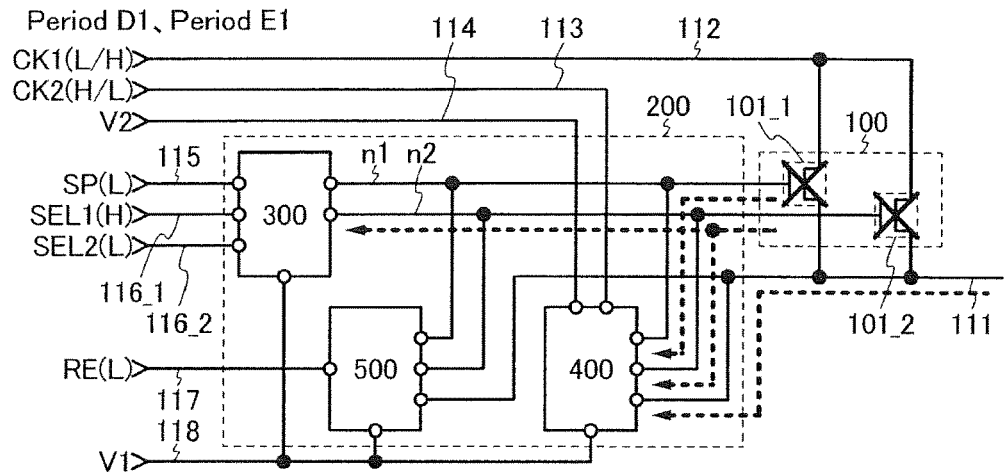
FIGS. 12A to 12C are examples of a schematic view for showing operation of the semiconductor device in Embodiment 2.

Next, during the period D1 and the period E1, as shown in FIG. 12A, the circuit 400 supplies a low-level signal or the voltage V1 to the node n1, the node n2, and/or the wiring 111. However, this embodiment is not limited to this. For example, during one of the period D1 and the period E1, it is possible that the circuit 400 supplies a low-level signal or the voltage V1 to the node n1, the node n2, and/or the wiring 111, and during the other period, it is possible that the circuit 400 supplies no signal or voltage to the node n1, the node n2, and/or the wiring 111.

Note that during the period D1 and the period E1, the circuit 300 may or may not supply a low-level signal or the voltage V1 to the node n1 and/or the node n2.

Note that during the period D1 and the period E1, the circuit 500 supplies no signal or voltage to the node n1, the node n2, and/or the wiring 111 in many cases.

Next, an operation during the period T2 will be described. During the period T2, the signal SEL1 is at a low level and the signal SEL2 is at a high level.

Figure 12B:
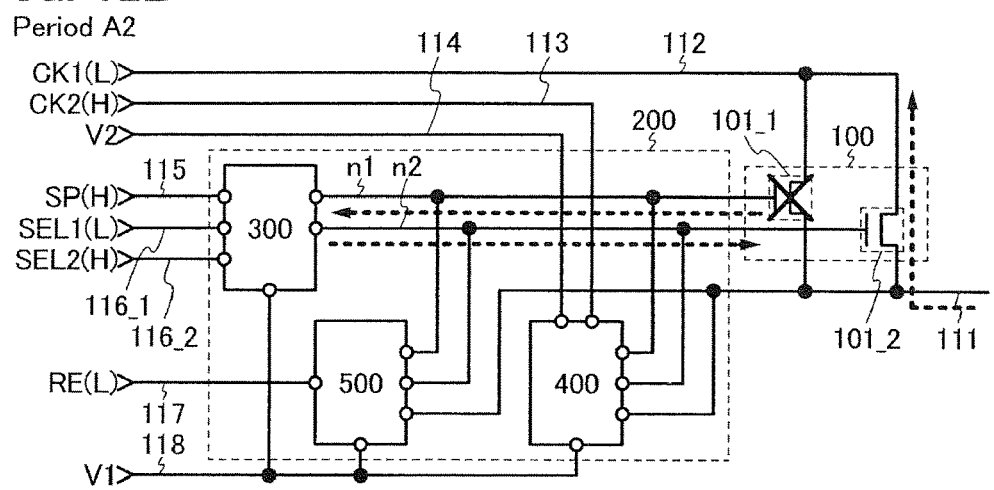

During the period A2, as shown in FIG. 12B, the signal SP is at a high level. Accordingly, the circuit 300 supplies a low-level signal or the voltage V1 to the node n1. Meanwhile, the circuit 300 supplies the voltage V2 or a high-level signal to the node n2. After that, as described in Embodiment 1, the circuit 300 stops supplying the signal or the voltage to the node n2 at the time that the voltage of the node n2 reaches V1+Vth101_2 or more. Thus, electrical continuity is broken between the circuit 300 and the node n2. However, this embodiment is not limited to this. For example, the circuit 300 can keep supplying the voltage of V1+Vth101_2 or more to the node n2.

Note that during the period A2, the circuit 400 supplies no signal or voltage to the node n2 in many cases. Note that the circuit 400 may or may not supply a low-level signal or the voltage V1 to the node n1 and/or the wiring 111.

Note that during the period A2, the circuit 500 supplies no signal or voltage to the node n1, the node n2, and/or the wiring 111 in many cases.

Figure 12C:
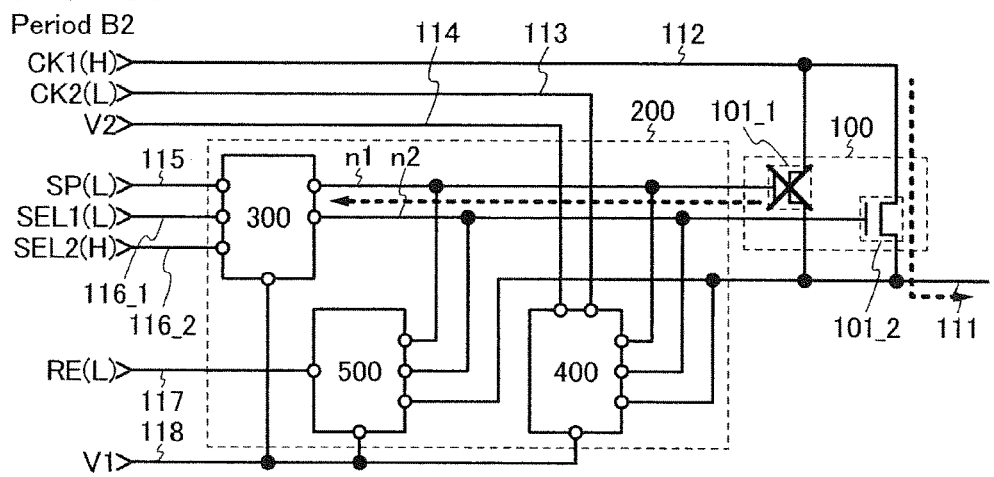

Next, during the period B2, as shown in FIG. 12C, the circuit 300 supplies a low-level signal or the voltage V1 to the node n1. Meanwhile, the circuit 300 keeps supplying no signal or voltage to the node n2. Accordingly, there is still no electrical continuity between the circuit 300 and the node n2.

Note that during the period B2, the circuit 400 supplies no signal or voltage to the node n2 and the wiring 111 in many cases. Note that the circuit 400 may or may not supply a low-level signal or the voltage V1 to the node n1.

Note that during the period B2, the circuit 500 supplies no signal or voltage to the node n1, the node n2, and/or the wiring 111 in many cases.

Figure 13A:
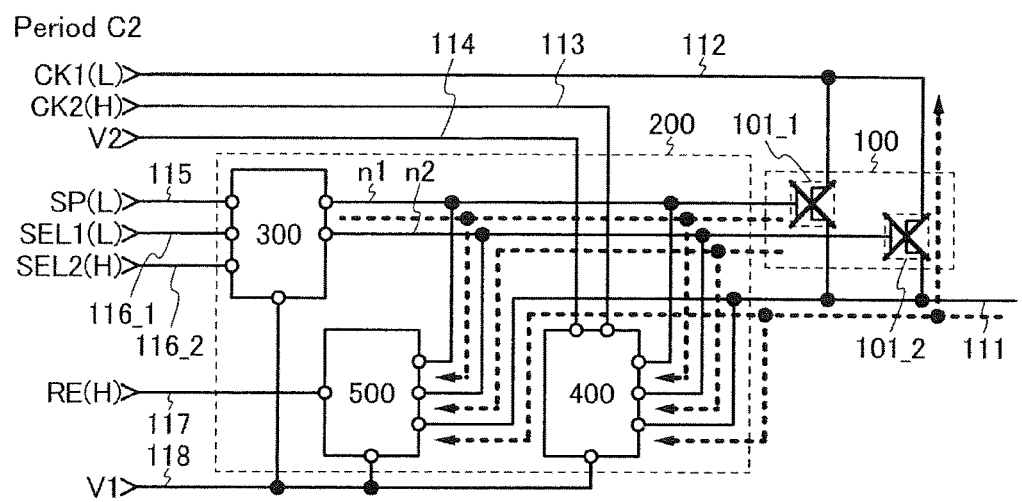
FIGS. 13A and 13B are examples of a schematic view for showing operation of the semiconductor device in Embodiment 2.

Next, during the period C2, as shown in FIG. 13A, the signal RE is at a high level. Accordingly, the circuit 500 supplies a low-level signal or the voltage V1 to the node n1, the node n2, and/or the wiring 111.

Note that during the period C2, the circuit 300 may or may not supply a low-level signal or the voltage V1 to the node n1 and/or the node n2.

Note that during the period C2, the circuit 400 may or may not supply a low-level signal or the voltage V1 to the node n1, the node n2, and/or the wiring 111.

Figure 13B:
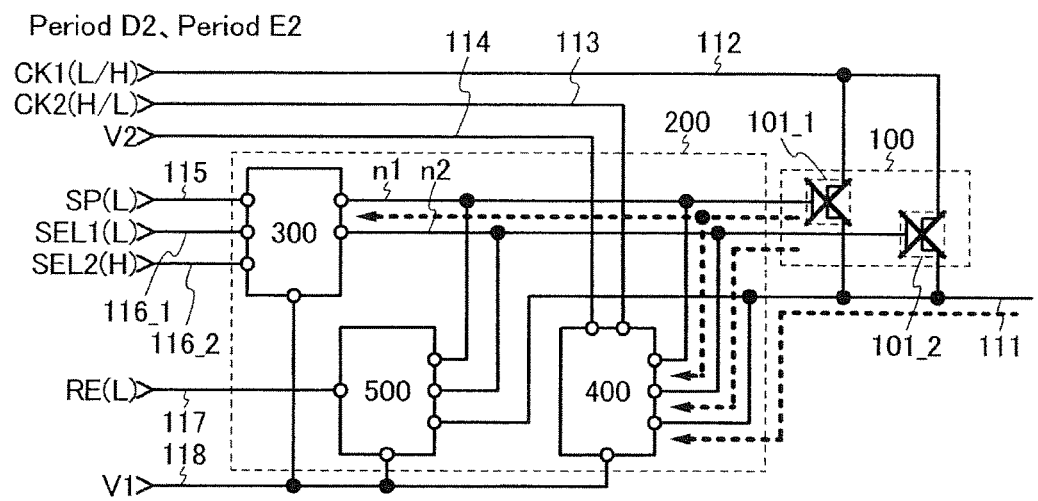

Next, during the period D2 and the period E2, the circuit 400 supplies a low-level signal or the voltage V1 to the node n1, the node n2, and/or the wiring 111 as shown in FIG. 13B. However, this embodiment is not limited to this. For example, during one of the period D2 and the period E2, it is possible that the circuit 400 supplies the voltage 1 or a low-level signal to the node n1, the node n2, and/or the wiring 111, and during the other period, it is possible that the circuit 400 supplies no signal or voltage to the node n1, the node n2, and/or the wiring ill.

Note that during the period D2 and the period E2, the circuit 300 may or may not supply a low-level signal or the voltage V1 to the node n1 and/or the node n2.

Note that during the period D2 and the period E2, the circuit 500 supplies no signal or voltage to the node n1, the node n2, and/or the wiring 111 in many cases.

Figure 14A:
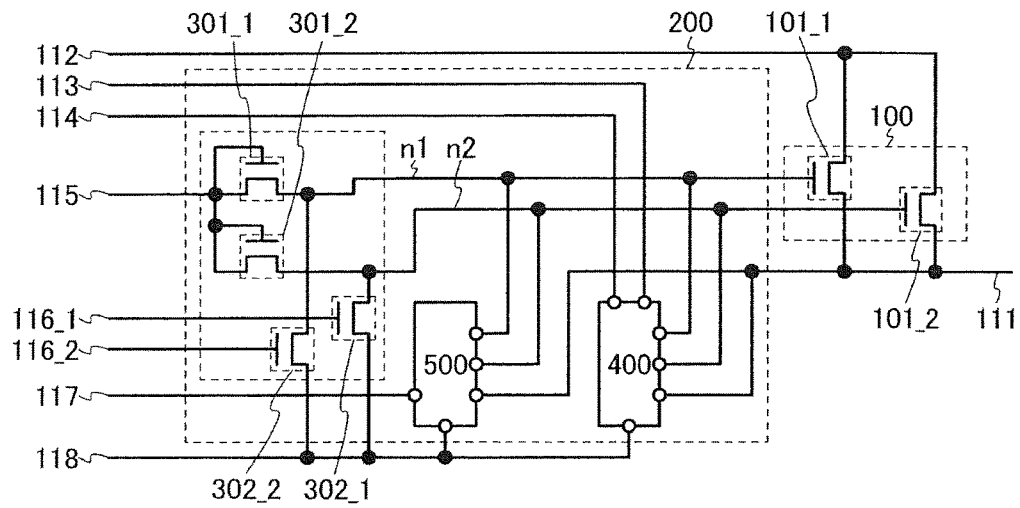
FIGS. 14A to 14E are examples of a circuit diagram of the semiconductor device in Embodiment 2.

Next, a specific example of the circuit 300 will be described with reference to FIG. 14A. The circuit 300 includes a plurality of transistors, that is, transistors 301_1, 301_2, 302_1, and 302_2. The transistors 301_1, 301_2, 302_1, and 302_2 preferably have the same polarity as the transistors 101_1 and 101_2, which are n-channel transistors. However, this embodiment is not limited to this, that is, the transistors 301_1, 301_2, 302_1, and 302_2 can be p-channel transistors.

A first terminal of the transistor 301_1 is connected to the wiring 115, a second terminal of the transistor 301_1 is connected to the node n1, and a gate of the transistor 301_1 is connected to the wiring 115. A first terminal of the transistor 301_2 is connected to the wiring 115, a second terminal of the transistor 301_2 is connected to the node n2, and a gate of the transistor 301_2 is connected to the wiring 115. A first terminal of the transistor 302_1 is connected to the wiring 118, a second terminal of the transistor 302_1 is connected to the node n2, and a gate of the transistor 302_1 is connected to the wiring 116_1. A first terminal of the transistor 302_2 is connected to the wiring 118, a second terminal of the transistor 302_2 is connected to the node n1, and a gate of the transistor 302_2 is connected to the wiring 116_2.

The transistor 301_1 has the function of controlling electrical continuity between the wiring 115 and the node n1, for example. Alternatively, the transistor 301_1 has the function of controlling the timing of when the voltage of the wiring 115 is supplied to the node n1. For example, when a signal or a voltage (e.g., the signal SP or the voltage V2) is supplied to the wiring 115, the transistor 301_1 has the function of controlling the timing of when the signal or the voltage supplied to the wiring 115 is supplied to the node n1. Alternatively, the transistor 301_1 has the function of controlling the timing of when a high-level signal (e.g., the signal SP) or the voltage V2 is supplied to the node n1. Alternatively, the transistor 301_1 has the function of controlling the timing of when the voltage of the node n1 is increased. Alternatively, the transistor 301_1 has the function of controlling the timing of when the supply of a signal or a voltage to the node n1 is stopped. Alternatively, the transistor 301_1 has the function of controlling the timing of when the node n1 is brought into a floating state. As described above, the transistor 301_1 functions as a switch, a rectifier, a diode, a diode-connected transistor, or the like. Alternatively, the transistor 301_1 has the function of controlling whether or not the transistor 101_1 is turned off, by being on or off. Alternatively, the transistor 301_1 has the function of controlling whether or not the diode 101a_1 (shown in FIG. 1E) is made non-conducting, by being on or off. However, this embodiment is not limited to this. Note that the transistor 301_1 need not have all of the functions above.

The transistor 301_2 has the function of controlling electrical continuity between the wiring 115 and the node n2, for example. Alternatively, the transistor 301_2 has the function of controlling the timing of when the voltage of the wiring 115 is supplied to the node n2. For example, when a signal or a voltage (e.g., the signal SP or the voltage V2) is supplied to the wiring 115, the transistor 301_2 has the function of controlling the timing of when the signal or the voltage supplied to the wiring 115 is supplied to the node n2. Alternatively, the transistor 301_2 has the function of controlling the timing of when a high-level signal (e.g., the signal SP) or the voltage V2 is supplied to the node n2. Alternatively, the transistor 301_2 has the function of controlling the timing of when the voltage of the node n2 is increased. Alternatively, the transistor 301_2 has the function of controlling the timing of when the supply of a signal or a voltage to the node n2 is stopped. Alternatively, the transistor 301_2 has the function of controlling the timing of when the node n2 is brought into a floating state. As described above, the transistor 301_2 functions as a switch, a rectifier, a diode, a diode-connected transistor, or the like. Alternatively, the transistor 301_2 has the function of controlling whether or not the transistor 101_2 is turned off, by being on or off. Alternatively, the transistor 301_2 has the function of controlling whether or not the diode 101a_2 (shown in FIG. 1E) is made non-conducting, by being on or off. However, this embodiment is not limited to this. Note that the transistor 301_2 need not have all of the functions above.

The transistor 302_1 has the function of controlling electrical continuity between the wiring 118 and the node n2, for example. Alternatively, the transistor 302_1 has the function of controlling the timing of when the voltage of the wiring 118 is supplied to the node n2. For example, when a signal or a voltage (e.g., the signal SEL2 or the voltage V1) is supplied to the wiring 118, the transistor 302_1 has the function of controlling the timing of when the signal or the voltage supplied to the wiring 118 is supplied to the node n2. Alternatively, the transistor 302_1 has the function of controlling the timing of when a low-level signal or the voltage V1 is supplied to the node n2. Alternatively, the transistor 302_1 has the function of controlling the timing of when the voltage of the node n2 is decreased or maintained. Alternatively, the transistor 302_1 has the function of controlling whether or not the transistor 101_2 is turned off, that is, the transistor 302_1 has the function of controlling the timing of when the transistor 101_2 is turned off. As described above, the transistor 302_1 functions as a switch. However, this embodiment is not limited to this. Note that the transistor 302_1 need not have all of the functions above.

The transistor 302_2 has the function of controlling electrical continuity between the wiring 118 and the node n1, for example. Alternatively, the transistor 302_2 has the function of controlling the timing of when the voltage of the wiring 118 is supplied to the node n1. For example, when a signal or a voltage (e.g., the signal SEL1 or the voltage V1) is supplied to the wiring 118, the transistor 302_2 has the function of controlling the timing of when the signal or the voltage supplied to the wiring 118 is supplied to the node n1. Alternatively, the transistor 302_2 has the function of controlling the timing of when a low-level signal or the voltage V1 is supplied to the node n1. Alternatively, the transistor 302_2 has the function of controlling the timing of when the voltage of the node n1 is decreased or maintained. Alternatively, the transistor 302_2 has the function of controlling whether or not the transistor 101_1 is turned off, that is, the transistor 302_2 has the function of controlling the timing of when the transistor 101_1 is turned off. As described above, the transistor 302_2 functions as a switch. However, this embodiment is not limited to this. Note that the transistor 302_2 need not have all of the functions above.

Next, an example of the operation of the semiconductor device in FIG. 14A will be described. Note that since the semiconductor device in FIG. 14A operates in a manner similar to the semiconductor device in FIG. 1A, the operation of the semiconductor device in FIG. 14A will be described with reference to the timing chart in FIG. 2. Note that the operation of the semiconductor device in FIG. 14A is not limited to that shown in the timing chart in FIG. 2 and can be controlled at different timings.

During the period A1, as shown in FIG. 15A, the signal SP is at a high level. Accordingly, the transistor 301_1 and the transistor 301_2 are turned on, so that electrical continuity is established between the wiring 115 and the node n1 and between the wiring 115 and the node n2. Therefore, the signal SP at a high level is supplied from the wiring 115 to the node n1 through the transistor 301_1. Here, the signal SEL2 is at a low level. Accordingly, the transistor 302_2 is turned off; thus, electrical continuity is broken between the wiring 118 and the node n1. Therefore, the voltage of the node n1 starts to be increased. The voltage of the node n1 is then increased to a value (V2−Vth301_1) obtained by subtracting the threshold voltage of the transistor 301_1 (Vth 301_1) from the gate voltage of the transistor 301_1 (e.g., the voltage of the signal SP at a high level (V2)). Accordingly, the transistor 301_1 is turned off; thus, electrical continuity is broken between the wiring 115 and the node n1. Meanwhile, the signal SP at a high level is supplied from the wiring 115 to the node n2 through the transistor 301_2. Here, the signal SEL1 is at a high level. Accordingly, the transistor 302_1 is turned on; thus, electrical continuity is established between the wiring 118 and the node n2. Therefore, the voltage V1 is supplied from the wiring 118 to the node n2 through the transistor 302_1. As a result, the voltage of the node n2 is determined by the ratio of the resistance of the transistor 301_2 to the resistance of the transistor 302_1. Therefore, setting the channel width of the transistor 302_1 larger than that of the transistor 301_2 makes it possible to reduce the voltage of the node n2 (e.g., V1).

Figure 16A:
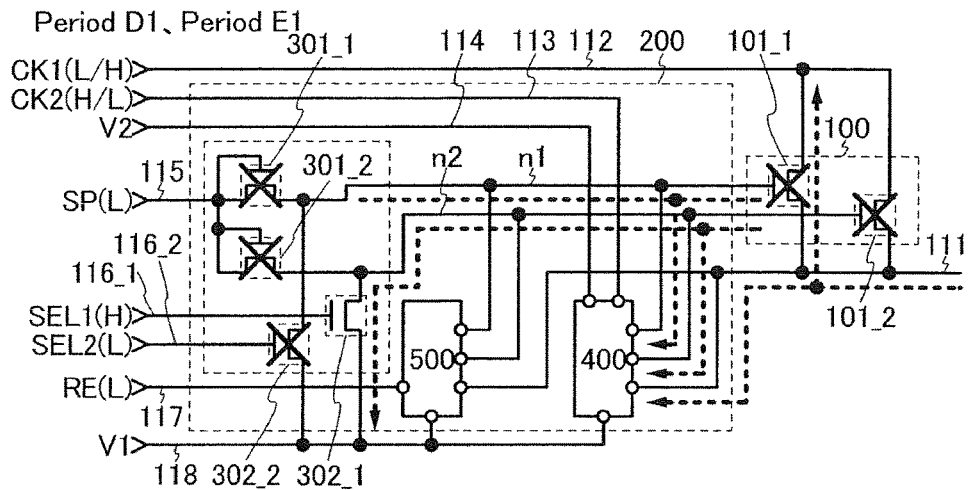
FIGS. 16A to 16C are examples of a schematic view for showing operation of the semiconductor device in Embodiment 2.

During the periods B1 to E1, as shown in FIGS. 15B and 15C and FIG. 16A, the signal SP is at a low level. Accordingly, the transistor 301_1 and the transistor 301_2 are turned off, so that electrical continuity is broken between the wiring 115 and the node n1 and between the wiring 115 and the node n2. Here, the signal SEL1 is at a high level and the signal SEL2 is at a low level. Accordingly, the transistor 302_1 is turned on and the transistor 302_2 is turned off, so that electrical continuity is established between the wiring 118 and the node n2 and electrical continuity is broken between the wiring 118 and the node n1. Therefore, the voltage V1 is supplied from the wiring 118 to the node n2 through the transistor 302_1.

Figure 16B:
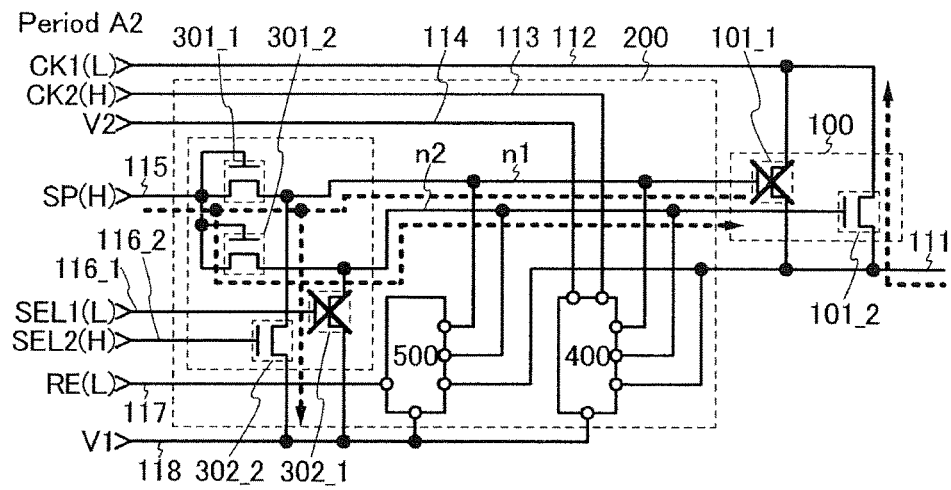
Figure 16C:
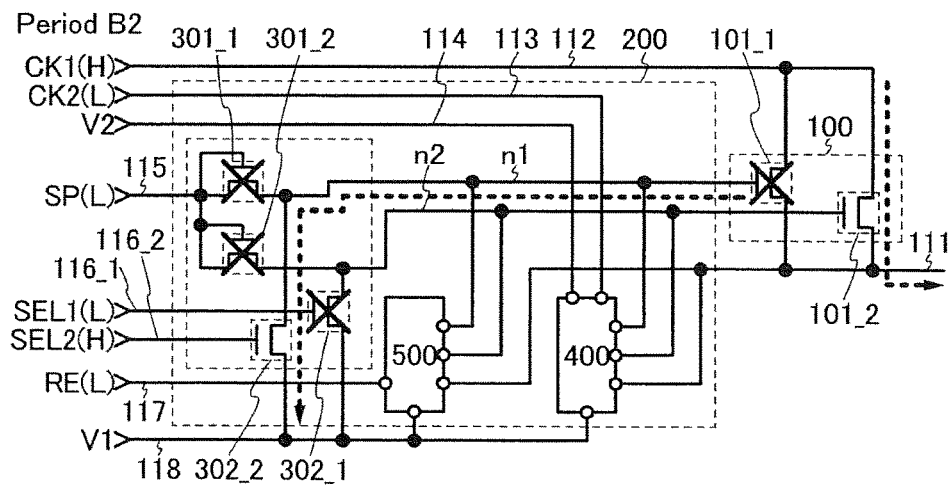

During the period A2, as shown in FIG. 16B, the signal SP is at a low level. Accordingly, the transistor 301_1 and the transistor 301_2 are turned on, so that electrical continuity is established between the wiring 115 and the node n1 and between the wiring 115 and the node n2. The signal SP at a high level is supplied from the wiring 115 to the node n1 through the transistor 301_1. Here, the signal SEL2 is at a high level. Accordingly, the transistor 302_2 is turned on; thus, electrical continuity is established between the wiring 118 and the node n1. Therefore, the voltage V1 is supplied from the wiring 118 to the node n1 through the transistor 302_2. As a result, the voltage of the node n1 is determined by the ratio of the resistance of the transistor 301_1 to the resistance of the transistor 302_2. Therefore, setting the channel width of the transistor 302_2 larger than that of the transistor 301_1 makes it possible to reduce the voltage of the node n1 (e.g., V1). Meanwhile, the signal SP at a high level is supplied from the wiring 115 to the node n2 through the transistor 301_2. Here, the signal SEL1 is at a low level. Accordingly, the transistor 302_1 is turned off thus, electrical continuity is broken between the wiring 118 and the node n2. Therefore, the voltage of the node n2 starts to be increased. The voltage of the node n2 is then increased to a value (V2−Vth301_2) obtained by subtracting the threshold voltage of the transistor 301_2 (Vth 301_2) from the gate voltage of the transistor 301_2 (e.g., the voltage of the signal SP at a high level (V2)). Accordingly, the transistor 301_2 is turned off; thus, electrical continuity is broken between the wiring 115 and the node n2.

During the periods B2 to E2, as shown in FIG. 16C and FIGS. 17A to 17C, the signal SP is at a low level. Accordingly, the transistor 301_1 and the transistor 301_2 are turned off, so that electrical continuity is broken between the wiring 115 and the node n1 and between the wiring 115 and the node n2. Here, the signal SEL1 is at a low level and the signal SEL2 is at a high level. Accordingly, the transistor 302_1 is turned off and the transistor 302_2 is turned on, so that electrical continuity is broken between the wiring 118 and the node n2 and electrical continuity is established between the wiring 118 and the node n1. Therefore, the voltage V1 is supplied from the wiring 118 to the node n1 through the transistor 302_2.

As described above, one of the signal SEL1 and the signal SEL2 is set at a high level. In such a manner, maintaining one of the voltage of the node n1 and the voltage of the node n2 at a low value (e.g., V1) makes it possible to select whether the transistor 101_1 or the transistor 101_2 is turned on. However, this embodiment is not limited to this. For example, both the signal SEL1 and the signal SEL2 can be set at a low level. In this case, both the voltage of the node n1 and the voltage of the node n2 can be increased. Therefore, both the transistor 101_1 and the transistor 101_2 are turned on; thus, electrical continuity is established between the wiring 112 and the wiring 111 through the transistor 101_1 and the transistor 101_2 connected in parallel. Accordingly, the fall time or the rise time of the signal OUT can be shortened.

It is preferable that the channel width of the transistor 301_1 be substantially equal to that of the transistor 301_2. By making the transistors have substantially the same size in such a manner, the transistors can have substantially the same current supply capability. Alternatively, the degree of degradation of the transistors can be substantially equal. Accordingly, the voltage of the node n1 and the voltage of the node n2 can be substantially equal; thus, the waveform of the signal OUT can be substantially uniform. Note that for a similar reason, it is preferable that the channel length of the transistor 301_1 be substantially equal to that of the transistor 301_2. However, this embodiment is not limited to this.

Note that each of the channel width of the transistor 301_1 and the channel width of the transistor 301_2 is preferably 500 μm to 3000 μm, more preferably 800 μm to 2500 μm, and much more preferably 1000 μm to 2000 μm. However, this embodiment is not limited to this.

It is preferable that the channel width of the transistor 302_1 be substantially equal to that of the transistor 302_2. By making the transistors have substantially the same size in such a manner, the transistors can have substantially the same current supply capability. Alternatively, the degree of degradation of the transistors can be substantially equal. Accordingly, the voltage of the node n1 and the voltage of the node n2 can be substantially equal; thus, the waveform of the signal OUT can be substantially uniform. Note that for a similar reason, it is preferable that the channel length of the transistor 302_1 be substantially equal to that of the transistor 302_2. However, this embodiment is not limited to this.

The channel width of the transistor 302_1 is preferably larger than that of the transistor 301_2. Thus, the voltage of the node n1 can be set at a low value (e.g., V1) during the period A2. The channel width of the transistor 302_1 preferably is approximately less than 10 times, and more preferably less than 7 times, and much more preferably less than 3 times that of the transistor 301_2. However, this embodiment is not limited to this.

The channel width of the transistor 302_2 is preferably larger than that of the transistor 301_1. Thus, the voltage of the node n2 can be set at a low value (e.g., V1) during the period A. The channel width of the transistor 302_2 preferably is approximately 10 times or less, and more preferably 7 times or less, and much more preferably 3 times or less that of the transistor 301_1. However, this embodiment is not limited to this.

Note that each of the channel width of the transistor 301_1 and the channel width of the transistor 301_2 is preferably 600 μm to 3500 μm, more preferably 1000 μm to 3000 μm, and much more preferably 1500 μm to 2500 μm. However, this embodiment is not limited to this.

Figure 14B:
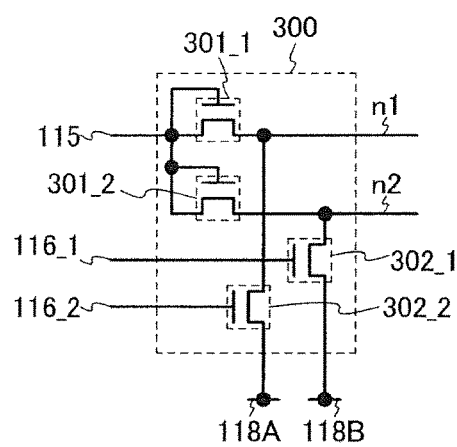

Note that in the structure described with reference to FIG. 14A, the first terminal of the transistor 302_1 and the first terminal of the transistor 302_2 can be connected to different wirings as shown in FIG. 14B. In an example of FIG. 14B, the wiring 118 is divided into a plurality of wirings, that is, wirings 118A and 118B. Accordingly, the first terminal of the transistor 302_1 is connected to the wiring 118B, and the first terminal of the transistor 302_2 is connected to the wiring 118A. However, this embodiment is not limited to this. Note that the wirings 118A and 118B can function in a manner similar to the wiring 118. Accordingly, a signal such as the signal CK1 can be input to the wirings 118A and 118B. However, this embodiment is not limited to this. For example, the wiring 118A and the wiring 118B can be supplied with different voltages or different signals.

Figure 14C:
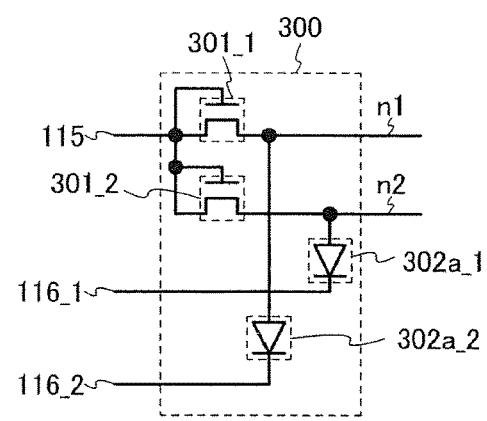
Figure 14D:
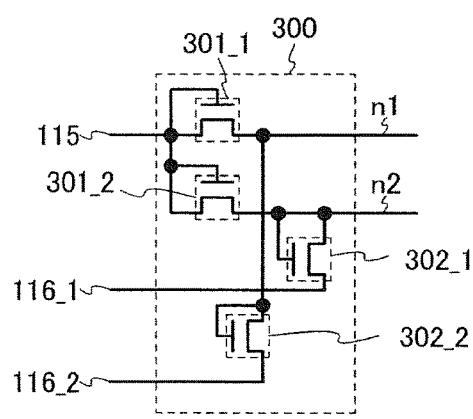

Note that in the structure described with reference to FIGS. 14A and 14B, the transistor 302_1 can be replaced with a diode 302a_1 as shown in FIG. 14C. One terminal of the diode 302a_1 is connected to the node n2 and the other terminal is connected to the wiring 116_1. In a similar manner, the transistor 302_2 can be replaced with a diode 302a_2. One terminal of the diode 302a_2 is connected to the node n1 and the other terminal is connected to the wiring 116_2. For example, the diode 302a_1 has the function of controlling whether or not the transistor 101_2 is turned off, by being conducting or non-conducting. Alternatively, the diode 302a_2 has the function of controlling whether or not the transistor 101_1 is turned off, by being conducting or non-conducting. Alternatively, the diode 302a_1 has the function of controlling whether or not the diode 101a_2 (shown in FIG. 1E) is made non-conducting, by being conducting or non-conducting. Alternatively, the diode 302a_2 has the function of controlling whether or not the diode 101a_1 (shown in FIG. 1E) is made non-conducting, by being conducting or non-conducting. However, this embodiment is not limited to this. For example, in the structure described with reference to FIGS. 14A and 14B, connecting the first terminal of the transistor 302_1 to the wiring 116_1 and the gate of the transistor 302_1 to the node n2 allows the transistor 302_1 to be diode-connected as shown in FIG. 14D. In a similar manner, connecting the first terminal of the transistor 302_2 to the wiring 116_2 and the gate of the transistor 302_2 to the node n1 allows the transistor 302_2 to be diode-connected.

Figure 14E:
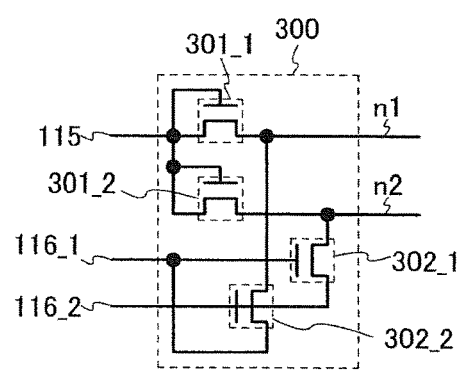

Note that in the structure described with reference to FIGS. 14A to 14D, the first terminal of the transistor 302_1 can be connected to the wiring 116_2 as shown in FIG. 14E. Alternatively, the first terminal of the transistor 302_2 can be connected to the wiring 116_1. Accordingly, during a period in which the transistor 302_1 is off, a high-level signal can be supplied to the first terminal of the transistor 302_1. Alternatively, during a period in which the transistor 302_2 is off, a high-level signal can be supplied to the first terminal of the transistor 302_2. Therefore, the transistors can be reverse-biased; therefore, degradation of the transistor characteristics can be suppressed. However, this embodiment is not limited to this.

Figure 18A:
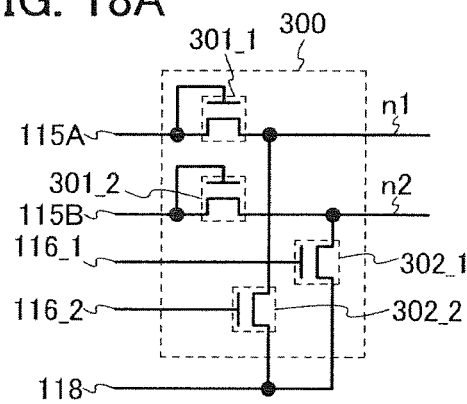
FIGS. 18A to 18F are examples of a circuit diagram of the semiconductor device in Embodiment 2.

Note that in the structure described with reference to FIGS. 14A to 14E, the first terminal of the transistor 301_1 and the first terminal of the transistor 301_2 can be connected to different wirings as shown in FIG. 18A. In an example of FIG. 18A, the wiring 115 can be divided into a plurality of wirings, that is, wirings 115A and 115B. In this case, for example, the wiring 115A can be connected to one of the wiring 119A and the wiring 119B which are shown in FIG. 60 and the wiring 115B can be connected to the other one of the wiring 119A and the wiring 119B. However, this embodiment is not limited to this. Note that the wirings 115A and 115B can function in a manner similar to the wiring 115. Accordingly, a signal such as the signal SP can be input to the wirings 115A and 115B. However, this embodiment is not limited to this. For example, the wiring 115A and the wiring 115B can be supplied with different voltages or different signals.

Figure 18B:
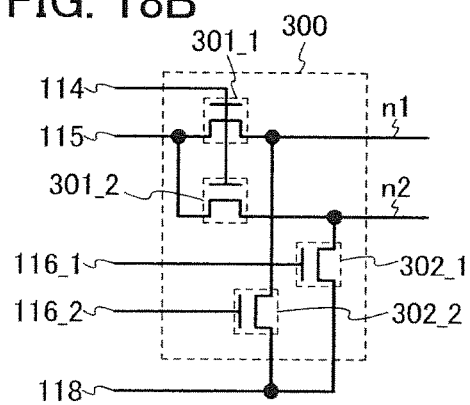

Note that in the structure described with reference to FIGS. 14A to 14E and FIG. 18A, the gate of the transistor 301_1 and the gate of the transistor 301_2 can be connected to the wiring 114 as shown in FIG. 18B. However, this embodiment is not limited to this. For example, the gate of the transistor 301_1 and the gate of the transistor 301_2 can be connected to the wiring 113. Alternatively, when the gate of the transistor 301_1 and the gate of the transistor 301_2 are connected to the wiring 115, the first terminal of the transistor 301_1 and the first terminal of the transistor 301_2 can be connected to the wiring 113 or the wiring 114.

Figure 18C:
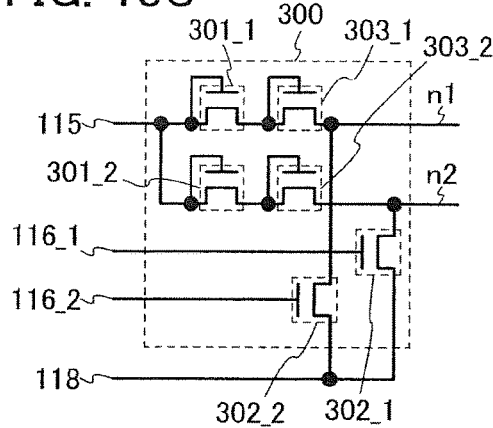
Figure 18D:
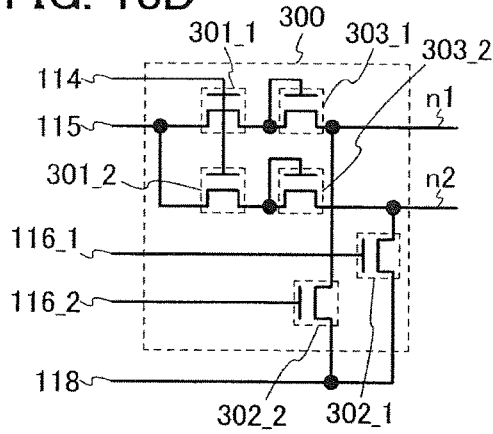

Note that in the structures described with reference to FIGS. 14A to 14E and FIGS. 18A and 18B, the circuit 300 can include a plurality of transistors, that is, the transistors 303_1 and 303_2 as shown in FIGS. 18C and 18D. The transistors 303_1 and 303_2 preferably have the same polarity as the transistors 301_1 and 301_2, which are n-channel transistors, in many cases. However, this embodiment is not limited to this, that is, the transistors 303_1 and 303_2 can be p-channel transistors.

The first terminal of the transistor 303_1 is connected to the second terminal of the transistor 301_1. The second terminal of the transistor 303_1 is connected to the node n1. The gate of the transistor 303_1 is connected to the second terminal of the transistor 301_1. The first terminal of the transistor 303_2 is connected to the second terminal of the transistor 301_2. The second terminal of the transistor 303_2 is connected to the node n2. The gate of the transistor 303_2 is connected to the second terminal of the transistor 301_2. However, this embodiment is not limited to this.

The transistor 303_1 has the function of controlling the timing of when the node n1 is brought into a floating state, for example. Alternatively, the transistor 303_1 has the function of preventing charge leakage from the node n1. Alternatively, the transistor 303_1 has the function of preventing the decrease in the voltage of the node n1. Alternatively, the transistor 303_1 functions as a rectifier, a diode, a diode-connected transistor, or the like. However, this embodiment is not limited to this. Note that the transistor 303_1 need not have all of the functions above.

The transistor 303_2 has the function of controlling the timing of when the node n2 is brought into a floating state, for example. Alternatively, the transistor 303_2 has the function of preventing charge leakage from the node n2. Alternatively, the transistor 303_2 has the function of preventing the decrease in the voltage of the node n2. As described above, the transistor 303_2 functions as a rectifier, a diode, a diode-connected transistor, or the like. However, this embodiment is not limited to this. Note that the transistor 303_2 need not have all of the functions above.

Figure 18E:
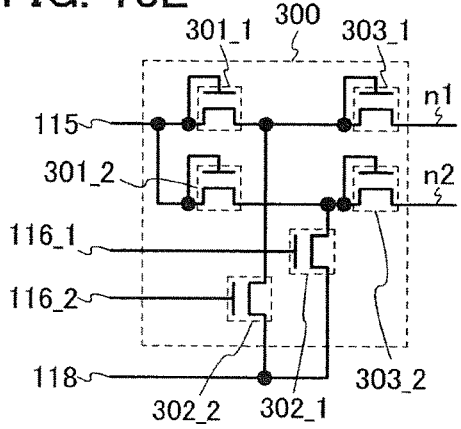
Figure 18F:
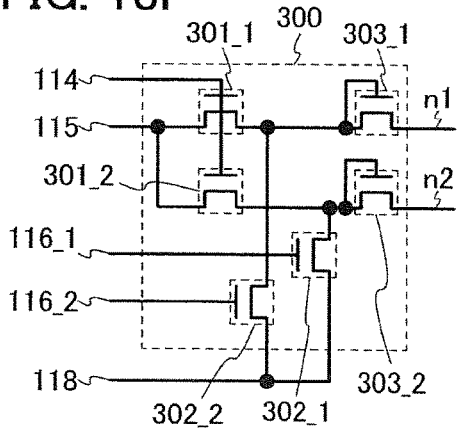

Note that in the structure described with reference to FIGS. 14A to 14E and FIGS. 18A to 18D, the second terminal of the transistor 302_1 can be connected to the second terminal of the transistor 301_2 and the first terminal of the transistor 303_2 as shown in FIGS. 18E and 18F. Alternatively, the second terminal of the transistor 302_2 can be connected to the second terminal of the transistor 301_1 and the first terminal of the transistor 303_1. However, this embodiment is not limited to this.

Figure 19A:
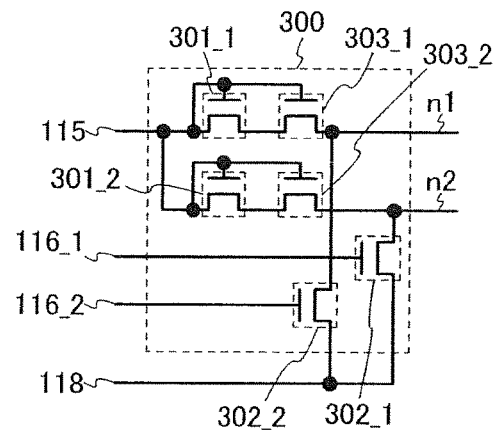
FIGS. 19A to 19F are examples of a circuit diagram of the semiconductor device in Embodiment 2.
Figure 19B:
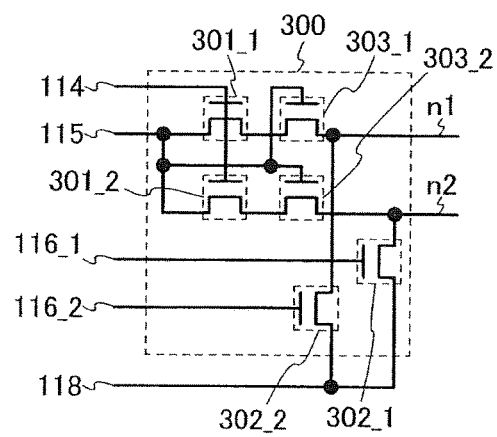

Note that in the structures described with reference to FIGS. 14A to 14E and FIGS. 18A to 18F, the gate of the transistor 303_1 can be connected to the wiring 115 as shown in FIGS. 19A and 19B. Alternatively, the gate of the transistor 303_2 can be connected to the wiring 115. However, this embodiment is not limited to this. For example, the gate of the transistor 303_1 and the gate of the transistor 303_2 can be connected to different wirings. Alternatively, the gate of the transistor 303_1 and the gate of the transistor 303_2 can be connected to the wiring 114. Alternatively, the gate of the transistor 303_1 can be connected to the wiring 116_1 and the gate of the transistor 303_2 can be connected to the wiring 116_2.

Figure 19C:
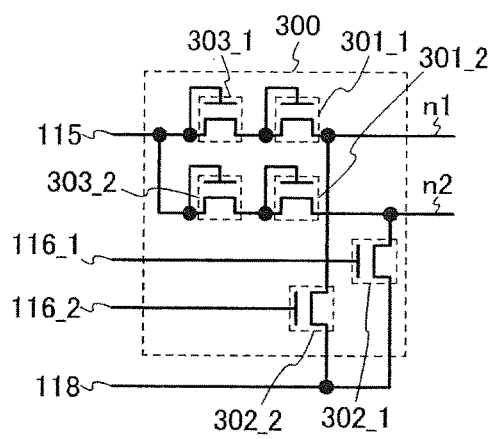
Figure 19D:
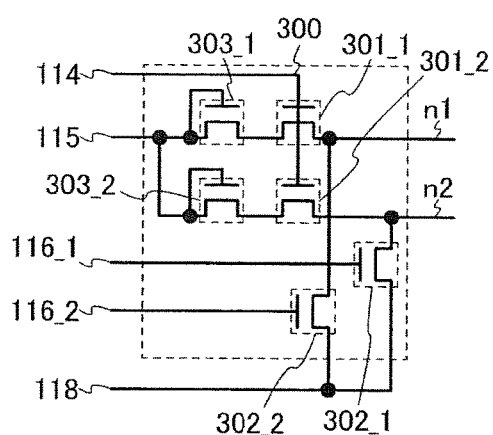

Note that in the structures described with reference to FIGS. 14A to 14E, FIGS. 18A to 18F, and FIGS. 19A and 19B, the transistor 303_1 can be connected to the first terminal of the transistor 301_1 side as shown in FIGS. 19C and 19D. Alternatively, the transistor 303_2 can be connected to the first terminal of the transistor 301_2 side. In the examples of FIGS. 19C and 19D, the first terminal of the transistor 303_1 is connected to the wiring 115, the second terminal of the transistor 303_1 is connected to the first terminal of the transistor 301_1, and the gate of the transistor 301_1 is connected to the wiring 115. The first terminal of the transistor 303_2 is connected to the wiring 115, the second terminal of the transistor 303_2 is connected to the first terminal of the transistor 301_2, and the gate of the transistor 301_2 is connected to the wiring 115. However, this embodiment is not limited to this.

Figure 19E:
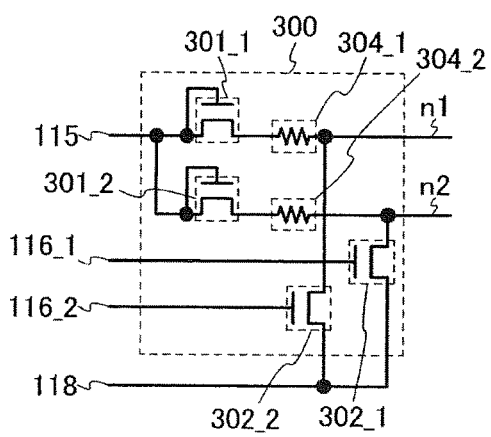

Note that in the structures described with reference to FIGS. 14A to 14E, FIGS. 18A to 18F, and FIGS. 19A to 19D, the transistor 303_1 can be replaced with a resistor 304_1 as shown in FIG. 19E. Alternatively, the transistor 303_2 can be replaced with a resistor 304_2. Not only the material of a transistor or a diode but also the material of a light-transmissive electrode (e.g., a pixel electrode, ITO, or IZO) or the like can be used for the resistor 304_1 and the resistor 304_2. However, this embodiment is not limited to this.

Figure 19F:
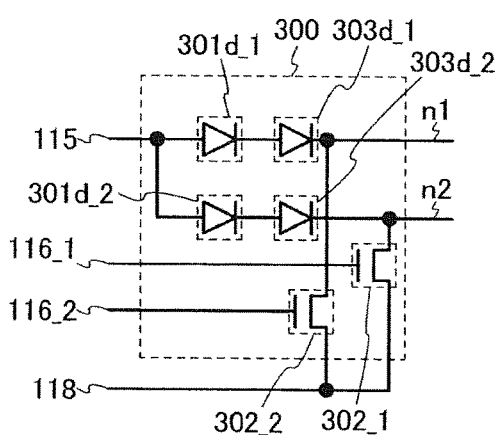

Note that in the structures described with reference to FIGS. 14A to 14E, FIGS. 18A to 18F, and FIGS. 19A to 19E, the diode-connected transistors can be replaced with diodes as shown in FIG. 19F. Diodes 301d_1 and 301d_2 function in a manner similar to the transistors 301_1 and 301_2. Diodes 303d_1 and 303d_2 function in a manner similar to the transistors 303_1 and 303_2. However, this embodiment is not limited to this. For example, each of the diode-connected transistors can be replaced with a circuit that produces a rectifying effect. In this case, the circuit preferably includes at least one diode or diode-connected transistor, however, this embodiment is not limited to this.

Figure 17A:
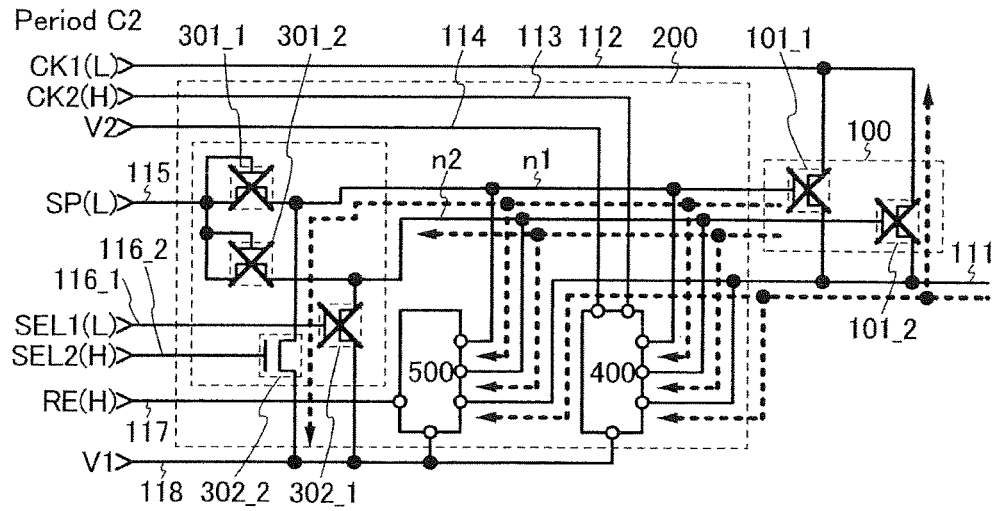
FIGS. 17A to 17C are examples of a schematic view for showing operation of the semiconductor device in Embodiment 2.
Figure 17B:
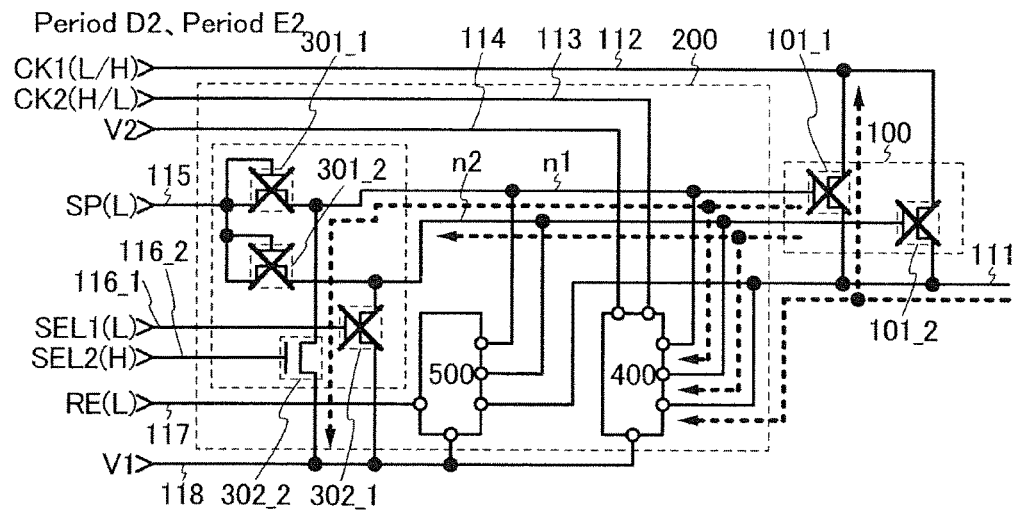
Figure 17C:
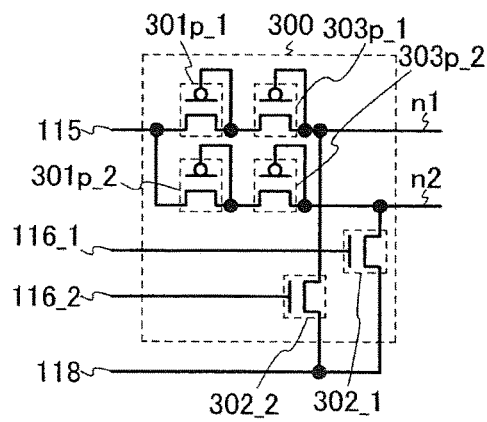

For example, suppose that a transistor, which is used as a diode, is a p-channel transistor. In this case, for example, as for each of the transistors 301p_1, 301p_2, 303p_1, and 303p_2, the gate and the second terminal is connected in many cases as shown in FIG. 17C. Note that the transistors 301p_1 and 301p_2 function in a manner similar to the transistors 301_1 and 301_2 and are p-channel transistors. The transistors 303p_1, 303p_2 function in a manner similar to the transistors 303_1 and 303_2 and are p-channel transistors. However, this embodiment is not limited to this.

Figure 20A:
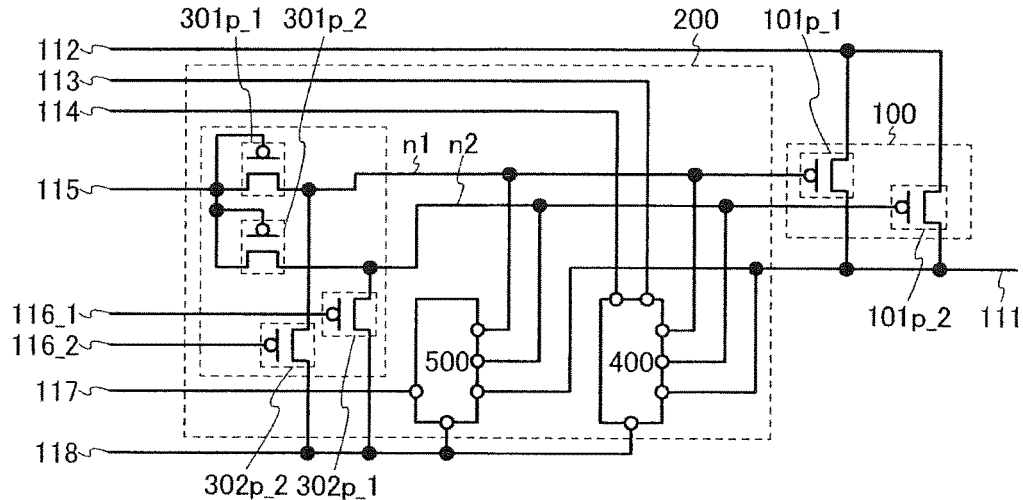
FIG. 20A is an example of a circuit diagram of the semiconductor device in Embodiment 2 and FIG. 20B is an example of a timing chart for showing operation of the semiconductor device in Embodiment 2.
Figure 20B:
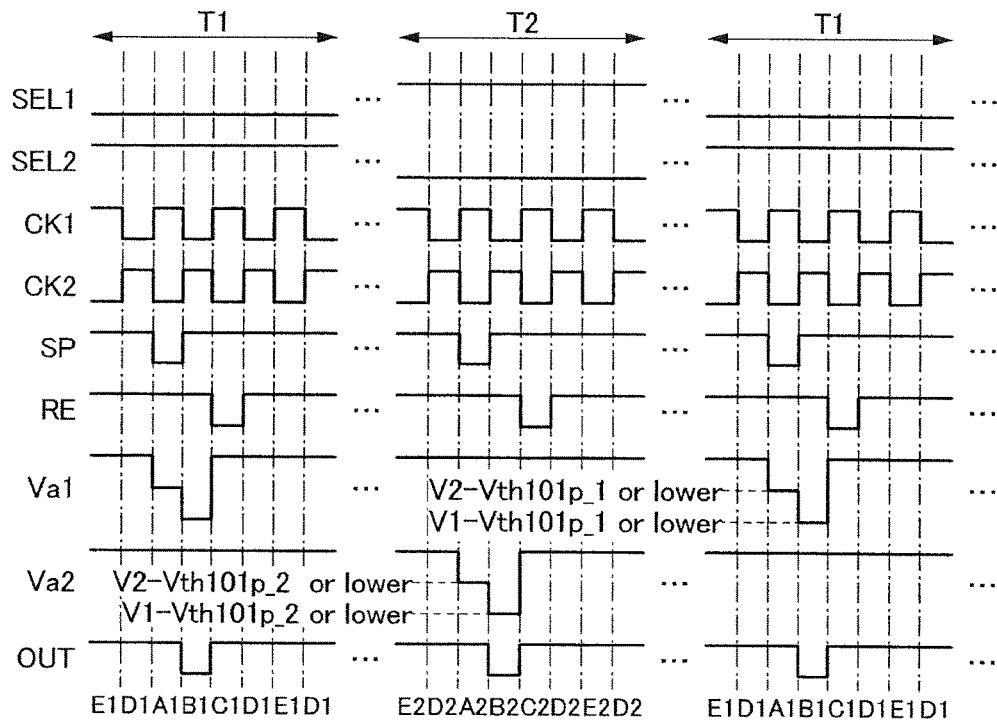

Note that in the structures described with reference to FIGS. 14A to 14E, FIGS. 18A to 18F, FIG. 17C, and FIGS. 19A to 19D, a p-channel transistor can be used as a transistor as shown in FIG. 20A. The transistors 101p_1 and 101p_2 function in a manner similar to the transistors 101_1 and 101_2 and are p-channel transistors. The transistors 302p_1 and 302p_2 function in a manner similar to the transistors 302_1 and 302_2 and are p-channel transistors. Note that as shown in FIG. 20B, when the transistor has a p-type polarity, the voltage V1 is supplied to the wiring 113, and the voltage V2 is supplied to the wiring 118, and the signal CK1, the signal CK2, the signal SP, the signal SEL1, the signal SEL2, the signal RE, the voltage of the node n1, the voltage of the node n2, and the signal OUT are inverted from those in the timing chart in FIG. 2.

(Embodiment 3)

In this embodiment, an example of a semiconductor device will be described. The semiconductor device in this embodiment can be used for the circuit 400 described in Embodiment 2. Note that description of the content described in Embodiments 1 and 2 is not repeated. Note that the content described in this embodiment can be combined with the content described in Embodiments 1 and 2, as appropriate.

Figure 21A:
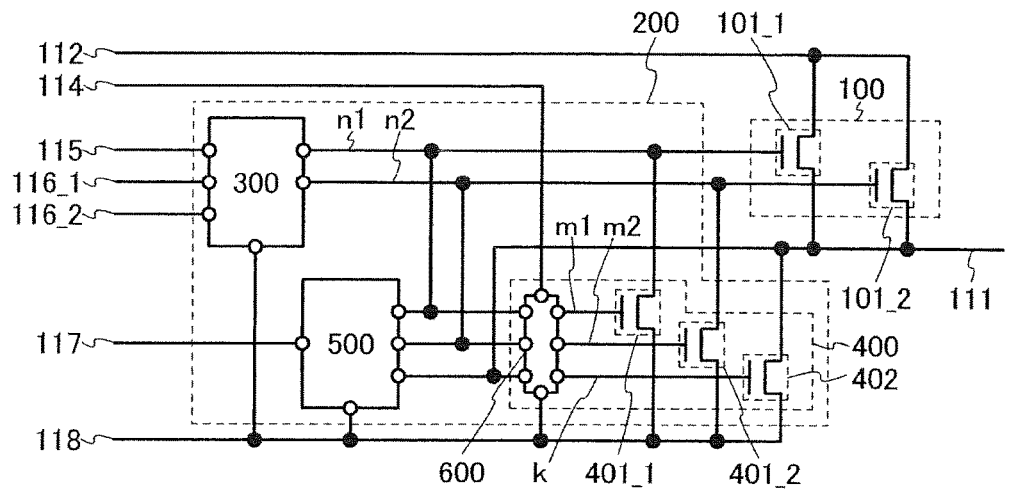
FIG. 21A is an example of a circuit diagram of a semiconductor device in Embodiment 3 and FIG. 21B is an example of a timing chart for showing operation of the semiconductor device in Embodiment 3.

First, an example of the circuit 400 will be described with reference to FIG. 21A. In the example of FIG. 21A, the circuit 400 includes a circuit 600, a plurality of transistors, that is, transistors 401_1 and 401_2, and a transistor 402. The transistors 401_1 and 401_2 and the transistor 402 preferably have the same polarity as the transistors 101_1_1 and 101_2, which are n-channel transistors. Note that this embodiment is not limited to this, that is, the transistors 401_1 and 401_2 and the transistor 402 can be p-channel transistors. Note that the circuit 400 need not have all of the functions above and some of these transistors can be omitted.

A first terminal of the transistor 401_1 is connected to the wiring 118, and a second terminal of the transistor 401_1 is connected to the node n1. A first terminal of the transistor 401_2 is connected to the wiring 118, and a second terminal of the transistor 401_2 is connected to the node n2. A first terminal of the transistor 402 is connected to the wiring 118, and a second terminal of the transistor 402 is connected to the wiring 111. The circuit 600 is connected to the wiring 111, the wiring 114, the wiring 118, the node n1, the node n2, a gate of the transistor 401_1, a gate of the transistor 401_2, and/or a gate of the transistor 402. However, this embodiment is not limited to this. For example, the circuit 600 can be connected to various other wirings or nodes depending on its structure. Alternatively, the circuit 600 need not be connected to all of the wirings described above, that is, the circuit 600 can be disconnected from some of the wirings described above.

Note that a junction of the gate of the transistor 401_1 and the circuit 600 is referred to as a node m1, a junction of the gate of the transistor 401_2 and the circuit 600 is referred to as a node m2, and a junction of the gate of the transistor 402 and the circuit 600 is referred to as a node k.

Note that the transistor 401_1 has the function of controlling electrical continuity between the wiring 118 and the node n1, for example. Alternatively, the transistor 401_1 has the function of controlling the timing of when the voltage of the wiring 118 is supplied to the node n1. For example, when a signal, a voltage, or the like (e.g., the signal CK2 or the voltage V1) is supplied to the wiring 118, the transistor 401_1 has the function of controlling the timing of when the signal, the voltage, or the like supplied to the wiring 118 is supplied to the node n1. Alternatively, the transistor 401_1 has the function of controlling the timing of when a low-level signal or the voltage V1 is supplied to the node n1. Alternatively, the transistor 401_1 has the function of controlling the timing of when the voltage of the node n1 is decreased or maintained. As described above, the transistor 401_1 can function as a switch. However, this embodiment is not limited to this. Note that the transistor 401_1 need not have all of the functions above.

Note that the transistor 401_2 has the function of controlling electrical continuity between the wiring 118 and the node n2, for example. Alternatively, the transistor 401_2 has the function of controlling the timing of when the voltage of the wiring 118 is supplied to the node n2. For example, when a signal, a voltage, or the like (e.g., the signal CK2 or the voltage V1) is supplied to the wiring 118, the transistor 401_2 has the function of controlling the timing of when the signal, the voltage, or the like supplied to the wiring 118 is supplied to the node n2. Alternatively, the transistor 401_2 has the function of controlling the timing of when a low-level signal or the voltage V1 is supplied to the node n2. Alternatively, the transistor 401_2 has the function of controlling the timing of when the voltage of the node n2 is decreased or maintained. As described above, the transistor 401_2 can function as a switch. However, this embodiment is not limited to this. Note that the transistor 401_2 need not have all of the functions above.

Note that the transistor 402 has the function of controlling electrical continuity between the wiring 118 and the wiring 111, for example. Alternatively, the transistor 402 has the function of controlling the timing of when the voltage of the wiring 118 is supplied to the wiring 111. For example, when a signal, a voltage, or the like (e.g., the signal CK2 or the voltage V1) is supplied to the wiring 118, the transistor 402 has the function of controlling the timing of when the signal, the voltage, or the like supplied to the wiring 118 is supplied to the wiring 111. Alternatively, the transistor 402 has the function of controlling the timing of when a low-level signal or the voltage V1 is supplied to the wiring 111. Alternatively, the transistor 402 has the function of controlling the timing of when the voltage of the wiring 111 is decreased or maintained. As described above, the transistor 402 can function as a switch. However, this embodiment is not limited to this. Note that the transistor 402 need not have all of the functions above.

The circuit 600 has the function of controlling the voltage of the node m1, the voltage of the node m2, and/or the voltage of the node k in accordance with the voltage of the node n1, the voltage of the node n2, and/or the voltage of the wiring ill, for example. Alternatively, the circuit 600 has the function of controlling the timing of when a high-level signal, a low-level signal, the voltage V1, the voltage V2, or the like is supplied to the node m1, the node m2, and/or the node k. Alternatively, the circuit 600 has the function of controlling the timing of when the voltage of the node m1, the voltage of the node m2, and/or the voltage of the node k is increased, decreased, or maintained. However, this embodiment is not limited to this. Note that the circuit 600 need not have all of the functions above.

Figure 21B:
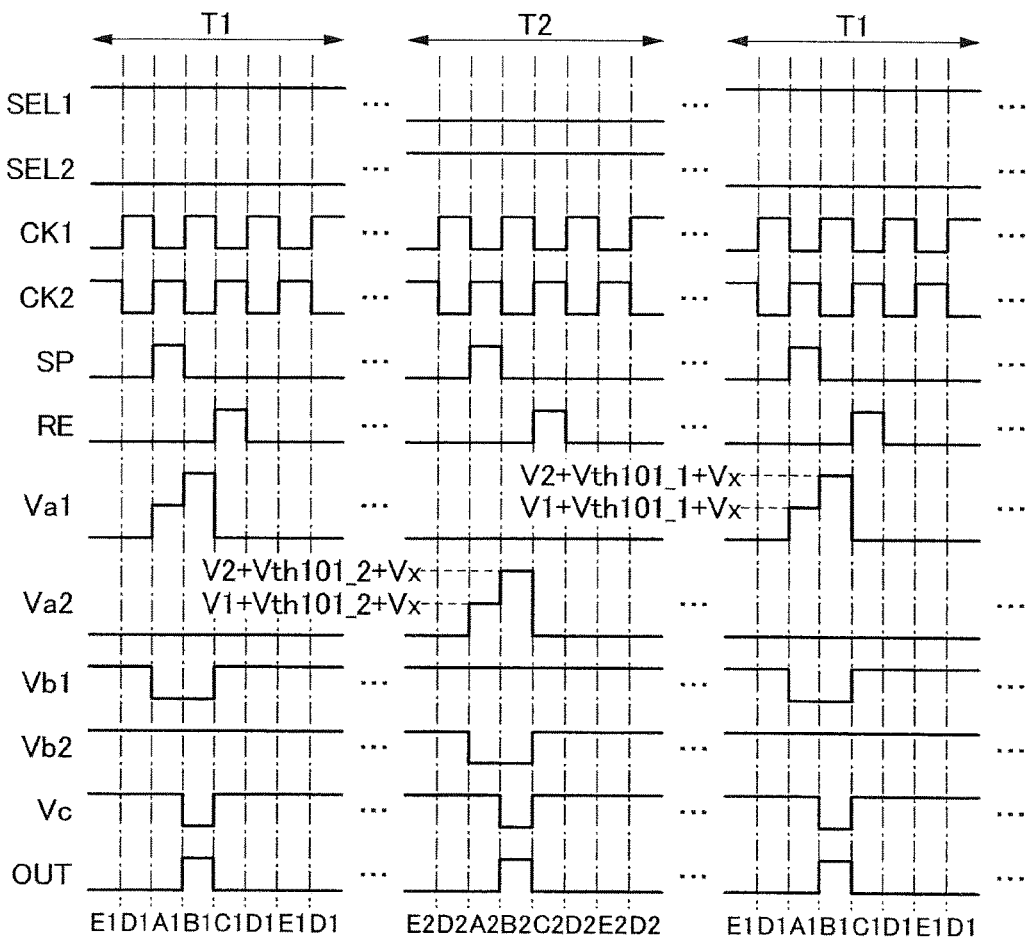

Next, an example of the operation of the semiconductor device in FIG. 21A will be described with reference to a timing chart in FIG. 21B. The timing chart in FIG. 21B shows an example of the signal SEL1, the signal SEL2, the signal CK1, the signal CK2, the signal SP, the signal RE, the voltage of the node n1 (Va1), the voltage of the node n2 (Va2), the voltage of the node m1 (Vb1), the voltage of the node m2 (Vb2), the voltage of the node k (Vc), and the signal OUT. Note that the operation of the semiconductor device in FIG. 21A is not limited to that shown in the timing chart in FIG. 21B and can be controlled at different timings.

Figure 22A:
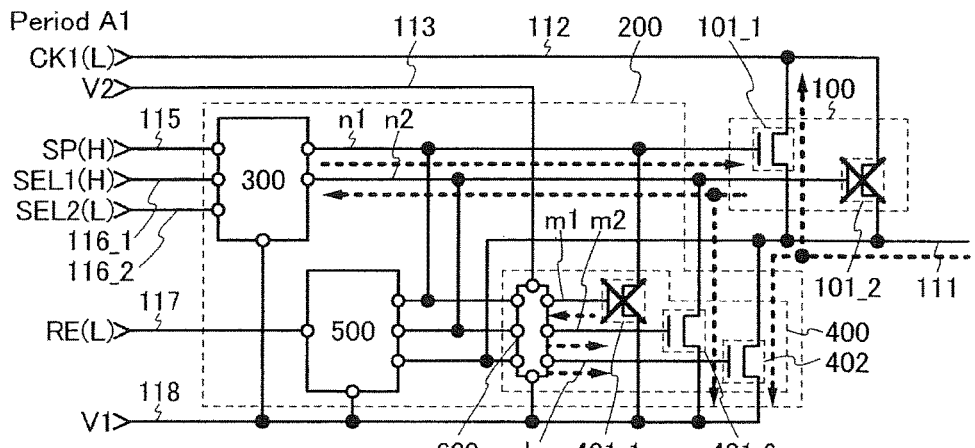
FIGS. 22A to 22C are examples of a schematic view for showing operation of the semiconductor device in Embodiment 3.

During the period A1, since the circuit 300 supplies a high-level signal or the voltage V2 to the node n1, the voltage of the node n1 is increased to a value of V1+Vth101_1+Vx as shown in FIG. 22A. Here, Vx is a value larger than 0. Since the circuit 300 supplies a low-level signal or the voltage V1 to the node n2, the voltage of the node n2 is decreased. Further, since the signal CK1 at a low level is supplied to the wiring 111, the voltage of the wiring 111 is decreased. In accordance with these voltages (the voltage of the node n1, the voltage of the node n2, and the voltage of the wiring 111), the circuit 600 supplies a low-level signal or the voltage V1 to the node m1, a high-level signal or the voltage V2 to the node m2, and a high-level signal or the voltage V2 to the node k, for example. Therefore, the transistor 401_1 is turned off; thus, electrical continuity is broken between the wiring 118 and the node n1. The transistor 401_2 is turned on; thus, electrical continuity is established between the wiring 118 and the node n2. Accordingly, the voltage V1 is supplied from the wiring 118 to the node n2 through the transistor 401_2. Since the transistor 402 is turned on, electrical continuity is established between the wiring 118 and the wiring 111. Accordingly, the voltage V1 is supplied from the wiring 118 to the wiring 111 through the transistor 402. However, this embodiment is not limited to this. For example, the circuit 600 can supply a low-level signal or the voltage V1 to the node m2 and/or the node k. Accordingly, the transistor 401_2 can turn off; thus, electrical continuity can be broken between the wiring 118 and the node n2. Alternatively, the transistor 402 can turn off, thus, electrical continuity can be broken between the wiring 118 and the wiring 111.

Figure 22B:
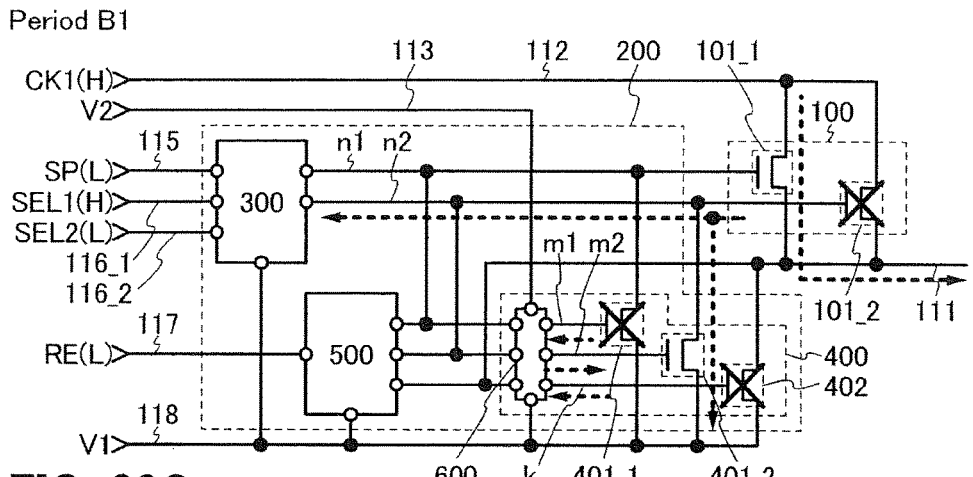

During the period B1, as shown in FIG. 22B, the voltage of the node n1 is increased to a value of V2+Vth101_1+Vx by the bootstrap operation. Since the circuit 300 supplies a low-level signal or the voltage V1 to the node n2, the voltage of the node n2 is maintained at a low value (e.g., V1). Further, since the signal CK1 at a high level is supplied to the wiring 111, the voltage of the wiring 111 is increased. The circuit 600 supplies a low-level signal or the voltage V1 to the node m1, a high-level signal or the voltage V2 to the node m2, and a low-level signal or the voltage V1 to the node k in accordance with these voltages (the voltage of the node n1, the voltage of the node n2, and the voltage of the wiring 111), for example. Therefore, the transistor 401_1 is turned off; thus, electrical continuity is broken between the wiring 118 and the node n1. The transistor 401_2 is turned on; thus, electrical continuity is established between the wiring 118 and the node n2. Accordingly, the voltage V1 is supplied from the wiring 118 to the node n2 through the transistor 401_2. Since the transistor 402 is turned off, electrical continuity is broken between the wiring 118 and the wiring 111. However, this embodiment is not limited to this. For example, the circuit 600 can supply a low-level signal or the voltage V1 to the node m2. Accordingly, the transistor 401_2 can turn off; therefore, electrical continuity is broken between the wiring 118 and the node n2.

Figure 22C:
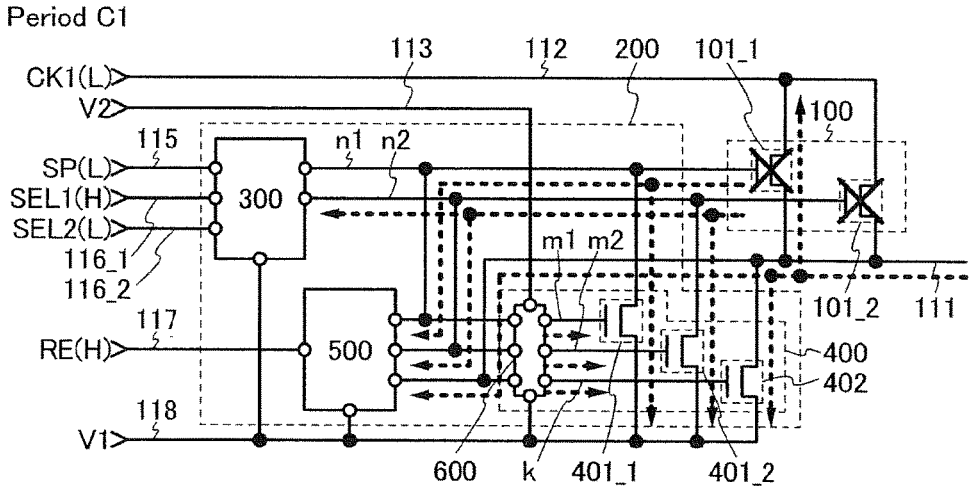
Figure 23A:
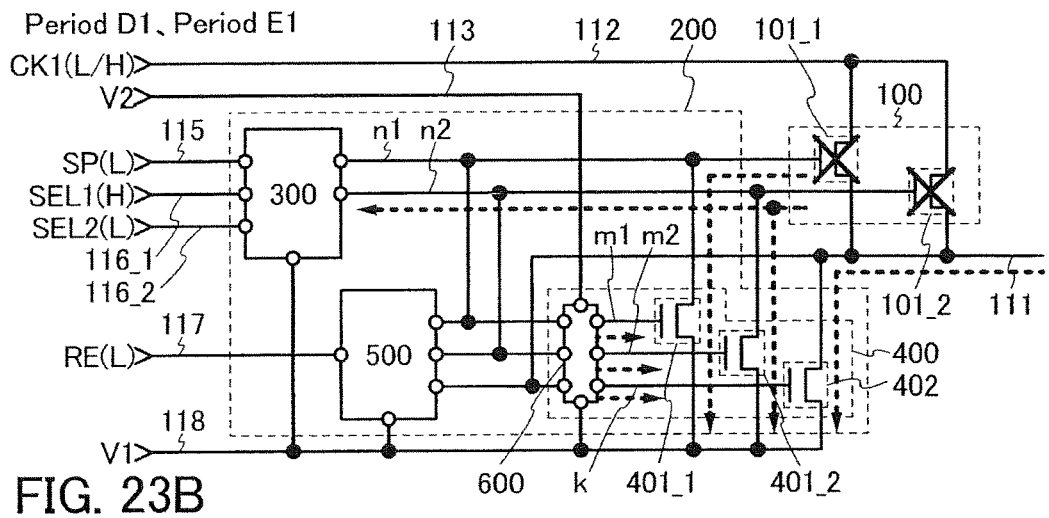
FIGS. 23A to 23C are examples of a schematic view for showing operation of the semiconductor device in Embodiment 3.

During the periods C1 to E1, as shown in FIG. 22C and FIG. 23A, a low-level signal or the voltage V1 is supplied to the node n1, the node n2, and the wiring 111; thus, the voltage of the node n1, the voltage of the node n2, and the voltage of the wiring 111 is decreased or maintained at a low value (e.g., V1). In accordance with these voltages (the voltage of the node n1, the voltage of the node n2, and the voltage of the wiring 111), the circuit 600 supplies a high-level signal or the voltage V2 to the node m1, a high-level signal or the voltage V2 to the node m2, and a high-level signal or the voltage V2 to the node k, for example. Accordingly, the transistor 401_1 is turned on; thus, electrical continuity is established between the wiring 118 and the node n1. Accordingly, the voltage V2 is supplied from the wiring 118 to the node n1 through the transistor 401_1. The transistor 401_2 is turned on; thus, electrical continuity is established between the wiring 118 and the node n2. Accordingly, the voltage V1 is supplied from the wiring 118 to the node n2 through the transistor 401_2. The transistor 402 is turned on; thus, electrical continuity is established between the wiring 118 and the wiring 111. Accordingly, the voltage V1 is supplied from the wiring 118 to the wiring 111 through the transistor 402. However, this embodiment is not limited to this. For example, the circuit 600 can supply a low-level signal or the voltage V1 to the node m1, the node m2, and/or the node k. Accordingly, the transistor 401_1 can turn off; thus, electrical continuity can be broken between the wiring 118 and the node n1. Alternatively, the transistor 401_2 can turn off thus, electrical continuity can be broken between the wiring 118 and the node n2. Alternatively, the transistor 402 can turn off; thus, electrical continuity can be broken between the wiring 118 and the wiring ill.

Note that during one of the period E1 and the period D1, the circuit 600 can supply a high-level signal or the voltage V2 to the node m1, the node m2, and/or the node k. During the other period, the circuit 600 can supply a low-level signal or the voltage V1 to the node m1, the node m2, and/or the node k. In such a manner, the number of times the transistor is turned on is reduced or the time over which the transistor is on is shortened. Therefore, deterioration of a transistor can be suppressed.

Figure 23B:
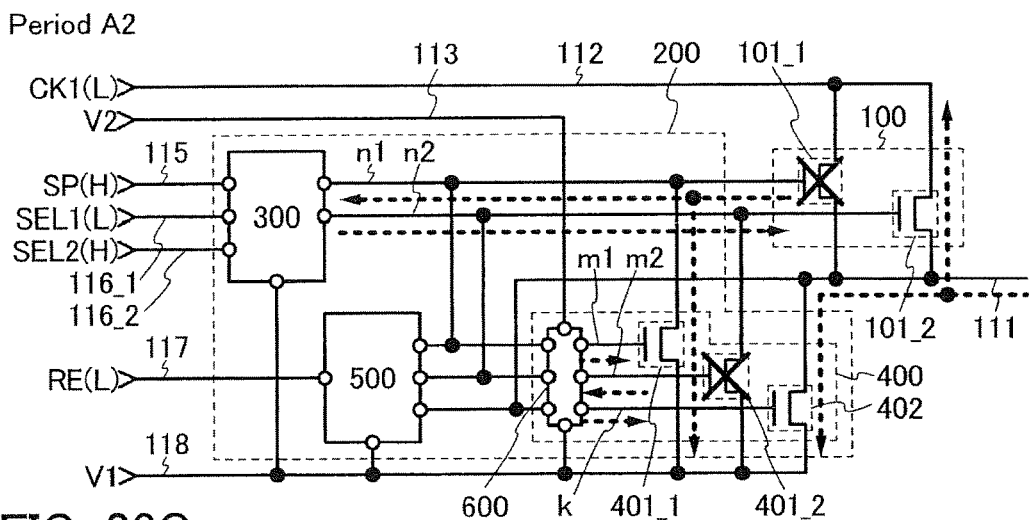

During the period A2, as shown in FIG. 23B, the circuit 300 supplies a low-level signal or the voltage V1 to the node n1; thus, the voltage of the node n1 is decreased. The circuit 300 supplies a high-level signal or the voltage V2 to the node n2; thus, the voltage of the node n2 is increased to a value of V1+Vth101_2+Vx. Here, Vx is a value larger than 0. Alternatively, the signal CK1 at a low level is supplied to the wiring 111; thus, the voltage of the wiring 111 is decreased. In accordance with these voltages (the voltage of the node n1, the voltage of the node n2, and the voltage of the wiring 111), the circuit 600 supplies a high-level signal or the voltage V2 to the node m1, a low-level signal or the voltage V1 to the node m2, and a high-level signal or the voltage V2 to the node k, for example. Therefore, the transistor 401_1 is turned on; thus, electrical continuity is established between the wiring 118 and the node n1. Accordingly, the voltage V1 is supplied from the wiring 118 to the node n1 through the transistor 401_1. The transistor 401_2 is turned off; thus, electrical continuity is broken between the wiring 118 and the node n2. The transistor 402 is turned on; thus, electrical continuity is established between the wiring 118 and the wiring 111. Accordingly, the voltage V1 is supplied from the wiring 118 to the wiring 111 through the transistor 402. However, this embodiment is not limited to this. For example, the circuit 600 can supply a low-level signal or the voltage V1 to the node m1 and/or the node k. Accordingly, the transistor 401_1 can turn off; thus, electrical continuity can be broken between the wiring 118 and the node n1. Alternatively, the transistor 402 can turn off thus, electrical continuity can be broken between the wiring 118 and the wiring 111.

Figure 23C:
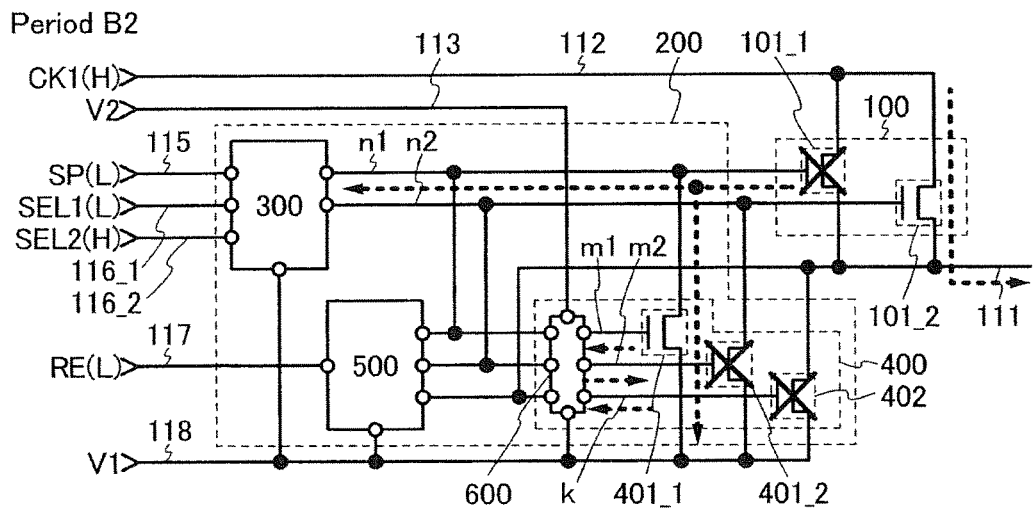

During the period B2, as shown in FIG. 23C, the circuit 300 supplies a low-level signal or the voltage V1 to the node n1; thus, the voltage of the node n1 is maintained at a low value (e.g., V1). The voltage of the node n2 is increased to a value of V2+Vth101_2+Vx by the bootstrap operation. Further, the signal CK1 at a high level is supplied to the wiring 111; thus, the voltage of the wiring 111 is increased. In accordance with these voltages (the voltage of the node n1, the voltage of the node n2, and the voltage of the wiring 111), the circuit 600 supplies a high-level signal or the voltage V2 to the node m1, a low-level signal or the voltage V1 to the node m2, and a low-level signal or the voltage V1 to the node k, for example. Therefore, the transistor 401_1 is turned on; thus, electrical continuity is established between the wiring 118 and the node n1. Accordingly, the voltage V1 is supplied from the wiring 118 to the node n1 through the transistor 401_1. The transistor 401_2 is turned off; thus, electrical continuity is broken between the wiring 118 and the node n2. The transistor 402 is turned off; thus, electrical continuity is broken between the wiring 118 and the wiring 111. However, this embodiment is not limited to this. For example, the circuit 600 can supply a low-level signal or the voltage V1 to the node m1. Accordingly, the transistor 401_1 can turn off; thus, electrical continuity can be broken between the wiring 118 and the node n1.

Figure 24A:
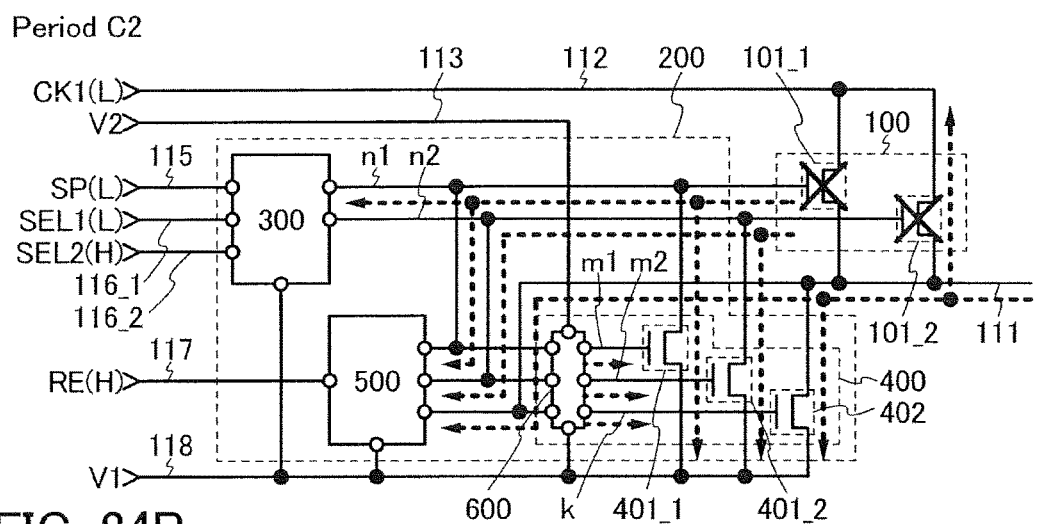
FIGS. 24A and 24B are examples of a schematic view for showing operation of the semiconductor device in Embodiment 3.
Figure 24B:
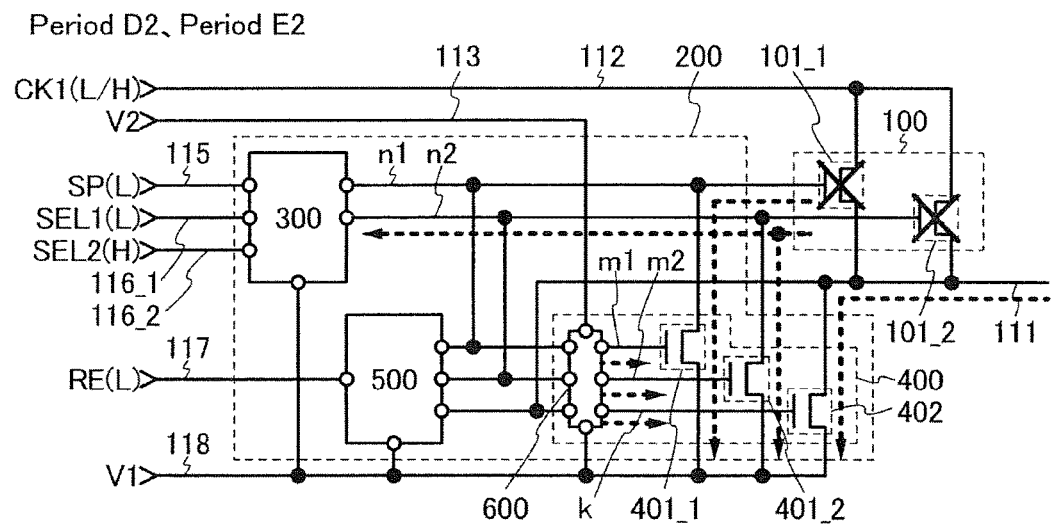

During the periods C2 to E2, as shown in FIGS. 24A and 24B, a low-level signal or the voltage V1 is supplied to the node n1, the node n2, and the wiring 111; thus, the voltage of the node n1, the voltage of the node n2, and the voltage of the wiring 111 are decreased or maintained at a low value (e.g., V1). In accordance with these voltages (the voltage of the node n1, the voltage of the node n2, and the voltage of the wiring 111), the circuit 600 supplies a high-level signal or the voltage V2 to the node m1, a high-level signal or the voltage V2 to the node m2, and a high-level signal or the voltage V2 to the node k, for example. Accordingly, the transistor 401_1 is turned on; thus, electrical continuity is established between the wiring 118 and the node n1. Accordingly, the voltage V2 is supplied from the wiring 118 to the node n1 through the transistor 401_1. The transistor 401_2 is turned on; thus, electrical continuity is established between the wiring 118 and the node n2. Accordingly, the voltage V1 is supplied from the wiring 118 to the node n2 through the transistor 401_2. The transistor 402 is turned on; thus, electrical continuity is established between the wiring 118 and the wiring 111. Accordingly, the voltage V1 is supplied from the wiring 118 to the wiring 111 through the transistor 402. However, this embodiment is not limited to this. For example, the circuit 600 can supply a low-level signal or the voltage V1 to the node m1, the node m2, and/or the node k. Accordingly, the transistor 401_1 can turn off; thus, electrical continuity can be broken between the wiring 118 and the node n1. Alternatively, the transistor 401_2 can turn off; thus, electrical continuity can be broken between the wiring 118 and the node n2. Alternatively, the transistor 402 can turn off; thus, electrical continuity can be broken between the wiring 118 and the wiring 111.

Note that during one of the period E2 and the period D2, the circuit 600 can supply a high-level signal or the voltage V2 to the node m1, the node m2, and/or the node k. During the other period, the circuit 600 can supply a low-level signal or the voltage V1 to the node m1, the node m2, and/or the node k. In such a manner, the number of times the transistor is turned on is reduced or the time over which the transistor is on is shortened. Therefore, deterioration of the transistor can be suppressed.

Note that it is preferable that the channel width of the transistor 401_1 be substantially equal to that of the transistor 401_2. Thus, the degree of the change in the voltage of the node n1 during the period T1 and the degree of the change in the voltage of the node n2 during the period T2 can be substantially equal. Accordingly, the waveform of the signal OUT can be substantially uniform. Note that for a similar reason, it is preferable that the channel length of the transistor 401_1 be substantially equal to that of the transistor 401_2. However, this embodiment is not limited to this.

Note that each of the channel width of the transistor 401_1 and the channel width of the transistor 401_2 is preferably 100 μm to 4000 μm, more preferably 500 μm to 3000 μm, and much more preferably 1000 μm to 2000 μm. However, this embodiment is not limited to this.

Note that the channel width of the transistor 402 is preferably 500 μm to 5000 μm, more preferably 1000 μm to 3000 μm, and much more preferably 2000 μm to 3000 μm. However, this embodiment is not limited to this.

Figure 25A:
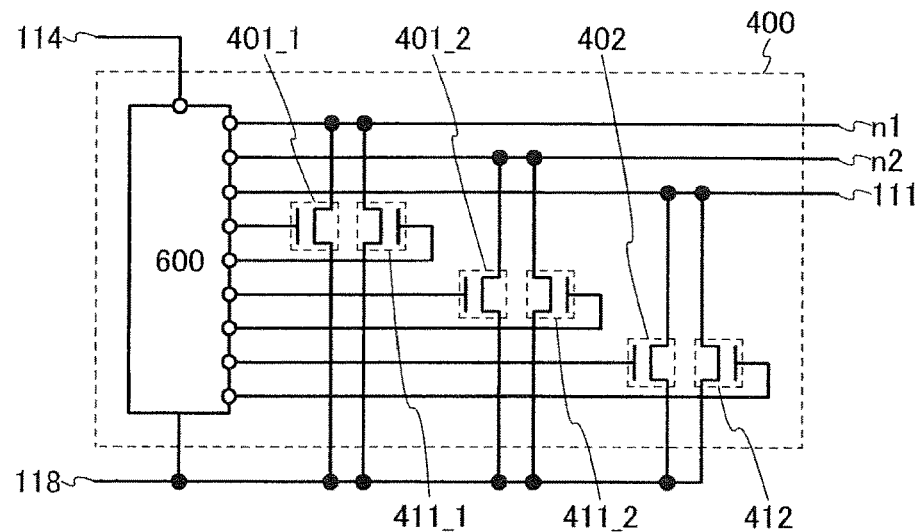
FIGS. 25A and 25B are examples of a circuit diagram of the semiconductor device in Embodiment 3.

Note that in the structure described with reference to FIG. 21A, a plurality of transistors can be connected in parallel as shown in FIG. 25A. The plurality of transistors can be turned on in order or at random. FIG. 25A shows the case of two transistors connected in parallel as an example. In this case, the two transistors can repeatedly be turned on and off every gate selection period or every half cycle of the clock signal. Transistors 411_1, 411_2, and 412 are connected in parallel with the transistors 401_1, 401_2, and 402, respectively. A first terminal of the transistor 411_1 is connected to the wiring 118, a second terminal of the transistor 411_1 is connected to the node n1, and a gate of the transistor 411_1 is connected to the circuit 600. A first terminal of the transistor 411_2 is connected to the wiring 118, a second terminal of the transistor 411_2 is connected to the node n2, and a gate of the transistor 411_2 is connected to the circuit 600. A first terminal of the transistor 412 is connected to the wiring 118, a second terminal of the transistor 412 is connected to the wiring 111, and a gate of the transistor 412 is connected to the circuit 600. However, this embodiment is not limited to this. For example, only one or more of the transistors 411_1, 411_2, and 412 can be added.

Note that in FIG. 25A, the circuit 400 can include only the circuit 600, the transistor 402, and the transistor 412 by omitting the transistor 401_1, the transistor 411_1, the transistor 401_2, and the transistor 411_2. Alternatively, in FIG. 25A, the circuit 400 can include only the circuit 600, the transistor 401_2, and the transistor 411_2 by omitting the transistor 401_1, the transistor 411_1, the transistor 402, and the transistor 412. Alternatively, in FIG. 25A, the circuit 400 can include only the circuit 600, the transistor 401_1, and the transistor 411_1 by omitting the transistor 401_2, the transistor 411_2, the transistor 402, and the transistor 412. However, this embodiment is not limited to this.

Note that in FIG. 25A, it is preferable that the channel width of the transistor 401_1 be substantially equal to that of the transistor 411_1. It is preferable that the channel width of the transistor 401_2 be substantially equal to that of the transistor 411_2. It is preferable that the channel width of the transistor 402 be substantially equal to that of the transistor 412. Accordingly, each of the channel width of the transistor 411_1 and the channel width of the transistor 411_2 is preferably 100 µm to 4000 µm, more preferably 500 µm to 3000 µm, and much more preferably 1000 µm to 2000 µm. The channel width of the transistor 412 is preferably 500 µm to 5000 µm, more preferably 1000 µm to 3000 µm, and much more preferably 2000 µm to 3000 µm. However, this embodiment is not limited to this.

Figure 25B:
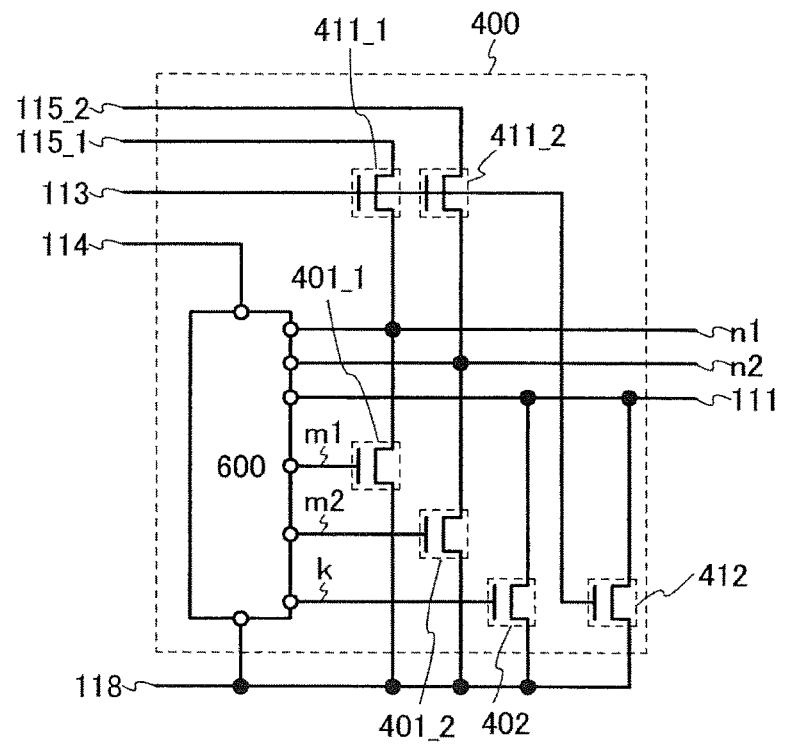

Note that in the structure described with reference to FIG. 21A and FIG. 25A, the first terminal of the transistor 411_1 can be connected to the wiring 115_1, and the gate of the transistor 411_1 can be connected to the wiring 113 as shown in FIG. 25B. Alternatively, the first terminal of the transistor 411_2 can be connected to the wiring 115_2, and the gate of the transistor 411_2 can be connected to the wiring 113. Alternatively, the gate of the transistor 412 can be connected to the wiring 113. In such a manner, a circuit for controlling the conduction of the transistors 411_1, 411_2, and 412 can be omitted. However, this embodiment is not limited to this. For example, the second terminal of the transistor 401_1, the second terminal of the transistor 401_2, and/or the second terminal of the transistor 402 can be connected to the wiring 113. In such a manner, the transistors can be reverse-biased; therefore, degradation of the transistor characteristics can be suppressed.

Figure 26A:
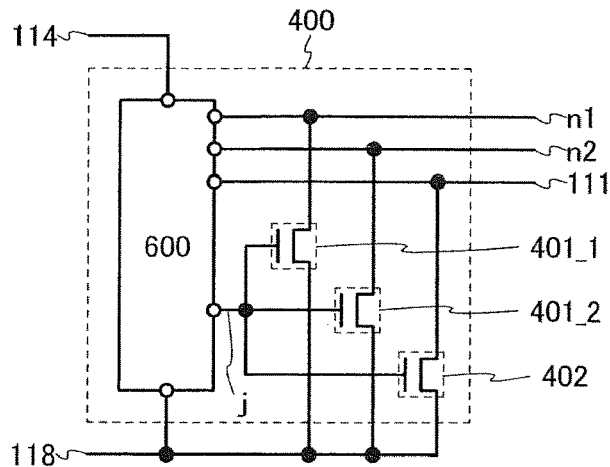
FIGS. 26A to 26C are examples of a circuit diagram of the semiconductor device in Embodiment 3.
Figure 26B:
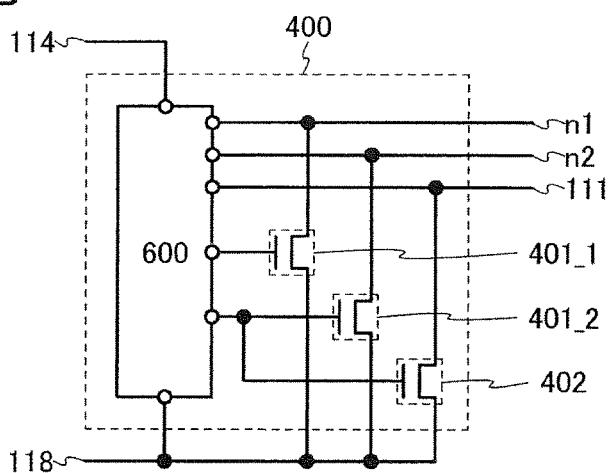

Note that in the structures described with reference to FIG. 21A and FIGS. 25A and 25B, the gate of the transistor 401_1, the gate of the transistor 401_2, and the gate of the transistor 402 can be connected to each other as shown in FIG. 26A. Note that a junction of the gates of the transistor 401_1, the transistor 401_2, and the transistor 402, and the circuit 600 is denoted as a node j. In this case, the circuit 600 can supply a low-level signal or the voltage V1 to the node j during the periods A1 to B1, and A2 to B2. Meanwhile, the circuit 600 can supply a high-level signal or the voltage V2 to the node j during the periods C1 to E1 and the periods C2 to E2. Therefore, the transistor 401_1, the transistor 401_2, and the transistor 402 can be off during the periods A1 to B1, A2 to B2 and can be on during the periods C1 to E1 and the periods C2 to E2. Accordingly, the conduction of the transistors 401_1, 401_2, and 402 can be controlled by the same circuit, which results in a simple and small circuit. However, this embodiment is not limited to this. For example, the circuit 600 can supply a low-level signal or the voltage V1 to the node j during one of the period D1 and the period E1 and one of the period D2 and the period E2. Alternatively, the circuit 600 can supply a low-level signal or the voltage V1 to the node j during one of the periods C1 to E1 and one of the periods C2 to E2. Accordingly, the transistors can repeatedly be turned on and off every gate selection period or every half cycle of the clock signal; thus, degradation of the transistor characteristics can be suppressed. Alternatively, as shown in FIG. 26B, the gate of the transistor 402 can be connected to one of the gate of the transistor 401_1 and the gate of the transistor 401_2.

Figure 26C:
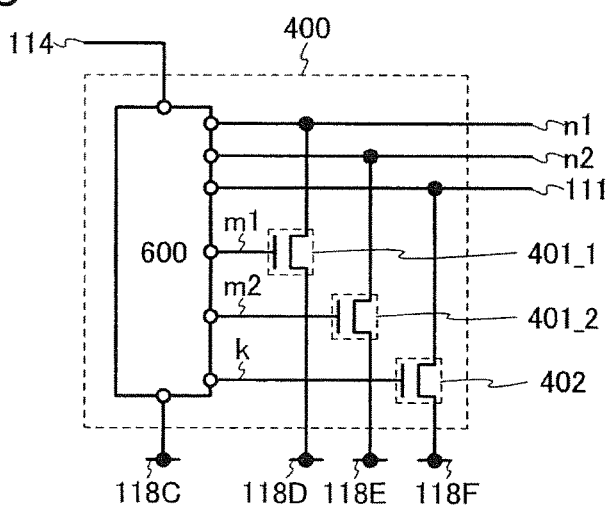

Note that in the structures described with reference to FIG. 21A, FIGS. 25A and 25B, and FIGS. 26A and 26B, the first terminal of the transistor 401_1, the first terminal of the transistor 401_2, and the first terminal of the transistor 402 can be connected to different wirings as shown in FIG. 26C. In FIG. 26A, the wiring 118 is divided into a plurality of wirings, that is, wirings 118C to 118F, for example. The circuit 600 is connected to the wiring 118C, the first terminal of the transistor 401_1 is connected to the wiring 118D, the first terminal of the transistor 401_2 is connected to the wiring 118E, and the first terminal of the transistor 402 is connected to the wiring 118F. However, this embodiment is not limited to this. Note that the wirings 118C to 118F can function in a manner similar to the wiring 118. Accordingly, a voltage such as the voltage V1 can be input to the wirings 118C to 118F. However, this embodiment is not limited to this. For example, the wirings 118C to 118F can be supplied with different voltages or different signals.

Figure 27A:
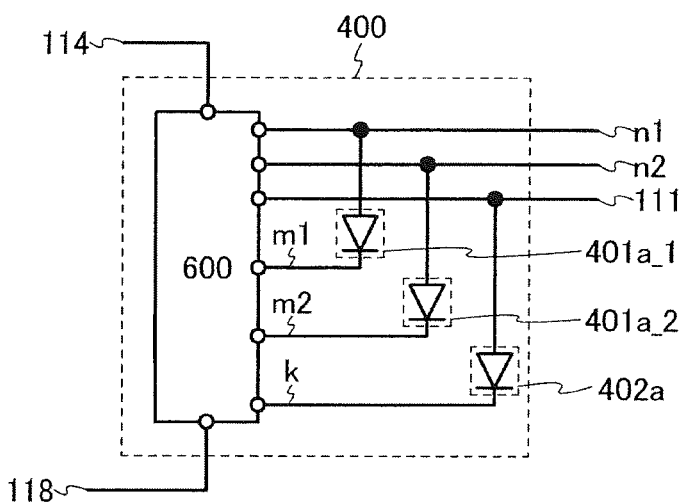
FIGS. 27A and 27B are examples of a circuit diagram of the semiconductor device in Embodiment 3.
Figure 27B:
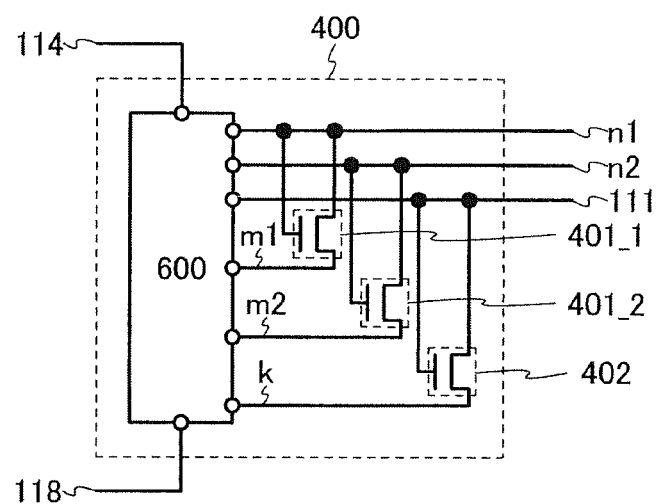

Note that in the structures described with reference to FIG. 21A, FIGS. 25A and 25B, and FIGS. 26A to 26C, the transistor 401_1 can be replaced with a diode 401a_1 as shown in FIG. 27A. One terminal (hereinafter also referred to as an anode) of the diode 401a_1 is connected to the node n1 and the other terminal (hereinafter also referred to as a cathode) is connected to the node m1. Alternatively, the transistor 401_2 can be replaced with a diode 401a_2. One terminal (hereinafter also referred to as an anode) of the diode 401a_2 is connected to the node n2 and the other terminal (hereinafter also referred to as a cathode) is connected to the node m2. Alternatively, the transistor 402 can be replaced with a diode 402a. One terminal (hereinafter also referred to as an anode) of the diode 402a is connected to the wiring 111 and the other terminal (hereinafter also referred to as a cathode) is connected to the node k. However, this embodiment is not limited to this. For example, in the structure described with reference to FIG. 21A, FIGS. 25A and 25B, and FIGS. 26A to 26C, connecting the first terminal of the transistor 401_1 to the node m1 and the second terminal of the transistor 401_1 to the node n1 allows the transistor 401_1 to be diode-connected as shown in FIG. 27B. Alternatively, connecting the first terminal of the transistor 401_2 to the node m2 and the second terminal of the transistor 401_2 to the node n2 allows the transistor 401_2 to be diode-connected. Connecting the first terminal of the transistor 402 to the node k and the second terminal of the transistor 402 to the wiring 111 allows the transistor 402 to be diode-connected.

Figure 28A:
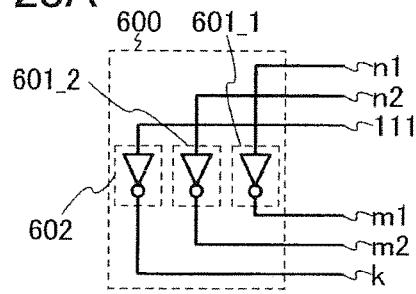
FIGS. 28A to 28H are examples of a circuit diagram of the semiconductor device in Embodiment 3.

Next, a specific example of the circuit 600 will be described with reference to FIG. 28A. The circuit 600 includes circuits 601_1, 601_2, and 602. Each of the circuits 601_1, 601_2, and 602 can function as a NOT circuit or an inverter, for example. An input terminal of the circuit 601_1 is connected to the node n1, and an output terminal of the circuit 601_1 is connected to the node m1. An input terminal of the circuit 601_2 is connected to the node n2, and an output terminal of the circuit 601_2 is connected to the node m2. An input terminal of the circuit 602 is connected to the wiring 111, and an output terminal of the circuit 602 is connected to the node k.

Figure 28B:
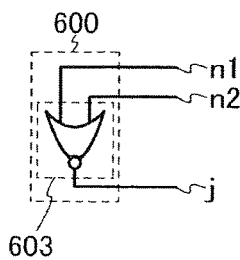

Next, another example of the circuit 600 will be described with reference to FIG. 28B. The circuit 600 includes a circuit 603. The circuit 603 can function as a two-input NOR circuit, for example. One input terminal of the circuit 603 is connected to the node n1, the other input terminal of the circuit 603 is connected to the node n2, and an output terminal of the circuit 603 is connected to the node j.

Figure 28C:
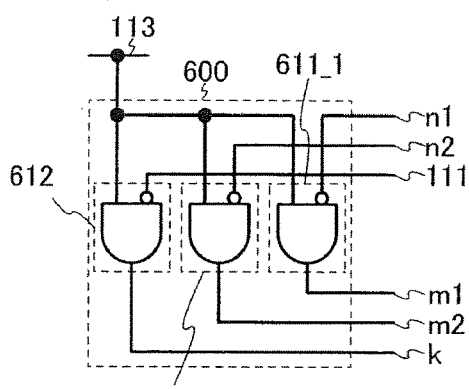

Another example of the circuit 600 will be described with reference to FIG. 28C. The circuit 600 includes circuits 611_1, 611_2, and 612. Each of the circuits 611_1, 611_2, and 612 can function as a two-input logic circuit that is a combination of an AND circuit and a NOT circuit, for example. One input terminal of the circuit 611_1 is connected to the wiring 113, the other input terminal of the circuit 611_1 is connected to the node n1, and an output terminal of the circuit 611_1 is connected to the node m1. One input terminal of the circuit 611_2 is connected to the wiring 113, the other input terminal of the circuit 611_2 is connected to the node n2, and an output terminal of the circuit 611_2 is connected to the node m2. One input terminal of the circuit 612 is connected to the wiring 113, the other input terminal of the circuit 612 is connected to the wiring 111, and an output terminal of the circuit 612 is connected to the node k.

Figure 28D:
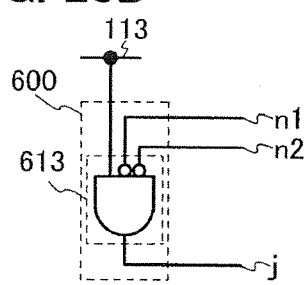

Another example of the circuit 600 will be described with reference to FIG. 28D. The circuit 600 includes a circuit 613. The circuit 613 can function as a three-input logic circuit that is a combination of an AND circuit and a NOT circuit, for example. A first input terminal of the circuit 613 is connected to the wiring 113, a second input terminal of the circuit 613 is connected to the node n1, a third input terminal of the circuit 613 is connected to the node n2, and an output terminal of the circuit 613 is connected to the node j.

Figure 28E:
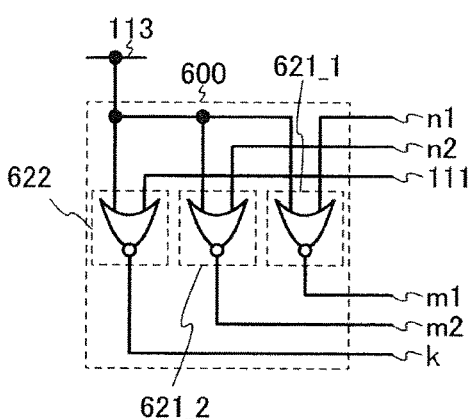

Another example of the circuit 600 will be described with reference to FIG. 28E. The circuit 600 includes circuits 621_1, 621_2, and 622. Each of the circuits 621_1, 621_2, and 622 can function as a two-input NOR circuit, for example. One input terminal of the circuit 621_1 is connected to the wiring 113, the other input terminal of the circuit 621_1 is connected to the node n1, and an output terminal of the circuit 621_1 is connected to the node m1. One input terminal of the circuit 621_2 is connected to the wiring 113, the other input terminal of the circuit 621_2 is connected to the node n2, and an output terminal of the circuit 621_2 is connected to the node m2. One input terminal of the circuit 622 is connected to the wiring 113, the other input terminal of the circuit 622 is connected to the wiring 111, and an output terminal of the circuit 622 is connected to the node k.

Figure 28F:
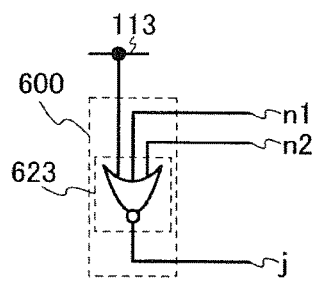

Another example of the circuit 600 will be described with reference to FIG. 28F. The circuit 600 includes a circuit 623. The circuit 623 can function as a three-input NOR circuit. A first input terminal of the circuit 623 is connected to the wiring 113, a second input terminal of the circuit 623 is connected to the node n1, a third input terminal of the circuit 623 is connected to the node n2, and an output terminal of the circuit 623 is connected to the node j.

Figure 28G:
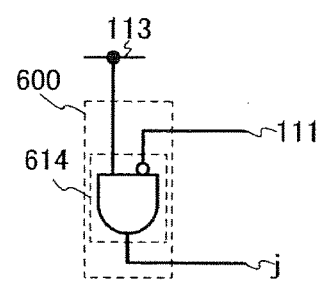

Another example of the circuit 600 will be described with reference to FIG. 28G. The circuit 600 includes a circuit 614. The circuit 614 can function as a two-input logic circuit that is a combination of an AND circuit and a NOT circuit. A first input terminal of the circuit 614 is connected to the wiring 113, a second input terminal of the circuit 614 is connected to the wiring 11, and an output terminal of the circuit 614 is connected to the node j.

Figure 28H:
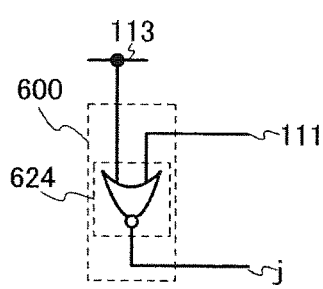

Another example of the circuit 600 will be described with reference to FIG. 28H. The circuit 600 includes a circuit 624. The circuit 624 can function as a two-input NOR circuit. A first input terminal of the circuit 624 is connected to the wiring 113, a second input terminal of the circuit 624 is connected to the wiring 111, and an output terminal of the circuit 624 is connected to the node j.

Next, examples of the circuits 601_1, 601_2, 602, 603, 611_1, 611_2, 612, 613, 621_1, 621_2, 622, and 623 which are shown in FIGS. 28A to 28F, will be described with reference to FIGS. 29A to 29F and FIGS. 30A to 30D. However, the circuits 601_1, 601_2, 602, 603, 611_1, 611_2, 612, 613, 621_1, 621_2, 622, and 623 can have various other structures.

Figure 29A:
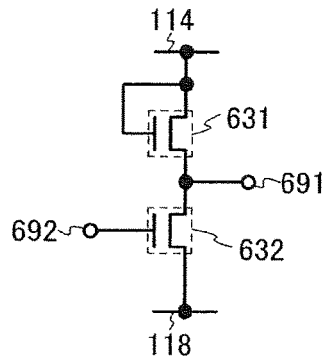
FIGS. 29A to 29F are examples of a circuit diagram of the semiconductor device in Embodiment 3.

A circuit in FIG. 29A includes a transistor 631 and a transistor 632. A first terminal of the transistor 631 is connected to the wiring 114, a second terminal of the transistor 631 is connected to an output terminal 691, and a gate of the transistor 631 is connected to the wiring 114. A first terminal of the transistor 632 is connected to the wiring 118, a second terminal of the transistor 632 is connected to an output terminal 691, and a gate of the transistor 632 is connected to an input terminal 692. The circuit in FIG. 29A can be applied to the circuit 601_1, the circuit 601_2, and/or the circuit 602. Therefore, the output terminal 691 can be connected to the node m1, the node m2, the node k, or the like. Alternatively, the input terminal 692 can be connected to the node n1, the node n2, the wiring 111, or the like.

Figure 29B:
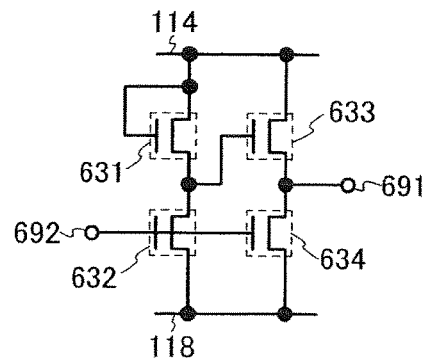

A circuit in FIG. 29B includes a transistor 631, a transistor 632, a transistor 633, and a transistor 634. A first terminal of the transistor 631 is connected to the wiring 114, a second terminal of the transistor 631 is connected to a gate of the transistor 633, and a gate of the transistor 631 is connected to the wiring 114. A first terminal of the transistor 632 is connected to the wiring 118, a second terminal of the transistor 632 is connected to the gate of the transistor 633, and a gate of the transistor 632 is connected to the input terminal 692. A first terminal of the transistor 633 is connected to the wiring 114 and a second terminal of the transistor 633 is connected to the output terminal 691. A first terminal of the transistor 634 is connected to the wiring 118, a second terminal of the transistor 634 is connected to the output terminal 691, and a gate of the transistor 634 is connected to the input terminal 692. The circuit in FIG. 29B can be applied to the circuit 601_1, the circuit 601_2, and/or the circuit 602. Therefore, the output terminal 691 can be connected to the node m1, the node m2, the node k, or the like. Alternatively, the input terminal 692 can be connected to the node n1, the node n2, the wiring 111, or the like.

Figure 29C:
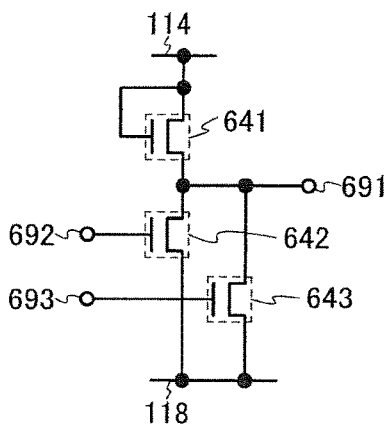

A circuit in FIG. 29C includes a transistor 641, a transistor 642, and a transistor 643. A first terminal of the transistor 641 is connected to the wiring 114, a second terminal of the transistor 641 is connected to the output terminal 691, and a gate of the transistor 641 is connected to the wiring 114. A first terminal of the transistor 642 is connected to the wiring 118, a second terminal of the transistor 642 is connected to the output terminal 691, and a gate of the transistor 642 is connected to the input terminal 692. A first terminal of the transistor 643 is connected to the wiring 118, a second terminal of the transistor 643 is connected to the output terminal 691, and a gate of the transistor 643 is connected to an input terminal 693. The circuit in FIG. 29C can be applied to the circuit 603, the circuit 621_1, the circuit 621_2, the circuit 622, the circuit 624, or the like. Therefore, the output terminal 691 can be connected to the node j, the node m1, the node m2, the node k, or the like. Alternatively, the input terminals 692 and 693 can be connected to the node n1, the node n2, the wiring 111, the wiring 113, or the like.

Figure 29D:
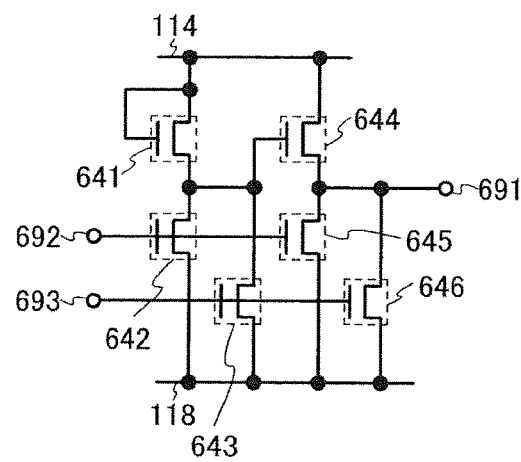

A circuit in FIG. 29D includes a transistor 641, a transistor 642, a transistor 643, a transistor 644, a transistor 645, and a transistor 646. A first terminal of the transistor 641 is connected to the wiring 114, a second terminal of the transistor 641 is connected to a gate of the transistor 644, and a gate of the transistor 641 is connected to the wiring 114. A first terminal of the transistor 642 is connected to the wiring 118, a second terminal of the transistor 642 is connected to a gate of the transistor 644, and a gate of the transistor 642 is connected to the input terminal 692. A first terminal of the transistor 643 is connected to the wiring 118, a second terminal of the transistor 643 is connected to the gate of the transistor 644, and a gate of the transistor 643 is connected to the input terminal 693. A first terminal of the transistor 644 is connected to the wiring 114 and a second terminal of the transistor 644 is connected to the output terminal 691. A first terminal of the transistor 645 is connected to the wiring 118, a second terminal of the transistor 645 is connected to the output terminal 691, and a gate of the transistor 645 is connected to the input terminal 692. A first terminal of the transistor 646 is connected to the wiring 118, a second terminal of the transistor 646 is connected to the output terminal 691, and a gate of the transistor 646 is connected to the input terminal 693. The circuit in FIG. 29D can be applied to the circuit 603, the circuit 621_1, the circuit 621_2, the circuit 622, the circuit 624, or the like. Therefore, the output terminal 691 can be connected to the node j, the node m1, the node m2, the node k, or the like. Alternatively, the input terminals 692 and 693 can be connected to the node n1, the node n2, the wiring 111, the wiring 113, or the like.

Figure 29E:
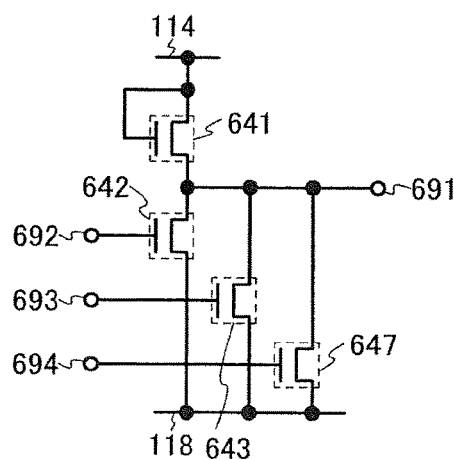

A circuit in FIG. 29E includes a transistor 641, a transistor 642, a transistor 643, and a transistor 647. A first terminal of the transistor 641 is connected to the wiring 114, a second terminal of the transistor 641 is connected to the output terminal 691, and a gate of the transistor 641 is connected to the wiring 114. A first terminal of the transistor 642 is connected to the wiring 118, a second terminal of the transistor 642 is connected to the output terminal 691, and a gate of the transistor 642 is connected to the input terminal 692. A first terminal of the transistor 643 is connected to the wiring 118, a second terminal of the transistor 643 is connected to the output terminal 691, and a gate of the transistor 643 is connected to the input terminal 693. A first terminal of the transistor 647 is connected to the wiring 118, a second terminal of the transistor 647 is connected to the output terminal 691, and a gate of the transistor 647 is connected to an input terminal 694. The circuit in FIG. 29E can be applied to the circuit 623 or the like. Therefore, the output terminal 691 can be connected to the node j or the like. Alternatively, the input terminals 692 to 694 can be connected to the node n1, the node n2, the wiring 113, or the like.

Figure 29F:
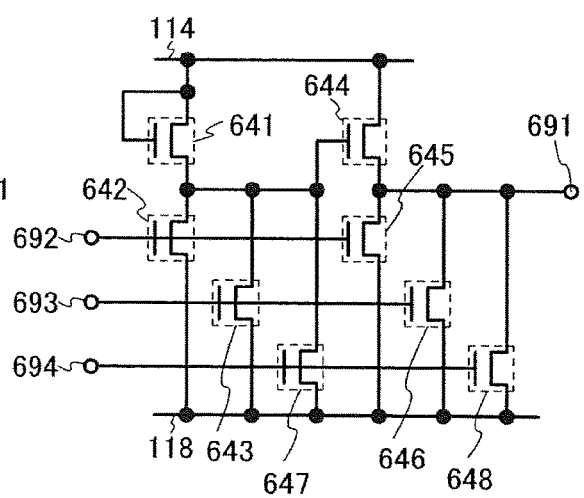

A circuit in FIG. 29F includes a transistor 641, a transistor 642, a transistor 643, a transistor 647, a transistor 644, a transistor 645, a transistor 646, and a transistor 648. A first terminal of the transistor 641 is connected to the wiring 114, a second terminal of the transistor 641 is connected to a gate of the transistor 644, and a gate of the transistor 641 is connected to the wiring 114. A first terminal of the transistor 642 is connected to the wiring 118, a second terminal of the transistor 642 is connected to the gate of the transistor 644, and a gate of the transistor 642 is connected to the input terminal 692. A first terminal of the transistor 643 is connected to the wiring 118, a second terminal of the transistor 643 is connected to the gate of the transistor 644, and a gate of the transistor 643 is connected to the input terminal 693. A first terminal of the transistor 647 is connected to the wiring 118, a second terminal of the transistor 647 is connected to the gate of the transistor 644, and a gate of the transistor 647 is connected to the input terminal 694. A first terminal of the transistor 644 is connected to the wiring 114 and a second terminal of the transistor 644 is connected to the output terminal 691. A first terminal of the transistor 645 is connected to the wiring 118, a second terminal of the transistor 645 is connected to the output terminal 691, and a gate of the transistor 645 is connected to the input terminal 692. A first terminal of the transistor 646 is connected to the wiring 118, a second terminal of the transistor 646 is connected to the output terminal 691, and a gate of the transistor 646 is connected to the input terminal 693. A first terminal of the transistor 648 is connected to the wiring 118, a second terminal of the transistor 648 is connected to the output terminal 691, and a gate of the transistor 648 is connected to the input terminal 694. The circuit in FIG. 29F can be applied to the circuit 623 or the like. Therefore, the output terminal 691 can be connected to the node j or the like. Alternatively, the input terminals 692 to 694 can be connected to the node n1, the node n2, the wiring 113, or the like.

Figure 30A:
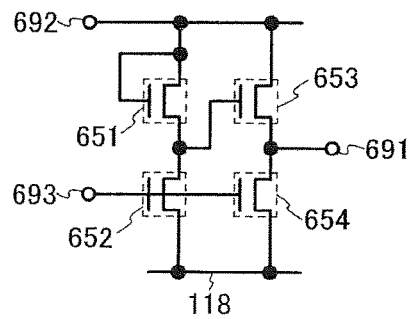
FIGS. 30A to 30G are examples of a circuit diagram of the semiconductor device in Embodiment 3.

A circuit in FIG. 30A includes a transistor 651, a transistor 652, a transistor 653, and a transistor 654. A first terminal of the transistor 651 is connected to the input terminal 692, a second terminal of the transistor 651 is connected to a gate of the transistor 653, and a gate of the transistor 651 is connected to the input terminal 692. A first terminal of the transistor 652 is connected to the wiring 118, a second terminal of the transistor 652 is connected to the gate of the transistor 653, and a gate of the transistor 652 is connected to the input terminal 693. A first terminal of the transistor 653 is connected to the input terminal 692 and a second terminal of the transistor 653 is connected to the output terminal 691. A first terminal of the transistor 654 is connected to the wiring 118, a second terminal of the transistor 654 is connected to the output terminal 691, and a gate of the transistor 654 is connected to the input terminal 693. The circuit in FIG. 30A can be applied to the circuit 611_1, the circuit 611_2, the circuit 612, and/or the circuit 614. Therefore, the output terminal 691 can be connected to the node m1, the node m2, the node k, or the like. Alternatively, the input terminals 693 and 694 can be connected to the node n1, the node n2, the wiring 111, or the like.

Figure 30B:
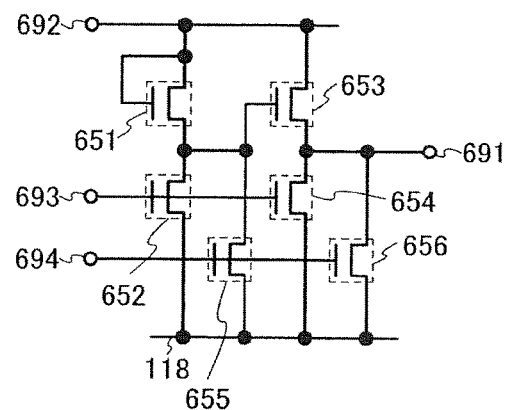

A circuit in FIG. 30B includes a transistor 651, a transistor 652, a transistor 653, a transistor 654, a transistor 655, and a transistor 656. A first terminal of the transistor 651 is connected to the input terminal 692, a second terminal of the transistor 651 is connected to the gate of the transistor 653, and a gate of the transistor 651 is connected to the input terminal 692. A first terminal of the transistor 652 is connected to the wiring 118, a second terminal of the transistor 652 is connected to the gate of the transistor 653, and a gate of the transistor 652 is connected to the input terminal 693.

A first terminal of the transistor 653 is connected to the input terminal 692 and a second terminal of the transistor 653 is connected to the output terminal 691. A first terminal of the transistor 654 is connected to the wiring 118, a second terminal of the transistor 654 is connected to the output terminal 691, and a gate of the transistor 654 is connected to the input terminal 693. A first terminal of the transistor 655 is connected to the wiring 118, a second terminal of the transistor 655 is connected to the gate of the transistor 653, and a gate of the transistor 655 is connected to the input terminal 694. A first terminal of the transistor 656 is connected to the wiring 118, a second terminal of the transistor 656 is connected to the output terminal 691, and a gate of the transistor 656 is connected to the input terminal 694. The circuit in FIG. 30B can be applied to the circuit 613 or the like. Therefore, the output terminal 691 can be connected to the node j or the like. Alternatively, the input terminal 692 can be connected to the wiring 113 or the like. Alternatively, the input terminals 693 and 694 can be connected to the node n1, the node n2, or the like.

Figure 30C:
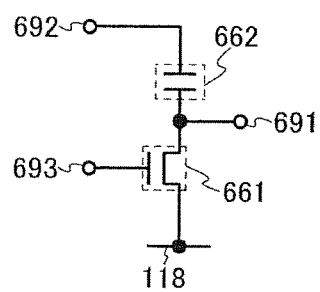

A circuit in FIG. 30C includes a transistor 661 and a capacitor 662. A first terminal of the transistor 661 is connected to the wiring 118, a second terminal of the transistor 661 is connected to the output terminal 691, and a gate of the transistor 661 is connected to the input terminal 693. One electrode of the capacitor 662 is connected to the input terminal 692, and the other electrode of the capacitor 662 is connected to the output terminal 691. The circuit in FIG. 30C can be applied to the circuit 611_1, the circuit 611_2, the circuit 612, and/or the circuit 614. Therefore, the output terminal 691 can be connected to the node m1, the node m2, the node k, the node j, or the like. Alternatively, the input terminal 692 can be connected to the wiring 113 or the like. Alternatively, the input terminal 693 can be connected to the node n1, the node n2, the wiring 111, or the like.

Figure 30D:
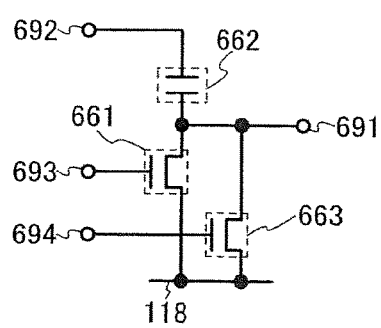

A circuit in FIG. 30D includes a transistor 661, a capacitor 662, and a transistor 663. A first terminal of the transistor 661 is connected to the wiring 118, a second terminal of the transistor 661 is connected to the output terminal 691, and a gate of the transistor 661 is connected to the input terminal 693. One electrode of the capacitor 662 is connected to the input terminal 692, and the other electrode of the capacitor 662 is connected to the output terminal 691. A first terminal of the transistor 663 is connected to the wiring 118, a second terminal of the transistor 663 is connected to the output terminal 691, and a gate of the transistor 663 is connected to the input terminal 694. The circuit in FIG. 30D can be applied to the circuit 613 or the like. Therefore, the output terminal 691 can be connected to the node j or the like. Alternatively, the input terminal 692 can be connected to the wiring 113 or the like. Alternatively, the input terminals 693 and 694 can be connected to the node n1, the node n2, or the like.

Figure 30E:
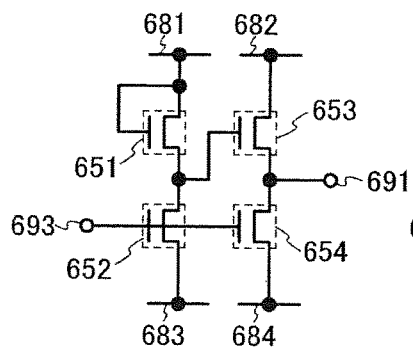

Note that the circuit structure is not limited to those shown in FIGS. 29A to 29F and FIGS. 30A to 30D. For example, in the structure described with reference to FIGS. 29A to 29F and FIGS. 30A to 30D, terminals of the transistors can be connected to different wirings or terminals as shown in FIG. 30E. In the example of FIG. 30E, the first terminal of the transistor 651 is connected to a wiring 681, the first terminal of the transistor 653 is connected to a wiring 682, the first terminal of the transistor 652 is connected to a wiring 683, the first terminal of the transistor 654 is connected to a wiring 684. However, this embodiment is not limited to this.

Figures 30F, 30G:
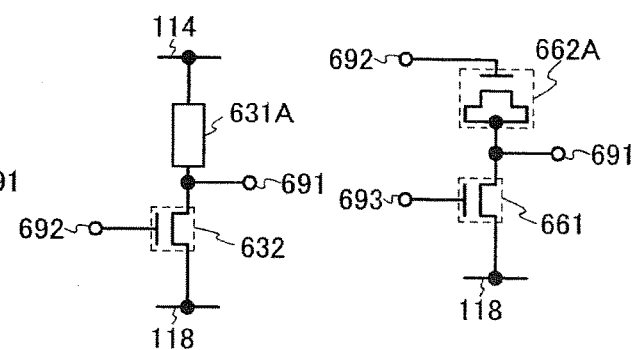

Alternatively, in the structures described with reference to FIGS. 29A to 29F and FIGS. 30A to 30E, a diode-connected transistor can be replaced with a resistor or another element such as a diode as shown in FIG. 30F. In the example of FIG. 30F, the transistor 631 is replaced with an element 631A. One terminal of the element 631A is connected to the wiring 114, and the other terminal of the element 631A is connected to the output terminal 691. The element 631A functions as an element containing a resistance component (e.g., a resistor or a diode).

Alternatively, in the structures described with reference to FIGS. 29A to 29F and FIGS. 30A to 30F, a transistor or a MIS capacitor can be used as the capacitor as shown in FIG. 30G. In the example of FIG. 30G, a transistor 662A is used as the capacitor 662. A first terminal and a second terminal of the transistor 662A are connected to the output terminal 691, and a gate of the transistor 662A is connected to the input terminal 692.

(Embodiment 4)

In this embodiment, one example of a semiconductor device will be described. The semiconductor device in this embodiment can be used as the circuit 500 described in Embodiment 2. Note that description of the content in Embodiments 1 to 3 is omitted. Note that the content described in this embodiment can be combined with the content described in Embodiments 1 to 3, as appropriate.

Figure 31A:
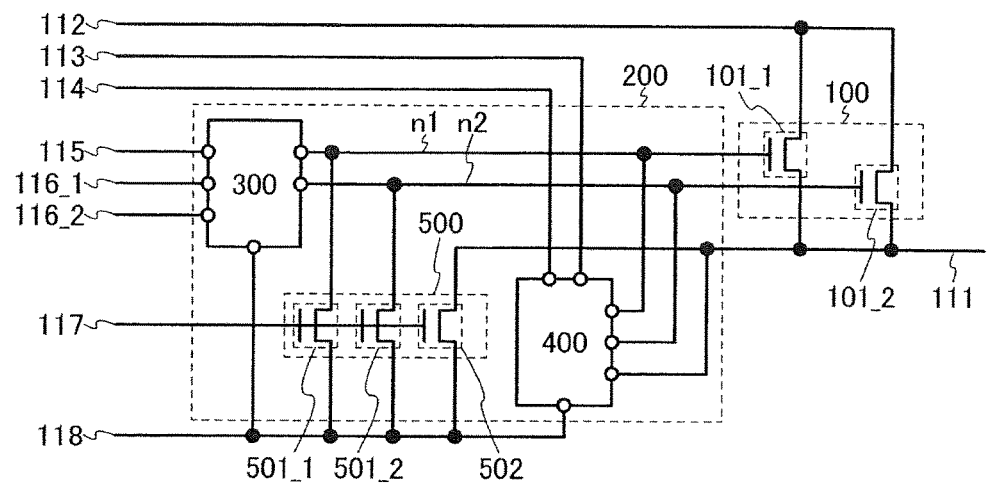
FIGS. 31A to 31D are examples of a circuit diagram of a semiconductor device in Embodiment 4.

First, an example of the circuit 500 will be described with reference to FIG. 31A. In the example of FIG. 31A, the circuit 500 includes a transistor 501_1, a transistor 501_2, and a transistor 502. The transistor 501_1, the transistor 501_2, and the transistor 502 preferably have the same polarity as the transistors 101_1 and 101_2, which are n-channel transistors. However, this embodiment is not limited to this, that is, the transistor 501_1, the transistor 501_2, and the transistor 502 can be p-channel transistors. Note that the circuit 500 need not have all of these transistors and some of these transistors can be omitted.

A first terminal of the transistor 501_1 is connected to the wiring 118, a second terminal of the transistor 501_1 is connected to the node n1, and a gate of the transistor 501_1 is connected to the wiring 117. A first terminal of the transistor 501_2 is connected to the wiring 118, a second terminal of the transistor 501_2 is connected to the node n2, and a gate of the transistor 501_2 is connected to the wiring 117. A first terminal of the transistor 502 is connected to the wiring 118, a second terminal of the transistor 502 is connected to the wiring 111, and a gate of the transistor 502 is connected to the wiring 117.

The transistor 501_1 has the function of controlling electrical continuity between the wiring 118 and the node n1, for example. Alternatively, the transistor 501_1 has the function of controlling the timing of when the voltage of the wiring 118 is supplied to the node n1. For example, when a signal or a voltage (e.g., the signal CK2 or the voltage V1) is supplied to the wiring 118, the transistor 501_1 has the function of controlling the timing of when the signal or the voltage supplied to the wiring 118 is supplied to the node n1. Alternatively, the transistor 501_1 has the function of controlling the timing of when a low-level signal or the voltage V1 is supplied to the node n1. Alternatively, the transistor 501_1 has the function of controlling the timing of when the voltage of the node n1 is decreased or maintained. As described above, the transistor 501_1 can function as a switch. However, this embodiment is not limited to this. Note that the transistor 501_1 need not have all of the functions above.

The transistor 501_2 has the function of controlling electrical continuity between the wiring 118 and the node n2, for example. Alternatively, the transistor 501_2 has the function of controlling the timing of when the voltage of the wiring 118 is supplied to the node n2. For example, when a signal or a voltage (e.g., the signal CK2 or the voltage V1) is supplied to the wiring 118, the transistor 501_2 has the function of controlling the timing of when the signal or the voltage supplied to the wiring 118 is supplied to the node n2. Alternatively, the transistor 501_2 has the function of controlling the timing of when a low-level signal or the voltage V1 is supplied to the node n2. Alternatively, the transistor 501_2 has the function of controlling the timing of when the voltage of the node n2 is decreased or maintained. As described above, the transistor 501_2 can function as a switch. However, this embodiment is not limited to this. Note that the transistor 501_2 need not have all of the functions above.

The transistor 502 has the function of controlling electrical continuity between the wiring 118 and the wiring 111, for example. Alternatively, the transistor 502 has the function of controlling the timing of when the voltage of the wiring 118 is supplied to the wiring 111. For example, when a signal or a voltage (e.g., the signal CK2 or the voltage V1) is supplied to the wiring 118, the transistor 502 has the function of controlling the timing of when the signal or the voltage supplied to the wiring 118 is supplied to the wiring 111. Alternatively, the transistor 502 has the function of controlling the timing of when a low-level signal or the voltage V1 is supplied to the wiring 111. Alternatively, the transistor 502 has the function of controlling the timing of when the voltage of the wiring 111 is decreased or maintained. As described above, the transistor 502 can function as a switch. However, this embodiment is not limited to this. Note that the transistor 502 need not have all of the functions above.

Next, an example of the operation of the semiconductor device in FIG. 31A is described. Note that since the semiconductor device in FIG. 31A operates in a manner similar to the semiconductor device in FIG. 1A, the operation of the semiconductor device in FIG. 31A will be described with reference to the timing chart in FIG. 2. Note that the operation of the semiconductor device in FIG. 31A is not limited to that shown in the timing chart in FIG. 2 and can be controlled at different timings.

During the periods A1 to B1, D1 to E1, A2 to B2, and the periods C2 to E2, as shown in FIGS. 32A and 32B, FIGS. 33A to 33C, and FIG. 34B, the signal RE is at a low-level. Accordingly, the transistors 501_1, 501_2, and 502 are turned off.

Figure 32A:
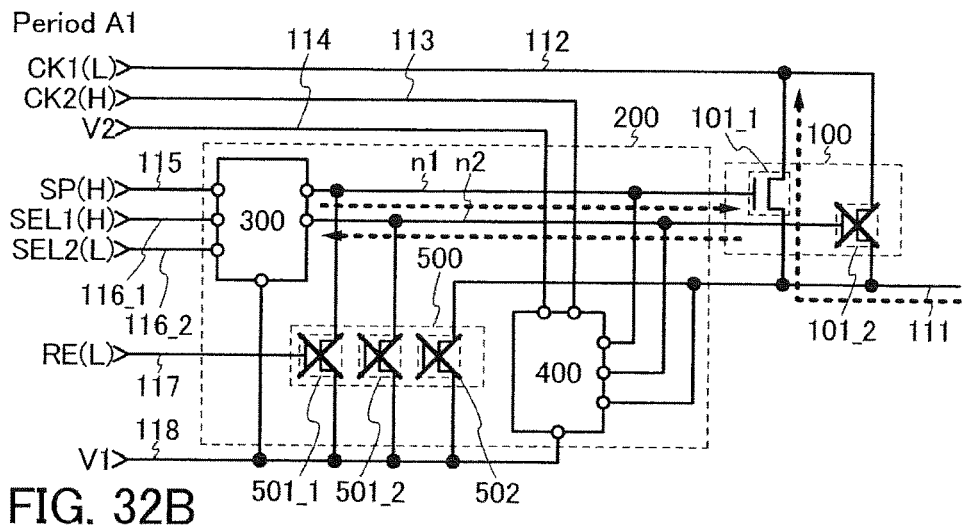
FIGS. 32A to 32C are examples of a schematic view for showing operation of the semiconductor device in Embodiment 4.
Figure 32B:
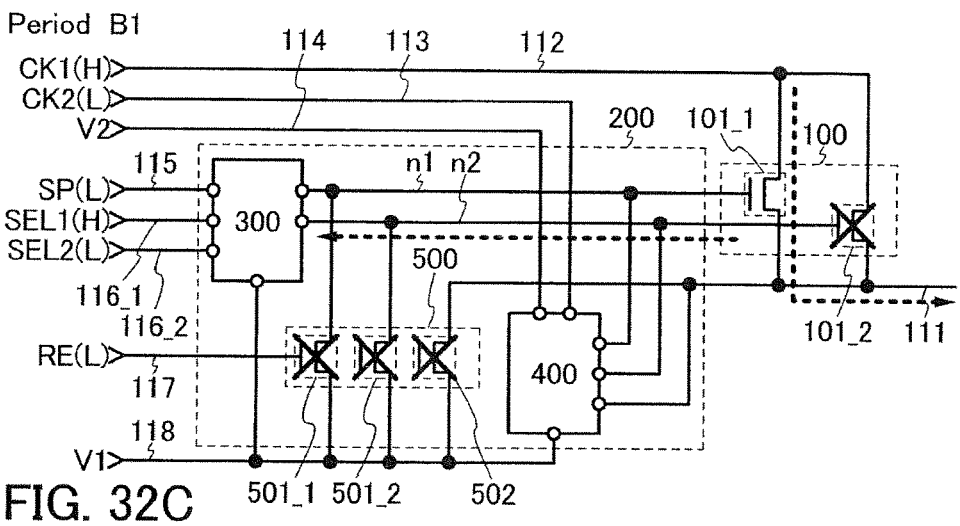
Figure 32C:
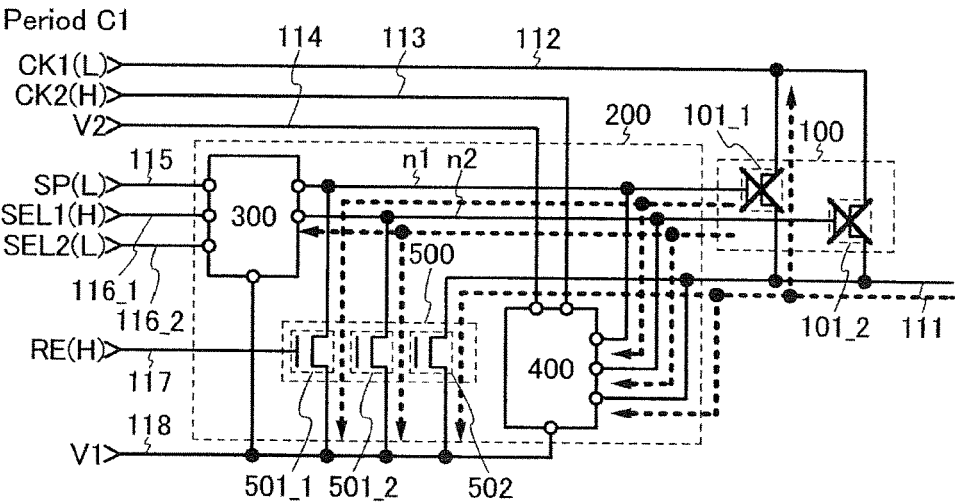
Figure 33A:
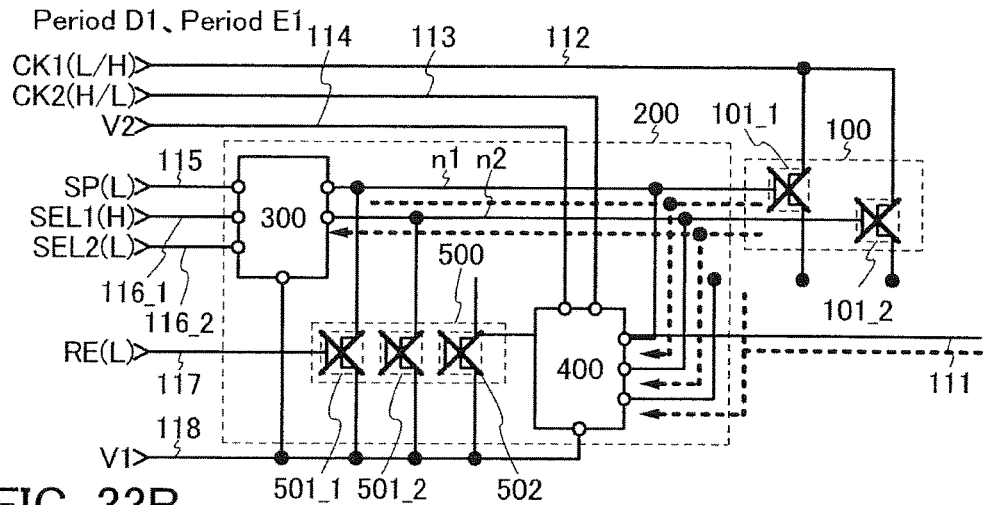
FIGS. 33A to 33C are examples of a schematic view for showing operation of the semiconductor device in Embodiment 4.
Figure 33B:
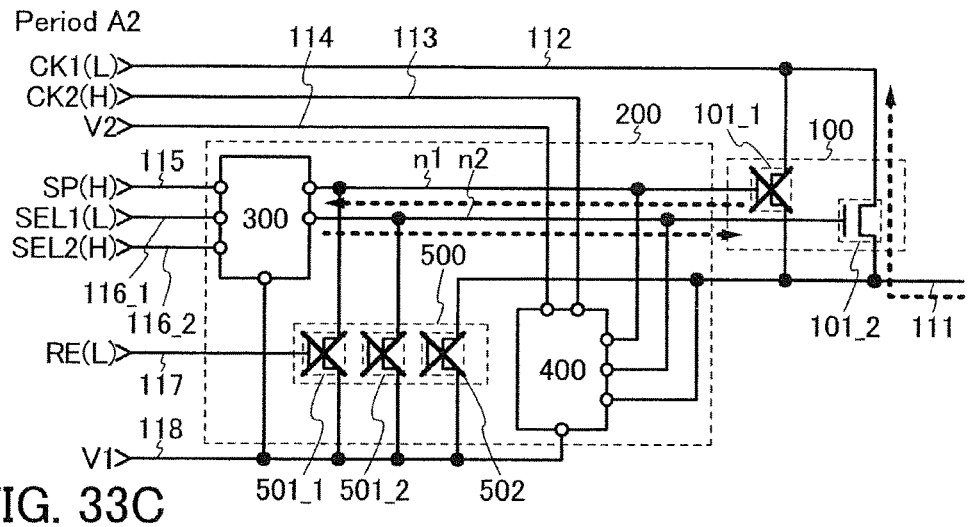
Figure 33C:
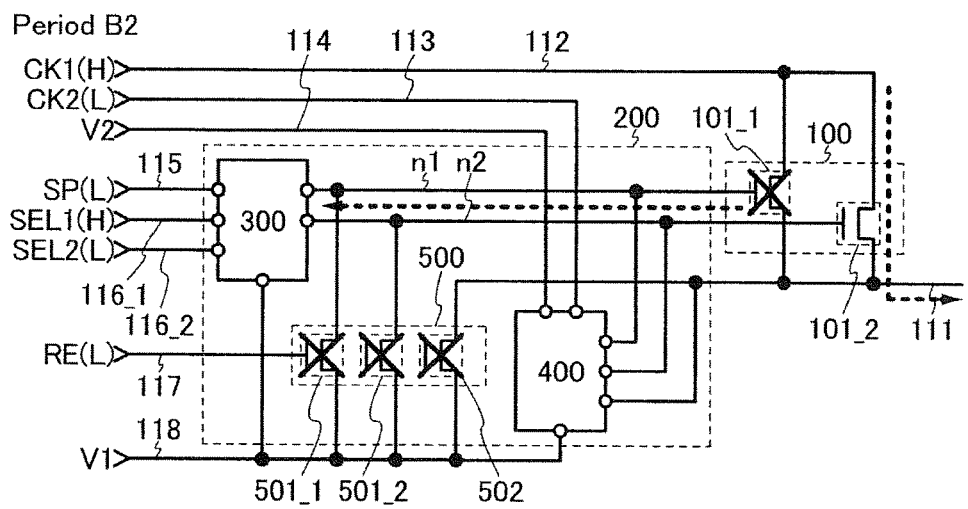
Figure 34A:
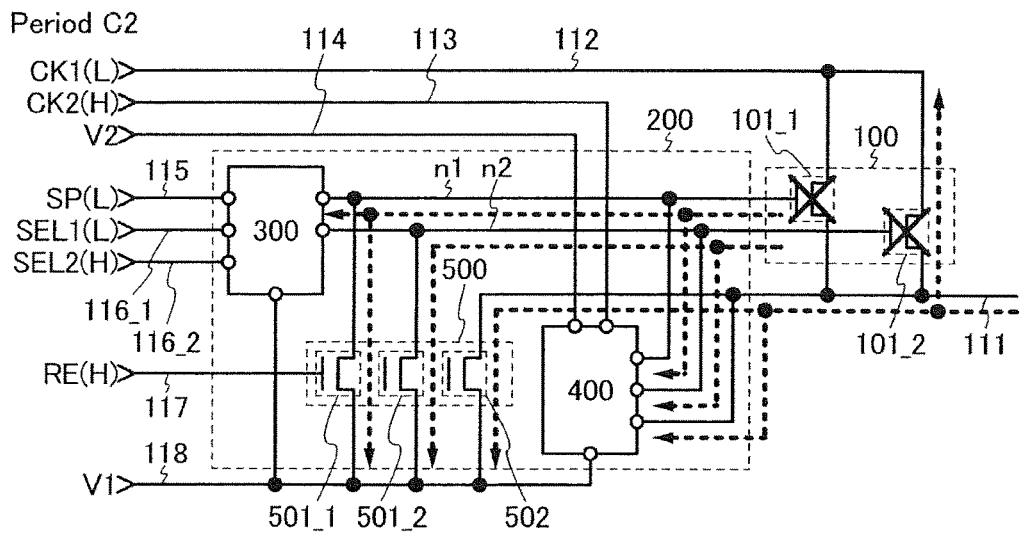
FIGS. 34A and 34B are examples of a schematic view for showing operation of the semiconductor device in Embodiment 4.
Figure 34B:
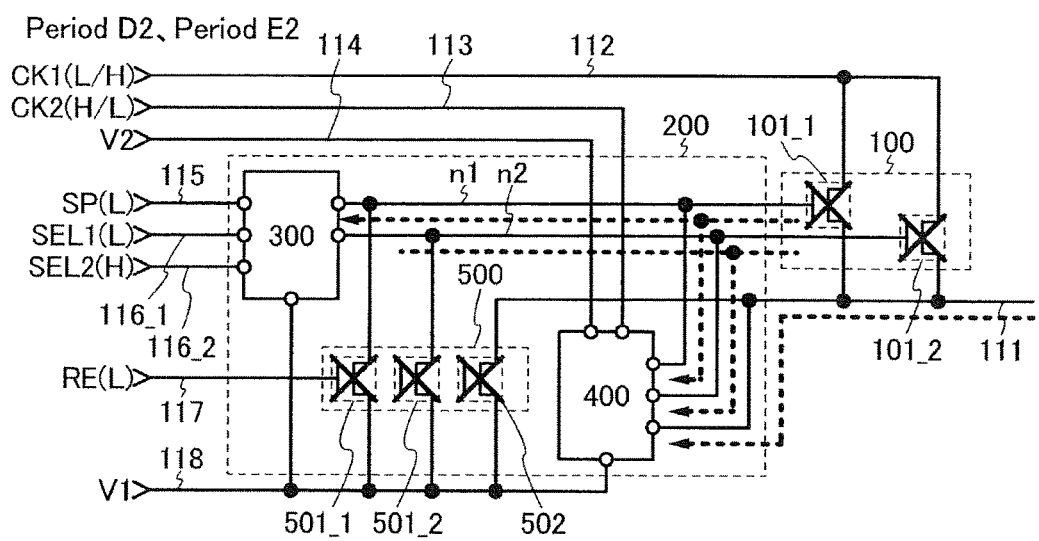

During the periods C1 and C2, as shown in FIG. 32C and FIG. 34A, the signal RE is at a high level. Therefore, the transistor 501_1 is turned on; thus, electrical continuity is established between the wiring 118 and the node n1 through the transistor 501_1. Accordingly, the voltage V1 is supplied from the wiring 118 to the node n1 through the transistor 501_1. The transistor 501_2 is turned on; thus, electrical continuity is established between the wiring 118 and the node n2 through the transistor 501_2. Therefore, the voltage V1 is supplied from the wiring 118 to the node n2 through the transistor 501_2. The transistor 502 is turned on; thus, electrical continuity is established between the wiring 111 and the wiring 118 through the transistor 502. Accordingly, the voltage V1 is supplied from the wiring 118 to the wiring 111 through the transistor 502.

Note that it is preferable that the channel width of the transistor 501_1 be substantially equal to that of the transistor 501_2. Thus, the degree of the change in the voltage of the node n1 during the period T1 and the degree of the change in the voltage of the node n2 during the period T2 can be substantially equal. Accordingly, the waveform of the signal OUT can be substantially uniform. Note that for a similar reason, it is preferable that the channel length of the transistor 501_1 be substantially equal to that of the transistor 501_2. However, this embodiment is not limited to this.

Note that each of the channel width of the transistor 501_1 and the channel width of the transistor 501_2 are preferably smaller than that of the transistor 502. This is because the time over which the voltage of the node n1 during the period C1 is decreased and the time over which the voltage of the node n2 during the period C2 is decreased can be shortened. Thus, the signal CK1 at a low level is supplied to the wiring 111 through the transistor 101_1 or the transistor 101_2; therefore, the fall time of the signal OUT can be shortened. Alternatively, during the periods C1 and C2, the voltage V1 is supplied to the wiring 111 through the transistor 502; therefore, the fall time of the signal OUT can be shortened.

Note that each of the channel width of the transistor 501_1 and the channel width of the transistor 501_2 is preferably 100 µm to 3000 µm, more preferably 300 µm to 2000 µm, and much more preferably 300 µm to 1000 µm. However, this embodiment is not limited to this.

Note that the channel width of the transistor 502 is preferably 500 µm to 5000 µm, more preferably 1000 µm to 30000 µm, and much more preferably 2000 µm to 3000 µm. However, this embodiment is not limited to this.

Figure 31B:
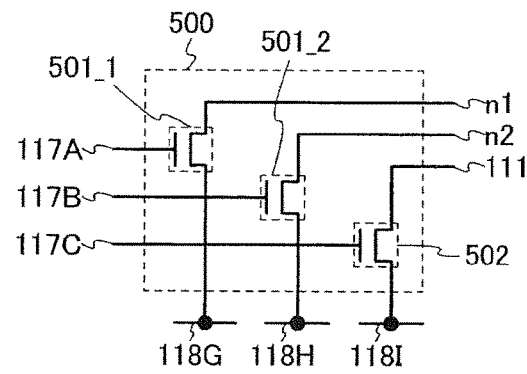

Note that in the structure described with reference to FIG. 31A, the first terminal of the transistor 501_1, the first terminal of the transistor 501_2, and the first terminal of the transistor 502 can be connected to different wirings as shown in FIG. 31B. In the example of FIG. 31B, the wiring 118 is divided into a plurality of wirings, that is, wirings 118G to 118I. The first terminal of the transistor 501_1 is connected to the wiring 118G. The first terminal of the transistor 501_2 is connected to the wiring 118H. The first terminal of the transistor 502 is connected to the wiring 118I. However, this embodiment is not limited to this. Note that the wirings 118G to 118I can function in a manner similar to the wiring 118. Accordingly, a voltage such as the voltage V1 can be input to the wirings 118G to 118I, and the wirings 118G to 118I can thus function as signal lines. However, this embodiment is not limited to this. For example, the wirings 118G to 118I can be supplied with different signals or different voltages.

Figure 31C:
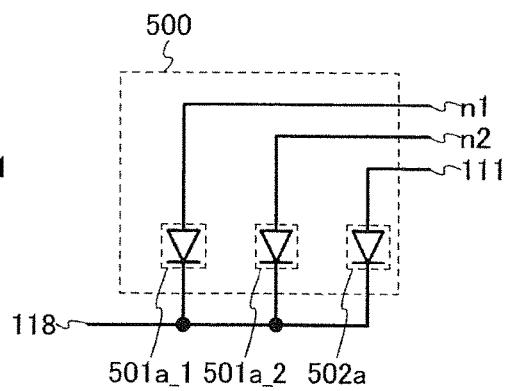
Figure 31D:
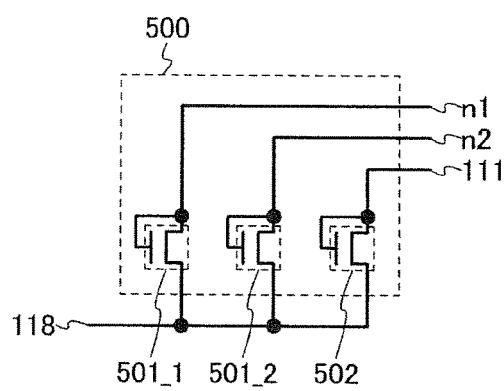

Note that in the structures described with reference to FIGS. 31A and 31B, the transistor 501_1 can be replaced with a diode 501a_1. One terminal of the diode 501a_1 is connected to the node n1, and the other terminal is connected to the wiring 118 as shown in FIG. 31C. Alternatively, the transistor 501_2 can be replaced with a diode 501a_2. One terminal of the diode 501a_2 is connected to the node n2, and the other terminal is connected to the wiring 118. Alternatively, the transistor 502 can be replaced with a diode 502a. One terminal of the diode 502a is connected to the wiring 111, and the other terminal is connected to the wiring 118. However, this embodiment is not limited to this. For example, in the structures described with reference to FIGS. 31A and 31B, connecting the gate terminal of the transistor 501_1 to the node n1 allows the transistor 501_1 to be diode-connected as shown in FIG. 31D. In a similar manner, connecting the gate terminal of the transistor 501_2 to the node n2 allows the transistor 501_2 to be diode-connected. In a similar manner, connecting the gate terminal of the transistor 502 to the wiring 111 allows the transistor 502 to be diode-connected.

Figure 35:
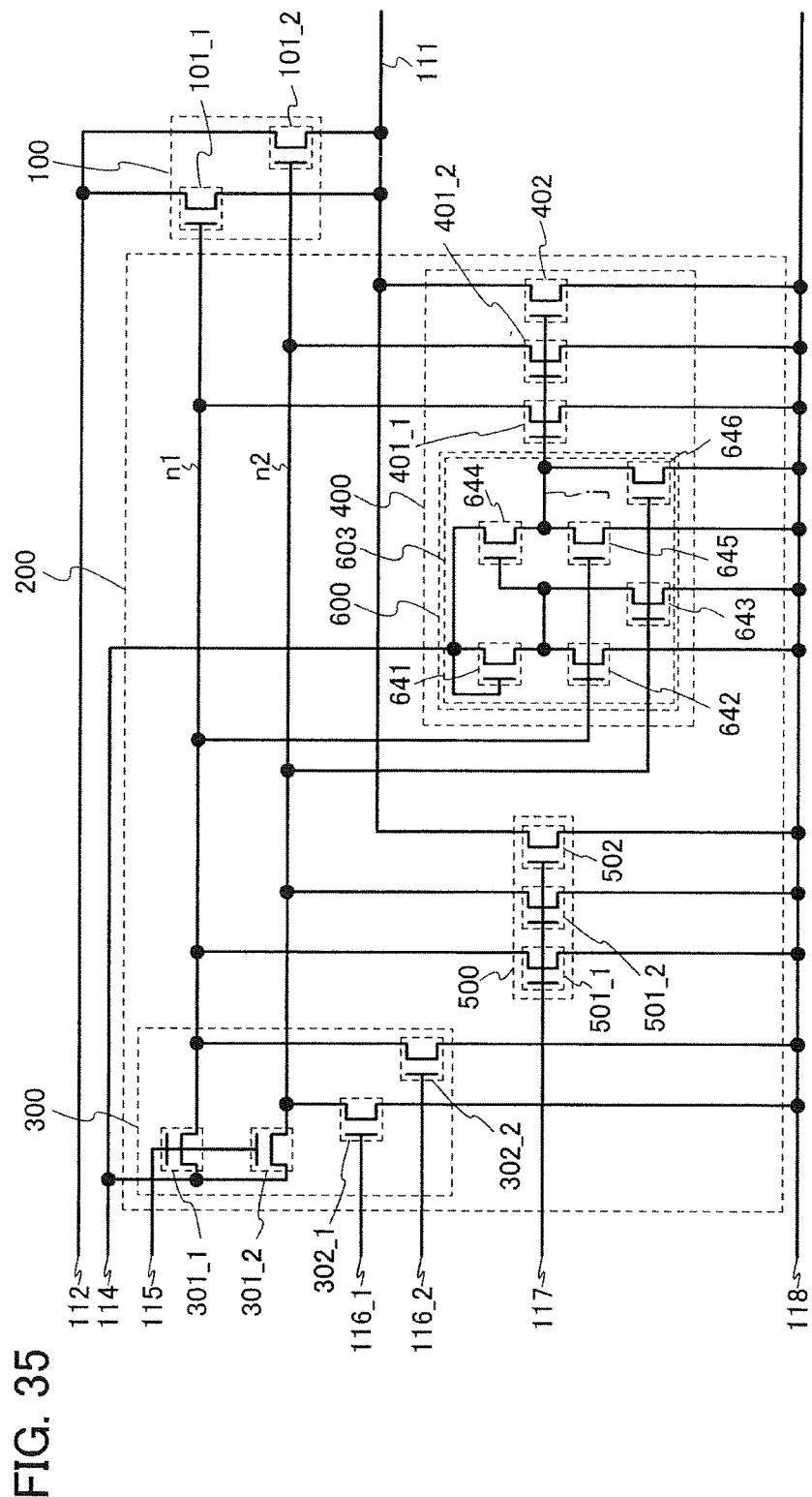
FIG. 35 is an example of a circuit diagram of the semiconductor device in Embodiment 4.
Figure 36:
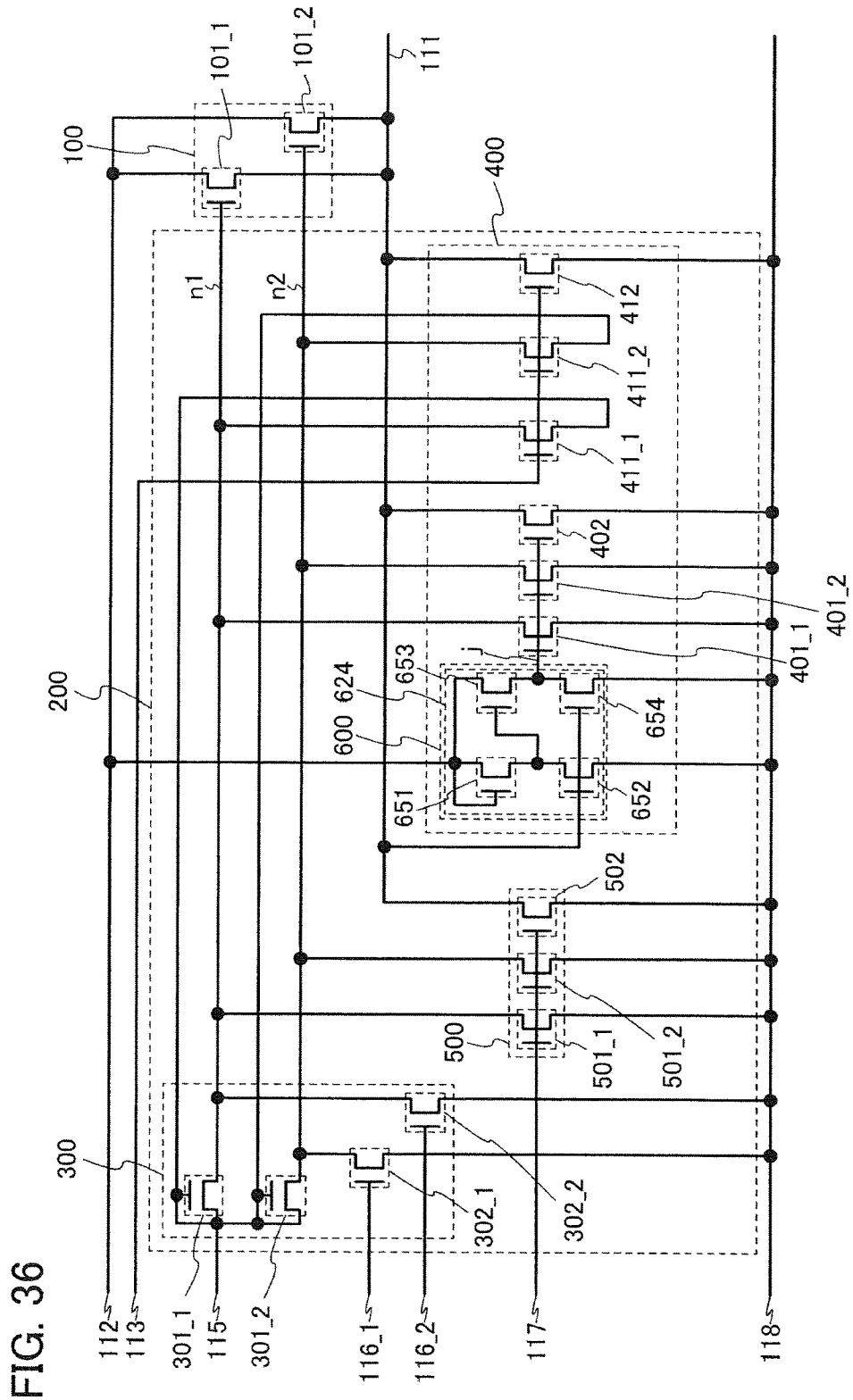
FIG. 36 is an example of a circuit diagram of the semiconductor device in Embodiment 4.

Here, an example of the semiconductor device in the case of combining the contents described in Embodiments 1 to 4 is shown in FIG. 35 and FIG. 36. However, this embodiment is not limited to this, that is, the semiconductor device can have various other structures by the combination of the contents described in Embodiments 1 to 4.

In a semiconductor device in FIG. 35, the structure described with reference to FIG. 1A is used as the circuit 100. The structure described with reference to FIG. 18B is used as the circuit 300. The structure described with reference to FIG. 26A is used as the circuit 400. The structure described with reference to FIG. 31A is used as the circuit 500. The structure described with reference to FIG. 28B is used as the circuit 600. The structure described with reference to FIG. 29D is used as the circuit 603. However, this embodiment is not limited to this.

In a semiconductor device in FIG. 36, the structure described with reference to FIG. 1A is used as the circuit 100. The structure described with reference to FIG. 14B is used as the circuit 300. The structure described with reference to FIG. 25A is used as the circuit 400. The structure described with reference to FIG. 31A is used as the circuit 500. The structure described with reference to FIG. 28H is used as the circuit 600. The structure described with reference to FIG. 30A is used as the circuit 624. However, this embodiment is not limited to this.

As an example, the operation of the semiconductor device in FIG. 35 will be described. Here, description will be given with reference to the timing chart in FIG. 2.

During the period A1, the signal SP is at a high level. Accordingly, the transistor 301_1 is turned on; thus, electrical continuity is established between the wiring 114 and the node n1. The transistor 301_2 is turned on; thus, electrical continuity is established between the wiring 114 and the node n2. Here, the signal SEL1 is at a high level and the signal SEL2 is at a low level. Accordingly, the transistor 302_1 is turned on and the transistor 302_2 is turned off; thus, electrical continuity is established between the wiring 118 and the node n2. As a result, the voltage of the node n1 is increased, and the voltage of the node n2 is maintained at a low value (e.g., V1). Accordingly, the transistor 101_1 is turned on, and the transistor 101_2 is turned off; thus, electrical continuity is established between the wiring 112 and the wiring 111. Here, in the circuit 600, the transistor 642 and the transistor 645 are turned on, and the transistor 643 and the transistor 646 are turned off. Therefore, electrical continuity is established between the wiring 118 and the gate of the transistor 644 and between the wiring 118 and the node j. As a result, the gate voltage of the transistor 644 becomes a low value (e.g., V1). Accordingly, the transistor 644 is turned off; thus, electrical continuity is broken between the wiring 114 and the node j. Therefore, the voltage of the node j becomes a low value (e.g., V1); thus, the transistor 401_1, the transistor 401_2, and the transistor 402 are turned off. Here, the signal RE is at a low level. Accordingly, the transistors 501_1, 501_2, and 502 are turned off. Therefore, electrical continuity is broken between the wiring 118 and the node n1, electrical continuity is established between the wiring 118 and the node n2, and electrical continuity is broken between the wiring 118 and the wiring 111.

During the period B1, the signal SP is at a low level. Accordingly, the transistor 301_1 is turned off; thus, electrical continuity is broken between the wiring 114 and the node n1. The transistor 301_2 is turned off, thus, electrical continuity is broken between the wiring 114 and the node n2. Here, the signal SEL1 remains at a high level, and the signal SEL2 remains at a low level. Accordingly, the transistor 302_1 remains on, and the transistor 302_2 remains off; therefore, electrical continuity remains between the wiring 118 and the node n2. As a result, the voltage of the node n1 is increased by the bootstrap operation, and the voltage of the node n2 remains at a low value (e.g., V1). Accordingly, the transistor 101_1 remains on, and the transistor 101_2 remains off; thus, electrical continuity remains between the wiring 112 and the wiring 111. Here, in the circuit 600, as during the period A1, the transistor 642 and the transistor 645 remain on, and the transistor 643 and the transistor 646 remain off. Therefore, the transistor 644 remains off and the voltage of the node j remains at a low value (e.g., V1). Accordingly the transistor 401_1, the transistor 401_2, and the transistor 402 remain off. Here, the signal RE remains at a low level. Accordingly, the transistors 501_1, 501_2, and 502 remain off. Thus, there is still no electrical continuity between the wiring 118 and the node n1, electrical continuity remains between the wiring 118 and the node n2, and there is still no electrical continuity between the wiring 118 and the wiring 111.

During the period C1, the signal SP remains at a low level. Accordingly, the transistor 301_1 and the transistor 301_2 remain off; thus, there is still no electrical continuity between the wiring 114 and the node n1 and between the wiring 114 and the node n2. Here, the signal SEL1 remains at a high level, and the signal SEL2 remains at a low level. Accordingly, the transistor 302_1 remains on and the transistor 302_2 remains off, thus, electrical continuity remains between the wiring 118 and the node n2. Here, the signal RE is at a high level. Therefore, the transistors 501_1, 501_2, and 502 are turned on; thus, electrical continuity is established between the wiring 118 and the node n1, the wiring 118 and the node n2, and between the wiring 118 and the wiring 111. As a result, the voltage of the node n1, the voltage of the node n2, and the voltage of the wiring 111 are decreased. Accordingly, the transistor 101_1 and the transistor 101_2 are turned off; thus, electrical continuity is broken between the wiring 112 and the wiring 111. Here, in the circuit 600, the transistor 642, the transistor 643, the transistor 645, and the transistor 646 are turned off. Therefore, the voltage V2 is supplied to the gate of the transistor 644 through the transistor 641; thus, the gate voltage of the transistor 644 is increased. Accordingly, the transistor 644 is turned on; thus, electrical continuity is established between the wiring 114 and the node j. As a result, the gate voltage of these transistors is increased, and the transistor 401_1, the transistor 401_2, and the transistor 402 are turned on.

During the periods D1 and E1, the signal SP remains at a low level. Accordingly, the transistor 301_1 and the transistor 301_2 remain off; thus, there is still no electrical continuity between the wiring 114 and the node n1 and between the wiring 114 and the node n2. Here, the signal SEL1 remains at a high level, and the signal SEL2 remains at a low level. Accordingly, the transistor 302_1 remains on and the transistor 302_2 remains off; thus, electrical continuity remains between the wiring 118 and the node n2. Here, in the circuit 600, the transistor 642, the transistor 643, the transistor 645, and the transistor 646 remain off; thus, the voltage of the node j remains high. Therefore, the transistors 401_1, 401_2, and 402 are turned on; thus, electrical continuity is established between the wiring 118 and the node n1, the wiring 118 and the node n2, and the wiring 118 and the wiring 111. As a result, the voltage of the node n1, the voltage of the node n2, and the voltage of the wiring 111 are maintained at a low value (e.g., V1). Accordingly, the transistor 101_1 and the transistor 101_2 are turned off; thus, electrical continuity is broken between the wiring 112 and the wiring 111.

During the period A2, the signal SP is at a high level. Accordingly, the transistor 301_1 is turned on; thus, electrical continuity is established between the wiring 114 and the node n1. The transistor 301_2 is turned on; thus, electrical continuity is established between the wiring 114 and the node n2. Here, the signal SEL1 is at a low level and the signal SEL2 is at a high level. Accordingly, the transistor 302_1 is turned off, and the transistor 302_2 is turned on; thus, electrical continuity is established between the wiring 118 and the node n1. As a result, the voltage of the node n1 is maintained at a low value (e.g., V1), and the voltage of the node n2 is increased. Accordingly, the transistor 101_1 is turned off, and the transistor 101_2 is turned on; thus, electrical continuity is established between the wiring 112 and the wiring 111. Here, in the circuit 600, the transistor 642 and the transistor 645 are turned off, and the transistor 643 and the transistor 646 are turned on. Therefore, electrical continuity is established between the wiring 118 and the gate of the transistor 644 and between the wiring 118 and the node j. As a result, the gate voltage of the transistor 644 becomes a low value (e.g., V1). Accordingly, the transistor 644 is turned off; thus, electrical continuity is broken between the wiring 114 and the node j. Therefore, the gate voltage of these transistors becomes a low value (e.g., V1); thus, the transistor 401_1, the transistor 401_2, and the transistor 402 are turned off. Here, the signal RE is at a low level. Accordingly, the transistors 501_1, 501_2, and 502 are turned off. Therefore, electrical continuity is established between the wiring 118 and the node n1, and electrical continuity is broken between the wiring 118 and the node n2 and between the wiring 118 and the wiring 111.

During the period B2, the signal SP is at a low level. Accordingly, the transistor 301_1 is turned off; thus, electrical continuity is broken between the wiring 114 and the node n1. The transistor 301_2 is turned off; thus, electrical continuity is broken between the wiring 114 and the node n2. Here, the signal SEL1 remains at a low level, and the signal SEL2 remains at a high level. Accordingly, the transistor 302_1 remains off and the transistor 302_2 remains on; therefore, electrical continuity remains between the wiring 118 and the node n1. As a result, the voltage of the node n1 remains at a low value (e.g., less than V1), and the voltage of the node n2 is increased by the bootstrap operation. Accordingly, the transistor 101_1 remains off, and the transistor 101_2 remains on; thus, electrical continuity remains between the wiring 112 and the wiring 111. Here, in the circuit 600, as during the period A1, the transistor 642 and the transistor 645 remain off, and the transistor 643 and the transistor 646 remain on. Therefore, the transistor 644 remains off, and the gate voltage of the transistor 401_1, the transistor 401_2, and the transistor 402 remains at a low value (e.g., V1). Accordingly the transistor 401_1, the transistor 401_2, and the transistor 402 remain off. Here, the signal RE remains at a low level. Accordingly, the transistors 501_1, 501_2, and 502 remain off. Thus, electrical continuity remains between the wiring 118 and the node n1, and there is still no electrical continuity between the wiring 118 and the node n2 and between the wiring 118 and the wiring 111.

During the period C2, the signal SP remains at a low level. Accordingly, the transistor 301_1 and the transistor 301_2 remain off thus, there is still no electrical continuity between the wiring 114 and the node n1 and between the wiring 114 and the node n2. Here, the signal SEL1 remains at a low level, and the signal SEL2 remains at a high level. Accordingly, the transistor 302_1 remains off, and the transistor 302_2 remains on; thus, electrical continuity remains between the wiring 118 and the node n1. Here, the signal RE is at a high level. Therefore, the transistors 501_1, 501_2, and 502 are turned on; thus, electrical continuity is established between the wiring 118 and the node n1, between the wiring 118 and the node n2, and between the wiring 118 and the wiring 111. As a result, the voltage of the node n1, the voltage of the node n2, and the voltage of the wiring 111 are decreased. Accordingly, the transistor 101_1 and the transistor 101_2 are turned off; thus, electrical continuity is broken between the wiring 112 and the wiring 111. Here, in the circuit 600, the transistor 642, the transistor 643, the transistor 645, and the transistor 646 are turned off. Therefore, the voltage V2 is supplied to the gate of the transistor 644 through the transistor 641; thus, the gate voltage of the transistor 644 is increased. Accordingly, the transistor 644 is turned on; thus, electrical continuity is established between the wiring 114 and the node j. As a result, the gate voltage of the transistors 401_1, 401_2, and 402 is increased, and the transistor 401_1, the transistor 401_2, and the transistor 402 are turned on.

During the periods D2 and E2, the signal SP remains at a low level. Accordingly, the transistor 301_1 and the transistor 301_2 remain off; thus, there is still no electrical continuity between the wiring 114 and the node n1 and between the wiring 114 and the node n2. Here, the signal SEL1 remains at a low level, and the signal SEL2 remains at a high level. Accordingly, the transistor 302_1 remains off, and the transistor 302_2 remains on; thus, electrical continuity remains between the wiring 118 and the node n1. Here, in the circuit 600, the transistor 642, the transistor 643, the transistor 645, and the transistor 646 remain off; thus, the voltage of the node j remains high. Therefore, the transistors 401_1, 401_2, and 402 are turned on; thus, electrical continuity is established between the wiring 118 and the node n1, between the wiring 118 and the node n2, and between the wiring 118 and the wiring 111. As a result, the voltage of the node n1, the voltage of the node n2, and the voltage of the wiring 111 is maintained at a low value (e.g., V1). Accordingly, the transistor 101_1 and the transistor 101_2 are turned off; thus electrical continuity is broken between the wiring 112 and the wiring 111.

Figure 49A:
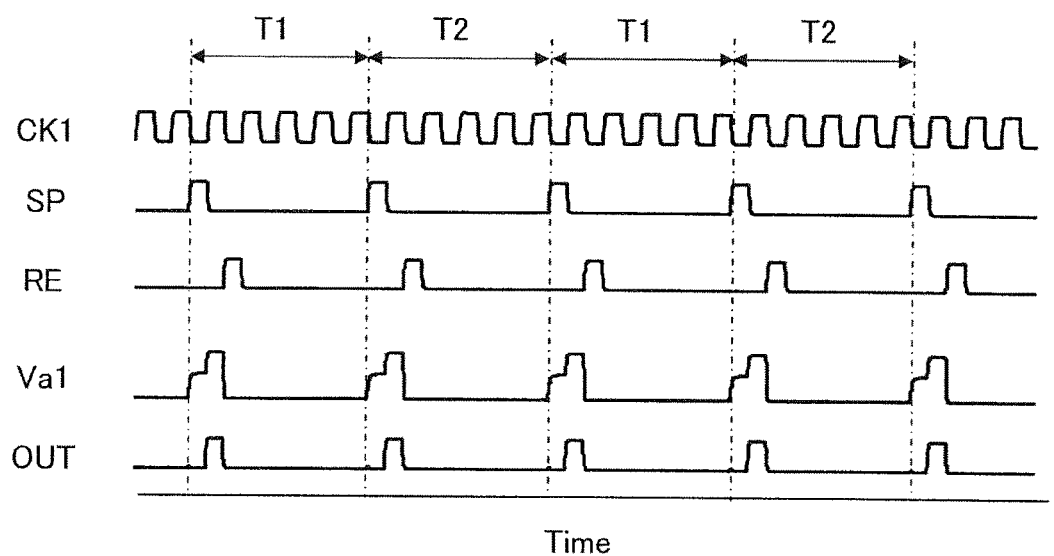
FIGS. 49A and 49B are timing charts showing verification results of the semiconductor device in Embodiment 4.
Figure 49B:
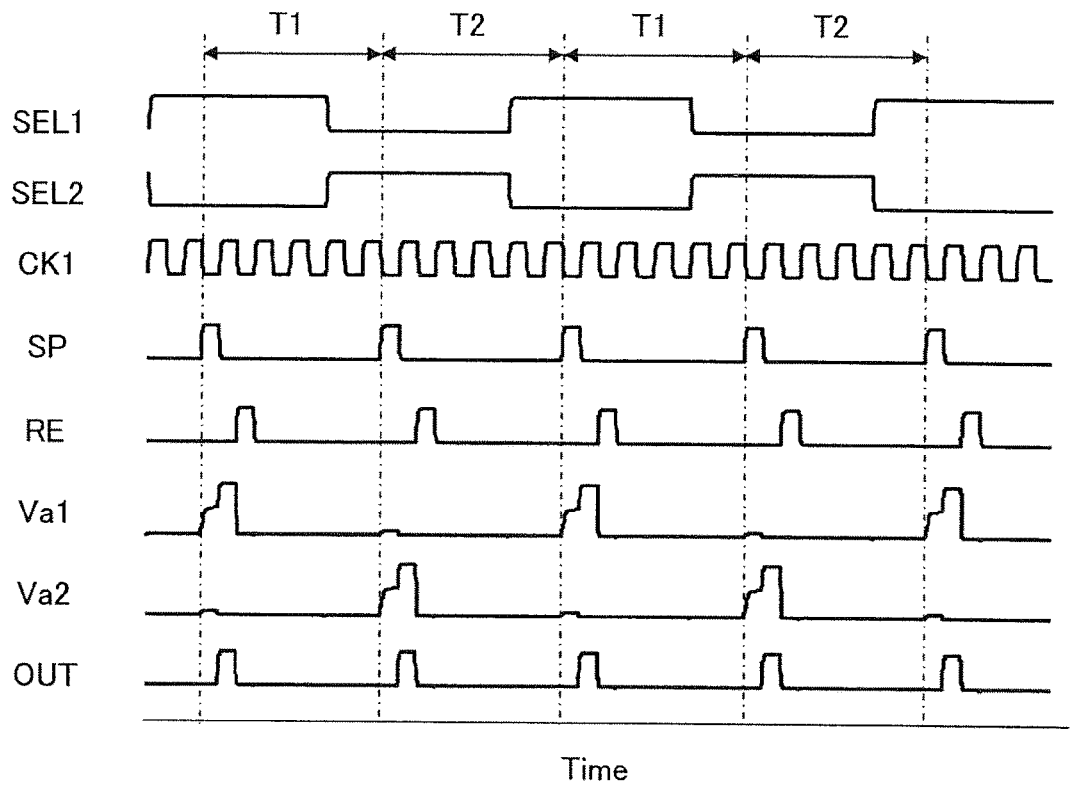

Further, the operation verification was performed on the semiconductor device in FIG. 35. Verification results are explained with reference to FIGS. 49A and 49B. FIGS. 49A and 49B show verification results of the semiconductor device in this embodiment. Note that the verification was performed using a SPICE simulator. In addition, for comparison, operation verification was also performed on a semiconductor device that does not include the transistor 101_2, the transistor 301_2, the transistor 302_1, the transistor 302_2, the transistor 401_2, the transistor 501_2, the transistor 643, and the transistor 646, which are included in the semiconductor device in FIG. 35. The verification was performed under the following conditions: the high-power supply voltage (also referred to as Vdd) is 30 V, Vss is 0 V, clock frequency is 25 kHz (one cycle is 40 μsec), mobility of each transistor is 1 cm$^2$/Vs, threshold voltage of each transistor is 5 V, and output capacity is 50 pF.

FIG. 49A is a timing chart that shows the verification results of a comparative semiconductor device. As shown in FIG. 49A, as for the comparative semiconductor device, during both the period T1 and the period T2, the voltage of the node n1 varies in accordance with the signal SP which is a start pulse, the transistor 101_1 is turned on in accordance with the voltage of the node n1, electrical continuity is established between the wiring 112 and the wiring 111 through the transistor 101_1, and the signal CK1 is supplied from the wiring 112 to the wiring 111 through the transistor 101_1.

FIG. 49B is a timing chart that shows the verification results of the semiconductor device in FIG. 35. As shown in FIG. 49B, as for the semiconductor device in FIG. 35, during the period T1, the voltage of the node n1 varies in accordance with the signal SP, the transistor 101_1 is turned on in accordance with the voltage of the node n1, electrical continuity is established between the wiring 112 and the wiring 111 through the transistor 101_1, and the signal CK1 is supplied from the wiring 112 to the wiring 111 through the transistor 101_1. During the period T2, the voltage of the node n2 varies in accordance with the signal SP, the transistor 101_2 is turned on in accordance with the voltage of the node n2, electrical continuity is established between the wiring 112 and the wiring 111 through the transistor 101_2, and the signal CK1 is supplied from the wiring 112 to the wiring 111 through the transistor 101_2. Thus, FIG. 49 confirms that the semiconductor device in this embodiment operates in such a way that a different transistor is turned on during each period, and the number of times each transistor is turned on is thus reduced or the time over which each transistor is on is thus shortened.

(Embodiment 5)

In this embodiment, an example of a display device, an example of a shift register included in the display device, and an example of a pixel included in the display device will be described. The shift register can include the semiconductor device described in Embodiments 1 to 4. Note that the shift register can refer to a semiconductor device or a gate driver. Note that description of the content described in Embodiments 1 to 4 is omitted. Note that the content described in Embodiments 1 to 4 can be combined with a content described in this embodiment, as appropriate.

First, an example of the display device will be described with reference to FIGS. 37A to 37D. The display device includes a circuit 1001, a circuit 1002, a circuit 1003_1, a pixel portion 1004, and a terminal 1005. A plurality of wirings can be drawn from the circuit 1003_1 and provided in the pixel portion 1004. The plurality of wirings can function as gate signal lines or scan lines. Alternatively, a plurality of wirings can be drawn from the circuit 1002 and provided in the pixel portion 1004. The plurality of wirings functions as video signal lines or data lines. A plurality of pixels is provided in accordance with the plurality of wirings that is drawn from the circuit 1003_1 and the plurality of wirings that are drawn from the circuit 1002. However, this embodiment is not limited to this. For example, the pixel portion 1004 can be provided with various other wirings. The wirings can function as gate signal lines, data lines, power supply lines, capacity lines, or the like.

The circuit 1001 has the function of supplying a signal, voltage, or current to the circuit 1002 and the circuit 1003_1. Alternatively, the circuit 1001 has the function of controlling the circuit 1002 and the circuit 1003_1. Accordingly, the circuit 1001 functions as a controller, a control circuit, a timing generator, a power source circuit, or a regulator. However, this embodiment is not limited to this.

The circuit 1002 has the function of supplying a video signal to the pixel portion 1004. Alternatively, the circuit 1002 has the function of controlling the luminance or the transmittance of a pixel included in the pixel portion 1004. Accordingly, the circuit 1002 functions as a driver circuit, a source driver, or a signal line driver circuit. However, this embodiment is not limited to this.

The circuit 1003_1 has the function of supplying a scan signal or a gate signal to the pixel portion 1004. Alternatively, the circuit 1003_1 has the function of selecting a pixel included in the pixel portion 1004. Accordingly, the circuit 1003_1 functions as a driver circuit, a gate driver, or a scan line driver circuit. However, this embodiment is not limited to this.

Figure 37A:
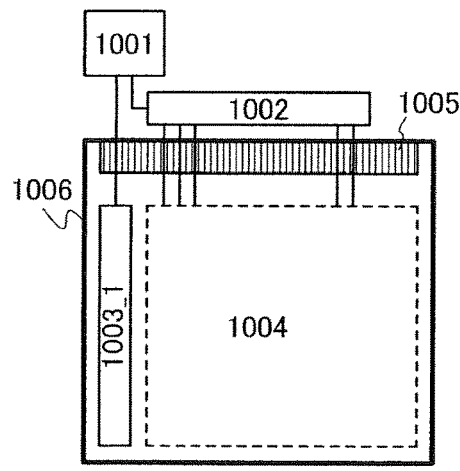
FIGS. 37A to 37D are examples of a block diagram of a display device in Embodiment 5 and FIG. 37E is an example of a circuit diagram of a pixel in Embodiment 5.

Note that as shown in FIG. 37A, the circuit 1001 and the circuit 1002 can be provided over a substrate (e.g., a semiconductor substrate or a SOI substrate) that is different from a substrate 1006 over which the pixel portion 1004 is provided. Alternatively, the circuit 1003_1 can be provided over the same substrate as the pixel portion 1004, that is, the substrate 1006. The drive frequency of the circuit 1003_1 is lower than that of the circuit 1001 or the circuit 1002, in many cases. Thus, a non-single-crystal semiconductor, an amorphous semiconductor, a microcrystalline semiconductor, an oxide semiconductor, an organic semiconductor, or the like can easily be used for a semiconductor layer of a transistor. As a result, the display device can be made larger. Further, the display device can be produced at a low cost. However, this embodiment is not limited to this.

Figure 37B:
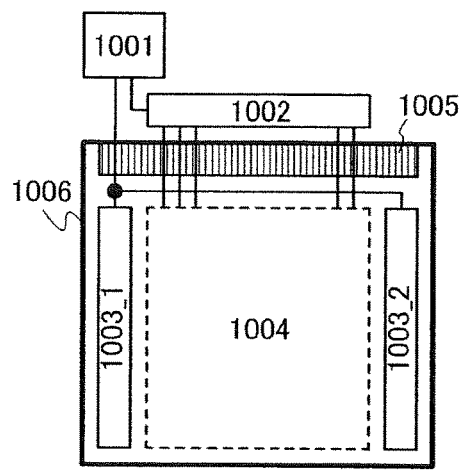

Note that in the structure described with reference to FIG. 37A, as shown in FIG. 37B, the display device can include a circuit 1003_2. The circuit 1003_2 functions in a manner similar to the circuit 1003_1. For example, the circuit 1003_1 and the circuit 1003_2 can supply a signal to the pixel portion 1004 at the same time. In such a manner, the load is reduced and the display device thus can be made large. However, this embodiment is not limited to this. For example, the circuit 1003_1 can select a pixel in odd-numbered stages, and the circuit 1003_2 can select a pixel in even-numbered stages. Accordingly, drive frequency is lowered; thus, power consumption can be reduced. Alternatively, an area in which one stage can be laid out can be made large; thus, the display device can be a high-definition display device.

Figure 37C:
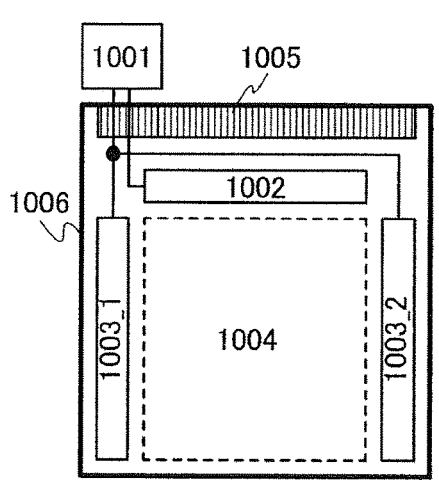

Note that in the structure described with reference to FIGS. 37A and 37B, as shown in FIG. 37C, the circuit 1002 can be provided over the same substrate as the pixel portion 1004, that is, the substrate 1006. However, this embodiment is not limited to this.

Figure 37D:
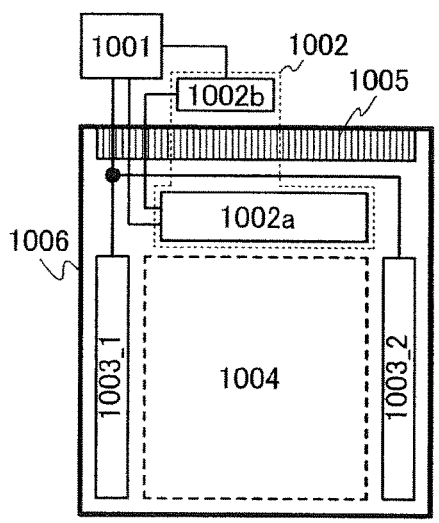

Note that in the structure described with reference to FIGS. 37A to 37C, as shown in FIG. 37D, a part of the circuit 1002 (e.g., a circuit 1002a) can be provided over the same substrate as the pixel portion 1004, that is, the substrate 1006, and another part of the circuit 1002 (e.g., a circuit 1002b) can be provided over a substrate that is different from the substrate over which the pixel portion 1004 is provided. In this case, a circuit whose drive frequency is comparatively low such as a switch, a shift register, and/or a selector can be used as the circuit 1002a. However, this embodiment is not limited to this.

Figure 37E:
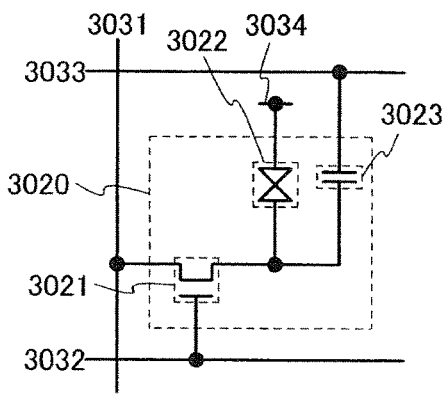

Next, an example of a pixel included in the pixel portion 1004 will be described with reference to FIG. 37E. A pixel 3020 includes a transistor 3021, a liquid crystal element 3022, and a capacitor 3023. A first terminal of the transistor 3021 is connected to a wiring 3031. A second terminal of the transistor 3021 is connected to one electrode of the liquid crystal element 3022 and one electrode of the capacitor 3023. A gate of the transistor 3021 is connected to a wiring 3032. The other electrode of the liquid crystal element 3022 is connected to an electrode 3034. The other electrode of the capacitor 3023 is connected to a wiring 3033.

A video signal is input from the circuit 1002, which is described with reference to FIGS. 37A to 37D, to the wiring 3031, for example. Accordingly, the wiring 3031 can function as a signal line, a video signal line, or a source signal line. A scan signal, a selection signal, or a gate signal is input from the circuit 1003_1 and/or the circuit 1003_2, which are described with reference to FIGS. 37A to 37D, to the wiring 3032, for example. Therefore, the wiring 3032 can function as a signal line, a scan line, or a gate signal line. The wiring 3032 and the electrode 3034 can be supplied with a constant voltage from the circuit 1001 described with reference to FIGS. 37A to 37D. Therefore, the wiring 3033 can function as a power supply line or a capacity line. Alternatively, the electrode 3034 can function as a common electrode or a counter electrode. However, this embodiment is not limited to this. For example, the wiring 3031 can be supplied with a precharge voltage. The precharge voltage has substantially the same value as the voltage supplied to the electrode 3034 in many cases. Alternatively, the wiring 3033 can be supplied with a signal. Accordingly, a voltage applied to the liquid crystal element 3022 can be controlled, so that the amplitude of a video signal can be small or inversion drive can be realized. Alternatively, the electrode 3034 can be supplied with a signal. Therefore, frame inversion drive can be realized.

The transistor 3021 has the function of controlling electrical continuity between the wiring 3031 and the one electrode of the liquid crystal element 3022. Alternatively, the transistor 3021 has the function of controlling the timing of when a video signal is written to a pixel. Accordingly, the transistor 3021 functions as a switch. The capacitor 3023 has the function of holding a voltage difference between the voltage of the one electrode of the liquid crystal element 3022 and the voltage of the wiring 3033. Alternatively, the capacitor 3023 has the function of holding a voltage applied to the liquid crystal element 3022 constant. Thus, the capacitor functions as a storage capacitor. However, this embodiment is not limited to this.

Figure 38:
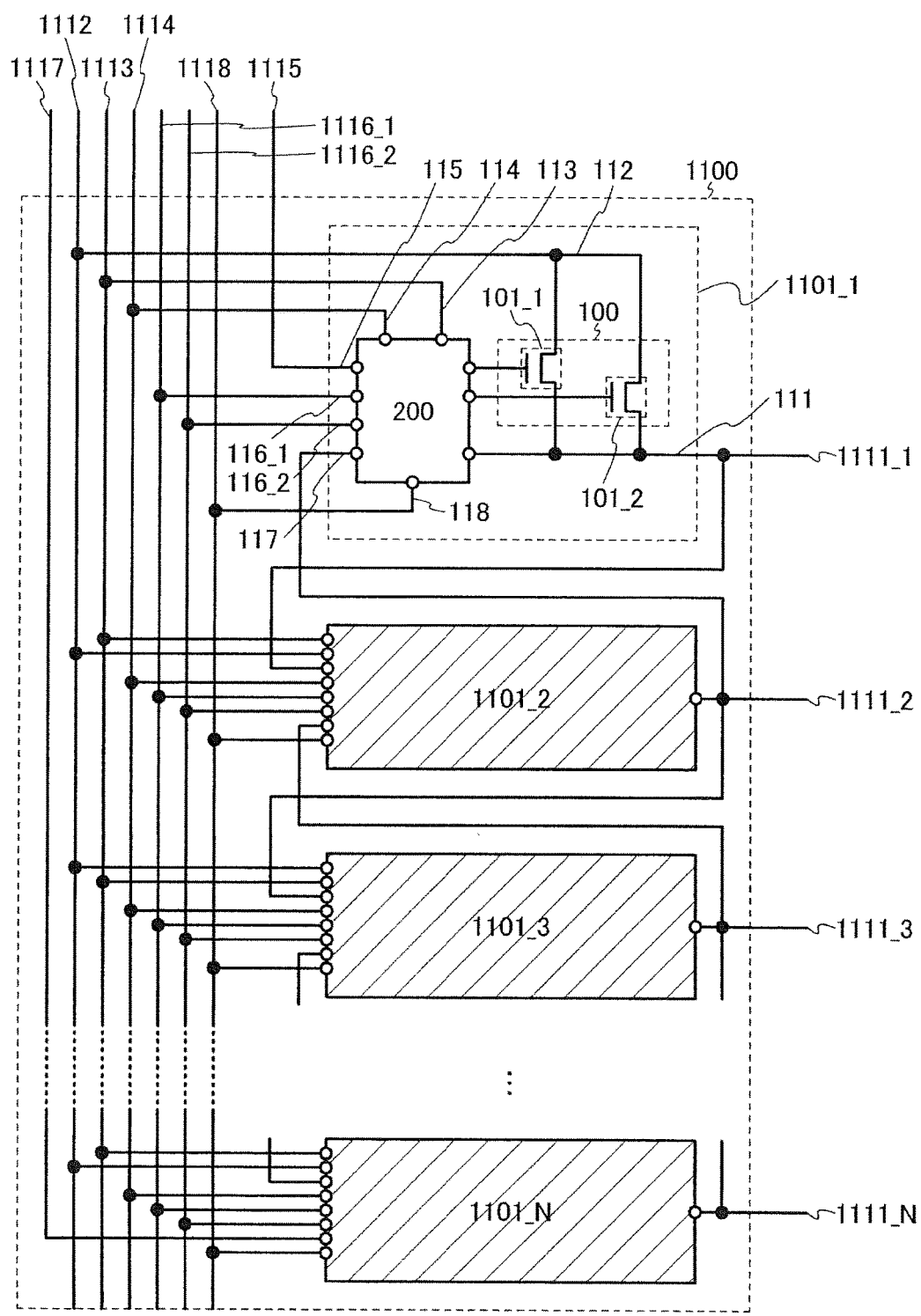
FIG. 38 is an example of a circuit diagram of a shift register in Embodiment 5.

Next, an example of a shift register will be described with reference to FIG. 38. The shift register can be included in the circuit 1002, the circuit 1003_1, and/or the circuit 1003_2.

A shift register 1100 includes a plurality of flip-flops, that is, flip-flops 1101_1 to 1101_N. In an example of FIG. 38, the semiconductor device in FIG. 1A is used for each of the flip-flops 1101_1 to 1101_N. Note that this embodiment is not limited to this, that is, other semiconductor devices or circuits described in Embodiments 1 to 4, for example, can be used for the flip-flops 1101_1 to 1101_N.

The shift register 1100 is connected to wirings 1111_1 to 1111_N, a wiring 1112, a wiring 1113, a wiring 1114, a wiring 1115, a wiring 1116_1, a wiring 1116_2, a wiring 1117, and a wiring 1118. In the flip-flop 1101_$i$ ($i$ is any one of 2 to N), the wiring 111, the wiring 112, the wiring 113, the wiring 114, the wiring 115, the wiring 116_1, the wiring 116_2, the wiring 117, and the wiring 118 are connected to the wiring 1111_$i$, the wiring 1112, the wiring 1113, the wiring 1114, a wiring 1111_i−1, the wiring 1116_1, the wiring 1116_2, the wiring 1111_i+1, and the wiring 1118, respectively. However, the access points of the wiring 112 and the wiring 113 of the flip-flops in the odd-numbered stages are reversed in that of the flip-flops in the even-numbered stages in many cases. Note that the wiring 115 of the flip-flop 1101_1 is connected to the wiring 1115 in many cases. Note that the wiring 117 of the flip-flop 1101_N is connected to the wiring 1117 in many cases. However, this embodiment is not limited to this.

For example, signals GOUT_1 to GOUT_N are output from the wirings 1111_1 to 1111_N, respectively. The signals GOUT_1 to GOUT_N are output signals of the flip-flops 1101_1 to 1101_N, respectively, and function in a manner similar to the signal OUT. Therefore, the wirings 1111_1 to 1111_N can function in a manner similar to the wiring 111. A signal GCK1, for example, is input to the wiring 1112, and a signal GCK2, for example, is input to the wiring 1113. The signal GCK1 and the signal GCK2 function in a manner similar to the signal CK1 or the signal CK2. Accordingly, the wiring 1112 and the wiring 1113 can function as the wiring 112 or the wiring 113. The voltage V2, for example, is input to the wiring 1114. Therefore, the wiring 1114 can function in a manner similar to the wiring 114. The signal GSP, for example, is input to the wiring 115. The signal GSP functions in a manner similar to the signal SP. Accordingly, the wiring 1115 can function in a manner similar to the wiring 115. The signal SEL1, for example, is input to the wiring 1116_1, and the signal SEL2, for example, is input to the wiring 1116_2. Therefore, the wiring 1116_1 can function in a manner similar to the wiring 116_1, and the wiring 1116_2 can function in a manner similar to the wiring 116_2. A signal GRE, for example, is input to the wiring 1117. The signal GRE functions in a manner similar to the signal RE. Accordingly, the wiring 1117 can function in a manner similar to the wiring 117. The voltage V1, for example, is input to the wiring 1118. Therefore, the wiring 1118 can function in a manner similar to the wiring 118. Note that this embodiment is not limited to this, that is, various other signals, voltages, or currents can be input to these wirings.

Figure 39:
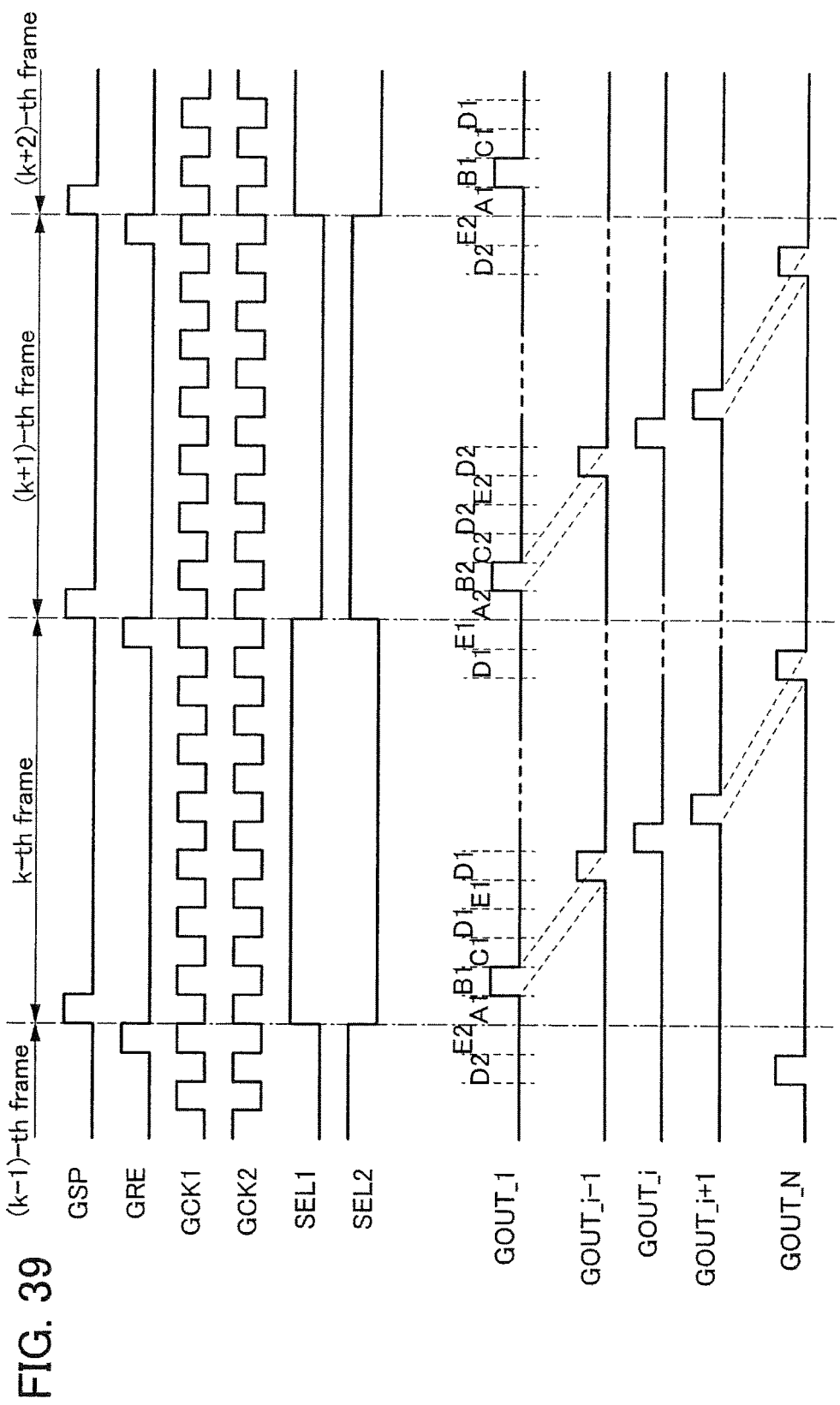
FIG. 39 is an example of a timing chart for showing operation of the shift register in Embodiment 5.

Next, operation of the shift register in FIG. 38 will be described with reference to a timing chart in FIG. 39. The timing chart in FIG. 39 shows the signal GCK1, the signal GCK2, the signal GSP, the signal GRE, the signal SEL1, the signal SEL2, and the signals GOUT_1 to GOUT_N.

Operation of the flip-flop 1101_$i$ ($i$ is a natural number of 2 to N) in a k-th frame (k is a natural number of 2 or more) will be described. First, in the k-th frame, the signal SEL1 is at a high level, and the signal SEL2 is at a low level. Therefore, when the signal OUT_i−1 goes to a high level, the flip-flop 1101_$i$ starts operation of the period A1. After that, when the signal GCK1 and the signal GCK2 are inverted, the flip-flop 1101_$i$ starts operation of the period B1. Therefore, the signal OUT_i goes to a high level. The signal OUT_i is input to the flip-flop 1101_i+1; thus, the flip-flop 1101_i+1 starts operation of the period A1. After that, when the signal GCK1 and the signal GCK2 are inverted again, the flip-flop 1101_i+1 starts operation of the period B1. Therefore, the signal OUT_i+1 goes to a high level. The signal OUT_i−1 is input to the flip-flop 1101_$i$; thus, the flip-flop 1101_$i$ starts operation of the period C1. Therefore, the signal GOUT_i goes to a low level. After that, the flip-flop 1101_$i$ repeats the operation of the period D1 and the operation of the period E1 until the signal SOUT1_i−1 goes to a high level again. Alternatively, the flip-flop 1101_$i$ repeats the operation of the period D1 and the operation of the period E1 until the signal SEL1 goes to a low level and the signal SEL2 goes to a high level.

Operation of the flip-flop 1101_$i$ in a (k+1)-th frame will be described. First, in the (k+1)-th frame, the signal SEL1 is at a low level, and the signal SEL2 is at a high level. Therefore, when the signal OUT_i−1 goes to a high level, the flip-flop 1101_$i$ starts operation of the period A2. After that, when the signal GCK1 and the signal GCK2 are inverted, the flip-flop 1101_$i$ starts operation of the period B2. Therefore, the signal OUT_i goes to a high level. The signal OUT_i is input to the flip-flop 1101_i+1; thus, the flip-flop 1101_$i$+1 starts operation of the period A2. After that, when the signal GCK1 and the signal GCK2 are inverted again, the flip-flop 1101_i+1 starts operation of the period B2. Therefore, the signal OUT_i+1 goes to a high level. The signal OUT_i−1 is input to the flip-flop 1101_i; thus, the flip-flop 1101_i starts operation of the period C2. Therefore, the signal GOUT_i goes to a low level. After that, the flip-flop 1101_i repeats the operation of the period D2 and the operation of the period E2 until the signal SOUT1_i−1 goes to a high level again. Alternatively, the flip-flop 1101_i repeats the operation of the period D2 and the operation of the period E2 until the signal SEL1 goes to a high level and the signal SEL2 goes to a low level.

Note that the signal GSP is input to the flip-flop 1101_1 through the wiring 1115 instead of an output signal from a flip-flop in the previous stage. Therefore, the flip-flop 1101_1 starts operation of the period A1 or operation of the period A2 when the signal GSP goes to a high level.

Note that the signal GRE is input to the flip-flop 1101_N through the wiring 1117 instead of an output signal from a flip-flop in the next stage. Therefore, the flip-flop 1101_N starts operation of the period C1 or operation of the period C2 when the signal GRE goes to a high level.

(Embodiment 6)

In this embodiment, an example of a signal line driver circuit is described. Note that the signal line driver circuit can be referred to as a semiconductor device or a signal generation circuit.

Figure 46A:
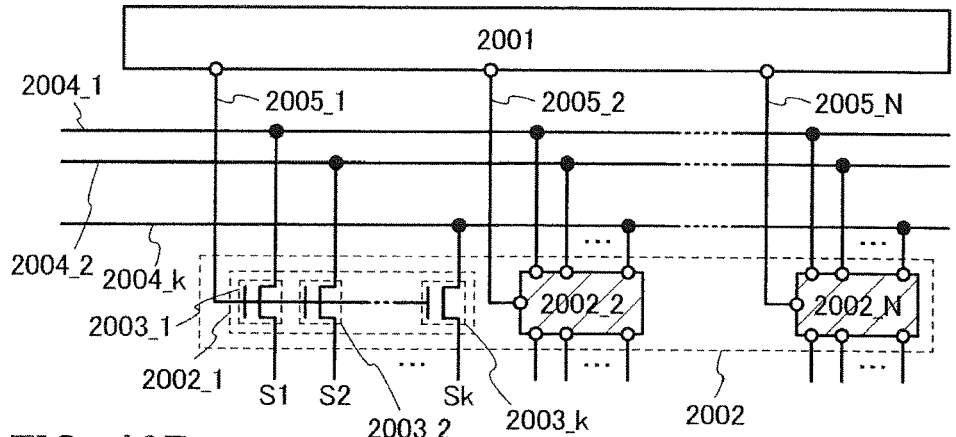
FIG. 46A is an example of a circuit diagram of a source driver in Embodiment 6.

An example of a signal line driver circuit is described with reference to FIG. 46A. The signal line driver circuit includes a circuit 2001 and a circuit 2002. The circuit 2002 includes a plurality of circuits 2002_1 to 2002_N. The circuits 2002_1 to 2002_N each include a plurality of transistors 2003_1 to 2003_k. The transistors 2003_1 to 2003_k are n-channel transistors. However, this embodiment is not limited to this. The transistors 2003_1 to 2003_k can be either p-channel transistors or CMOS switches.

The connection relation of the signal line driver circuit will be described taking the circuit 2002_1 as an example. First terminals of the transistors 2003_1 to 2003_k are connected to wirings 2004_1 to 2004_k, respectively. Second terminals of the transistors 2003_1 to 2003_k are connected to wirings S1 to Sk, respectively. Gates of the transistors 2003_1 to 2003_k are connected to the wiring 2005_1.

The circuit 2001 has the function of sequentially outputting high-level signals to wirings 2005_1 to 2005_N or the function of sequentially selecting the circuits 2002_1 to 2002_N. In this manner, the circuit 2001 functions as a shift register.

However, this embodiment is not limited to this. The circuit 2001 can output high-level signals to the wirings 2005_1 to 2005_N in different orders. Alternatively, the circuits 2002_1 to 2002_N can be selected in different orders. In this manner, the circuit 2001 can function as a decoder.

The circuit 2002_1 has the function of controlling electrical continuity between the wirings 2004_1 to 2004_k and the wirings S1 to Sk. Alternatively, the circuit 2001_1 has the function of supplying the voltages of the wirings 2004_1 to 2004_k to the wirings S1 to Sk. In this manner, the circuit 2002_1 can function as a selector. However, this embodiment is not limited to this. Note that each of the circuits 2002_2 to 2002_N can have a function that is similar to the function of the circuit 2002_1.

Each of the transistors 2003_1 to 2003_N has the function of controlling electrical continuity between the wirings 2004_1 to 2004_k and the wirings S1 to Sk. Alternatively, each of the transistors 2003_1 to 2003_N has the function of supplying the voltages of the wirings 2004_1 to 2004_k to the wirings S1 to Sk. For example, the transistor 2003_1 has the function of controlling electrical continuity between the wiring 2004_1 and the wiring S1. Alternatively, the transistor 2003_1 has the function of supplying the voltage of the wiring 2004_1 to the wiring S1. In this manner, each of the transistors 2003_1 to 2003_N functions as a switch. However, this embodiment is not limited to this.

Note that different signals are supplied to the wirings 2004_1 to 2004_k in many cases. The signals are analog signals corresponding to image data or image signals in many cases. The image data or the analog signals corresponding to the image data can function as video signals. Thus, the wirings 2004_1 to 2004_k can function as signal lines. However, this embodiment is not limited to this. For example, depending on the pixel structure, the signals input to the wirings 2004_1 to 2004_k can be digital signals, analog voltage, or analog current.

Figure 46B:
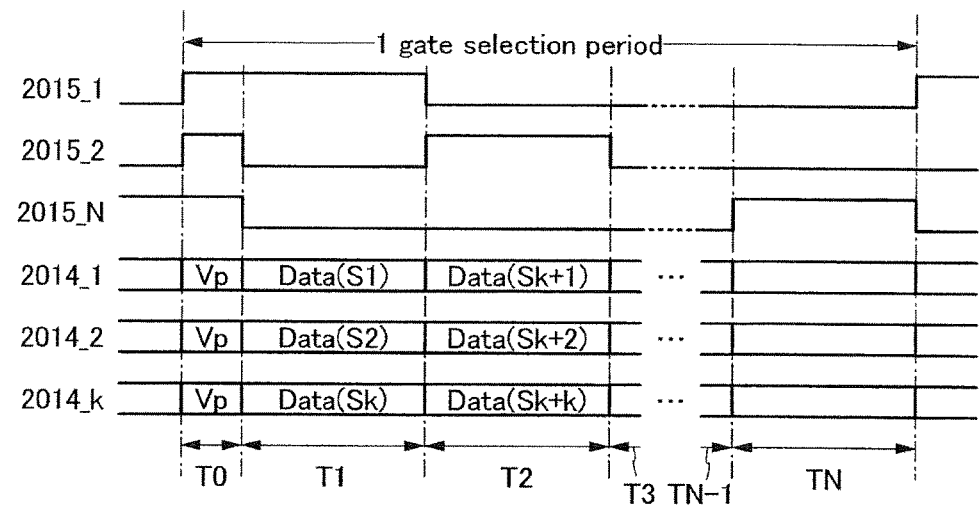
FIG. 46B is an example of a timing chart for showing operation of the source driver in Embodiment 6.

Next, the operation of the signal line driver circuit in FIG. 46A will be described with reference to a timing chart in FIG. 46B. FIG. 46B shows examples of signals 2015_1 to 2015_N and signals 2014_1 to 2014_k. The signals 2015_1 to 2015_N are examples of output signals in the circuit 2001. The signals 2014_1 to 2014_k are examples of signals that are input to the wirings 2004_1 to 2004_k. Note that one operation period of the signal line driver circuit corresponds to one gate selection period in a display device. For example, one gate selection period is divided into a period T0, and T1 to TN. The period T0 is a period for applying precharge voltage to pixels in a selected row concurrently and can serve as a precharge period. Each of the periods T1 to TN is a period during which video signals are written to pixels in the selected row and can serve as a write period.

First, during the period T0, the circuit 2001 supplies high-level signals to the wirings 2005_1 to 2005_N. Then, for example, the transistors 2003_1 to 2003_k are turned on in the circuit 2002_1, so that electrical continuity is established between the wirings 2004_1 to 2004_k and the wirings S1 to Sk. In this case, precharge voltage Vp is applied to the wirings 2004_1 to 2004_k. Thus, the precharge voltage Vp is output to the wirings S1 to Sk through the transistors 2003_1 to 2003_k. Thus, the precharge voltage Vp is written to the pixels in the selected row, so that the pixels in the selected row are precharged.

During the periods T1 to TN, the circuit 2001 sequentially outputs high-level signals to the wirings 2005_1 to 2005_N. For example, during the period T1, the circuit 2001 outputs a high-level signal to the wirings 2005_1. Then, the transistors 2003_1 to 2003_k are turned on, so that electrical continuity is established between the wirings 2004_1 to 2004_k and the wirings S1 to Sk. In this case, Data (S1) to Data (Sk) are input to the wirings 2004_1 to 2004_k, respectively. The Data (S1) to Data (Sk) are input to pixels in a selected row in a first to k-th columns through the transistors 2003_1 to 2003_k, respectively. Thus, during the periods T1 to TN, video signals are sequentially written to the pixels in the selected row by k columns.

By writing video signals to pixels by a plurality of columns, the number of video signals or the number of wirings can be reduced. Thus, the number of connections to an external circuit can be reduced, so that improvement in yield, improvement in reliability, reduction in the number of components, and/or reduction in cost can be achieved. Alternatively, by writing video signals to pixels by a plurality of columns, write time can be extended. This prevents the video signals from being insufficiently written to the pixels, so that visual quality can be improved.

Note that by increasing k, the number of connections to the external circuit can be reduced. However, if k is too large, time to write signals to pixels can be shortened. Thus, it is preferable that k≤6. It is more preferable that k≤3. It is much more preferable that k=2. However, this embodiment is not limited to this.

In particular, in the case where the number of color elements of a pixel is n (n is a natural number), k=n or k=n×d (d is a natural number) is preferable. For example, in the case where the color element of the pixel is divided into three colors: red (R), green (G), and blue (B), k=3 or k=3×d is preferable. However, this embodiment is not limited to this. For example, in the case where the pixel is divided into m (m is a natural number) pieces of pixels (hereinafter also referred to as sub-pixels), k=m or k=m×d is preferable. For example, in the case where the pixel is divided into two sub-pixels, k=2 is preferable. Alternatively, in the case where the number of color elements of the pixel is n, k=m×n or k=m×n×d is preferable. However, this embodiment is not limited to this.

Figure 46C:
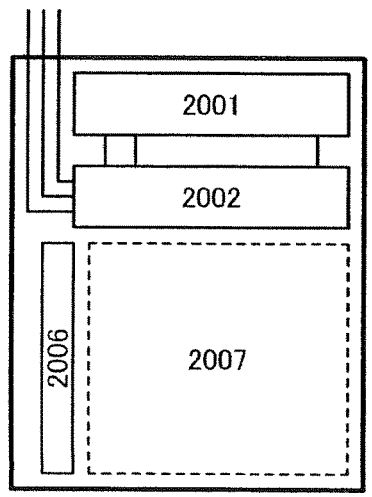
FIGS. 46C and 46D are examples of a block diagram of a display device in Embodiment 6.
Figure 46D:
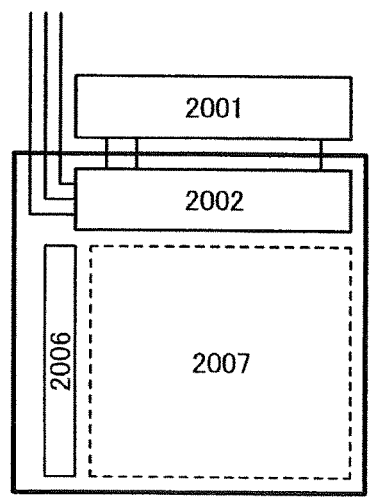

Note that the drive frequencies of the circuit 2001 and the circuit 2002 are low in many cases, so that the circuit 2001 and the circuit 2002 can be formed over the same substrate as a pixel portion 2007 as shown in FIG. 46C. Thus, the number of connections between the substrate over which the pixel portion is formed and an external circuit can be reduced, so that improvement in yield, improvement in reliability, reduction in the number of components, or reduction in cost can be achieved, for example. In particular, when a signal line driver circuit 2006 is formed over the same substrate as the pixel portion 2007, the number of connections to the external circuit can be further reduced. However, this embodiment is not limited to this. For example, as shown in FIG. 46D, the circuit 2001 can be formed over a substrate which is different from the substrate over which the pixel portion 2007 is formed, and the circuit 2002 can be formed over the same substrate as the pixel portion 2007. Also in this case, the number of connections between the substrate over which the pixel portion is formed and the external circuit can be reduced, so that improvement in yield, improvement in reliability, reduction in the number of components, or reduction in cost can be achieved, for example. Alternatively, since the number of circuits which are formed over the same substrate as the pixel portion 2007 is made smaller, the size of a frame can be reduced.

Note that the semiconductor device or the shift register described in Embodiments 1 to 5 can be used for the circuit 2001. Therefore, degradation of a transistor can be suppressed, thereby increasing the life of a signal line driver circuit.

(Embodiment 7)

In this embodiment, examples of protection circuits are described.

First, an example of a protection circuit will be described with reference to FIG. 47A. A protection circuit 3000 is provided in order to prevent a semiconductor device (e.g., a transistor, a capacitor, or a circuit) that is connected to a wiring 3011, or the like from being damaged by ESD (electrostatic discharge). The protection circuit 3000 includes a transistor 3001 and a transistor 3002. The transistor 3001 and the transistor 3002 are n-channel transistors in many cases. However, this embodiment is not limited to this. The transistor 3001 and the transistor 3002 can be p-channel transistors.

A first terminal of the transistor 3001 is connected to a wiring 3012. A second terminal of the transistor 3001 is connected to the wiring 3011. A gate of the transistor 3001 is connected to the wiring 3011. A first terminal of the transistor 3002 is connected to a wiring 3013. A second terminal of the transistor 3002 is connected to the wiring 3011. A gate of the transistor 3002 is connected to the wiring 3013.

For example, a signal (e.g., a scan signal, a video signal, a clock signal, a start signal, a reset signal, or a selection signal) or voltage (negative power supply voltage, ground voltage, or positive power supply voltage) can be supplied to the wiring 3011. For example, positive power supply voltage (Vdd) is supplied to the wiring 3012. For example, negative power supply voltage (Vss), ground voltage, or the like is supplied to the wiring 3013. However, this embodiment is not limited to this.

When a voltage of the wiring 3011 is between Vss and Vdd, the transistor 3001 and the transistor 3002 are turned off. Thus, voltage, a signal, or the like supplied to the wiring 3011 is supplied to the semiconductor device that is connected to the wiring 3011. Note that due to an adverse effect of static electricity, a voltage that is higher or lower than power supply voltage is supplied to the wiring 3011 in some cases. Then, the semiconductor device that is connected to the wiring 3011 might be broken by the voltage which is higher or lower than the power supply voltage. In order to prevent such a semiconductor device from being damaged by electrostatic discharge, the transistor 3001 is turned on in the case where the voltage that is higher than the power supply voltage is supplied to the wiring 3011. Then, since electric charge accumulated in the wiring 3011 is transferred to the wiring 3012 through the transistor 3001, the voltage of the wiring 3011 is lowered. On the other hand, in the case where the voltage that is lower than the power supply voltage is supplied to the wiring 3011, the transistor 3002 is turned on. Then, since the electric charge accumulated in the wiring 3011 is transferred to the wiring 3013 through the transistor 3002, the voltage of the wiring 3011 is raised. Thus, the semiconductor device that is connected to the wiring 3011 can be prevented from being damaged by electrostatic discharge.

Figure 47A:
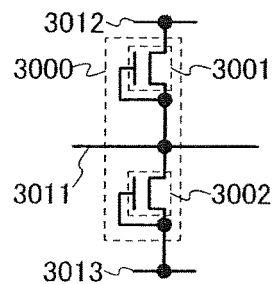
FIGS. 47A to 47G are examples of a circuit diagram of a protection circuit in Embodiment 7.
Figure 47B:
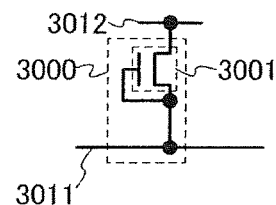
Figure 47C:
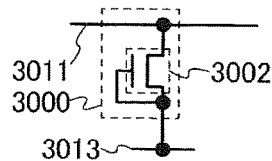

Note that in the structure shown in FIG. 47A, the transistor 3002 can be omitted, as shown in FIG. 47B. Alternatively, in the structure shown in FIG. 47A, the transistor 3001 can be omitted, as shown in FIG. 47C. However, this embodiment is not limited to this.

Figure 47D:
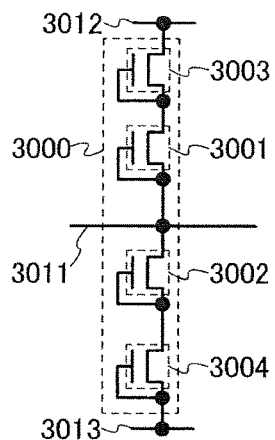
Figure 47E:
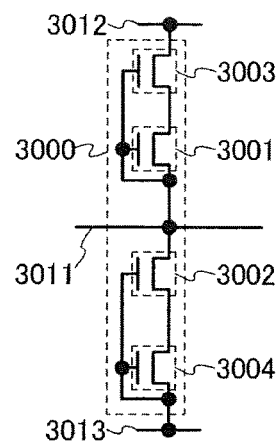

Note that in the structures shown in FIGS. 47A to 47C, transistors can be connected in series between the wiring 3011 and the wiring 3012, as shown in FIG. 47D. Alternatively, transistors can be connected in series between the wiring 3011 and the wiring 3013. A first terminal of a transistor 3003 is connected to the wiring 3012. A second terminal of the transistor 3003 is connected to the first terminal of the transistor 3001. A gate of the transistor 3003 is connected to the first terminal of the transistor 3001. A first terminal of a transistor 3004 is connected to the wiring 3013. A second terminal of the transistor 3004 is connected to the first terminal of the transistor 3002. A gate of the transistor 3004 is connected to the wiring 3013. However, this embodiment is not limited to this. For example, as shown in FIG. 47E, the gate of the transistor 3001 and the gate of the transistor 3003 can be connected to each other. Alternatively, the gate of the transistor 3002 and the gate of the transistor 3004 can be connected to each other.

Figure 47F:
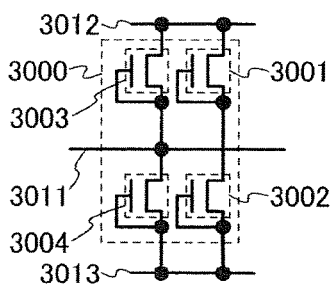

Note that in the structures shown in FIGS. 47A to 47E, the transistors can be connected in parallel between the wiring 3011 and the wiring 3012, as shown in FIG. 47F. Alternatively, the transistors can be connected in parallel between the wiring 3011 and the wiring 3013. The first terminal of the transistor 3003 is connected to the wiring 3012. The second terminal of the transistor 3003 is connected to the wiring 3011. The gate of the transistor 3003 is connected to the wiring 3011. The first terminal of the transistor 3004 is connected to the wiring 3013. The second terminal of the transistor 3004 is connected to the wiring 3011. The gate of the transistor 3004 is connected to the wiring 3013.

Figure 47G:
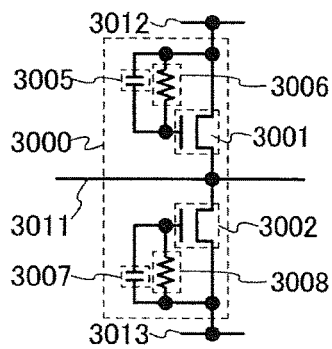

Note that in the structures shown in FIGS. 47A to 47F, a capacitor 3005 and a resistor 3006 can be connected in parallel between the gate of the transistor 3001 and the first terminal of the transistor 3001, as shown in FIG. 47G. Alternatively, a capacitor 3007 and a resistor 3008 can be connected in parallel between the gate of the transistor 3002 and the first terminal of the transistor 3002. Thus, breakage or degradation of the protection circuit 3000 itself can be prevented. For example, in the case where a voltage that is higher than power supply voltage is supplied to the wiring 3011, Vgs of the transistor 3001 is raised. Thus, the transistor 3001 is turned on, so that the voltage of the wiring 3011 is lowered. However, since high voltage is applied between the gate of the transistor 3001 and the second terminal of the transistor 3001, the transistor might be damaged or degraded. In order to prevent damage or degradation of a transistor, a voltage of the gate of the transistor 3001 is raised and Vgs of the transistor 3001 is lowered. The capacitor 3005 is used for realizing this operation. When the transistor 3001 is turned on, a voltage of the first terminal of the transistor 3001 is raised instantaneously. Then, with capacitive coupling of the capacitor 3005, the voltage of the gate of the transistor 3001 is raised. In this manner, Vgs of the transistor 3001 can be lowered, and breakage or degradation of a transistor 3001 can be suppressed. However, this embodiment is not limited to this. In a similar manner, in the case where a voltage which is lower than the power supply voltage is supplied to the wiring 3011, a voltage of the first terminal of the transistor 3002 is lowered instantaneously. Then, with capacitive coupling of the capacitor 3007, the voltage of the gate of the transistor 3002 is lowered. In this manner, Vgs of the transistor 3002 can be lowered, so that breakage or degradation of the transistor 3002 can be suppressed.

Figure 48A:
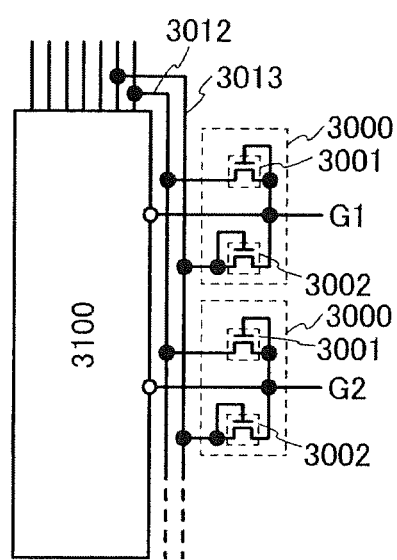
FIGS. 48A and 48B are examples of a circuit diagram of a semiconductor device provided with a protection circuit in Embodiment 7.
Figure 48B:
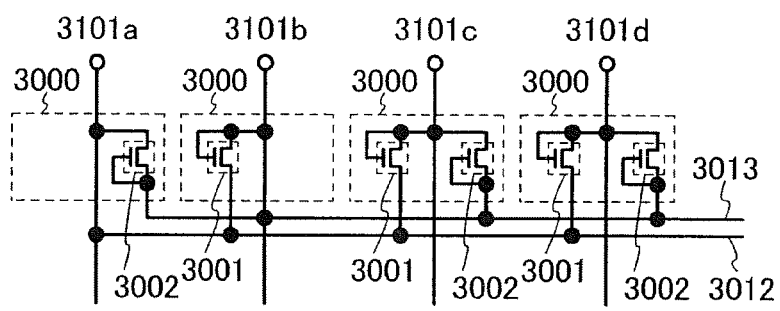

Here, the protection circuits shown in FIGS. 47A to 47G can be used for various places. FIG. 48A shows a structure when a protection circuit is provided in a gate signal line, for example. In this case, the wiring 3012 and the wiring 3013 can be connected to any of wirings connected to a gate driver 3100. Thus, the number of power sources and the number of wirings can be reduced. FIG. 48B shows a structure when a protection circuit is provided in a terminal to which a signal or voltage is supplied from the outside such as an FPC, for example. In this case, the wiring 3012 and the wiring 3013 can be connected to any of external terminals. For example, the wiring 3012 is connected to a terminal 3101a, and the wiring 3013 is connected to a terminal 3101b. In this case, in a protection circuit provided in the terminal 3101a, the transistor 3001 can be omitted. In a similar manner, in a protection circuit provided in the terminal 3101b, the transistor 3002 can be omitted. Thus, the number of transistors can be reduced, so that a layout area can be reduced.

(Embodiment 8)

In this embodiment, examples of structures of transistors are described with reference to FIGS. 40A to 40C.

Figure 40A:
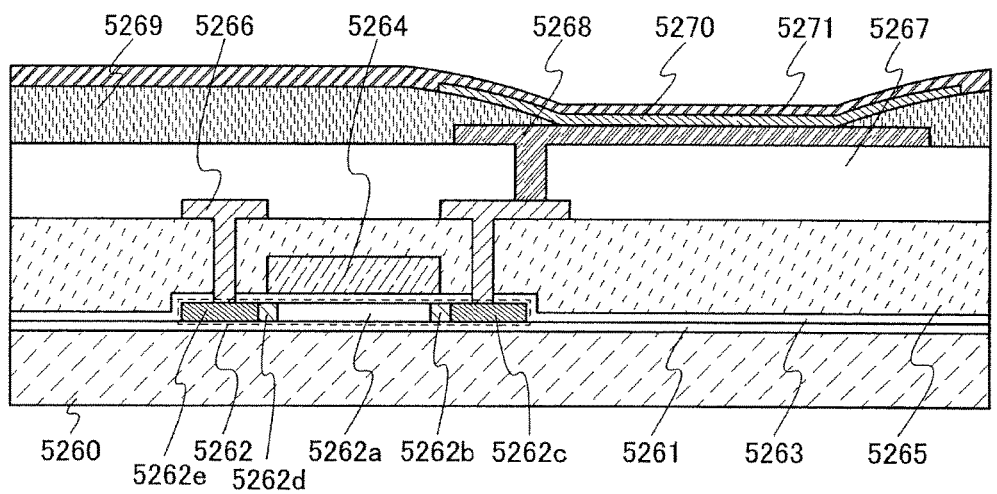
FIGS. 40A to 40C are examples of a cross-sectional view of a semiconductor device in Embodiment 8.

FIG. 40A shows an example of the structure of a top-gate transistor or an example of the structure of a display device. FIG. 40B shows an example of the structure of a bottom-gate transistor or an example of the structure of a display device. FIG. 40C shows an example of the structure of a transistor formed using a semiconductor substrate.

An example of the transistor in FIG. 40A includes an insulating layer 5261 formed over the substrate 5260; a semiconductor layer 5262 which is formed over the insulating layer 5261 and is provided with a region 5262a, a region 5262b, a region 5262c, a region 5262d, and a region 5262e; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; and a conductive layer 5266 which is formed over the insulating layer 5265 and in the openings formed in the insulating layer 5265.

Figure 40B:
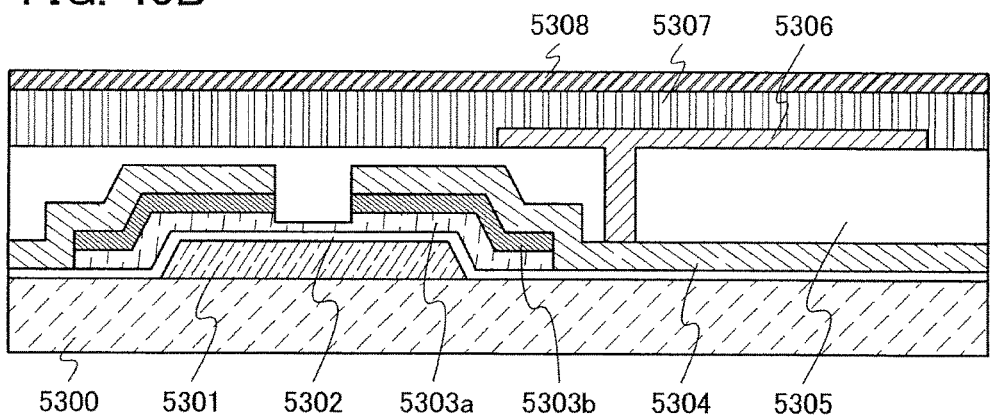

An example of the transistor in FIG. 40B includes a substrate 5300; a conductive layer 5301 formed over the substrate 5300; an insulating layer 5302 formed so as to cover the conductive layer 5301; a semiconductor layer 5303a formed over the conductive layer 5301 and the insulating layer 5302; a semiconductor layer 5303b formed over the semiconductor layer 5303a; a conductive layer 5304 formed over the semiconductor layer 5303b and the insulating layer 5302; an insulating layer 5305 which is formed over the insulating layer 5302 and the conductive layer 5304 and is provided with an opening; and a conductive layer 5306 which is formed over the insulating layer 5305 and in the opening formed in the insulating layer 5305.

Figure 40C:
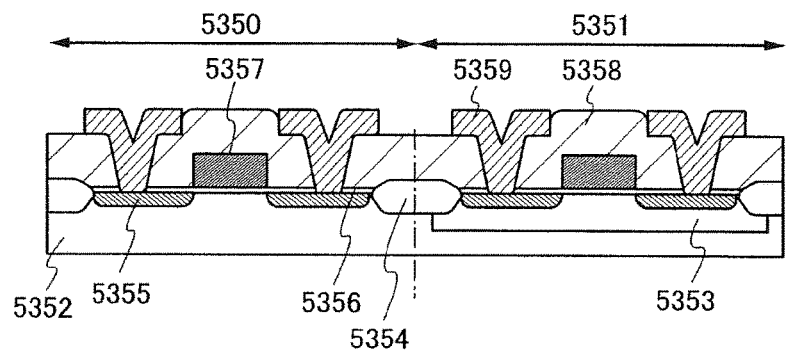

An example of the transistor in FIG. 40C includes a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

Note that in the case where a display device is formed using the transistor in this embodiment, as shown in, for example, FIG. 40A, it is possible to form an insulating layer 5267 which is formed over the conductive layer 5266 and the insulating layer 5265 and is provided with an opening, a conductive layer 5268 which is formed over the insulating layer 5267 and in the opening formed in the insulating layer 5267; an insulating layer 5269 which is formed over the insulating layer 5267 and the conductive layer 5268 and is provided with the opening; a light-emitting layer 5270 which is formed over the insulating layer 5269 and in the opening formed in the insulating layer 5269; and a conductive layer 5271 formed over the insulating layer 5269 and the light-emitting layer 5270.

Alternatively, as shown in FIG. 40B, it is possible to form a liquid crystal layer 5307 which is formed over the insulating layer 5305 and the conductive layer 5306 and a conductive layer 5308 which is formed over the liquid crystal layer 5307.

The insulating layer 5261 can serve as a base film. The insulating layer 5354 serves as an element isolation layer (e.g., a field oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as an interlayer film or a planarization film. Each of the conductive layer 5266, the conductive layer 5304, and the conductive layer 5359 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5269 can serve as a partition wall. Each of the conductive layer 5271 and the conductive layer 5308 can serve as a counter electrode, a common electrode, or the like.

As each of the substrate 5260 and the substrate 5300, a glass substrate, a quartz substrate, a semiconductor substrate (e.g., a silicon substrate), an SOI substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. Alternatively, an attachment film (formed using polypropylene, polyester, vinyl, polyvinyl fluoride, polyvinyl chloride, or the like), paper of a fibrous material, a base material film (formed using polyester, polyamide, polyimide, an inorganic vapor deposition film, paper, or the like), or the like can be used.

As the semiconductor substrate 5352, for example, a single crystal silicon substrate having n-type or p-type conductivity can be used. For example, the region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where the semiconductor substrate 5352 has n-type conductivity, the region 5353 has p-type conductivity and serves as a p-well. For example, the region 5355 is a region where an impurity is added to the semiconductor substrate 5352 and serves as a source region or a drain region. Note that an LDD region can be formed in the semiconductor substrate 5352.

For the insulating layer 5261, a single-layer structure or a layered structure of an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0) can be used, for example. In an example in the case where the insulating layer 5261 has a two-layer structure, a silicon nitride film and a silicon oxide film can be formed as a first insulating layer and a second insulating layer, respectively. In an example in the case where the insulating layer 5261 has a three-layer structure, a silicon oxide film, a silicon nitride film, and a silicon oxide film can be formed as a first insulating layer, a second insulating layer, and a third insulating layer, respectively.

For each of the semiconductor layer 5262, the semiconductor layer 5303a, and the semiconductor layer 5303b, for example, a non-single-crystal semiconductor (e.g., amorphous silicon, polycrystalline silicon, or microcrystalline silicon), a single crystal semiconductor, an oxide semiconductor (e.g., ZnO, InGaZnO, IZO (indium zinc oxide), ITO (indium tin oxide), SnO, TiO, or AlZnSnO (AZTO)), a compound semiconductor (e.g., SiGe or GaAs), an organic semiconductor, a carbon nanotube, or the like can be used.

Note that for example, the region 5262a is an intrinsic region where an impurity is not added to the semiconductor layer 5262 and serves as a channel region. However, an impurity can be added to the region 5262a. The concentration of the impurity added to the region 5262a is preferably lower than the concentration of an impurity added to the region 5262b, the region 5262c, the region 5262d, or the region 5262e. Each of the region 5262b and the region 5262d is a region to which an impurity is added at lower concentration than the region 5262c or the region 5262e and serves as an LDD (lightly doped drain) region. Note that the region 5262b and the region 5262d can be omitted. Each of the region 5262c and the region 5262e is a region to which an impurity is added at high concentration and serves as a source region or a drain region.

Note that the semiconductor layer 5303b is a semiconductor layer to which phosphorus or the like is added as an impurity element and has n-type conductivity.

Note that in the case where an oxide semiconductor or a compound semiconductor is used for the semiconductor layer 5303a, the semiconductor layer 5303b can be omitted.

For each of the insulating layer 5263, the insulating layer 5302, and the insulating layer 5356 is a single-layer or multilayer insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0), for example.

The conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359 may each be a single-layer conductive film or a multilayer conductive film. For example, for the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cesium (Cs); a compound containing one or more elements selected from the above group; or the like can be used. Note that the single film or the compound can contain phosphorus (P), boron (B), arsenic (As), and/or oxygen (O), for example. For example, the compound is an alloy containing one or more elements selected from the above plurality of elements (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum titanium (Al—Ti), aluminum-cesium (Al—Cs), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above plurality of elements (e.g., a nitride film containing titanium nitride, tantalum nitride, molybdenum nitride, or the like); or a compound containing silicon and one or more elements selected from the above plurality of elements (e.g., a silicide film containing tungsten silicide, titanium silicide, nickel silicide, aluminum silicon, or molybdenum silicon); or the like. Alternatively, a nanotube material such as a carbon nanotube, an organic nanotube, an inorganic nanotube, or a metal nanotube can be used, for example.

The insulating layer 5265, the insulating layer 5267, the insulating layer 5269, the insulating layer 5305, and the insulating layer 5358 can be a single-layer insulating layer, a multilayer insulating layer, or the like, for example. For example, as the insulating layer, an insulating film containing oxygen or nitrogen, such as silicon oxide ($SiO_x$), silicon nitride ($SiN_x$), silicon oxynitride ($SiO_xN_y$) ($x>y>0$), or silicon nitride oxide ($SiN_xO_y$) ($x>y>0$); a film containing carbon such as diamond-like carbon (DLC); an organic material such as a siloxane resin, epoxy, polyimide, polyamide, polyvinyl phenol, benzocyclobutene, or acrylic; or the like can be used.

Note that an insulating layer that serves as an alignment film, an insulating layer that serves as a protrusion portion or the like can be formed over the insulating layer 5305 and the conductive layer 5306.

Note that an insulating layer or the like that serves as a color filter, a black matrix, or a protrusion portion can be formed over the conductive layer 5308. An insulating layer that serves as an alignment film can be formed below the conductive layer 5308.

The transistor in this embodiment can be applied to that which is described in Embodiments 1 to 7. Particularly, in FIG. 40B, using an amorphous semiconductor, a microcrystalline semiconductor, an organic semiconductor, an oxide semiconductor, or the like for a semiconductor layer can cause degradation of a transistor. Therefore, using the transistor in this embodiment for a semiconductor device, a shift register, a display device, or various other circuits reduces the life thereof. However, degradation of a transistor can be suppressed by that which is described in Embodiments 1 to 7, that is, applying the transistor in this Embodiment to that which is described in Embodiments 1 to 7 can increase the life thereof.

(Embodiment 9)

In this embodiment, examples of cross-sectional structures of a display device are described with reference to FIGS. 41A to 41C. Note that a liquid crystal display device will be described as an example here.

Figure 41A:
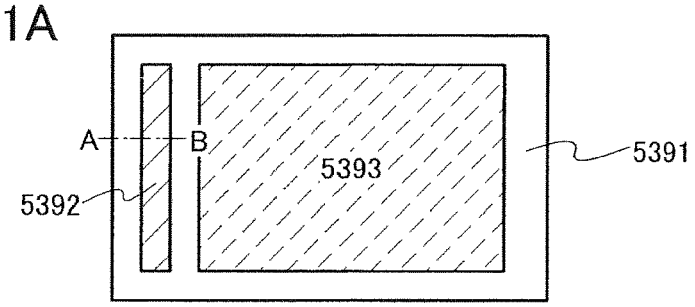
FIG. 41A is an example of a block diagram of a display device in Embodiment 9 and FIGS. 41B and 41C are examples of a cross-sectional view of the display device in Embodiment 9.

FIG. 41A shows an example of the top view of the display device. A driver circuit 5392 and a pixel portion 5393 are formed over a substrate 5391. Examples of the driver circuit 5392 include a scan line driver circuit, a signal line driver circuit, or the like. The pixel portion 5393 includes pixels. Operation of the pixels is controlled by the driver circuit 5392. In the case of a liquid crystal display device, the voltage applied to a liquid crystal element in a pixel is set by an output signal of the driver circuit 5392.

Figure 41B:
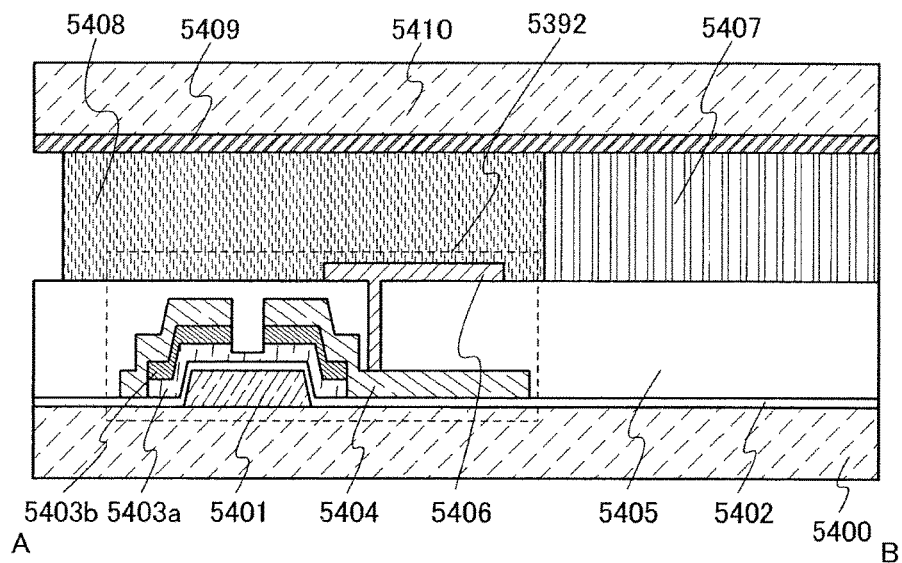

FIG. 41B shows an example of a cross section taken along line A-B in FIG. 41A. FIG. 41B shows a substrate 5400, a conductive layer 5401 formed over the substrate 5400, an insulating layer 5402 formed so as to cover the conductive layer 5401, a semiconductor layer 5403a formed over the conductive layer 5401 and the insulating layer 5402, a semiconductor layer 5403b formed over the semiconductor layer 5403a, a conductive layer 5404 formed over the semiconductor layer 5403b and the insulating layer 5402, an insulating layer 5405 that is formed over the insulating layer 5402 and the conductive layer 5404 and is provided with an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can serve as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer film or a planarization film. The conductive layer 5406 can serve as a wiring. The insulating layer 5408 can serve as a sealant. The conductive layer 5409 can serve as a counter electrode or a common electrode.

Here, parasitic capacitance may exist between the driver circuit 5392 and the conductive layer 5409. Accordingly, an output signal from the driver circuit 5392 or a voltage of each node is distorted or delayed, or power consumption is increased. However, when the insulating layer 5408 which can serve as the sealant is formed over the driver circuit 5392 as shown in FIG. 41B, parasitic capacitance between the driver circuit 5392 and the conductive layer 5409 can be reduced. This is because the dielectric constant of the sealant is often lower than the dielectric constant of the liquid crystal layer. Therefore, distortion or delay of the output signal from the driver circuit 5392 or the voltage of each node can be reduced. Alternatively, power consumption of the driver circuit 5392 can be reduced.

Figure 41C:
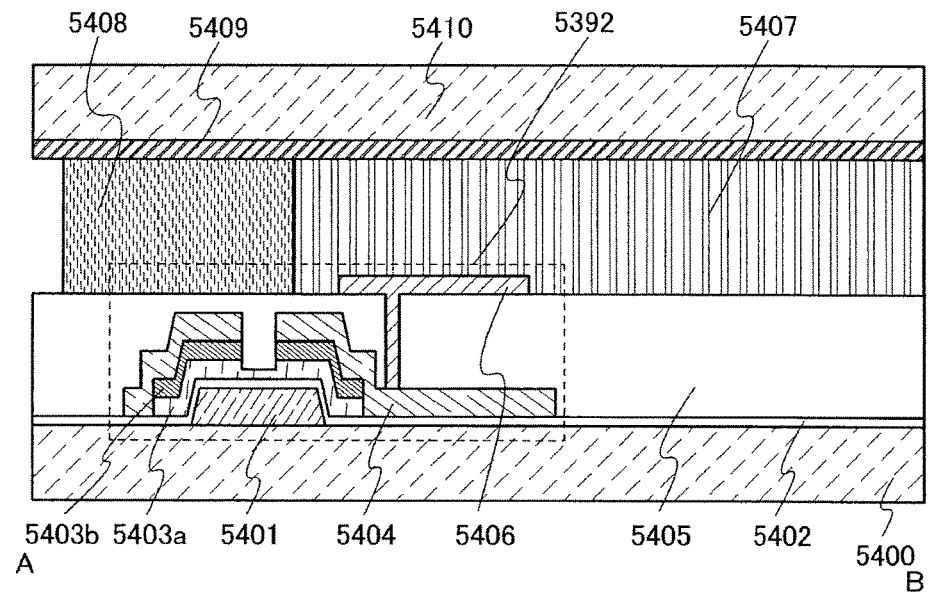

Note that as shown in FIG. 41C, the insulating layer 5408 which can serve as the sealant can be formed over part of the driver circuit 5392. Also in such a case, parasitic capacitance between the driver circuit 5392 and the conductive layer 5409 can be reduced. Thus, distortion or delay of the output signal from the driver circuit 5392 or the voltage of each node can be reduced. Note that this embodiment is not limited to this. It is possible not to form the insulating layer 5408, which can serve as the sealant, over the driver circuit 5392.

As described above, examples of cross-sectional structures of a display device are described in this embodiment. Such a structure can be combined with that which is described in Embodiments 1 to 7. For example, in the case where an amorphous semiconductor, a microcrystalline semiconductor, an organic semiconductor, an oxide semiconductor, or the like is used for a semiconductor layer of a transistor, the channel width of the transistor is increased in many cases. However, by reducing parasitic capacitance of the driver circuit as in this embodiment, the channel width of the transistor can be reduced. Thus, a layout area can be reduced, so that the frame of the display device can be reduced. Alternatively, the display device can have higher definition.

(Embodiment 10)

In this embodiment, an example of a manufacturing process of a transistor and a capacitor will be described. In particular, a manufacturing process when an oxide semiconductor is used for a semiconductor layer will be described.

Figure 42A:
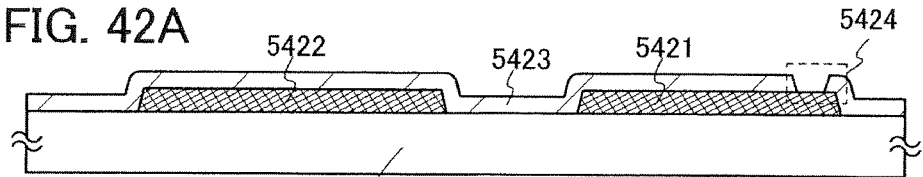
FIGS. 42A to 42E are examples of a diagram for showing manufacturing steps of a semiconductor device in Embodiment 10.
Figure 42B:
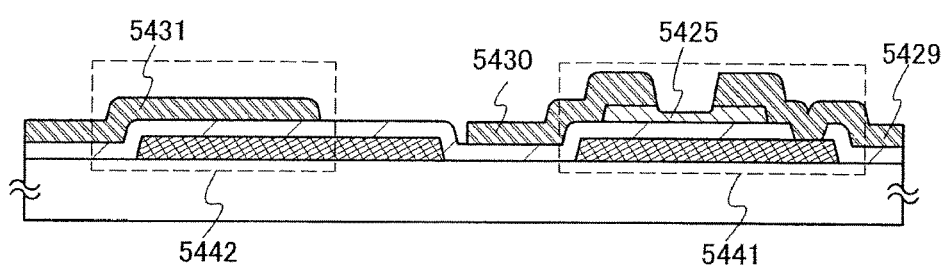
Figure 42C:
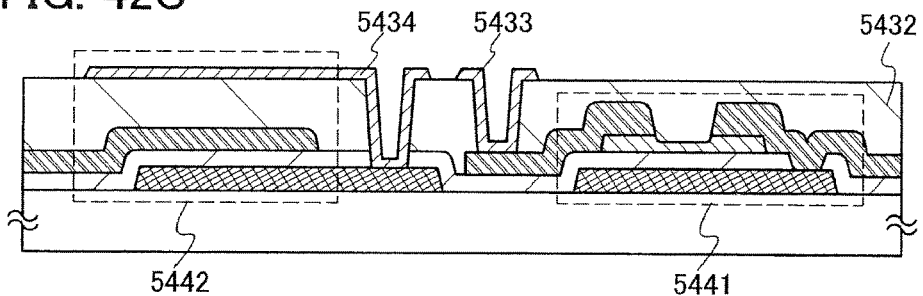

An example of a manufacturing process of a transistor and a capacitor will be described with reference to FIGS. 42A to 42C. FIGS. 42A to 42C show an example of a manufacturing process of a transistor 5441 and a capacitor 5442. The transistor 5441 is an example of an inverted staggered thin film transistor, in which a wiring is provided over an oxide semiconductor layer with a source electrode or a drain electrode therebetween.

First, a first conductive layer is formed over the entire surface of a substrate 5420 by sputtering. Next, the first conductive layer is selectively etched with the use of a resist mask formed through a photolithography process using a first photomask, so that a conductive layer 5421 and a conductive layer 5422 are formed. The conductive layer 5421 can serve as a gate electrode. The conductive layer 5422 can serve as one of electrodes of the capacitor. Note that this embodiment is not limited to this, and each of the conductive layers 5421 and 5422 can include a portion serving as a wiring, a gate electrode, or an electrode of the capacitor. After that, the resist mask is removed.

Next, an insulating layer 5423 is formed over the entire surface of the substrate 5420 through the conductive layer 5421 and the conductive layer 5422 by plasma-enhanced CVD or sputtering. The insulating layer 5423 can serve as a gate insulating layer and is formed so as to cover the conductive layers 5421 and 5422. Note that the thickness of the insulating layer 5423 is often 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that this embodiment is not limited to this, that is, the contact hole 5424 can be omitted. Alternatively, the contact hole 5424 can be formed after an oxide semiconductor layer is formed. A cross-sectional view of the steps so far corresponds to FIG. 42A.

Next, an oxide semiconductor layer is formed over the entire surface by sputtering. Note that this embodiment is not limited to this, that is, it is possible to form the oxide semiconductor layer by sputtering and to form a buffer layer (e.g., an n$^+$ layer) thereover. Note that the thickness of the oxide semiconductor layer is often 5 to 200 nm.

Next, the oxide semiconductor layer is selectively etched using a resist mask formed through a photolithography process using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as the other of the electrodes of the capacitor. Note that this embodiment is not limited to this, that is, each of the conductive layers 5429, 5430, and 5431 can include a portion serving as a wiring, the source electrode, the drain electrode, or the electrode of the capacitor. A cross-sectional view of the steps so far corresponds to FIG. 42B.

Next, heat treatment is performed at 200 to 600° C. in an air atmosphere or a nitrogen atmosphere. Through this heat treatment, rearrangement at the atomic level occurs in an oxide semiconductor layer 5425. In this manner, through heat treatment (the heat treatment may be annealing with light), strain which inhibits carrier movement is released. Note that there is no particular limitation to the timing of when the heat treatment is performed, and the heat treatment can be performed at different timings after the oxide semiconductor layer is formed.

Next, an insulating layer 5432 is formed over the entire surface. The insulating layer 5432 can be either single-layer or multilayer. For example, in the case where an organic insulating layer is used as the insulating layer 5432, the organic insulating layer is formed in such a manner that a composition which is a material for the organic insulating layer is applied and subjected to heat treatment at 200 to 600° C. in an air atmosphere or a nitrogen atmosphere. By forming the organic insulating layer that is in contact with the oxide semiconductor layer 5425 in this manner, a thin film transistor with high reliability can be manufactured. Note that in the case where an organic insulating layer is used as the insulating layer 5432, a silicon nitride film or a silicon oxide film can be provided below the organic insulating layer.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 42C. Each of the conductive layers 5433 and 5434 can serve as a wiring, a pixel electrode, a reflective electrode, a light-transmitting electrode, or the electrode of the capacitor. In particular, since the conductive layer 5434 is connected to the conductive layer 5422, the conductive layer 5434 can serve as the electrode of the capacitor 5442. Note that this embodiment is not limited to this, that is, the conductive layers 5433 and 5434 can have the function of connecting a conductive layer formed using the first conductive layer and a conductive layer formed using the second conductive layer to each other. For example, by connecting the conductive layers 5433 and 5434 to each other, the conductive layer 5422 and the conductive layer 5430 can be connected to each other through the third conductive layer (the conductive layers 5433 and 5434).

Through the above steps, the transistor 5441 and the capacitor 5442 can be manufactured.

Figure 42D:
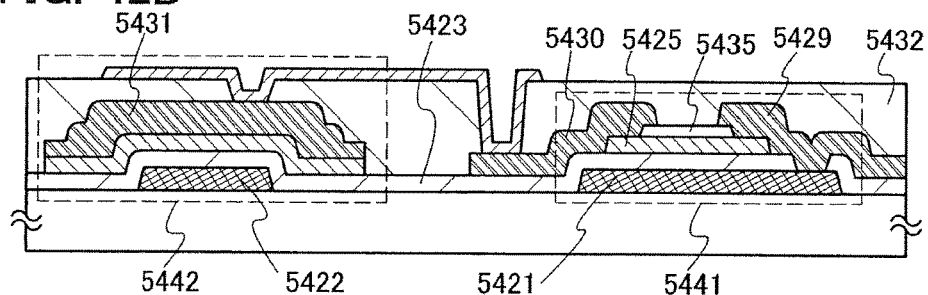

Note that as shown in FIG. 42D, an insulating layer 5435 can be formed over the oxide semiconductor layer 5425.

Figure 42E:
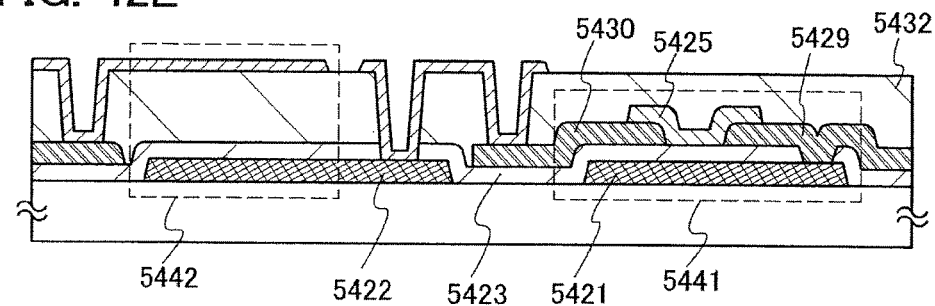

Note that as shown in FIG. 42E, the oxide semiconductor layer 5425 can be formed after the second conductive layer is patterned.

Note that for the substrate, the insulating film, the conductive film, and the semiconductor layer in this embodiment, the materials described in the other embodiments or materials which are similar to those described in this specification can be used.

(Embodiment 11)

In this embodiment, a layout view (hereinafter also referred to as a top view) of a shift register will be described. In this embodiment, a layout view of the shift register described in Embodiment 5 will be described. Note that a content described in this embodiment can be applied to the semiconductor device, the shift register, or the display device in Embodiments 1 to 6 in addition to the shift register in Embodiment 5. Note that the layout view in this embodiment is one example and this embodiment is not limited to this.

The layout view in this embodiment will be described with reference to FIG. 43. FIG. 43 shows a layout view of the shift register shown in FIG. 14A, as an example. Note that hatching patterns with reference numerals in the right part in FIG. 43 represent the hatching patterns of the components denoted by the respective reference numerals.

A transistor, a wiring, and the like shown in FIG. 43 include a conductive layer 901, a semiconductor layer 902, a conductive layer 903, a conductive layer 904, and a contact hole 905. However, this embodiment is not limited to this. A different conductive layer, insulating film, or a different contact hole can be newly formed. For example, a contact hole which connects the conductive layer 901 to the conductive layer 903 can be additionally provided.

The conductive layer 901 can include a portion which functions as a gate electrode or a wiring. The semiconductor layer 902 can include a portion which functions as a semiconductor layer of the transistor. The conductive layer 903 can include a portion which functions as a wiring, a source electrode, or a drain electrode. The conductive layer 904 can include a portion which functions as a light-transmissive electrode, a pixel electrode, or a wiring. The contact hole 905 has the function of connecting the conductive layer 901 and the conductive layer 904 with each other or connecting the conductive layer 903 and the conductive layer 904 with each other.

In this embodiment, in the transistor 101_1, the transistor 101_2, the transistor 301_1, the transistor 301_2, and the transistors 302_1 and 302_2, an area where the conductive layer 901 which functions as a second terminal and the conductive layer 903 overlap with each other is preferably smaller than that where the conductive layer 903 that functions as a first terminal and the conductive layer 901 overlap with each other. Accordingly, concentration of an electric field on the second terminal can be suppressed; thus, the deterioration of the transistor or the breakage of the transistor can be suppressed. However, this embodiment is not limited to this, that is, an area where the conductive layer 901 that functions as a second terminal and the conductive layer 903 overlap with each other can be larger than that where the conductive layer 903 that functions as a first terminal and the conductive layer 901 overlap with each other.

Note that the semiconductor layer 902 can be provided for a portion in which the conductive layer 901 and the conductive layer 903 overlap with each other. Accordingly, the parasitic capacitance between the conductive layer 901 and the conductive layer 903 can be reduced; thus, a reduction in noise can be achieved. For a similar reason, the semiconductor layer 902 can be provided in a portion where the conductive layer 903 and the conductive layer 904 overlap with each other.

Note that the conductive layer 904 can be formed over part of the conductive layer 901, and the conductive layer 901 can be connected to the conductive layer 904 through the contact hole 905. Accordingly, wiring resistance can be reduced. Alternatively, the conductive layer 903 and the conductive layer 904 can be formed over part of the conductive layer 901, the conductive layer 901 is connected to the conductive layer 904 through the contact hole 905, and the conductive layer 903 can be connected to the conductive layer 904 through the different contact hole 905. In this manner, the wiring resistance can be further reduced.

Note that the conductive layer 904 can be formed over part of the conductive layer 903, and the conductive layer 903 can be connected to the conductive layer 904 through the contact hole 905. Accordingly, wiring resistance can be reduced.

Note that the conductive layer 901 or the conductive layer 903 can be formed under part of the conductive layer 904, and the conductive layer 904 can be connected to the conductive layer 901 or the conductive layer 903 through the contact hole 905. Accordingly, wiring resistance can be reduced.

Note that as described above, the parasitic capacitance between the gate and the second terminal of the transistor 101_1 can be higher than that between the gate and the first terminal of the transistor 101_1. As shown in FIG. 43, the width of a part of the conductive layer 903 which can function as a first terminal of the transistor 101_1 is referred to as a width 931 and the width of a part of the conductive layer 903 which can function as a second electrode of the transistor 101_1 is referred to as a width 932. In addition, the width 931 can be larger than the width 932. In this manner, the parasitic capacitance between the gate and the second terminal of the transistor 101_1 can be higher than that between the gate and the first terminal of the transistor 101_1. However, this embodiment is not limited to this.

Note that as has been described above, the parasitic capacitance between the gate and the second terminal of the transistor 101_2 can be higher than that between the gate and the first terminal of the transistor 101_2. As shown in FIG. 43, the width of a part of the conductive layer 903 which can function as a first electrode of the transistor 101_2 is referred to as a width 941 and the width of a part of the conductive layer 903 which can function as a second electrode of the transistor 101_2 is referred to as a width 942. In addition, the width 941 can be larger than the width 942. In this manner, the parasitic capacitance between the gate and the second terminal of the transistor 101_2 can be higher than that between the gate and the first terminal of the transistor 101_2. However, this embodiment is not limited to this.

(Embodiment 12)

In this embodiment, examples of electronic devices are described.

FIGS. 44A to 44H and FIGS. 45A to 45D show electronic devices. These electronic devices can include a housing 5000, a display portion 5001, a speaker 5003, an LED lamp 5004, operation keys 5005 (including a power switch or an operation switch for controlling the operation of a display device), a connection terminal 5006, a sensor 5007 (a sensor having the function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 44A:
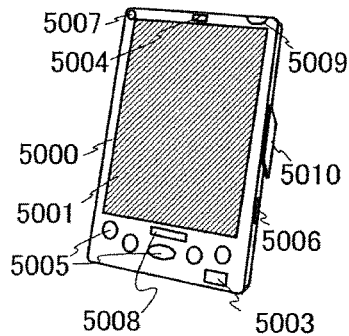
FIGS. 44A to 44H are examples of diagrams each showing an electronic device in Embodiment 12.
Figure 44B:
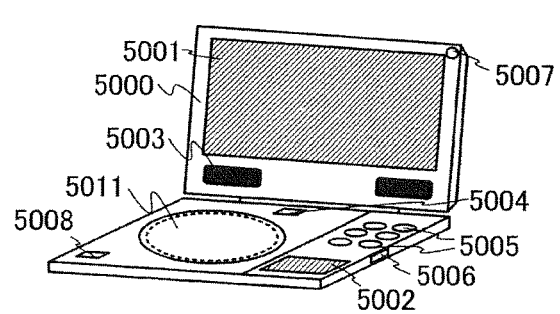
Figure 44C:
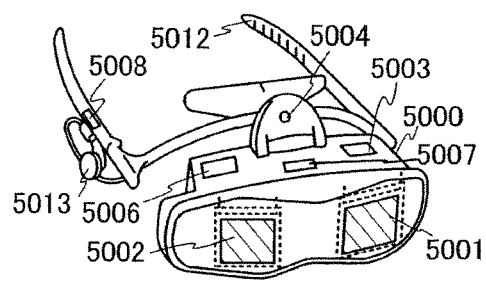
Figure 44D:
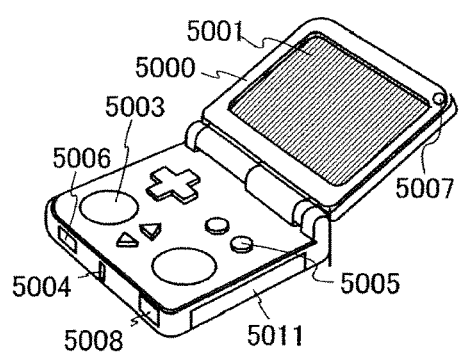
Figure 44E:
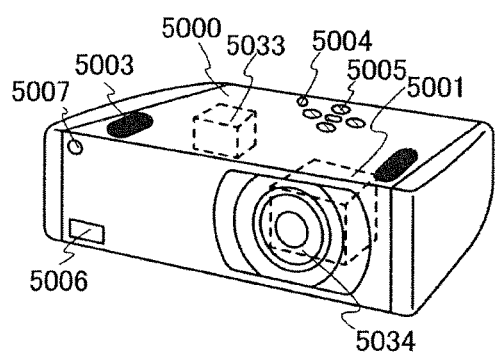
Figure 44F:
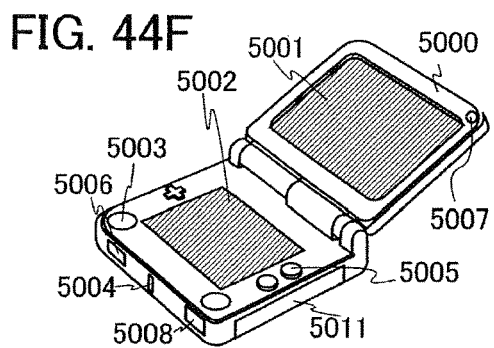
Figure 44G:
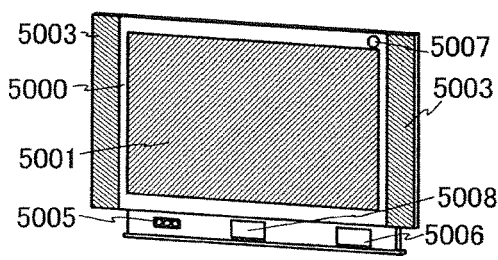
Figure 44H:
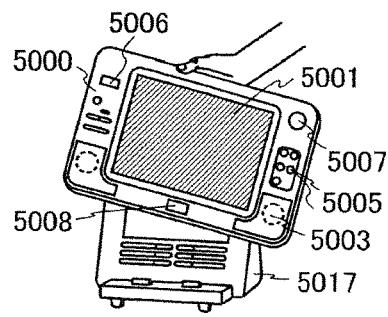
Figure 45A:
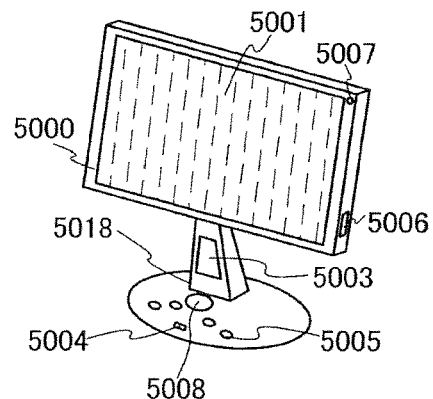
FIGS. 45A to 45H are examples of diagrams each showing an electronic device in Embodiment 12.
Figure 45B:
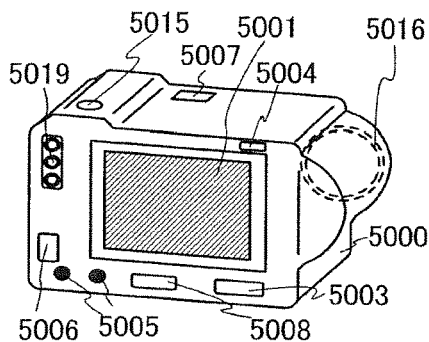
Figure 45C:
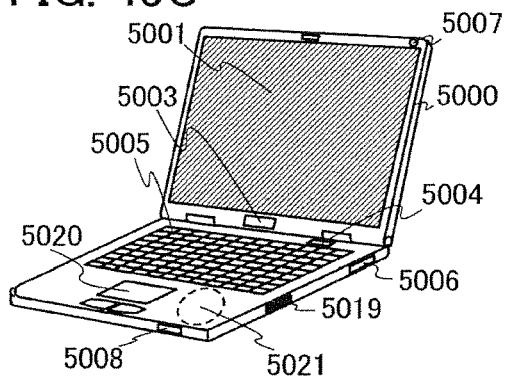
Figure 45D:
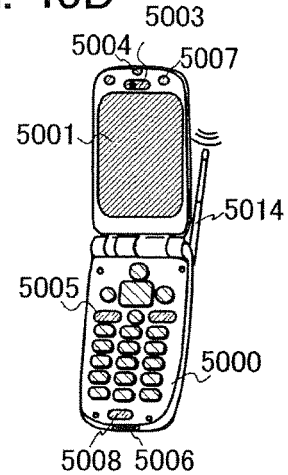

FIG. 44A shows a mobile computer, which can include a switch 5009, an infrared port 5010, and the like in addition to the above objects. FIG. 44B shows a portable image reproducing device provided with a memory medium (e.g., a DVD reproducing device) that can include a second display portion 5002, a memory medium reading portion 5011, and the like in addition to the above objects. FIG. 44C shows a goggle-type display that can include the second display portion 5002, a support portion 5012, an earphone 5013, and the like in addition to the above objects. FIG. 44D shows a portable game machine that can include the memory medium reading portion 5011 and the like in addition to the above objects. FIG. 44E shows a projector that can include a light source 5033, a projector lens 5034, and the like in addition to the above objects. FIG. 44F shows a portable game machine that can include the second display portion 5002, the memory medium reading portion 5011, and the like in addition to the above objects. FIG. 44G shows a television receiver that can include a tuner, an image processing portion, and the like in addition to the above objects. FIG. 44H shows a portable television receiver that can include a charger 5017 capable of transmitting and receiving signals and the like in addition to the above objects. FIG. 45A shows a display that can include a support base 5018 and the like in addition to the above objects. FIG. 45B shows a camera that can include an external connecting port 5019, a shutter button 5015, an image receiving portion 5016, and the like in addition to the above objects. FIG. 45C shows a computer that can include a pointing device 5020, the external connecting port 5019, a reader/writer 5021, and the like in addition to the above objects. FIG. 45D shows a mobile phone that can include an antenna 5014, a tuner of one-segment (1seg digital TV broadcasts) partial reception service for mobile phones and mobile terminals, and the like in addition to the above objects.

The electronic devices shown in FIGS. 44A to 44H and FIGS. 45A to 45D can have a variety of functions, for example, the function of displaying a lot of information (e.g., a still image, a moving image, and a text image) on a display portion; a touch panel function; the function of displaying a calendar, date, time, and the like; the function of controlling processing with a lot of software (programs); a wireless communication function; the function of being connected to a variety of computer networks with a wireless communication function the function of transmitting and receiving a lot of data with a wireless communication function; the function of reading a program or data stored in a memory medium and displaying the program or data on a display portion. Further, the electronic device including a plurality of display portions can have the function of displaying image information mainly on one display portion while displaying text information on another display portion, the function of displaying a three-dimensional image by displaying images where parallax is considered on a plurality of display portions, or the like. Furthermore, the electronic device including an image receiving portion can have the function of photographing a still image, the function of photographing a moving image, the function of automatically or manually correcting a photographed image, the function of storing a photographed image in a memory medium (an external memory medium or a memory medium incorporated in the camera), the function of displaying a photographed image on the display portion, or the like. Note that functions that can be provided for the electronic devices shown in FIGS. 44A to 44H and FIGS. 45A to 45D are not limited them, and the electronic devices can have a variety of functions.

The electronic devices described in this embodiment each include a display portion for displaying some kind of information. In particular, in the case where the display portion includes that which is described in Embodiments 1 to 6, degradation of a transistor can be suppressed, thereby increasing the life of the display portion. However, this embodiment is not limited to this, that is, in the case where the electronic devices include that which is described in Embodiments 1 to 6, the life of the electronic devices can be increased.

Next, applications of semiconductor devices are described.

Figure 45E:
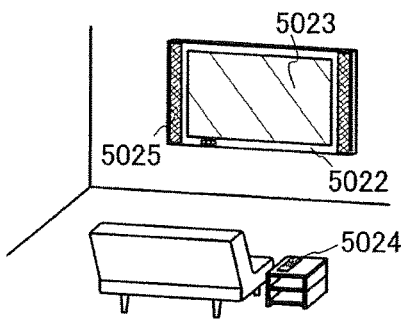

FIG. 45E shows an example in which a semiconductor device is incorporated in a building structure. FIG. 45E shows a housing 5022, a display portion 5023, a remote controller 5024 which is an operation portion, a speaker 5025, and the like. The semiconductor device is incorporated in the building structure as a wall-hanging type and can be provided without requiring a large space.

Figure 45F:
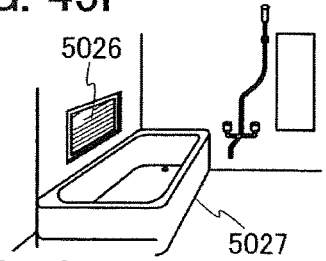

FIG. 45F shows another example in which a semiconductor device is incorporated in a building structure. A display panel 5026 is incorporated in a prefabricated bath unit 5027, so that a bather can view the display panel 5026.

Note that although this embodiment describes the wall and the prefabricated bath are given as examples of the building structures, this embodiment is not limited to them. The semiconductor devices can be provided in a variety of building structures.

Next, examples in which semiconductor devices are incorporated in moving objects are described.

Figure 45G:
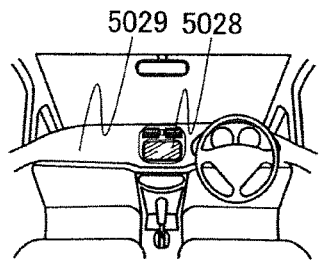

FIG. 45G shows an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 45H:
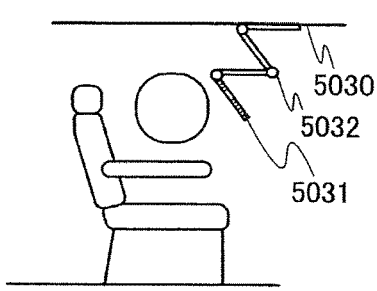

FIG. 45H shows an example in which a semiconductor device is incorporated in a passenger airplane. FIG. 45H shows a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has the function of displaying information by the operation of the passenger.

Note that although bodies of a car and an airplane are shown as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

This application is based on Japanese Patent Application serial no. 2009-077201 filed with Japan Patent Office on Mar. 26, 2009, the entire contents of which are hereby incorporated by reference.

What is claimed is:

1. A semiconductor device comprising:
   a first transistor, a second transistor, a third transistor, a fourth transistor, and a fifth transistor,
   wherein the first transistor, the second transistor, the third transistor, the fourth transistor, and the fifth transistor have the same conductivity type,
   wherein one of a source and a drain of the first transistor and one of a source and a drain of the second transistor are electrically connected to a first clock signal line,
   wherein the other of the source and the drain of the first transistor and the other of the source and the drain of the second transistor are electrically connected to a first gate signal line,
   wherein one of a source and a drain of the third transistor and one of a source and a drain of the fourth transistor are electrically connected to a second clock signal line,
   wherein the other of the source and the drain of the third transistor and the other of the source and the drain of the fourth transistor are electrically connected to a second gate signal line,
   wherein one of a source and a drain of the fifth transistor is electrically connected to a gate of the third transistor,
   wherein the other of the source and the drain of the fifth transistor is electrically connected to the first gate signal line,
   wherein a channel width of the third transistor is larger than a channel width of the fifth transistor, and
   wherein a channel width of the fourth transistor is larger than the channel width of the fifth transistor.

2. The semiconductor device according to claim 1, wherein gates of the first transistor, the second transistor, the third transistor, the fourth transistor, and the fifth transistor are controlled independently.

3. A shift register comprising the semiconductor device according to claim 1.

4. An electronic device comprising the semiconductor device according to claim 1.

5. The semiconductor device according to claim 1,
   wherein the other of the source and the drain of the second transistor is not directly connected to a gate of the second transistor, and
   wherein the other of the source and the drain of the fourth transistor is not directly connected to a gate of the fourth transistor.

6. A semiconductor device comprising:
a first transistor, a second transistor, a third transistor, a fourth transistor, and a fifth transistor,
wherein the first transistor, the second transistor, the third transistor, the fourth transistor, and the fifth transistor have the same conductivity type,
wherein one of a source and a drain of the first transistor and one of a source and a drain of the second transistor are electrically connected to a first clock signal line,
wherein the other of the source and the drain of the first transistor and the other of the source and the drain of the second transistor are electrically connected to a first gate signal line,
wherein one of a source and a drain of the third transistor and one of a source and a drain of the fourth transistor are electrically connected to a second clock signal line,
wherein the other of the source and the drain of the third transistor and the other of the source and the drain of the fourth transistor are electrically connected to a second gate signal line,
wherein one of a source and a drain of the fifth transistor is electrically connected to a gate of the third transistor,
wherein the other of the source and the drain of the fifth transistor is electrically connected to the first gate signal line,
wherein a channel width of the third transistor is larger than a channel width of the fifth transistor,
wherein a channel width of the fourth transistor is larger than the channel width of the fifth transistor, and
wherein gates of the first transistor, the second transistor, the third transistor, the fourth transistor, and the fifth transistor are not directly connected to each other.

7. The semiconductor device according to claim 6, wherein gates of the first transistor, the second transistor, the third transistor, the fourth transistor, and the fifth transistor are controlled independently.

8. A shift register comprising the semiconductor device according to claim 6.

9. An electronic device comprising the semiconductor device according to claim 6.

10. The semiconductor device according to claim 6,
wherein the other of the source and the drain of the second transistor is not directly connected to a gate of the second transistor, and
wherein the other of the source and the drain of the fourth transistor is not directly connected to a gate of the fourth transistor.

* * * * *